US012604658B2

(12) United States Patent
Kim et al.

(10) Patent No.: US 12,604,658 B2
(45) **Date of Patent: *Apr. 14, 2026**

(54) PLURALITY OF HOST MATERIALS AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Bitnari Kim, Gyeonggi-do (KR); Jeong-Eun Yang, Gyeonggi-do (KR); Doo-Hyeon Moon, Gyeonggi-do (KR); Su-Hyun Lee, Gyeonggi-do (KR); Hyo-Soon Park, Gyeonggi-do (KR); Sang-Hee Cho, Gyeonggi-do (KR)

(73) Assignee: DuPont Specialty Materials Korea Ltd. (KR)

( * ) Notice: Subject to any disclaimer, the term of this patent is extended or adjusted under 35 U.S.C. 154(b) by 745 days.

This patent is subject to a terminal disclaimer.

(21) Appl. No.: 17/259,909

(22) PCT Filed: Jun. 5, 2019

(86) PCT No.: PCT/KR2019/006784

§ 371 (c)(1),
(2) Date: Jan. 12, 2021

(87) PCT Pub. No.: WO2020/013448

PCT Pub. Date: Jan. 16, 2020

(65) Prior Publication Data

US 2021/0265569 A1 Aug. 26, 2021

(30) Foreign Application Priority Data

Jul. 13, 2018 (KR) ........................ 10-2018-0081499
May 13, 2019 (KR) ........................ 10-2019-0055617

(51) Int. Cl.
*H10K 85/60* (2023.01)
*H10K 101/00* (2023.01)

(52) U.S. Cl.
CPC ......... *H10K 85/633* (2023.02); *H10K 85/615* (2023.02); *H10K 85/654* (2023.02); *H10K 85/6572* (2023.02); *H10K 85/6574* (2023.02); *H10K 85/6576* (2023.02); *H10K 2101/90* (2023.02)

(58) Field of Classification Search
CPC ............ H10K 2201/90; H10K 2101/90; H01L 2251/5384
See application file for complete search history.

(56) References Cited

U.S. PATENT DOCUMENTS

| | | | | |
|---|---|---|---|---|
| 2007/0215889 | A1* | 9/2007 | Kawakami | H10K 85/633 257/94 |
| 2008/0160347 | A1 | 7/2008 | Wang et al. | |
| 2012/0203010 | A1* | 8/2012 | Matsumoto | C09K 11/06 548/440 |
| 2015/0340619 | A1 | 11/2015 | Pflumm et al. | |
| 2016/0343942 | A1 | 11/2016 | Hamada et al. | |
| 2018/0182973 | A1* | 6/2018 | Kim | H10K 85/654 |
| 2018/0208837 | A1* | 7/2018 | Ahn | H10K 50/11 |
| 2018/0323397 | A1 | 11/2018 | Ahn et al. | |
| 2019/0074448 | A1 | 3/2019 | Lim et al. | |
| 2019/0214572 | A1 | 7/2019 | Cho et al. | |
| 2019/0312212 | A1 | 10/2019 | Moon et al. | |

FOREIGN PATENT DOCUMENTS

| | | | | |
|---|---|---|---|---|
| KR | 20130106255 A | 9/2013 | | |
| KR | 2017022865 A * | 3/2017 | | C07D 251/12 |
| WO | WO-2015084114 A1 * | 6/2015 | | C07C 211/54 |
| WO | WO-2016204394 A1 * | 12/2016 | | C09K 11/06 |

OTHER PUBLICATIONS

Cited Reference from Japan Patent Office, Application No. 2024-064516, Filing Date: 2024-064516.

* cited by examiner

*Primary Examiner* — Sean M DeGuire
(74) *Attorney, Agent, or Firm* — G. Creston Campbell

(57) ABSTRACT

The present disclosure relates to a plurality of host materials comprising a first host material comprising a compound represented by formula 1, and a second host material comprising a compound represented by formula 2, and an organic electroluminescent device comprising the same. By comprising a specific combination of compounds of the present disclosure as host materials, it is possible to provide an organic electroluminescent device having higher luminous efficiency and/or longer lifespan properties as compared with a conventional organic electroluminescent device.

7 Claims, No Drawings

PLURALITY OF HOST MATERIALS AND ORGANIC ELECTROLUMINESCENT DEVICE COMPRISING THE SAME

TECHNICAL FIELD

The present disclosure relates to a host material comprising a combination of specific compounds, and an organic electroluminescent device comprising the same.

BACKGROUND ART

An electroluminescent (EL) device is a self-light-emitting device which has advantages in that it provides a wider viewing angle, a greater contrast ratio, and a faster response time. An organic EL device was first developed by Eastman Kodak in 1987, by using small aromatic diamine molecules and aluminum complexes as materials for forming a light-emitting layer [Appl. Phys. Lett. 51, 913, 1987].

An organic electroluminescent device (OLED) changes electric energy into light by applying electricity to an organic electroluminescent material, and commonly comprises an anode, a cathode, and an organic layer formed between the two electrodes. The organic layer of the OLED may comprise a hole injection layer, a hole transport layer, a hole auxiliary layer, a light-emitting auxiliary layer, an electron blocking layer, a light-emitting layer, an electron buffer layer, a hole blocking layer, an electron transport layer, an electron injection layer, etc., if necessary. The materials used in the organic layer can be classified into a hole injection material, a hole transport material, a hole auxiliary material, a light-emitting auxiliary material, an electron blocking material, a light-emitting material (containing host and dopant materials), an electron buffer material, a hole blocking material, an electron transport material, an electron injection material, etc., depending on their functions. In the OLED, holes from the anode and electrons from the cathode are injected into a light-emitting layer by the application of electric voltage, and excitons having high energy are produced by the recombination of the holes and electrons. The organic light-emitting compound moves into an excited state by the energy and emits light from an energy when the organic light-emitting compound returns to the ground state from the excited state.

The most important factor determining luminous efficiency in an OLED is light-emitting materials. The light-emitting materials are required to have the following features: high quantum efficiency, high mobility of an electron and a hole, and uniformity and stability of the formed light-emitting material layer. The light-emitting material is classified into blue, green, and red light-emitting materials according to the light-emitting color, and further includes yellow or orange light-emitting materials. Furthermore, the light-emitting material is classified into a host material and a dopant material in a functional aspect. Recently, an urgent task is the development of an OLED having high efficiency and long lifespan. In particular, the development of highly excellent light-emitting material over conventional materials is urgently required, considering the EL properties necessary for medium- and large-sized OLED panels. For this, preferably, as a solvent in a solid state and an energy transmitter, a host material should have high purity and a suitable molecular weight in order to be deposited under vacuum. Furthermore, a host material is required to have high glass transition temperature and pyrolysis temperature to achieve thermal stability, high electrochemical stability to achieve a long lifespan, easy formability of an amorphous thin film, good adhesion with adjacent layers, and no movement between layers.

DISCLOSURE OF THE INVENTION

Problems to be Solved

The objective of the present disclosure is to provide an improved host material capable of providing an organic electroluminescent device having higher luminous efficiency and/or longer lifespan properties.

Solution to Problems

The present inventors found that the above objective can be achieved by a plurality of host materials comprising a first host material and a second host material, wherein the first host material comprises a compound represented by the following formula 1, and the second host material comprises a compound represented by the following formula 2:

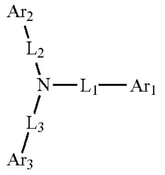

(1)

wherein, $Ar_1$ to $Ar_3$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

$L_1$ to $L_3$, each independently, represent a single bond, a substituted or unsubstituted (C1-C30)alkylene, a substituted or unsubstituted (C6-C30)arylene, a substituted or unsubstituted (3- to 30-membered) heteroarylene, or a substituted or unsubstituted (C3-C30)cycloalkylene;

with a proviso except that all of $L_1$ to $L_3$ are a single bond, and all of $Ar_1$ to $Ar_3$ are hydrogen; and

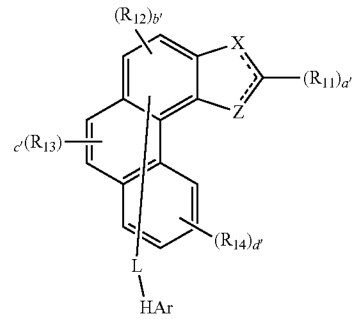

(2)

wherein,

X represents —N═, —$NR_{15}$—, —O—, or —S—;

Z represents —N═, —$NR_{16}$—, —O—, or —S—; with a proviso that when X represents —N═, Z represents —$NR_{16}$—, —O—, or —S—, and when X represents —$NR_{15}$—, Z represents —N═, —O—, or —S—;

HAr represents a substituted or unsubstituted (3- to 30-membered) heteroaryl;

$R_{11}$ represents a substituted or unsubstituted (C6-C30) aryl, or a substituted or unsubstituted (3- to 30-membered) heteroaryl;

$R_{12}$ to $R_{14}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or adjacent ones of $R_{12}$ to $R_{14}$ may be linked to each other to form a ring(s);

$R_{15}$ and $R_{16}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

L represents a single bond, a substituted or unsubstituted (C6-C30)arylene, or a substituted or unsubstituted (3- to 30-membered) heteroarylene;

a' represents an integer of 1; b' and c', each independently, represent an integer of 1 or 2; d' represents an integer of 1 to 4; where if b', c', and d', each independently, are an integer of 2 or more, each of $R_{12}$ to $R_{14}$ may be the same or different.

Effects of the Invention

By comprising a specific combination of compounds of the present disclosure as host materials, it is possible to provide an organic electroluminescent device having higher luminous efficiency and/or longer lifespan properties as compared with the conventional organic electroluminescent device, and manufacture a display system or a light system using the same.

EMBODIMENTS OF THE INVENTION

Hereinafter, the present disclosure will be described in detail. However, the following description is intended to explain the disclosure, and is not meant in any way to restrict the scope of the disclosure.

The term "organic electroluminescent material" in the present disclosure means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material (containing host and dopant materials), an electron buffer material, a hole blocking material, an electron transport material, an electron injection material, etc.

The term "a plurality of organic electroluminescent materials" in the present disclosure means an organic electroluminescent material(s) comprising a combination of at least two compounds, which may be comprised in any organic layer constituting an organic electroluminescent device. It may mean both a material before being comprised in an organic electroluminescent device (for example, before vapor deposition) and a material after being comprised in an organic electroluminescent device (for example, after vapor deposition). For example, a plurality of organic electroluminescent materials may be a combination of at least two compounds which may be comprised in at least one of a hole injection layer, a hole transport layer, a hole auxiliary layer, a light-emitting auxiliary layer, an electron blocking layer, a light-emitting layer, an electron buffer layer, a hole blocking layer, an electron transport layer, and an electron injection layer. At least two compounds may be comprised in the same layer or different layers by means of the methods used in the art, for example, they may be mixture-evaporated or co-evaporated, or may be individually deposited.

The term "a plurality of host materials" in the present disclosure means a host material(s) comprising a combination of at least two compounds, which may be comprised in any light-emitting layer constituting an organic electroluminescent device. It may mean both a material before being comprised in an organic electroluminescent device (for example, before vapor deposition) and a material after being comprised in an organic electroluminescent device (for example, after vapor deposition). For example, the plurality of host materials of the present disclosure may be a combination of two or more host materials, and may optionally further include a conventional material comprised in organic electroluminescent materials. The two or more compounds comprised in the plurality of host materials of the present disclosure may be included in one light-emitting layer or may be respectively included in different light-emitting layers. For example, the two or more host materials may be mixture-evaporated or co-evaporated, or individually deposited.

Herein, the term "(C1-C30)alkyl" is meant to be a linear or branched alkyl having 1 to 30 carbon atoms constituting the chain, in which the number of carbon atoms is preferably 1 to 10, and more preferably 1 to 6. The above alkyl may include methyl, ethyl, n-propyl, iso-propyl, n-butyl, iso-butyl, tert-butyl, etc. The term "(C3-C30)cycloalkyl" or "(C3-C30)cycloalkylene" is meant to be a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, etc. The term "(3- to 7-membered) heterocycloalkyl" is meant to be a cycloalkyl having 3 to 7 ring backbone atoms, and including at least one heteroatom selected from the group consisting of B, N, O, S, Si, and P, and preferably the group consisting of O, S, and N. The above heterocycloalkyl may include tetrahydrofuran, pyrrolidine, thiolan, tetrahydropyran, etc. The term "(C6-C30)aryl" or "(C6-C30) arylene" is meant to be a monocyclic or fused ring radical derived from an aromatic hydrocarbon having 6 to 30 ring backbone carbon atoms. The above aryl or arylene may be partially saturated, and may comprise a spiro structure. The above aryl may include phenyl, biphenyl, terphenyl, naphthyl, binaphthyl, phenylnaphthyl, naphthylphenyl, fluorenyl, phenylfluorenyl, benzofluorenyl, dibenzofluorenyl, phenanthrenyl, phenylphenanthrenyl, anthracenyl, indenyl, triphenylenyl, pyrenyl, tetracenyl, perylenyl, chrysenyl, naphthacenyl, fluoranthenyl, spirobifluorenyl, spiro[fluorene-benzofluorene]yl, etc. The term "(3- to 30-membered) heteroaryl" or "(3- to 30-membered) heteroarylene" is an aryl or an arylene having 3 to 30 ring backbone atoms, in which the number of the ring backbone carbon atoms is preferably 5 to 30, and including at least one, preferably 1 to 4 heteroatoms selected from the group consisting of B, N, O, S, Si, and P. The above heteroaryl(ene) may be a monocyclic ring, or a fused ring condensed with at least one benzene ring; may be partially saturated; may be one formed by linking at least one heteroaryl or aryl group to a heteroaryl group via a single bond(s); and may comprise a spiro structure. The above heteroaryl may include a monocyclic ring-type heteroaryl such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl such as benzofuranyl, benzothiophenyl, isobenzofuranyl, dibenzofuranyl, dibenzothiophenyl, benzonaphthothiophenyl, benzimidazolyl, benzothiazolyl, benzoisothiazolyl, benzoisoxazolyl, benzoxazolyl, isoindolyl, indolyl, indazolyl, benzothiadiazolyl, quinolyl, isoquinolyl, cinnolinyl, quinazolinyl, quinoxalinyl, carbazolyl, benzocarbazolyl, phenoxazinyl, phenanthridinyl, benzodioxolyl, etc. Furthermore, "halogen" includes F, Cl, Br, and I.

Herein, "substituted" in the expression "substituted or unsubstituted" means that a hydrogen atom in a certain functional group is replaced with another atom or another functional group, i.e., a substituent. In the present disclosure, the substituents of the substituted alkyl, the substituted alkylene, the substituted aryl, the substituted arylene, the substituted heteroaryl, the substituted heteroarylene, the substituted cycloalkyl, the substituted cycloalkylene, the substituted alkoxy, the substituted trialkylsilyl, the substituted dialkylarylsilyl, the substituted alkyldiarylsilyl, the substituted triarylsilyl, the substituted mono- or di-alkylamino, the substituted mono- or di-arylamino, or the substituted alkylarylamino, each independently, are at least one selected from the group consisting of deuterium; a halogen; a cyano; a carboxyl; a nitro; a hydroxyl; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered) heterocycloalkyl; a (C6-C30)aryloxy; a (C6-C30)arylthio; a (3- to 30-membered) heteroaryl unsubstituted or substituted with a (C6-C30)aryl(s) and/or a (3- to 30-membered) heteroaryl(s); a (C6-C30)aryl unsubstituted or substituted with at least one of a (C1-C30)alkyl(s), a (C6-C30)aryl(s) and a (3- to 30-membered) heteroaryl(s); a tri(C1-C30)alkylsilyl; a tri(C6-C30)arylsilyl; a di(C1-C30)alkyl(C6-C30)arylsilyl; a (C1-C30)alkyldi(C6-C30)arylsilyl; an amino; a mono- or di-(C1-C30)alkylamino; a mono- or di-(C6-C30)arylamino unsubstituted or substituted with a (C1-C30)alkyl(s); a (C1-C30)alkyl(C6-C30)arylamino; a (C1-C30)alkylcarbonyl; a (C1-C30)alkoxycarbonyl; a (C6-C30)arylcarbonyl; a di(C6-C30)arylboronyl; a di(C1-C30)alkylboronyl; a (C1-C30) alkyl(C6-C30)arylboronyl; a (C6-C30)aryl(C1-C30)alkyl; and a (C1-C30)alkyl(C6-C30)aryl. According to one embodiment of the present disclosure, the substituents, each independently, are at least one selected from the group consisting of a (C1-C20)alkyl; a (C6-C25)aryl unsubstitued or substituted with a (C1-C10)alkyl(s) and/or a (C6-C18) aryl(s); a (3- to 25-membered) heteroaryl unsubstituted or substituted with a (C6-C18)aryl(s); a di(C6-C18)arylamino; and a $(C_1\text{-}C_6)$alkyl(C6-C25)aryl. For example, the substituents, each independently, are at least one of methyl, phenyl, naphthyl, biphenyl, dimethylfluorenyl, diphenylfluorenyl, dimethylbenzofluorenyl, spirobifluorenyl, dibenzofuranyl, dibenzothiophenyl, carbazolyl substituted with a phenyl(s), benzocarbazolyl substituted with a phenyl(s), benzonaphthothiophenyl, and diphenylamino.

In the formulas of the present disclosure, a ring formed by a linkage of adjacent substituents means that at least two adjacent substituents are linked to or fused with each other to form a substituted or unsubstituted mono- or polycyclic (3- to 30-membered) alicyclic or aromatic ring, or the combination thereof; preferably, a substituted or unsubstituted mono- or polycyclic (3- to 26-membered) alicyclic or aromatic ring, or the combination thereof; more preferably, a mono- or polycyclic (5- to 10-membered) aromatic ring unsubstituted or substituted with a alkyl(s); and for example, a benzene ring, an indene ring substituted with a methyl(s), or a benzothiophene ring. Also, the formed ring may contain at least one heteroatom selected from B, N, O, S, Si, and P, preferably at least one heteroatom selected from N, O, and S.

Herein, the heteroaryl, the heteroarylene, and the heterocycloalkyl, each independently, may contain at least one heteroatom selected from B, N, O, S, Si, and P. Also, the heteroatom may be bonded to at least one selected from the group consisting of hydrogen, deuterium, a halogen, a cyano, a substituted or unsubstituted (C1-C30)alkyl, a substituted or unsubstituted (C6-C30)aryl, a substituted or unsubstituted (5- to 30-membered) heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, and a substituted or unsubstituted (C1-C30)alkyl(C6-C30)arylamino.

In formula 1, $Ar_1$ to $Ar_3$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, a substituted or unsubstituted (C3-C30) cycloalkyl, a substituted or unsubstituted (C1-C30)alkoxy, a substituted or unsubstituted tri(C1-C30)alkylsilyl, unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino. According to one embodiment of the present disclosure, $Ar_1$ to $Ar_3$, each independently, represent a substituted or unsubstituted (C6-C29)aryl, or a substituted or unsubstituted (5- to 30-membered) heteroaryl. According to another embodiment of the present disclosure, $Ar_1$ to $Ar_3$, each independently, represent a (C6-C29)aryl unsubstituted or substituted with a (C1-C10)alkyl(s) and/or a (C6-C18) aryl(s), or a (5- to 30-membered) heteroaryl unsubstituted or substituted with a (C6-C18)aryl(s). Specifically, $Ar_1$ may represent a dimethylfluorenyl; a diphenylfluorenyl; a dimethylbenzofluorenyl; a diphenylbenzofluorenyl; a carbazolyl unsubstituted or substituted with a biphenyl(s); a benzocarbazolyl unsubstituted or substituted with a phenyl(s) and/or a biphenyl(s); a dibenzocarbazolyl; or a (20- to 30-membered) heteroaryl containing at least one of N, O and S unsubstituted or substituted with a phenyl(s); and $Ar_2$ and $Ar_3$, each independently, may represent a phenyl; a naphthyl; a biphenyl; a terphenyl; a phenanthrenyl; a dimethylfluorenyl; a diphenylfluorenyl; a dimethylbenzofluorenyl; a diphenylbenzofluorenyl; a spirobifluorenyl; a dibenzofuranyl; a dibenzothiophenyl; a carbazolyl substituted with a phenyl(s); or a benzocarbazolyl substituted with a phenyl(s).

$L_1$ to $L_3$, each independently, represent a single bond, a substituted or unsubstituted (C1-C30)alkylene, a substituted or unsubstituted (C6-C30)arylene, a substituted or unsubstituted (3- to 30-membered) heteroarylene, or a substituted or unsubstituted (C3-C30)cycloalkylene. According to one embodiment of the present disclosure, $L_1$ to $L_3$, each independently, represent a single bond, a substituted or unsubstituted (C6-C25)arylene, or a substituted or unsubstituted (3- to 29-membered) heteroarylene. According to another embodiment of the present disclosure, $L_1$ to $L_3$, each independently, represent a single bond; a (C6-C18)arylene unsubstituted or substituted with at least one of a ($C_1$-$C_6$) alkyl(s), a (C6-C18)aryl(s) and a di(C6-C18)arylamino(s); or an unsubstituted nitrogen-containing (5- to 26-membered) heteroarylene. Specifically, $L_1$ to $L_3$, each independently, may represent a single bond, a phenylene unsubstituted or substituted with a diphenylamino(s), a naphthylene, a phenylnaphthylene, a naphthylphenylene, a biphenylene, a dimethylfluorenylene, or a nitrogen-containing (26-membered) heteroarylene.

According to one embodiment of the present disclosure, the formula 1 may be represented by at least one of the following formulas 1-1 to 1-14.

(1-1)

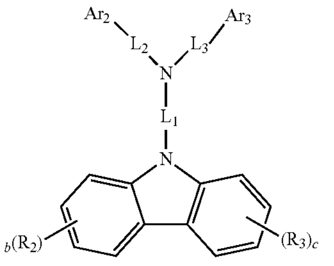

(1-2)

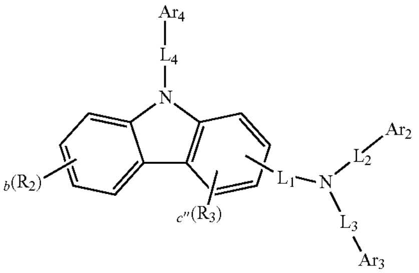

-continued (1-3)

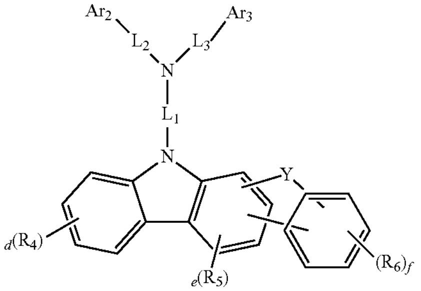

(1-4)

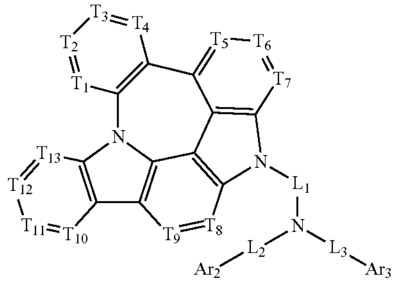

(1-5)

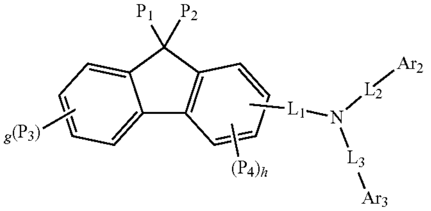

(1-6)

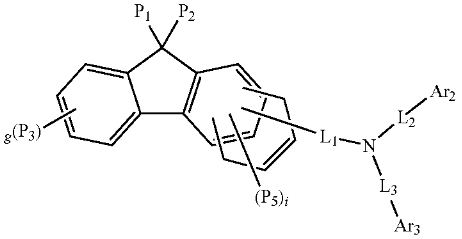

(1-7)

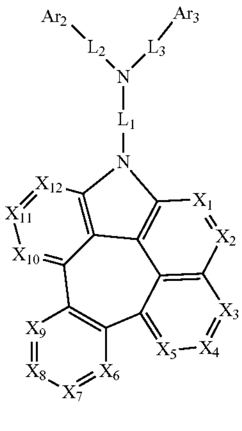

-continued (1-8)

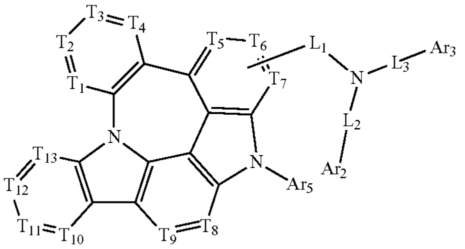

(1-9)

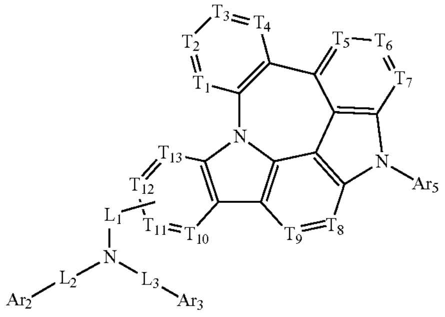

(1-10)

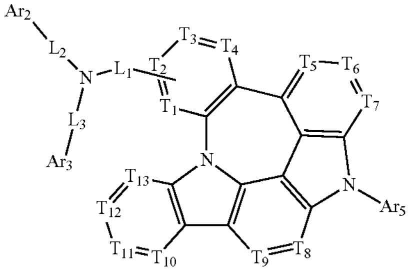

(1-11)

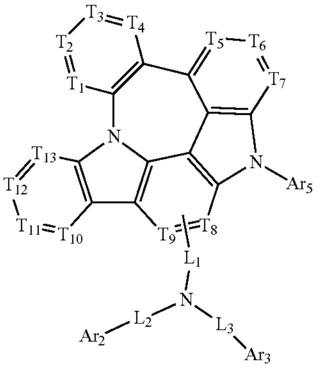

(1-12)

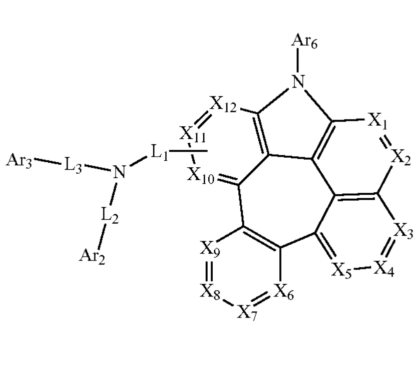

-continued (1-13)

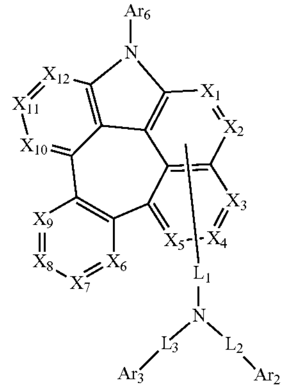

(1-14)

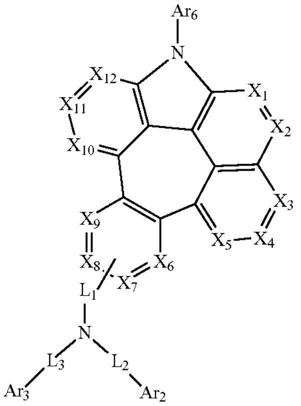

In formulas 1-1 to 1-14, $Ar_2$, $Ar_3$ and $L_1$ to $L_3$ are as defined in formula 1, and the definitions of other substituents are as follows.

Y represents $CR_7R_8$, $NR_9$, O, or S.

$T_1$ to $T_{13}$, and $X_1$ to $X_{12}$, each independently, represent N or $CV_1$; and preferably $CV_1$.

$V_1$, each independently, represents hydrogen, deuterium, a halogen, a cyano, a substituted or unsubstituted (C1-C30) alkyl, a substituted or unsubstituted (C6-C30)aryl, a substituted or unsubstituted (3- to 30-membered) heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or adjacent two $V_1$'s may be linked to each other to form a ring(s). According to one embodiment of the present disclosure, $V_1$, each independently, represents hydrogen, or a substituted or unsubstituted (C6-C25)aryl; or adjacent two $V_1$'s may be linked to or fused with each other to form a substituted or unsubstituted mono- or polycyclic (3- to 30-membered) alicyclic or aromatic ring, or the combination thereof; and the formed ring may contain at least one heteroatom selected from B, N, O, S, Si, and P. According to another embodiment of the present disclosure, $V_1$, each independently, represents hydrogen, or an unsubstituted (C6-C18)aryl; or adjacent two $V_1$'s may be linked to or fused with each other to form an unsubstituted monocyclic (3- to 10-membered) alicyclic or aromatic ring. For example, $V_1$, each independently, may represent hydrogen or a phenyl; or adjacent two $V_1$'s may be linked to or fused with each other to form a benzene ring.

$L_4$ represents a single bond, a substituted or unsubstituted (C1-C30)alkylene, a substituted or unsubstituted (C6-C30) arylene, a substituted or unsubstituted (3- to 30-membered) heteroarylene, or a substituted or unsubstituted (C3-C30) cycloalkylene. According to one embodiment of the present disclosure, La represents a single bond, or a substituted or unsubstituted (C6-C25)arylene. According to another embodiment of the present disclosure, $L_4$ represents a single bond, or an unsubstituted (C6-C18)arylene. For example, $L_4$ may represent a single bond or a phenylene.

$P_1$ and $P_2$, each independently, represent a substituted or unsubstituted (C1-C30)alkyl, or a substituted or unsubstituted (C6-C30)aryl. $P_1$ and $P_2$ may be the same as or different from each other, and preferably they may be the same as each other. According to one embodiment of the present disclosure, $P_1$ and $P_2$, each independently, represent a substituted or unsubstituted (C1-C20)alkyl, or a substituted or unsubstituted (C6-C25)aryl. According to another embodiment of the present disclosure, $P_1$ and $P_2$, each independently, represent an unsubstituted (C1-C10)alkyl, or an unsubstituted (C6-C18)aryl. Specifically, P; and $P_2$, each independently, may represent a methyl or a phenyl.

$R_2$ to Re, and $P_3$ to $P_5$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, a substituted or unsubstituted (C3-C30) cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30) arylamino, or a substituted or unsubstituted (C1-C30)alkyl (C6-C30)arylamino; or adjacent ones of $R_2$ to $R_9$ and $P_3$ to $P_5$ may be linked to each other to form a ring(s). $R_7$ and $R_8$ may be the same as or different from each other, and preferably they may be the same as each other. According to one embodiment of the present disclosure, $R_2$ to $R_9$ and $P_3$ to $P_5$, each independently, represent hydrogen, a substituted or unsubstituted (C1-C20)alkyl, or a substituted or unsubstituted (C6-C25)aryl; or adjacent ones of $R_2$ to $R_9$ and $P_3$ to $P_5$ may be linked to or fused with each other to form a substituted or unsubstituted mono- or polycyclic (3- to 30-membered) alicyclic or aromatic ring, or the combination thereof; and the formed ring may contain at least one heteroatom selected from B, N, O, S, Si, and P. According to another embodiment of the present disclosure, $R_2$ to $R_9$ and $P_3$ to $P_5$, each independently, represent hydrogen, an unsubstituted (C1-C10)alkyl, or an unsubstituted (C6-C18) aryl; or adjacent ones of $R_2$ to $R_9$ and $P_3$ to $P_5$ may be linked to or fused with each other to form a mono- or polycyclic (5- to 10-membered) ring unsubstituted or substituted with an alkyl(s). For example, $R_2$, $R_3$, $R_5$, and $P_3$, each independently, may represent hydrogen, or adjacent ones of $R_2$, $R_3$, $R_6$, and $P_3$ may be linked to each other to form a benzene ring; $R_4$ may represent hydrogen, or may be linked to an adjacent substituent(s) to form a benzene ring, an indene ring substituted with a methyl(s), or a benzothiophene ring; $R_5$, $P_4$ and $P_5$, each independently, may represent hydrogen; $R_7$ and $R_8$, may represent a methyl; and Ry may represent a phenyl.

$Ar_4$ represents hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, or a substituted or unsubstituted (C3-C30)cycloalkyl. According to one embodiment of the present disclosure, Ara represents a substituted or unsubstituted (C1-C20)alkyl, a substituted or unsubstituted (C6-C25)aryl, or a substituted or unsubstituted (3- to 25-membered) heteroaryl. According to another embodiment of the present disclosure, $Ar_4$ represents an unsubstituted (C6-C18)aryl. Specifically, Ara may represent a phenyl or a biphenyl.

$Ar_5$ and $Ar_6$, each independently, represent a substituted or unsubstituted (C6-C30)aryl, or a substituted or unsubstituted (3- to 30-membered) heteroaryl. According to one embodiment of the present disclosure, $Ar_5$ and $Ar_6$, each independently, represent a substituted or unsubstituted (C6-C25)aryl, or a substituted or unsubstituted (5- to 25-membered) heteroaryl. According to another embodiment of the present disclosure, $Ar_5$ and $Ar_6$, each independently, represent an unsubstituted (C6-C18)aryl. For example, $Ar_5$ and $Ar_6$, each independently, may represent a phenyl.

b, c, d, f, and g, each independently, represent an integer of 1 to 4; e represents an integer of 1 or 2; c" and h, each independently, represent an integer of 1 to 3; and i represents an integer of 1 to 5; where if b to i, and c", each independently, are an integer of 2 or more, each of $R_2$ to $R_6$ and $P_3$ to $P_5$ may be the same or different.

In formula 2, X represents —N=, —$NR_{15}$—, —O—, or —S—; Z represents —N=, —$NR_{16}$—, —O—, or —S—; with a proviso that when X represents —N=, Z represents —$NR_{16}$—, —O—, or —S—, and when X represents —$NR_{15}$—, Z represents —N=, —O—, or —S—. According to one embodiment of the present disclosure, X represents —N=, —$NR_{15}$—, —O—, or —S—; and Z represents —N=, —$NR_{16}$—, —O—, or —S—; with a proviso that any one of X and Z represents —N=.

In formula 2, HAr represents a substituted or unsubstituted (3- to 30-membered) heteroaryl. According to one embodiment of the present disclosure, HAr represents a substituted or unsubstituted (3- to 25-membered) heteroaryl. According to another embodiment of the present disclosure, HAr represents a (5- to 20-membered) heteroaryl substituted with a (C6-C30)aryl(s) and/or a (3- to 25-membered) heteroaryl(s). Specifically, HAr may represent a substituted or unsubstituted quinazolinyl, a substituted or unsubstituted quinoxalinyl, a substituted or unsubstituted triazinyl, or a substituted or unsubstituted pyrimidinyl. For example, HAr may represent a substituted triazinyl, a substituted pyrimidinyl, a substituted quinoxalinyl, or a substituted quinazolinyl, wherein the substituent of the substituted triazinyl, the substituted pyrimidinyl, the substituted quinoxalinyl, and the substituted quinazolinyl may be at least one of a phenyl, a biphenyl, a naphthyl, a spirobifluorenyl, a dimethylfluorenyl, a diphenylfluorenyl, a dimethylbenzofluorenyl, a dibenzofuranyl, a dibenzothiophenyl, a benzonaphthothiophenyl, a carbazolyl substituted with a phenyl(s), and a benzocarbazolyl substituted with a phenyl(s).

In formula 2, $R_{11}$ represents a substituted or unsubstituted (C6-C30)aryl, or a substituted or unsubstituted (3- to 30-membered) heteroaryl. According to one embodiment of the present disclosure, $R_{11}$ represents a substituted or unsubstituted (C6-C30)aryl, or a substituted or unsubstituted (3- to 25-membered) heteroaryl. According to another embodiment of the present disclosure, $R_{11}$ represents a (C6-C29) aryl unsubstituted or substituted with a (C1-C10)alkyl(s) and/or a (C6-C18)aryl(s), or a (5- to 25-membered) heteroaryl unsubstituted or substituted with a (C6-C18)aryl(s). Specifically, $R_1$ may represent a phenyl, a naphthyl, a phenylnaphthyl, a biphenyl, a dimethylfluorenyl, a dimethylbenzofluorenyl, a spirobifluorenyl, a spiro[fluorene-benzofluorene]yl, a carbazolyl substituted with a phenyl(s), a benzocarbazolyl substituted with a phenyl(s), a dibenzofuranyl, or a dibenzothiophenyl.

In formula 2, $R_{12}$ to $R_{14}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, a substituted or unsubstituted (C3-C30) cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30) arylamino, or a substituted or unsubstituted (C1-C30)alkyl (C6-C30)arylamino; or adjacent ones of $R_{12}$ to $R_{14}$ may be linked to each other to form a ring(s). For example, $R_{13}$ to $R_{14}$, each independently, may represent hydrogen.

In formula 2, $R_{15}$ and $R_{16}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, a substituted or unsubstituted (C3-C30) cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30) arylamino, or a substituted or unsubstituted (C1-C30)alkyl (C6-C30)arylamino. According to one embodiment of the present disclosure, $R_{15}$ and $R_{16}$, each independently, represent a substituted or unsubstituted (C6-C25)aryl, or a substituted or unsubstituted (3- to 25-membered) heteroaryl. According to another embodiment of the present disclosure, $R_{15}$ and $R_{16}$, each independently, represent an unsubstituted (C6-C18)aryl. For example, $R_{15}$ may represent a phenyl or a biphenyl, and $R_{16}$ may represent a phenyl.

In formula 2, L represents a single bond, a substituted or unsubstituted (C6-C30)arylene, or a substituted or unsubstituted (3- to 30-membered) heteroarylene. According to one embodiment of the present disclosure, L represents a single bond, or a substituted or unsubstituted (C6-C25) arylene. According to another embodiment of the present disclosure, L represents a single bond, or an unsubstituted (C6-C18)arylene. Specifically, L may represent a single bond, a phenylene, or a biphenylene.

In formula 2, a' represents an integer of 1; b' and c', each independently, represent an integer of 1 or 2; d' represents an integer of 1 to 4; where if b', c', and d', each independently, are an integer of 2 or more, each of $R_{12}$ to $R_{14}$ may be the same or different.

According to one embodiment of the present disclosure, the formula 2 may be represented by at least one of the following formulas 2-1 to 2-6.

(2-1)

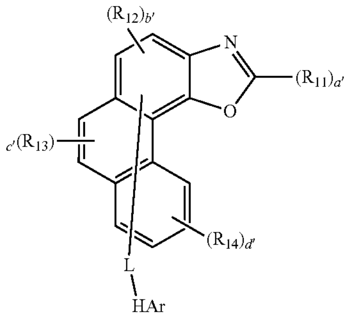

(2-2)

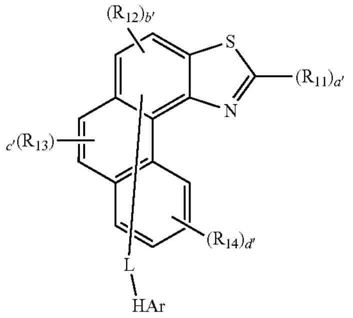

(2-3)

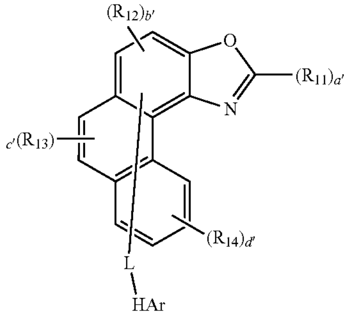

(2-4)

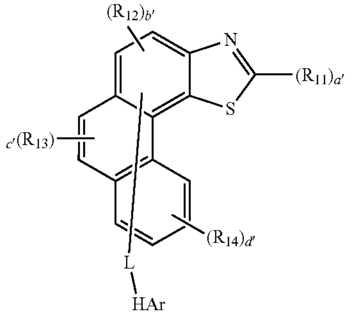

(2-5)

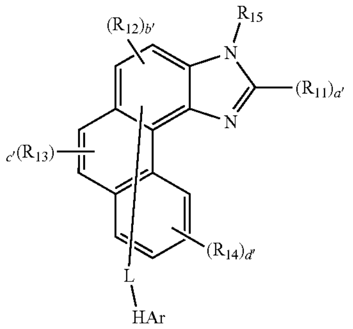

-continued
(2-6)
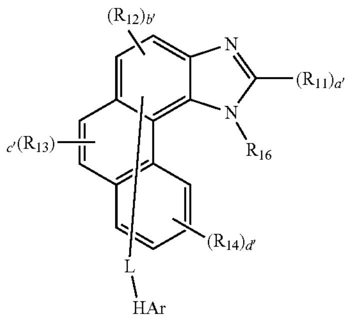
In formulas 2-1 to 2-6, HAr, $R_{11}$ to $R_{16}$, L, and a' to d' are as defined in formula 2.
The compound represented by formula 1 may be specifically exemplified by the following compounds, but is not limited thereto.
C-1-1
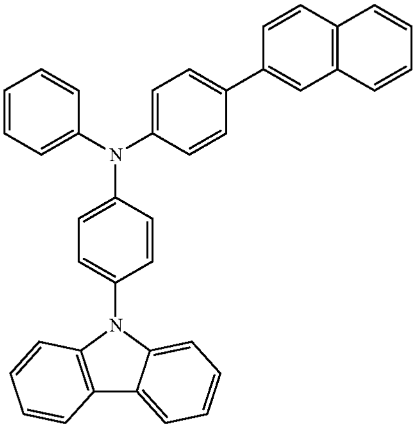
C-1-2
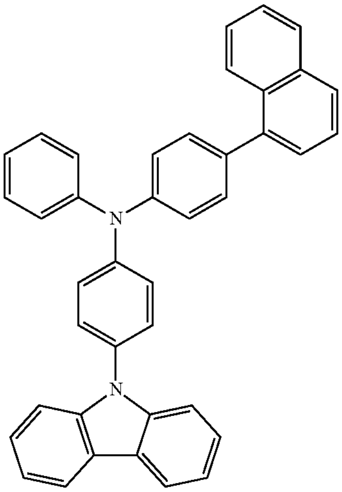
-continued
C-1-3
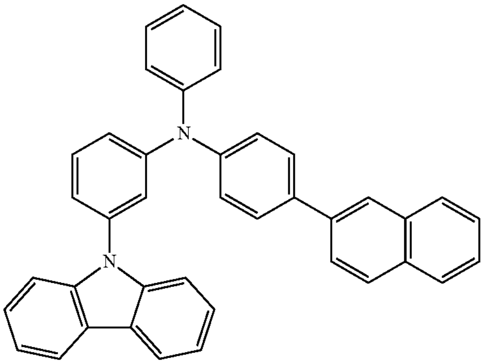
C-1-4
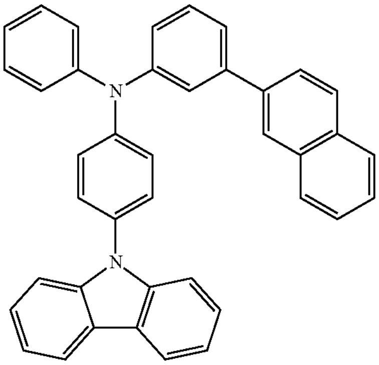
C-1-5
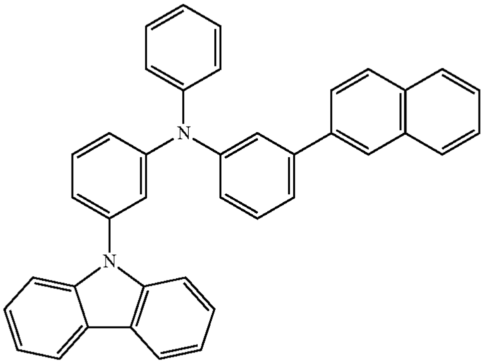
C-1-6
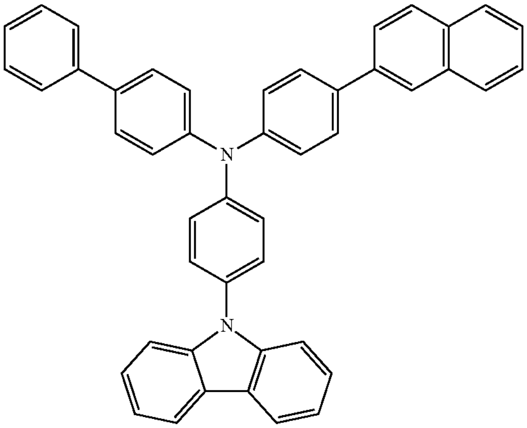

-continued
C-1-7
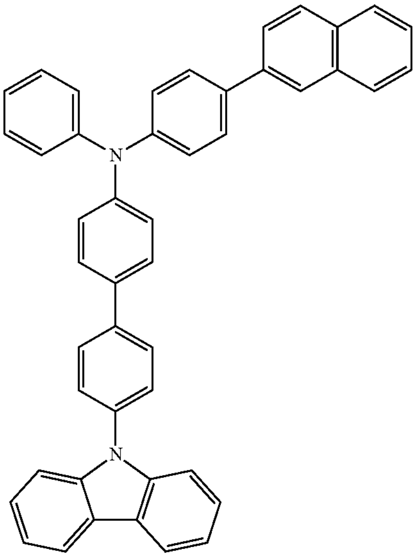
C-1-8
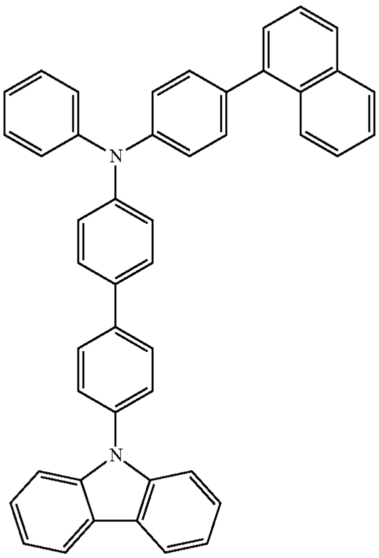
C-1-9
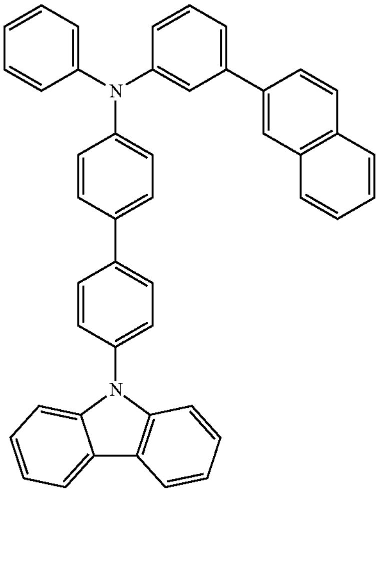
-continued
C-1-10
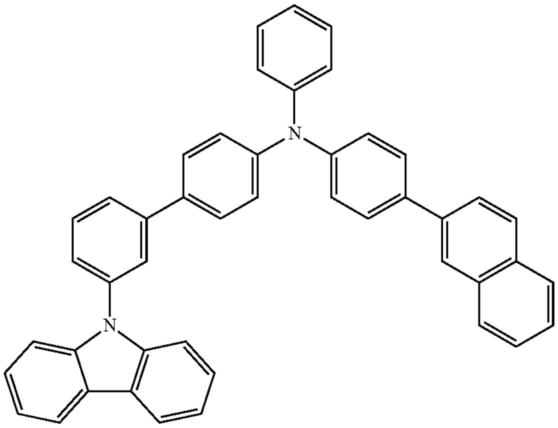
C-1-11
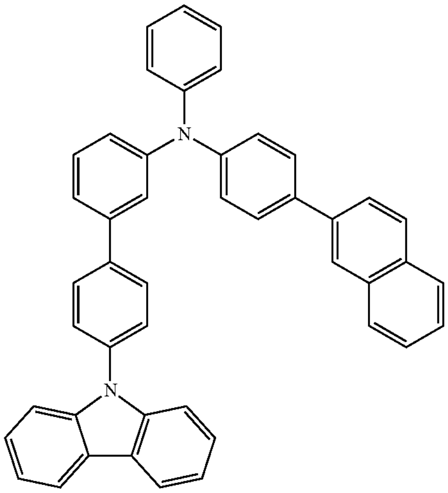
C-1-12
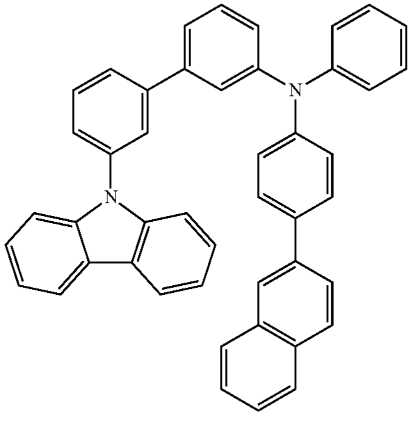

-continued
C-1-13
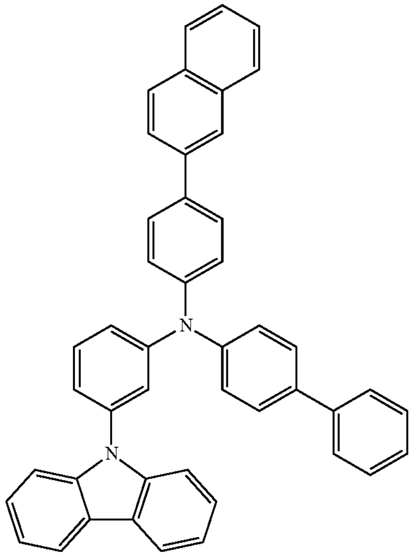
C-1-14
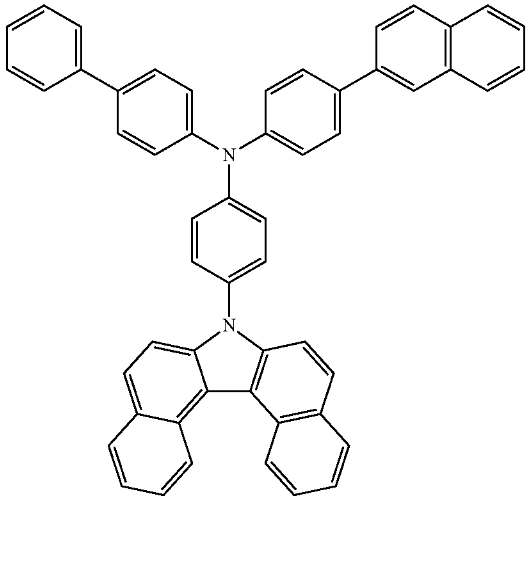
-continued
C-1-15
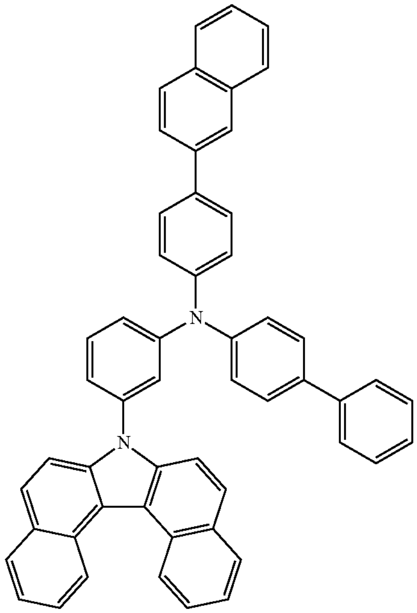
C-1-16
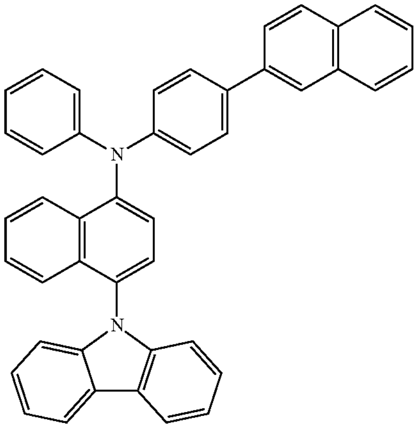
C-1-17
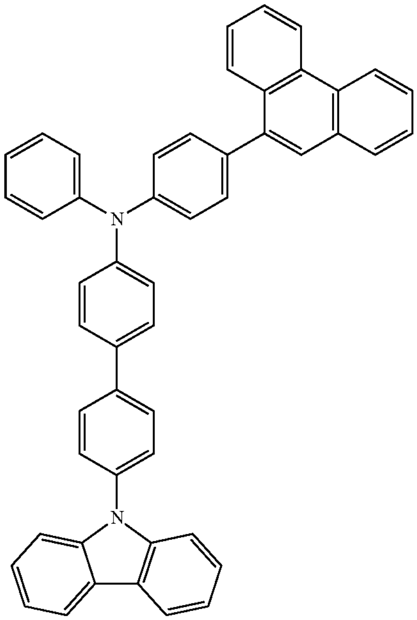

-continued
C-1-18
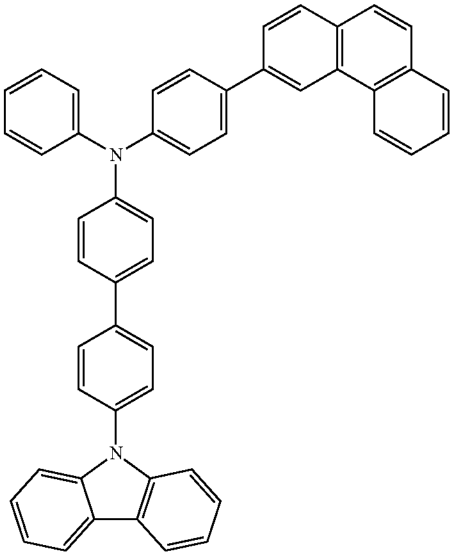
C-1-19
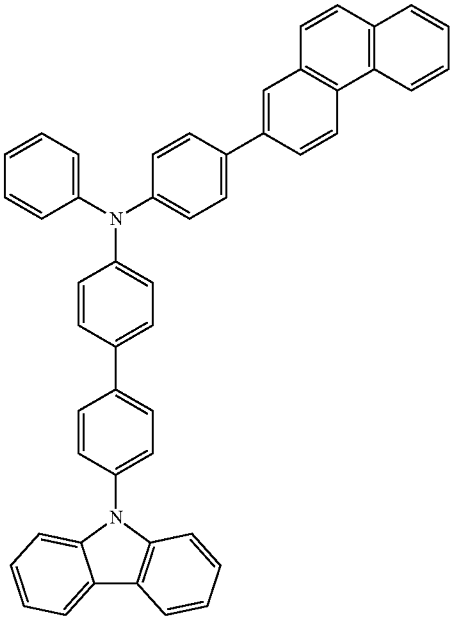
C-1-20
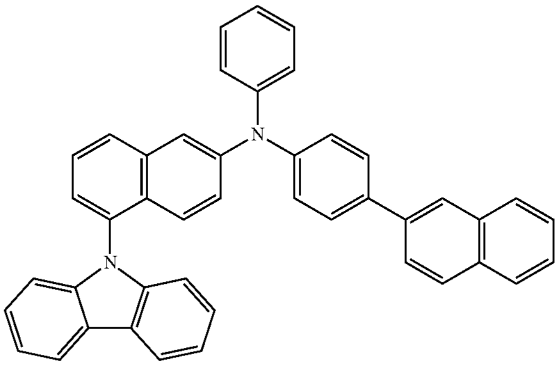
-continued
C-1-21
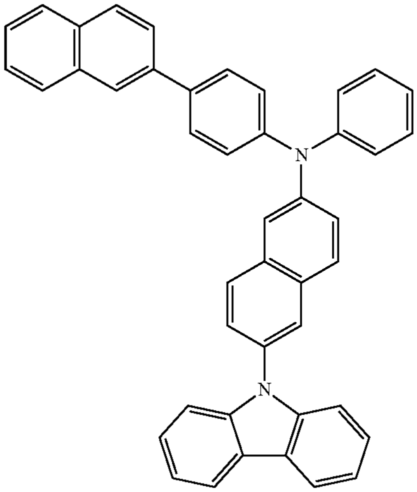
C-1-22
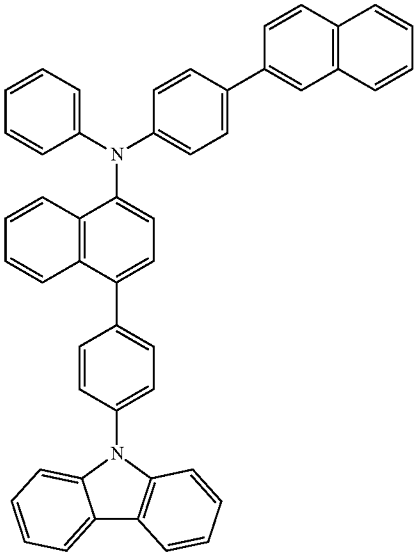
C-1-23
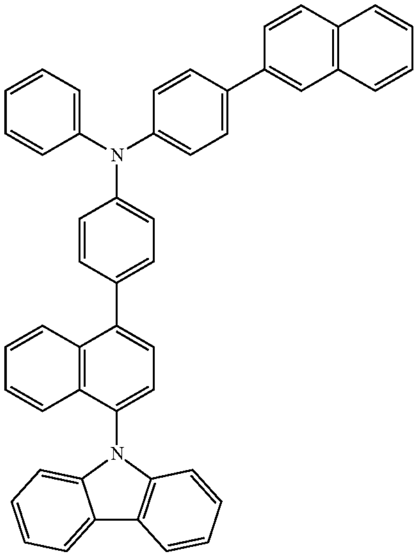

-continued
C-1-24
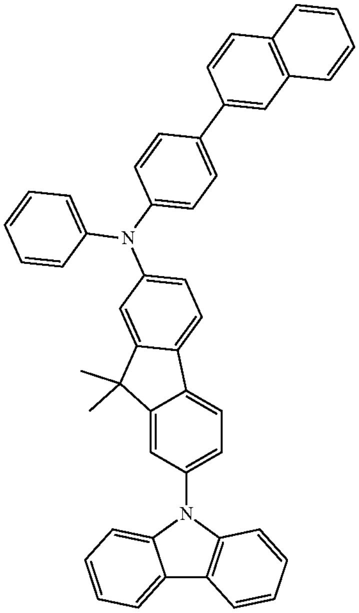
C-1-25
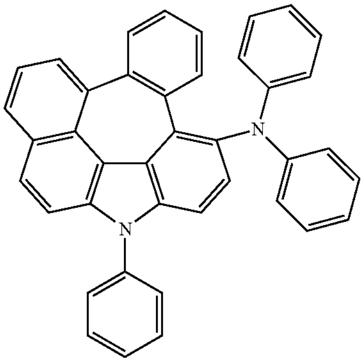
C-1-26
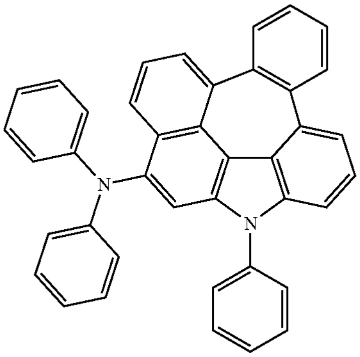
-continued
C-1-27
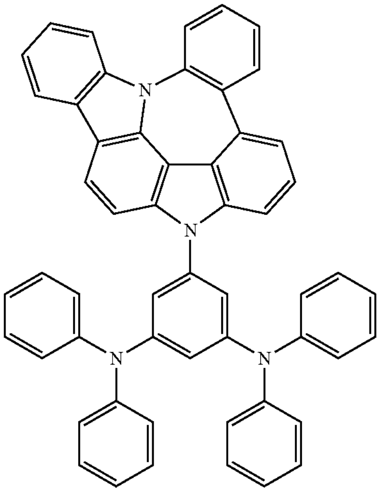
C-1-28
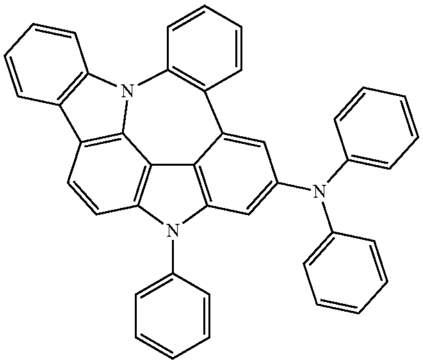
C-1-29
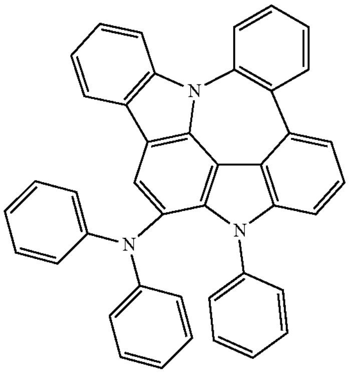

-continued
C-1-30
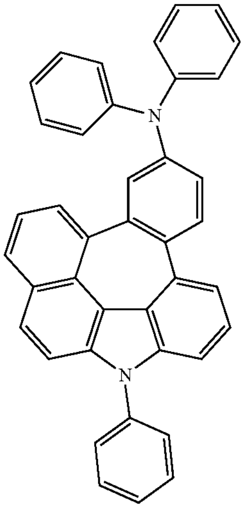
C-1-31
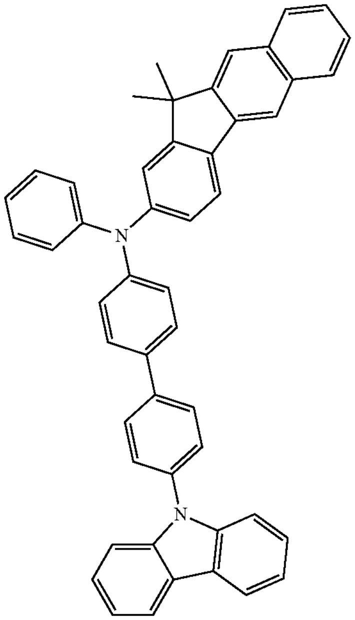
-continued
C-1-32
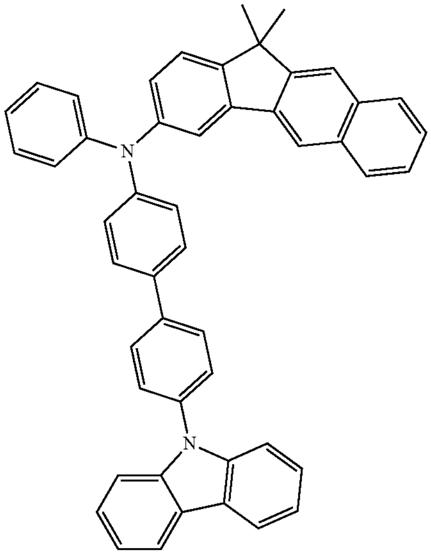
C-1-33
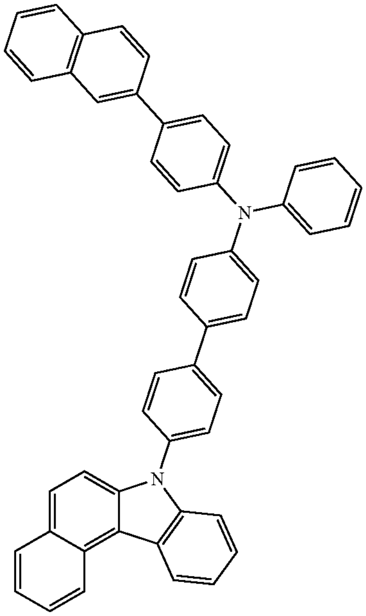

-continued
C-1-34
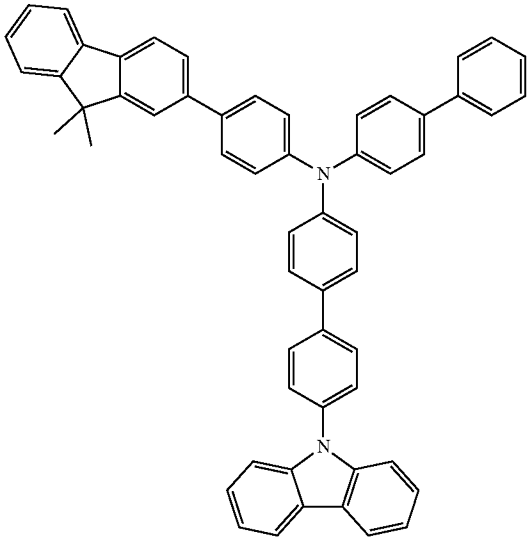
C-1-35
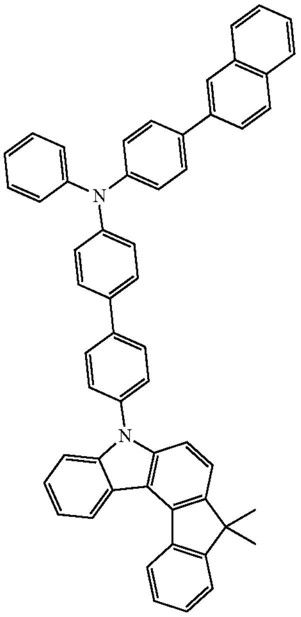
-continued
C-1-36
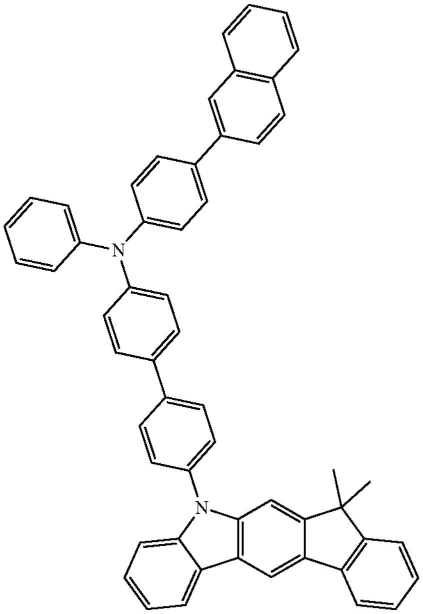
C-1-37
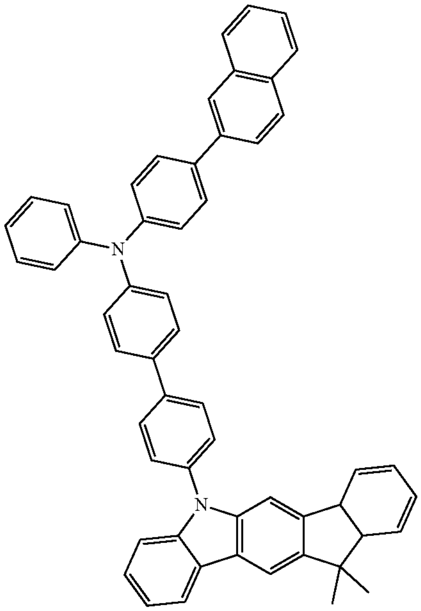
C-1-38
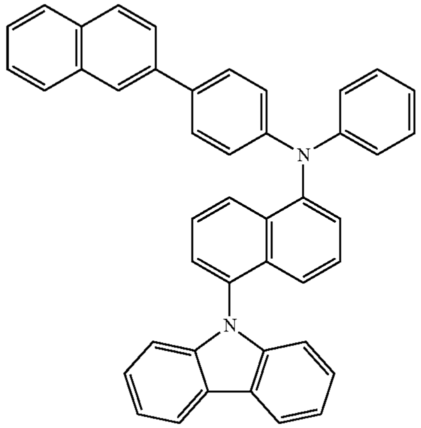

C-1-39
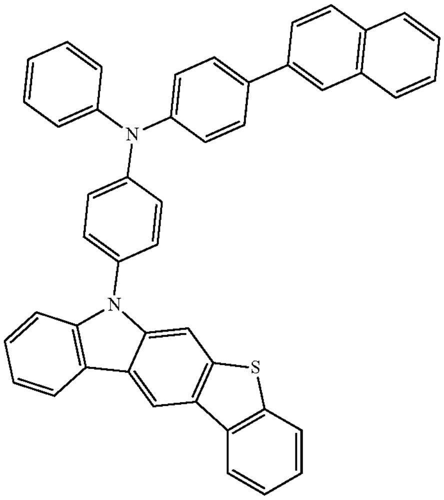
C-1-40
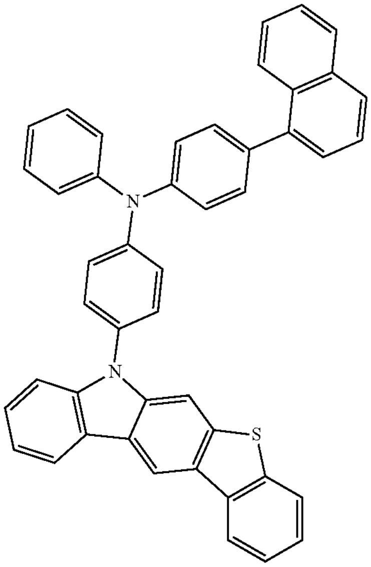
C-1-41
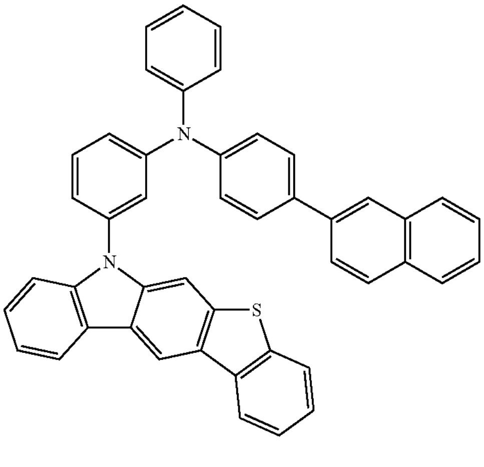
C-1-42
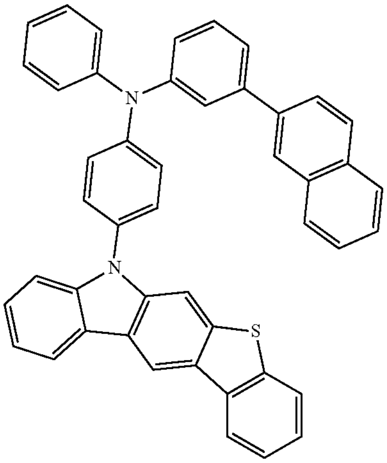
C-1-43
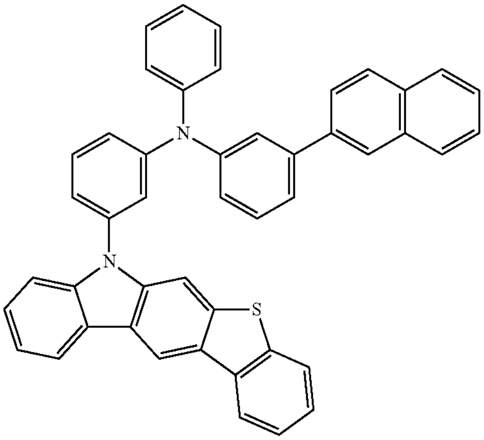
C-1-44
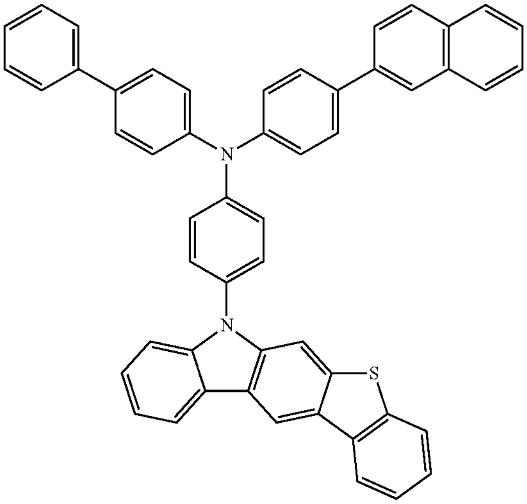

-continued
C-1-45
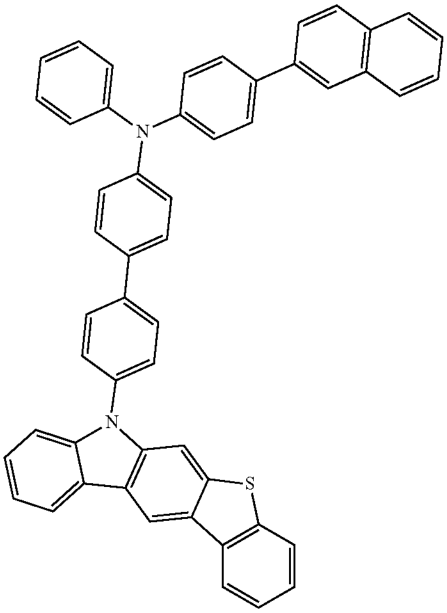
C-1-46
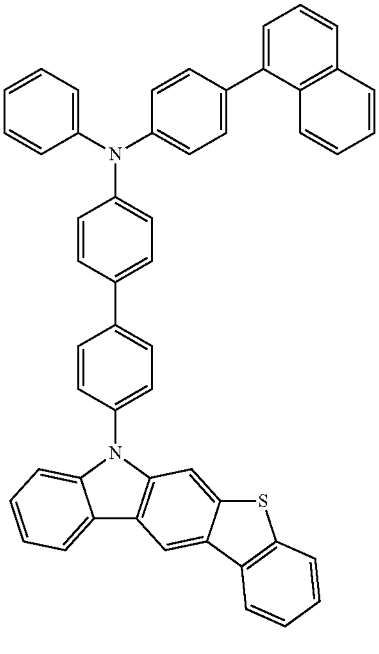
-continued
C-1-47
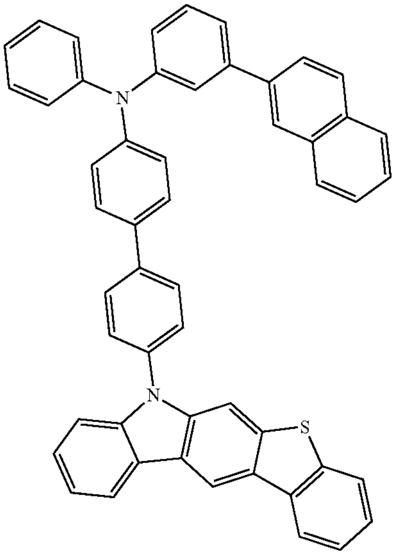
C-1-48
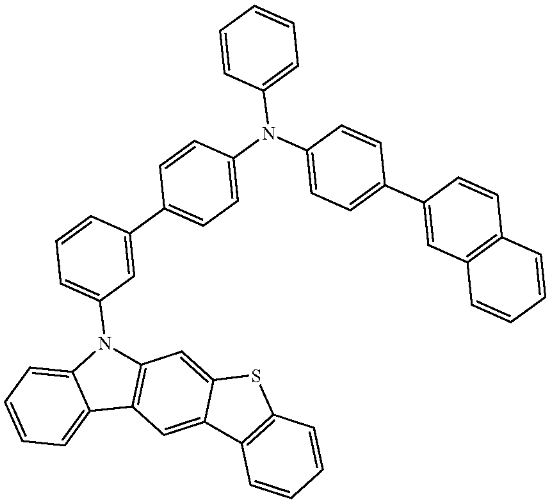
C-1-49
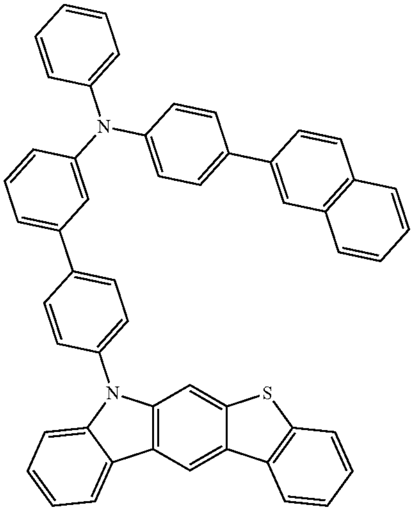

-continued
C-1-50
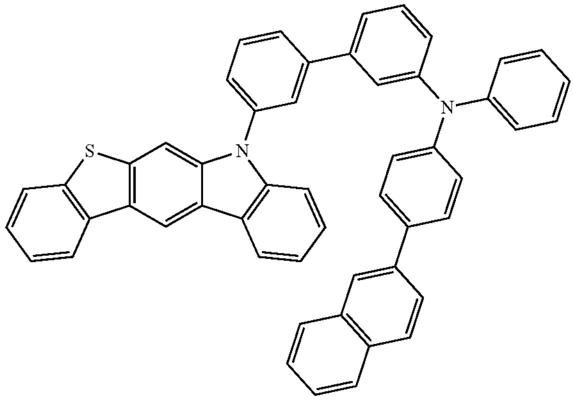
C-1-51
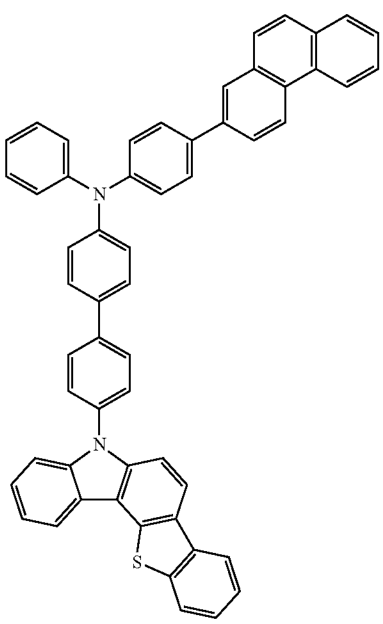
C-1-52
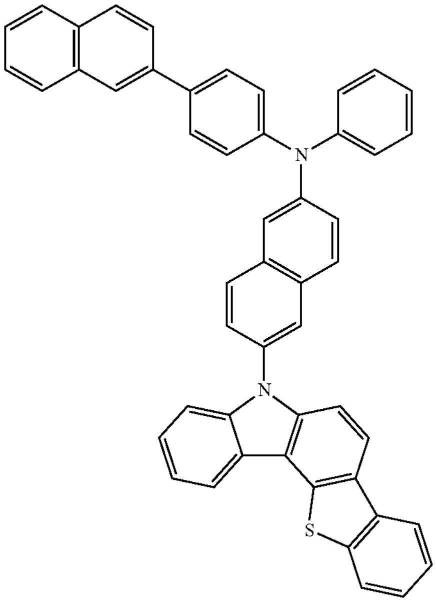
-continued
C-1-53
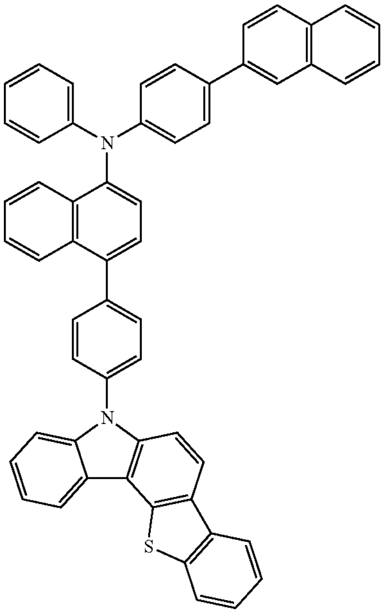
C-1-54
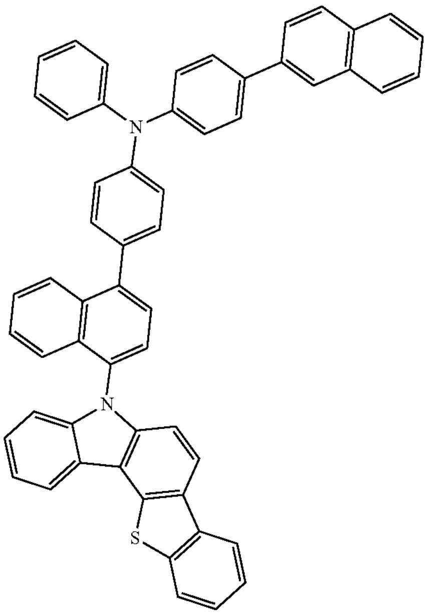

-continued
C-1-55
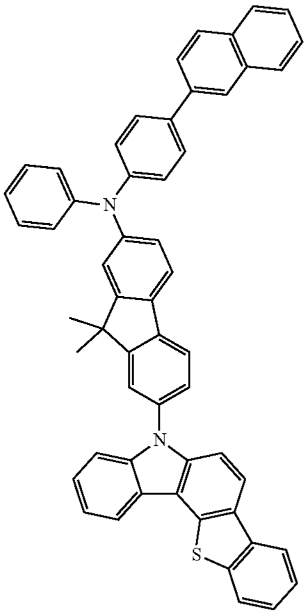
C-1-56
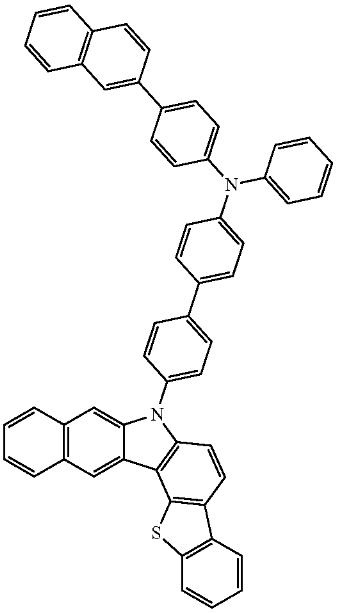
-continued
C-1-57
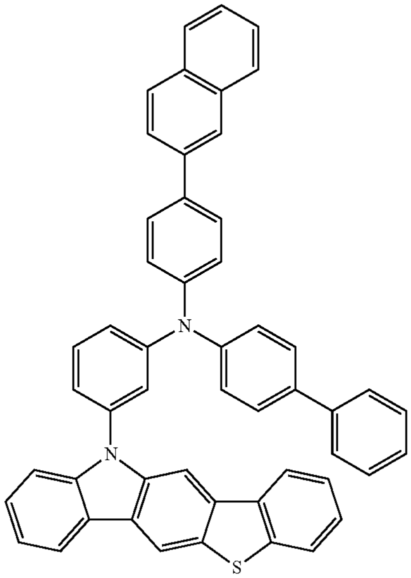
C-1-58
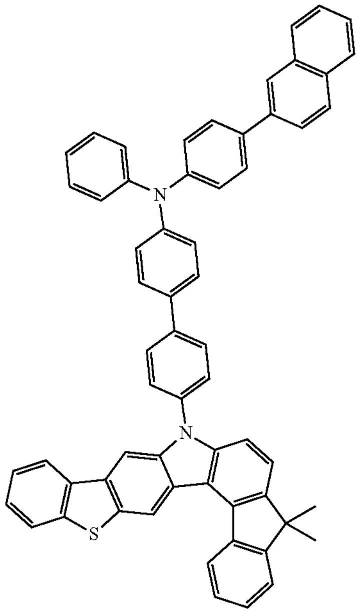

-continued
C-1-59
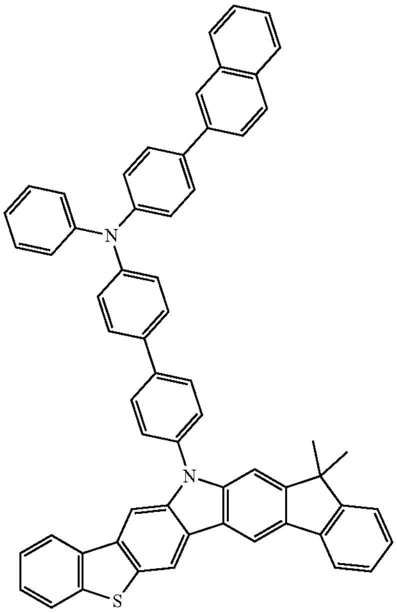
C-1-60
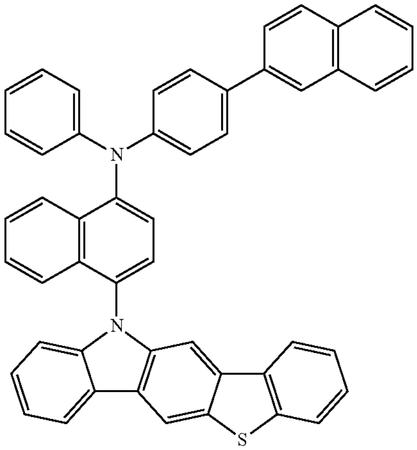
-continued
C-1-61
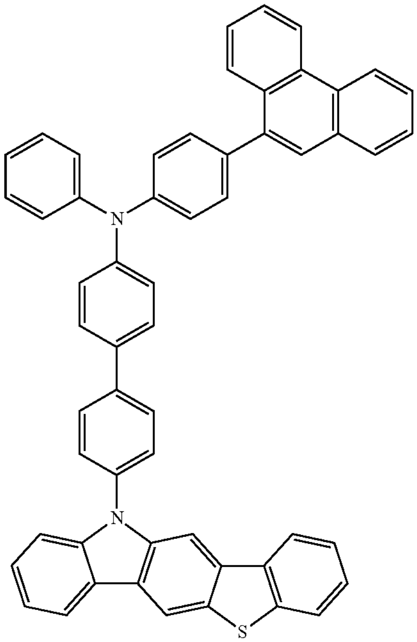
C-1-62
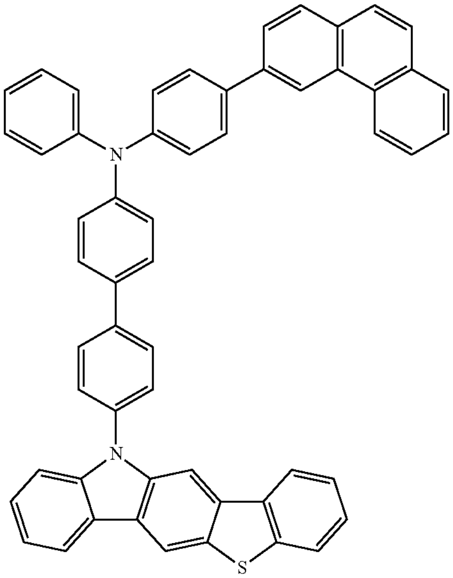
C-1-63
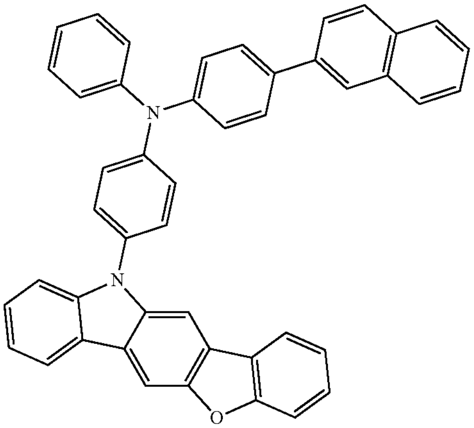

-continued
C-1-64
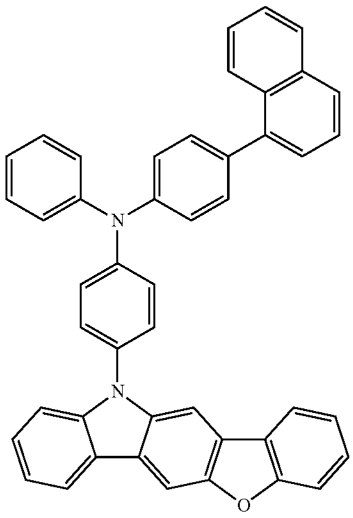
C-1-65
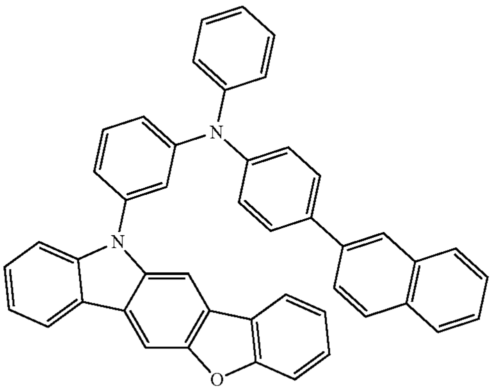
C-1-66
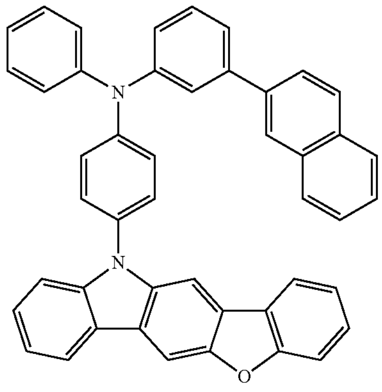
-continued
C-1-67
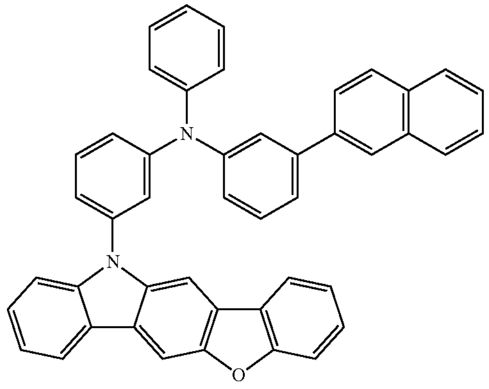
C-1-68
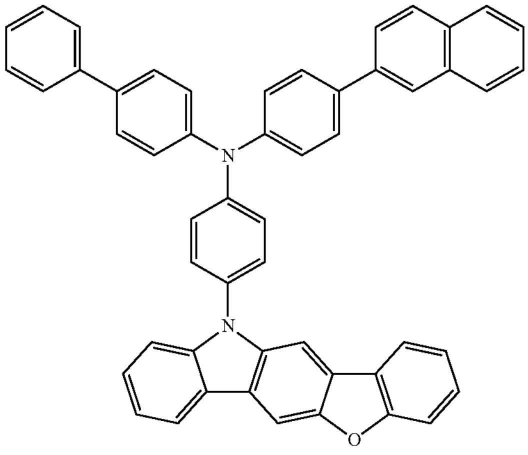
C-1-69
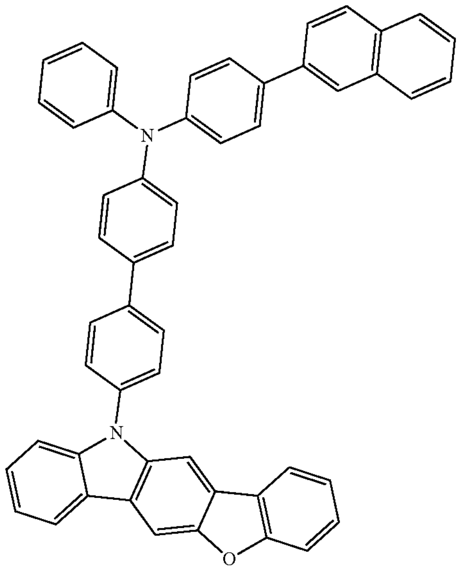

-continued
C-1-70
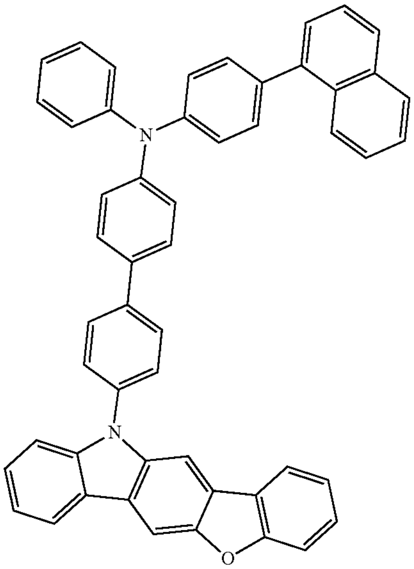
C-1-71
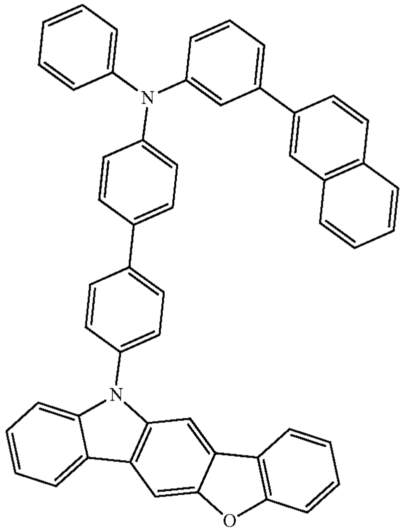
C-1-72
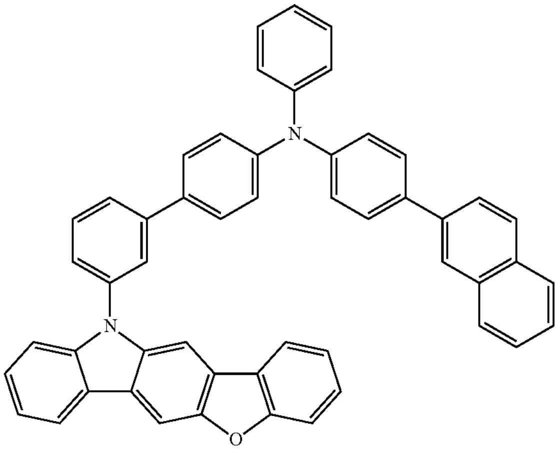
-continued
C-1-73
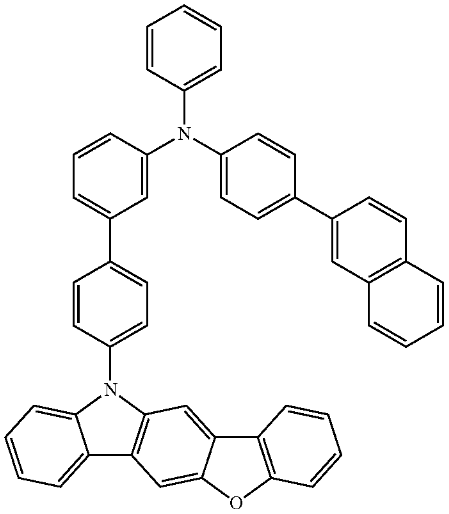
C-1-74
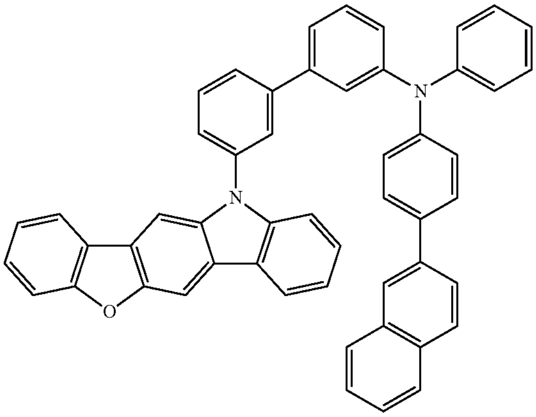
C-1-75
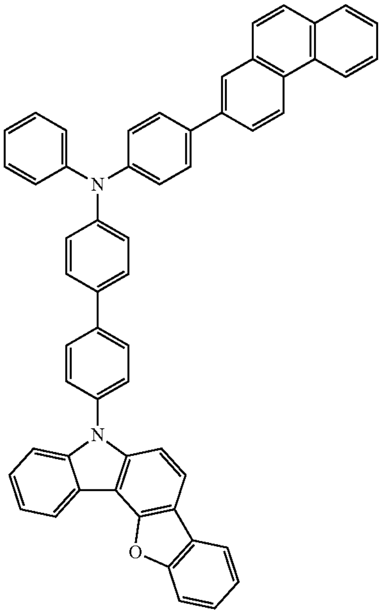

-continued
C-1-76
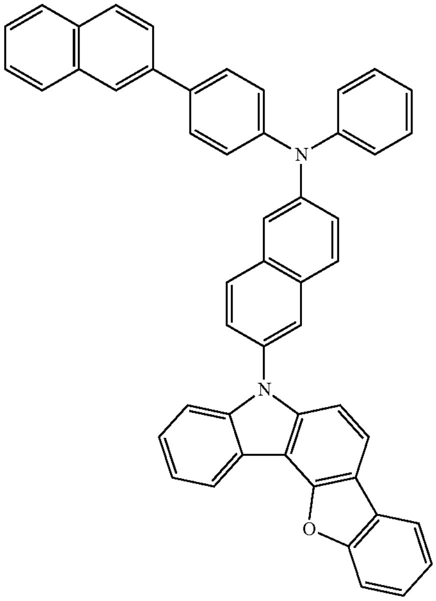
C-1-77
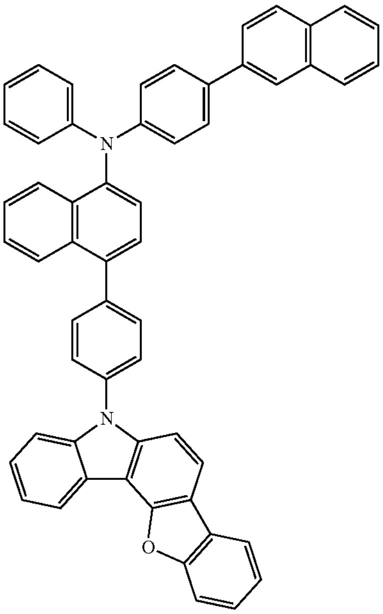
-continued
C-1-78
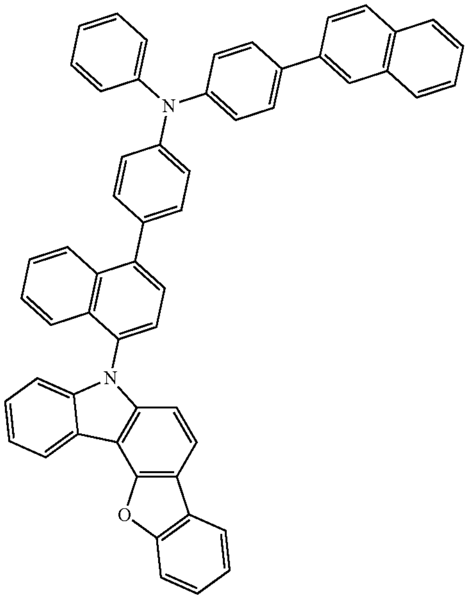
C-1-79
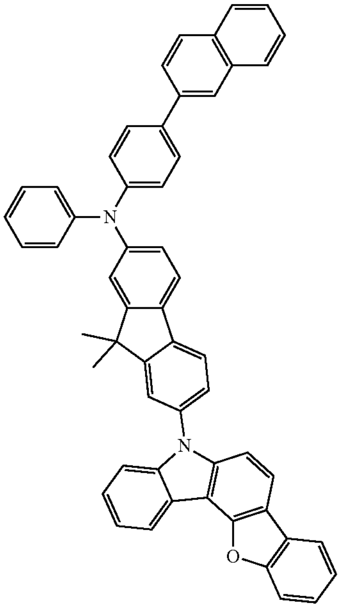

-continued
C-1-80
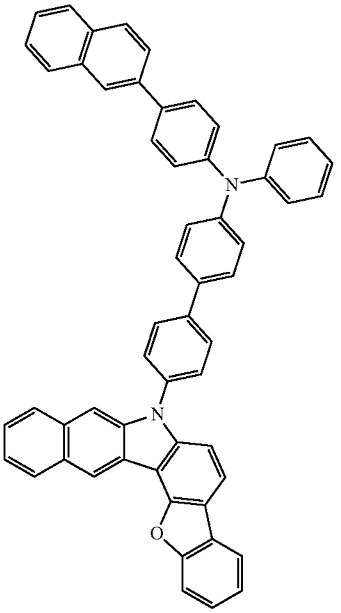
C-1-81
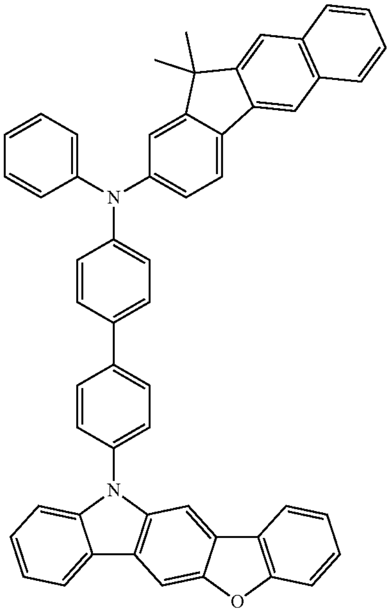
-continued
C-1-82
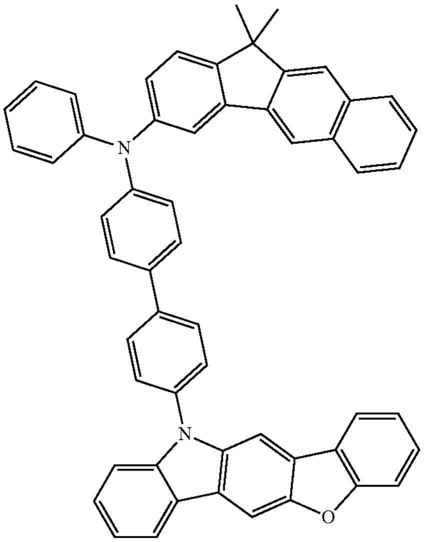
C-1-83
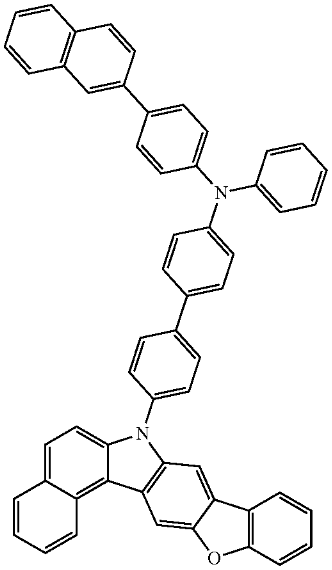

-continued
C-1-84
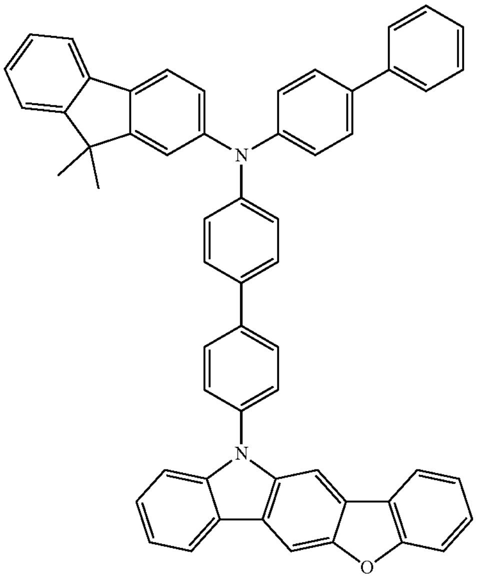
C-1-85
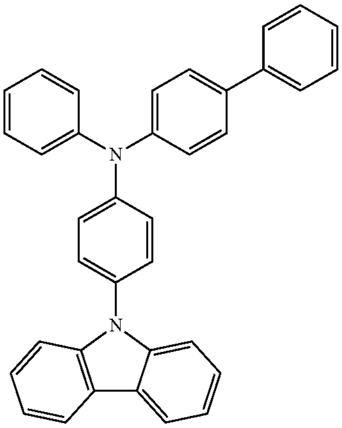
C-1-86
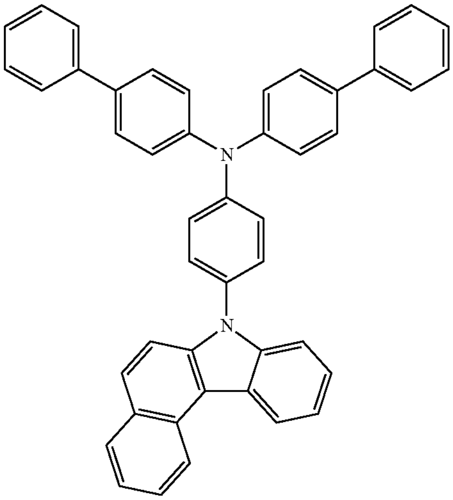
-continued
C-1-87
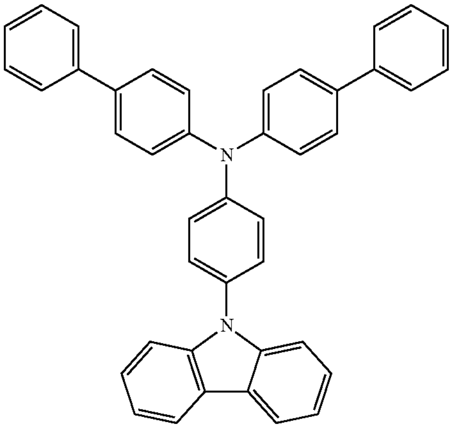
C-1-88
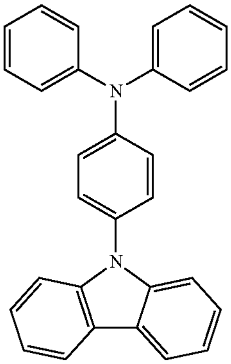
C-1-89
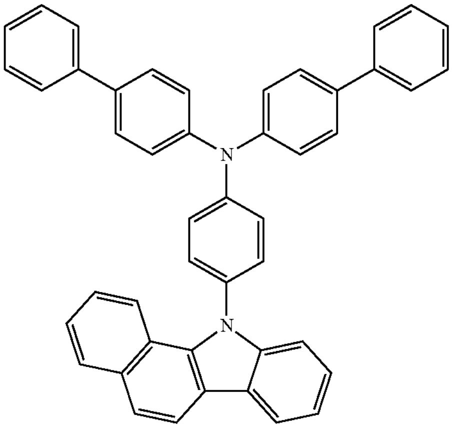

-continued
C-1-90
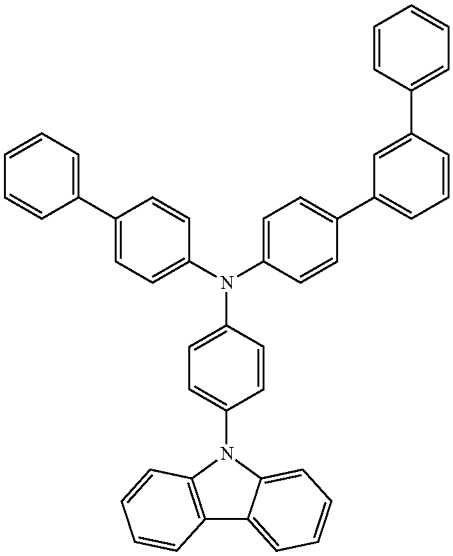
C-1-91
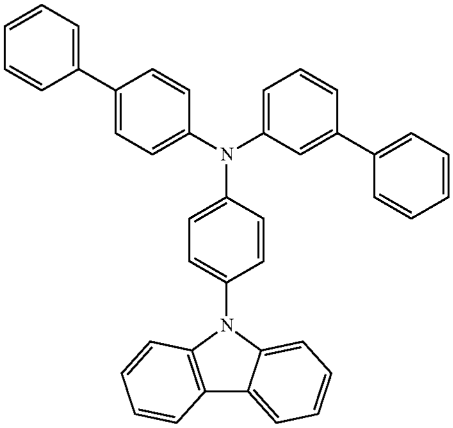
C-1-92
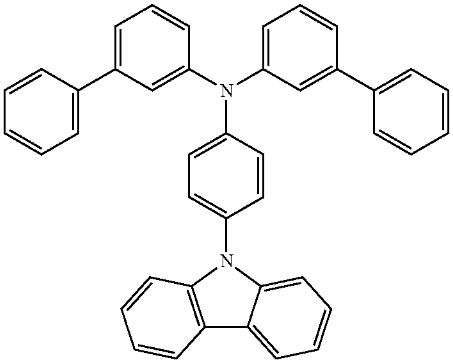
-continued
C-1-93
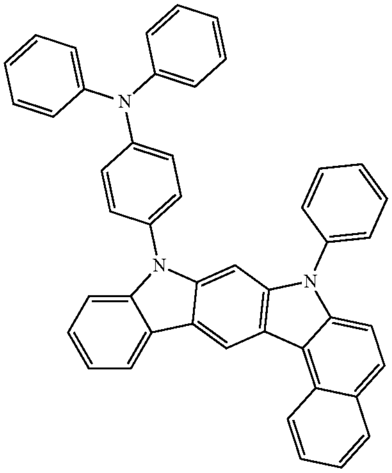
C-1-94
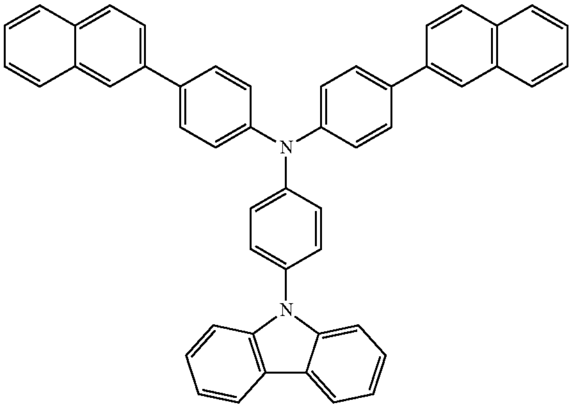
C-1-95
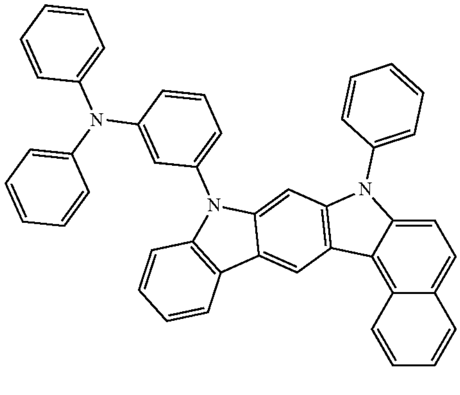

-continued
C-1-96
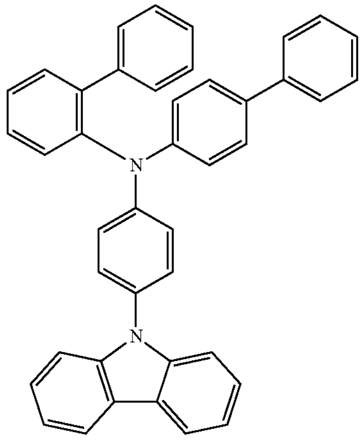
C-1-97
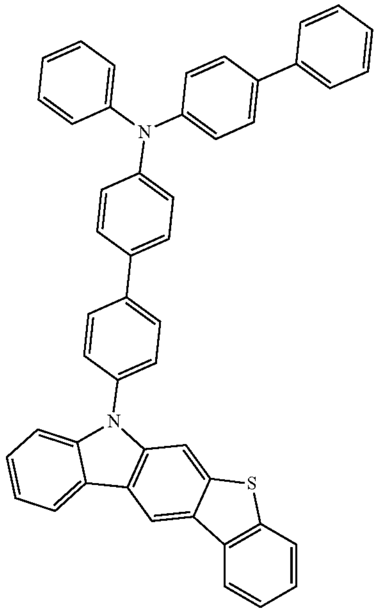
C-1-98
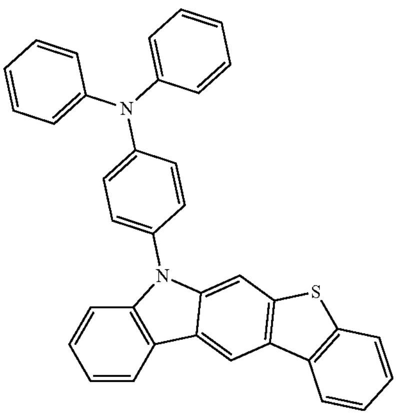
-continued
C-1-99
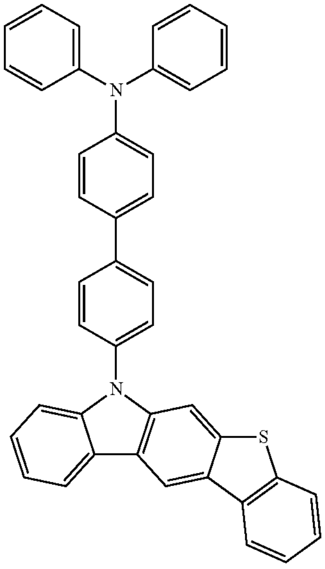
C-1-100
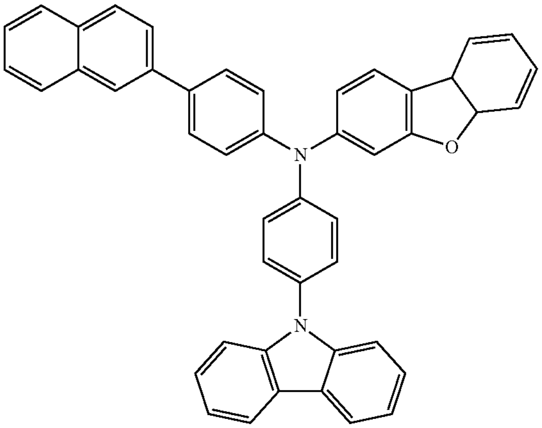
C-1-101
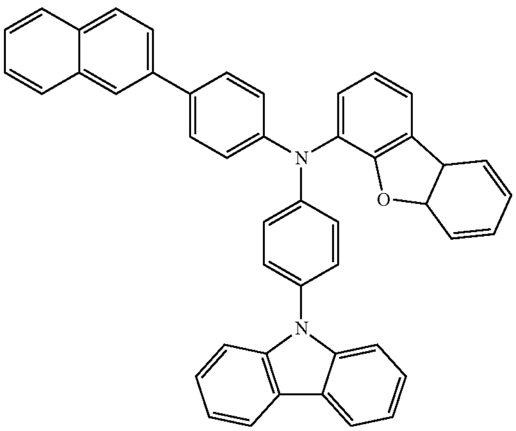

C-1-102
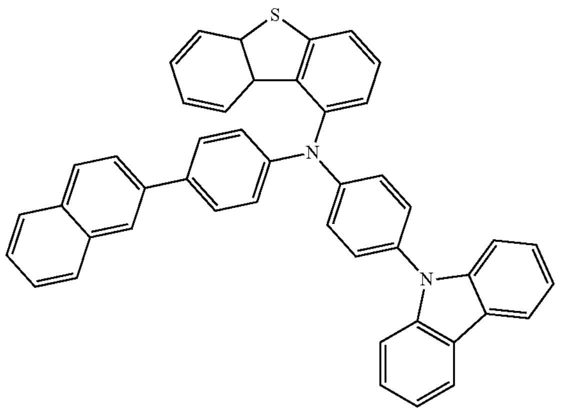
C-1-103
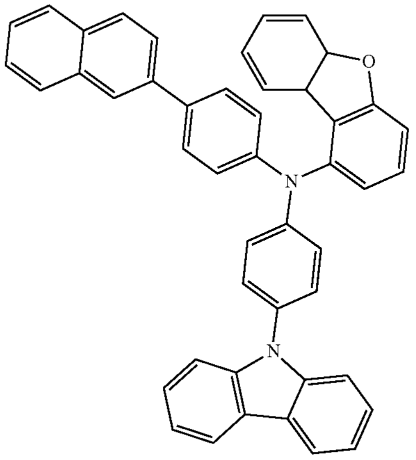
C-1-104
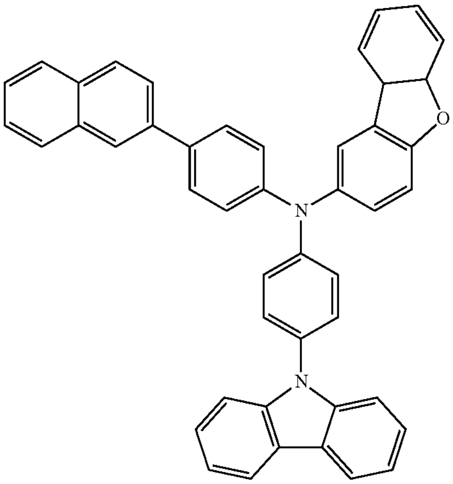
C-1-105
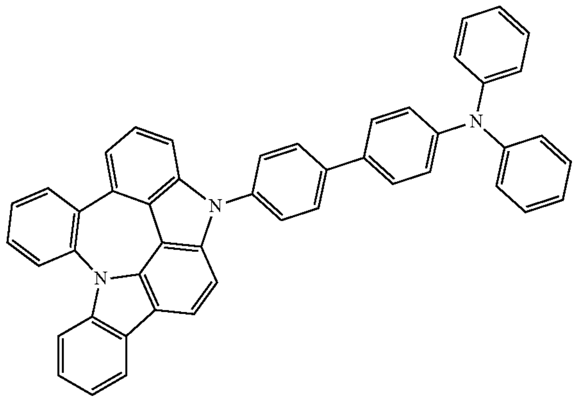
C-1-106
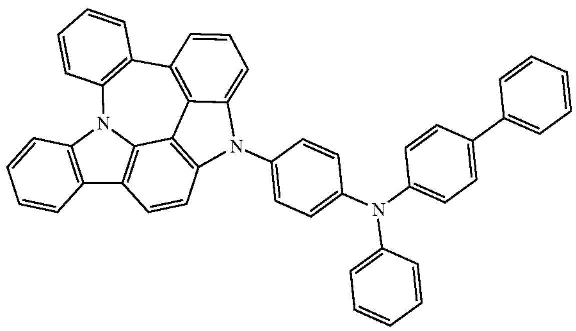
C-1-107
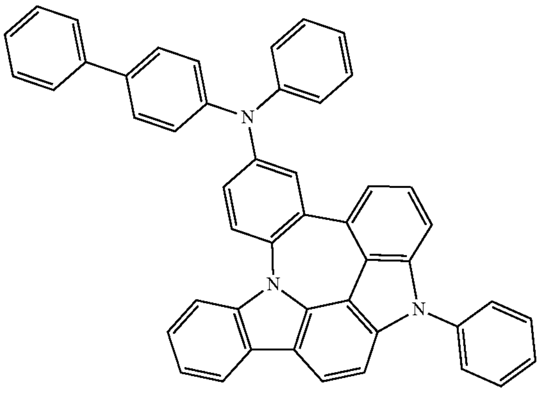

-continued
C-1-108
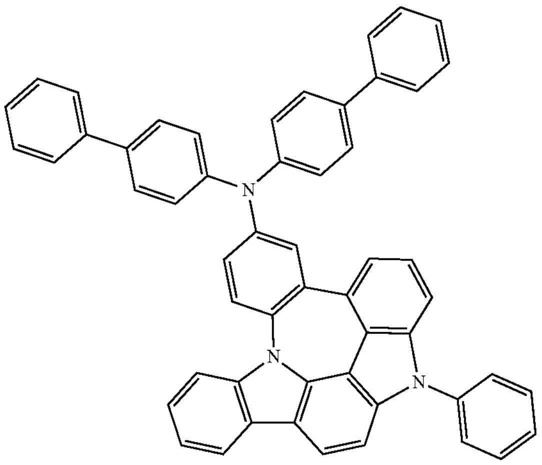
C-1-109
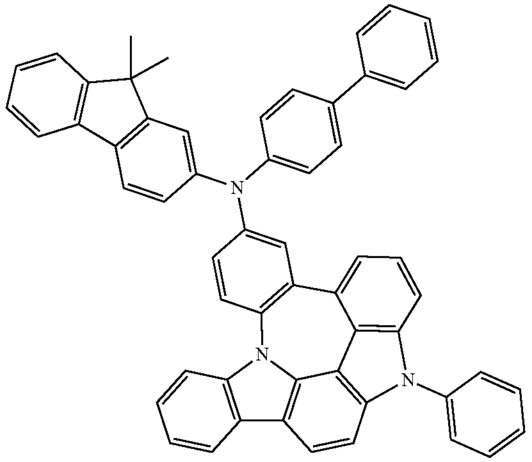
C-1-110
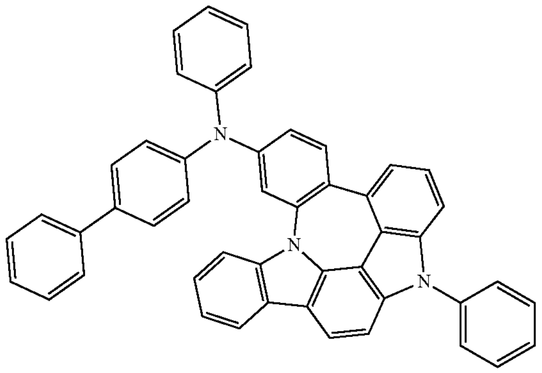
-continued
C-1-111
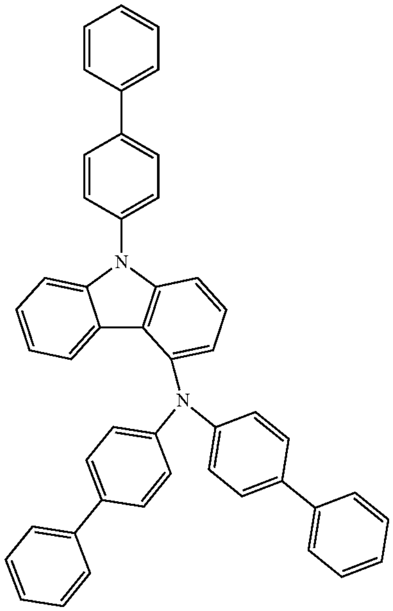
C-1-112
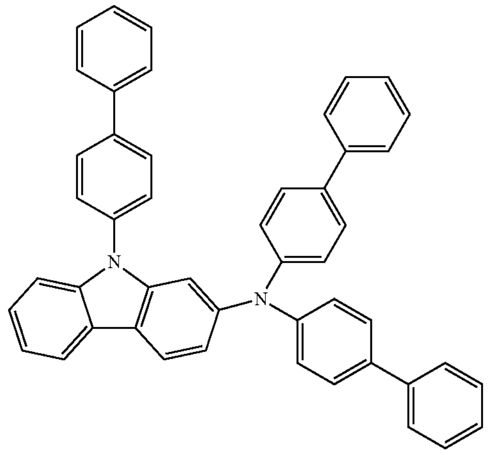

-continued
C-1-113
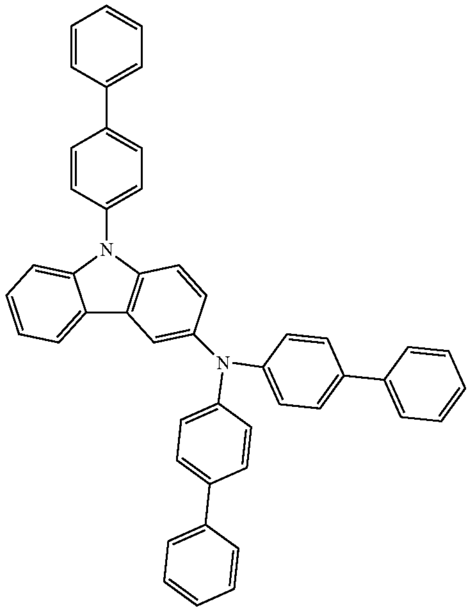
C-1-114
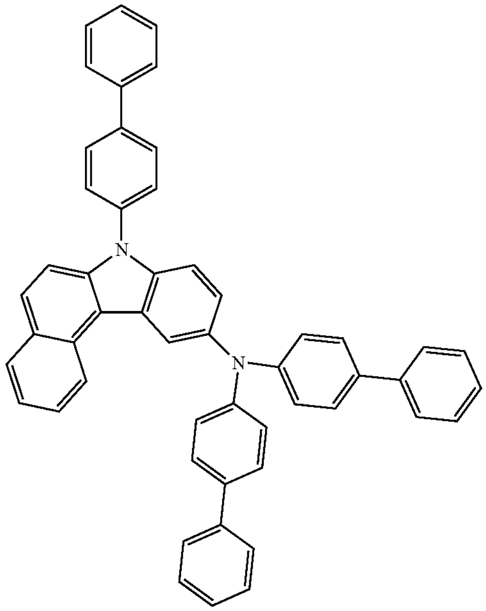
-continued
C-1-115
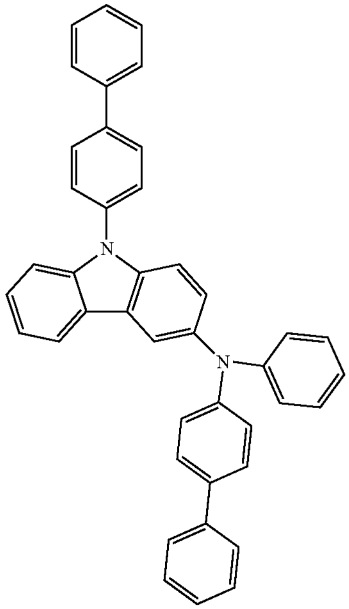
C-1-116
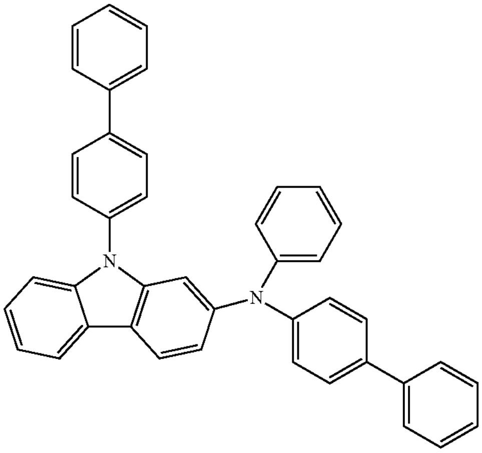

-continued
C-1-117
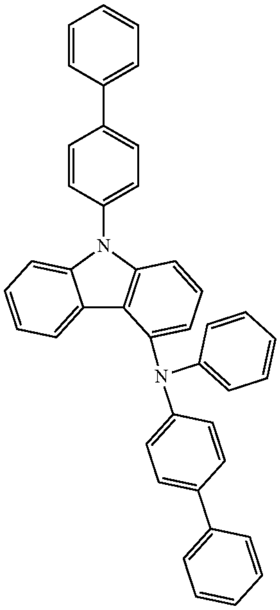
C-1-118
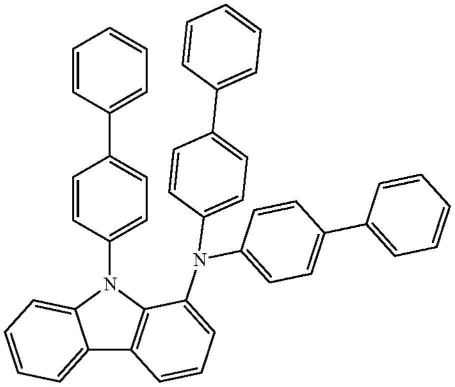
C-1-119
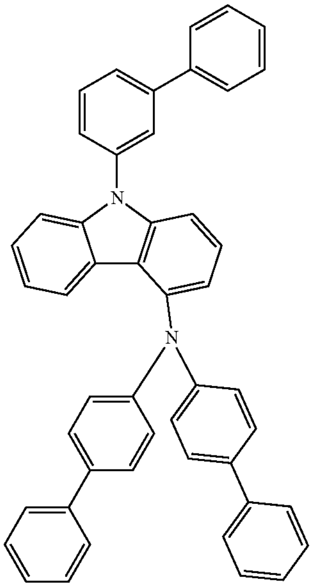
-continued
C-1-120
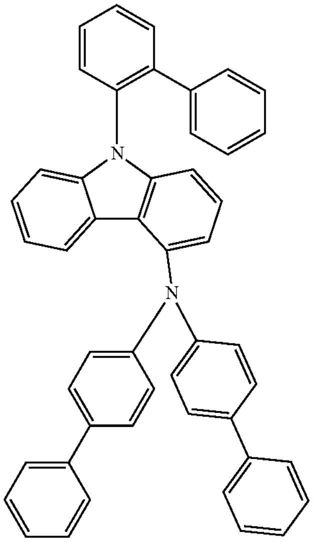
C-1-121
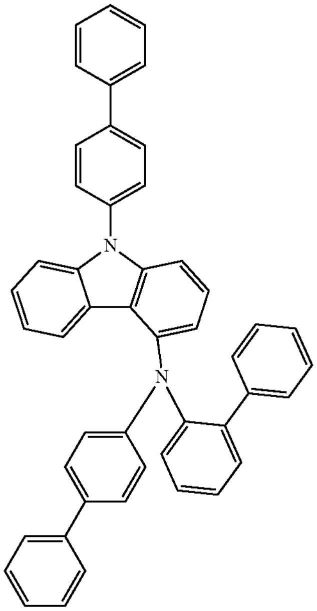

-continued
C-1-122
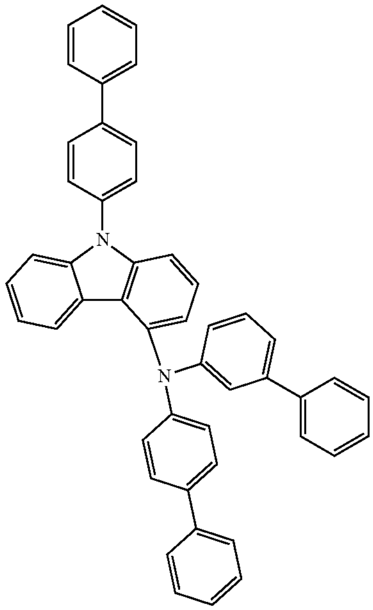
C-1-123
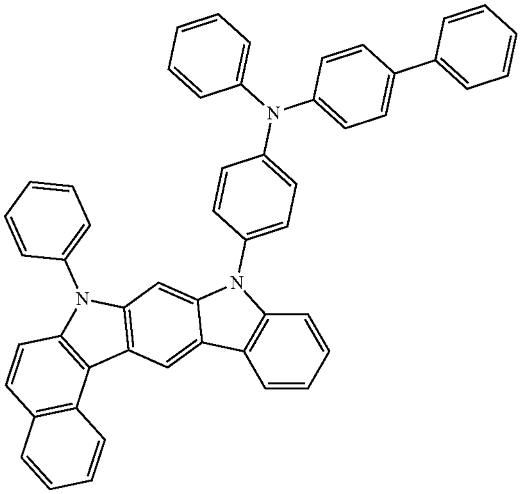
C-1-124
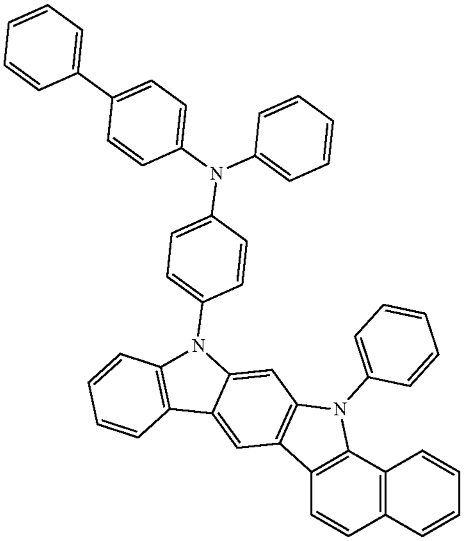
-continued
C-1-125
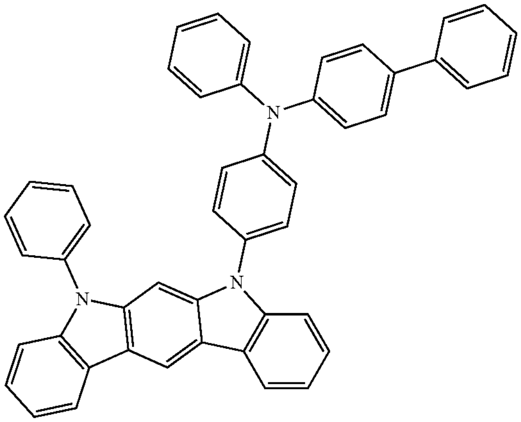
C-1-126
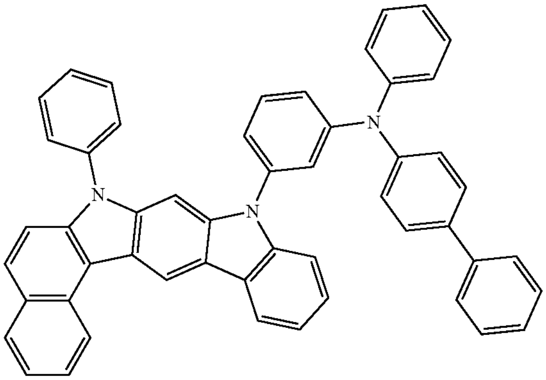
C-1-127
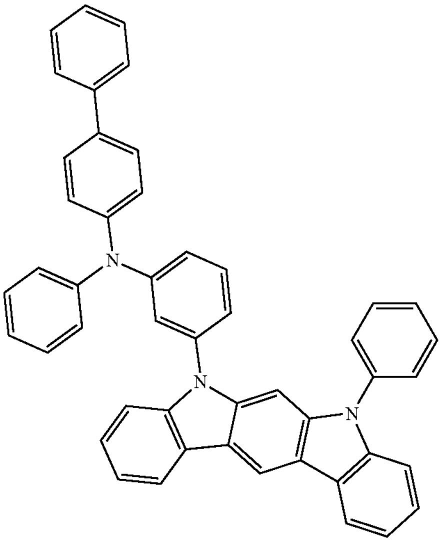

-continued
C-1-128
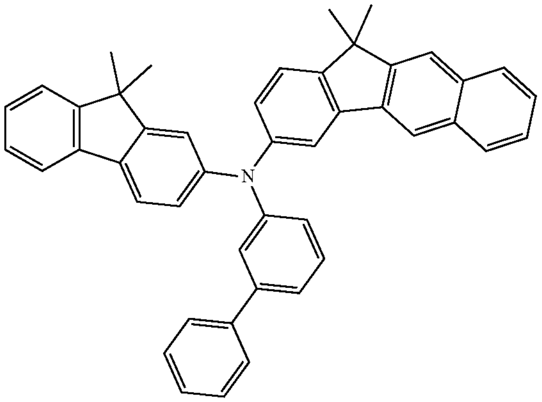
C-1-129
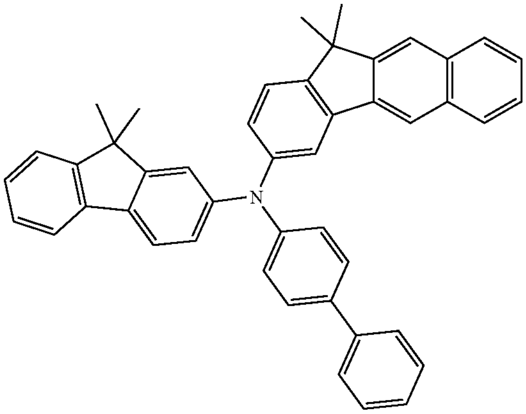
C-1-130
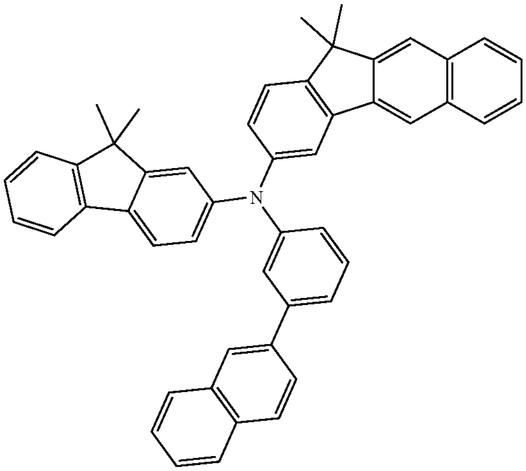
-continued
C-1-131
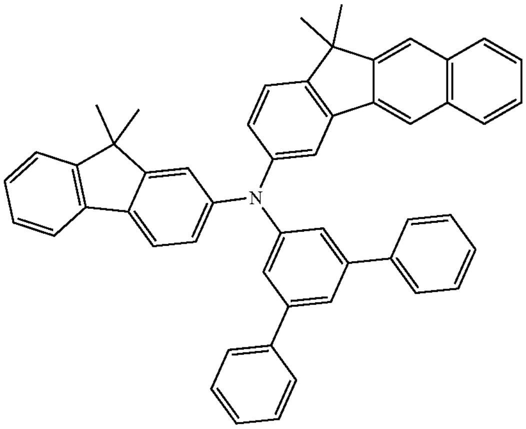
C-1-132
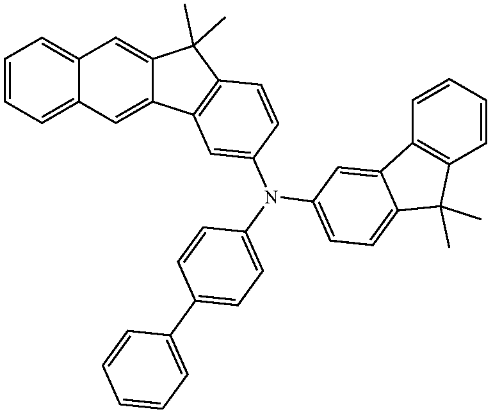
C-1-133
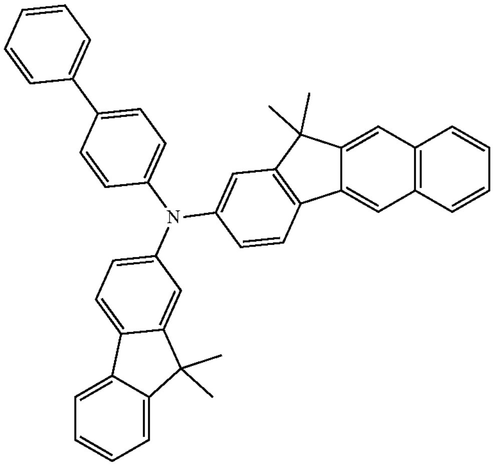

-continued
C-1-134
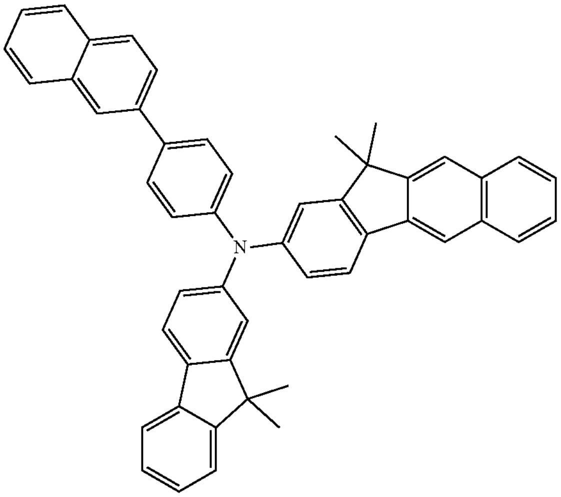
C-1-135
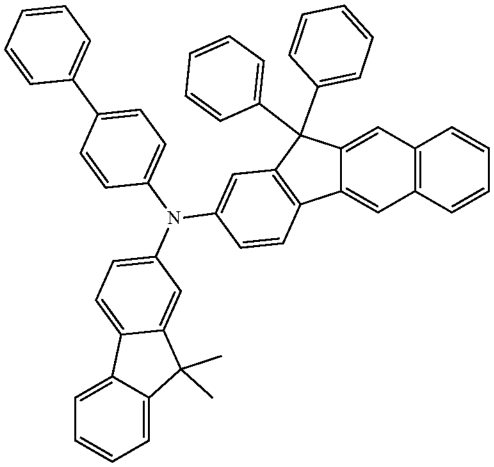
C-1-136
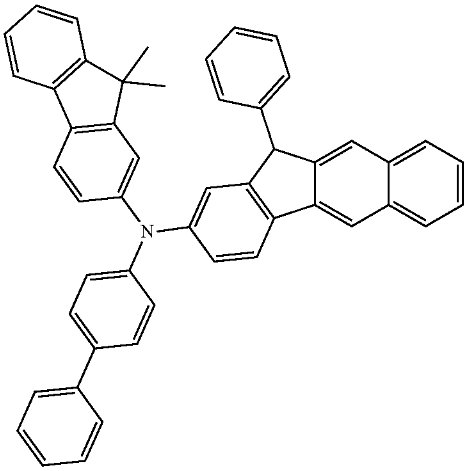
-continued
C-1-137
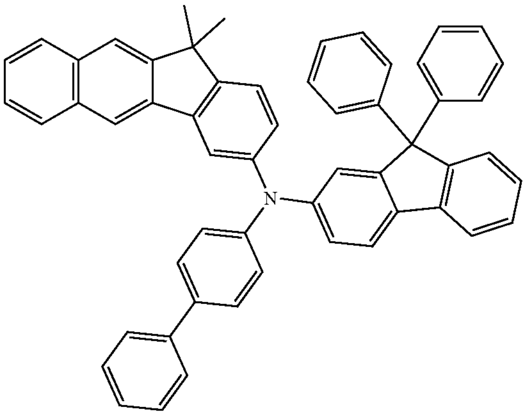
C-1-138
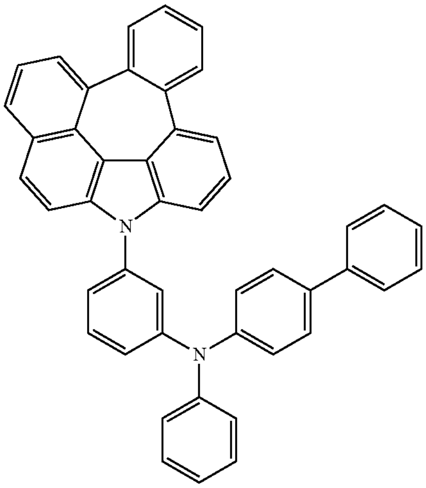
C-1-139
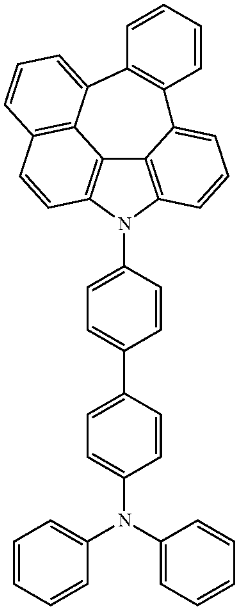

-continued
C-1-140
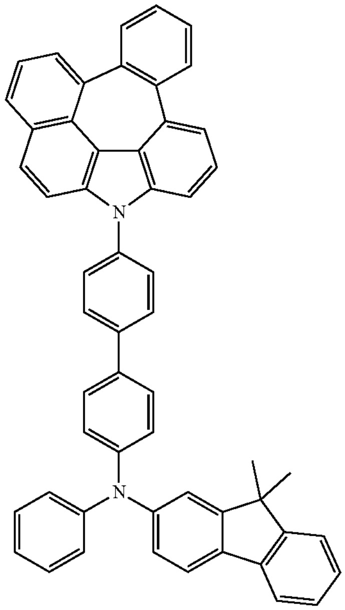
C-1-141
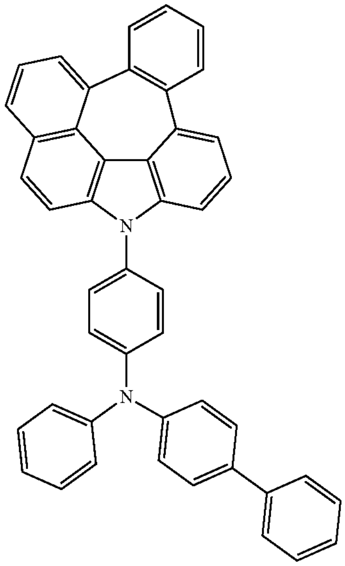
-continued
C-1-142
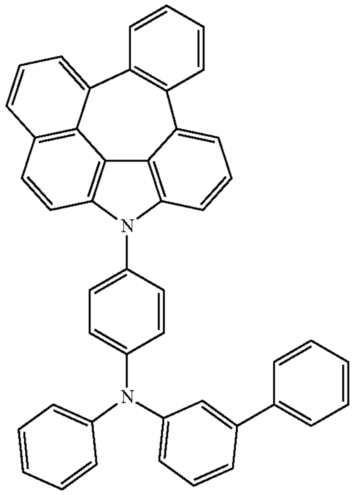
C-1-143
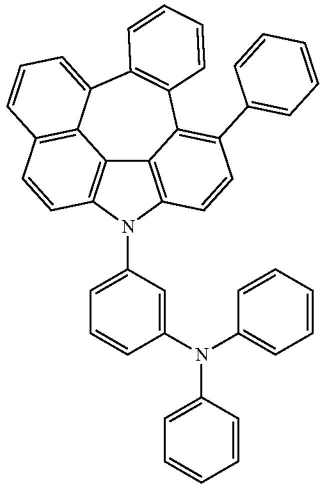
C-1-144
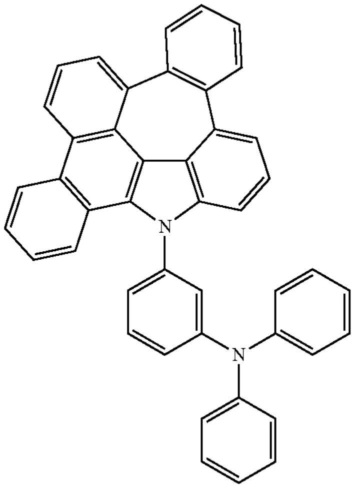

-continued
C-1-145
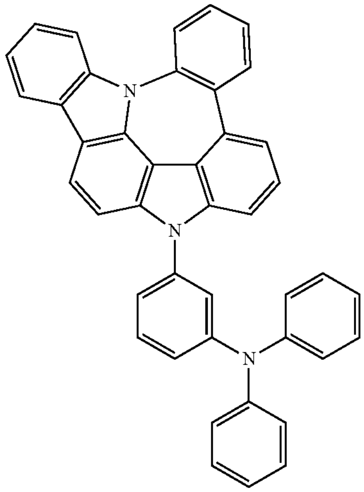
C-1-146
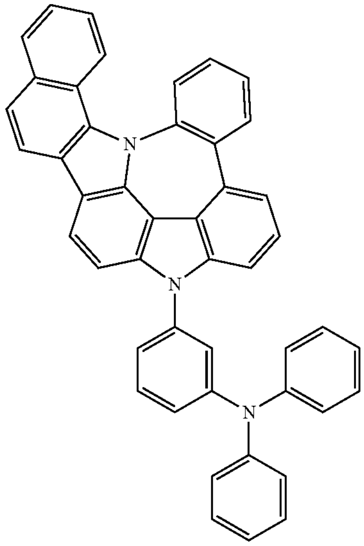
C-1-147
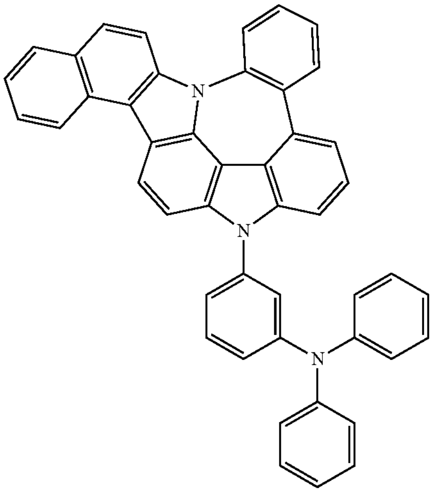
-continued
C-1-148
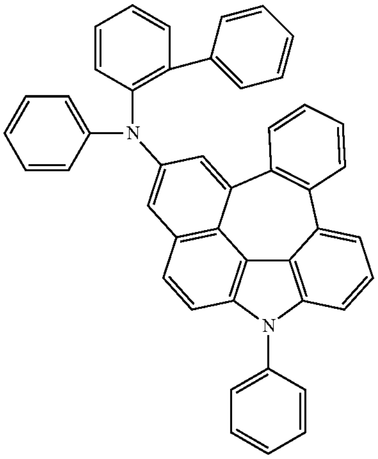
C-1-149
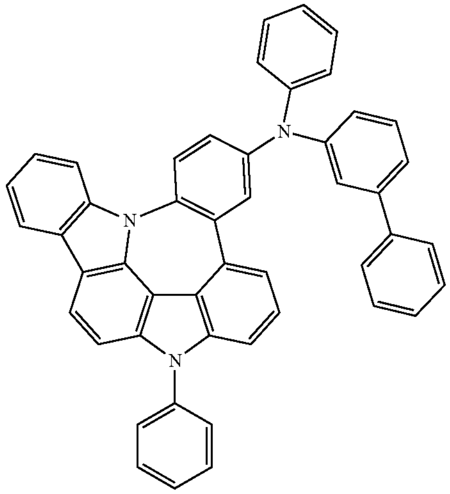
C-1-150
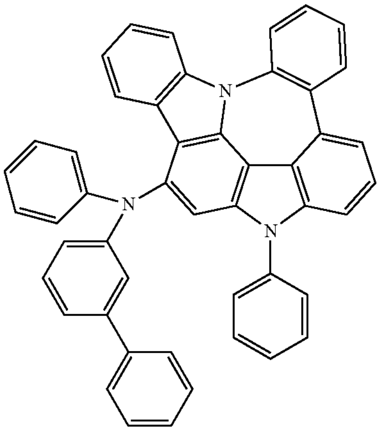

-continued
C-1-151
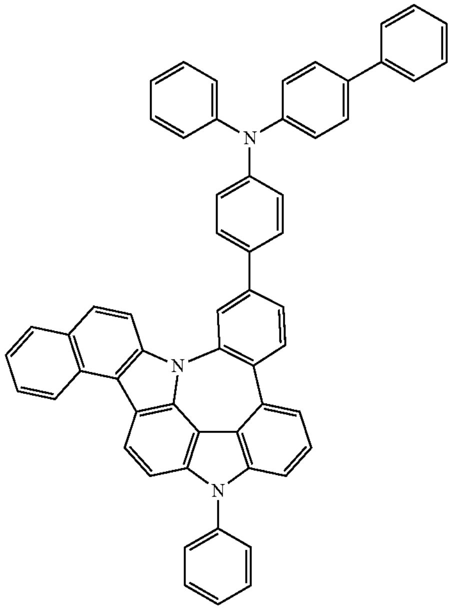
C-1-152
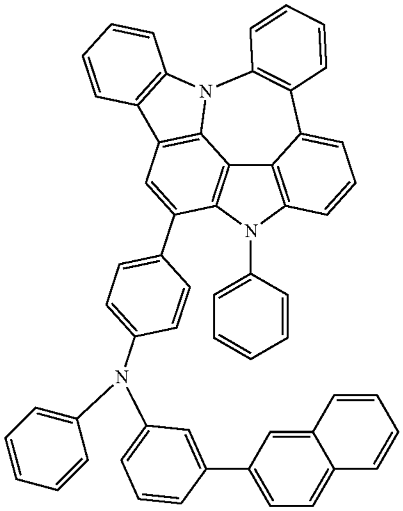
C-1-153
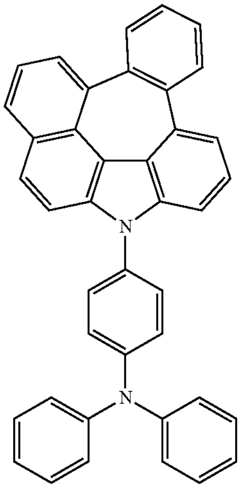
-continued
C-1-154
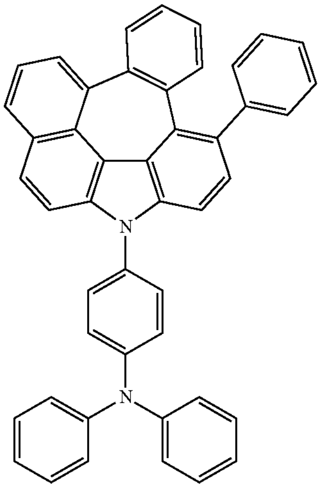
C-1-155
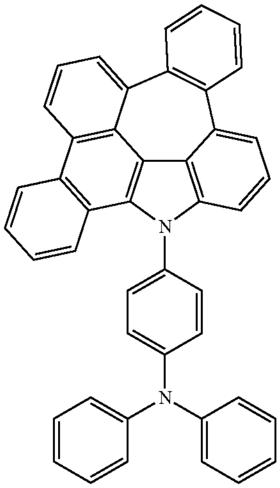
C-1-156
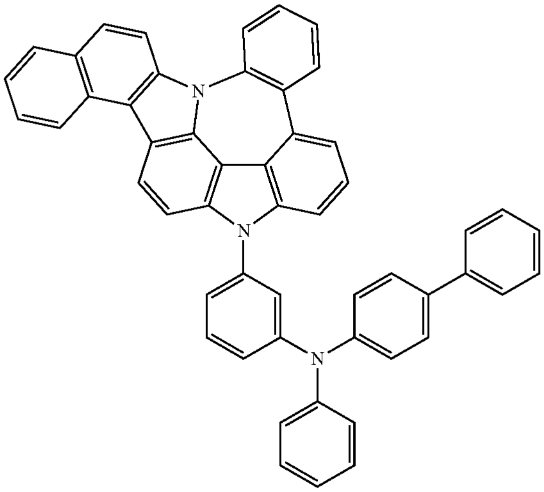

-continued
C-1-157
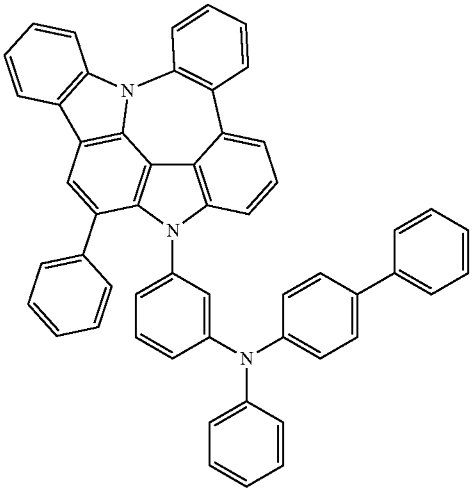
C-1-158
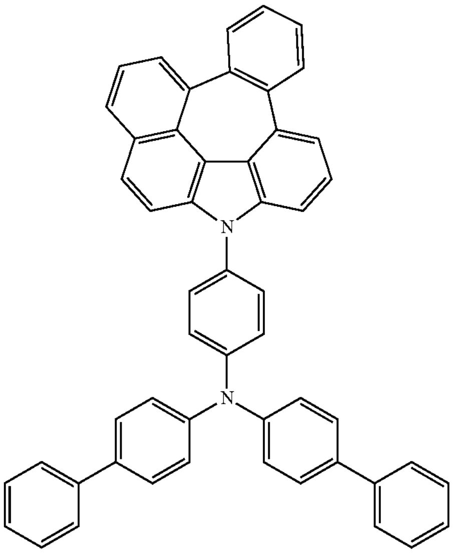
C-1-159
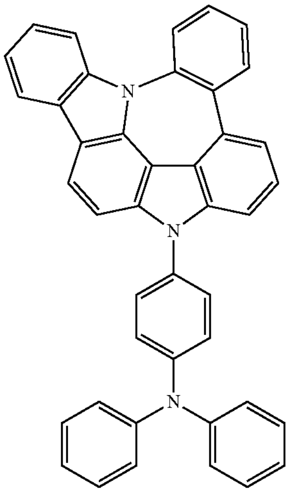
-continued
C-1-160
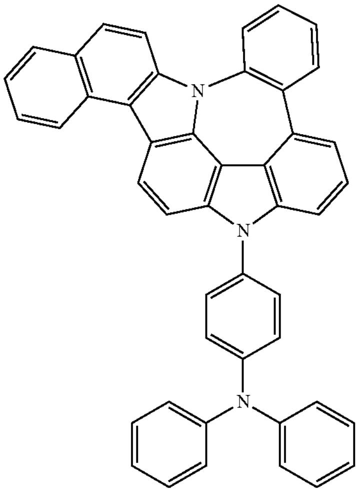
C-1-161
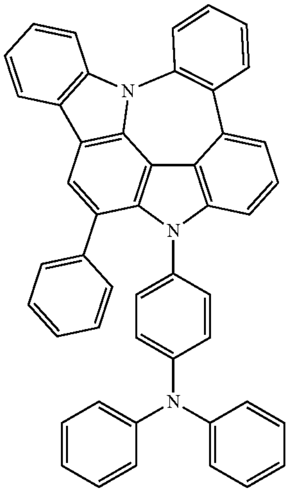
C-1-162
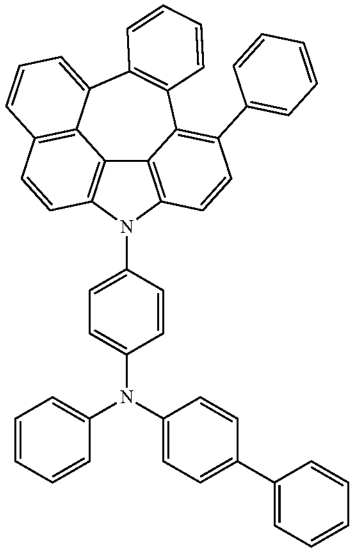

-continued
C-1-163
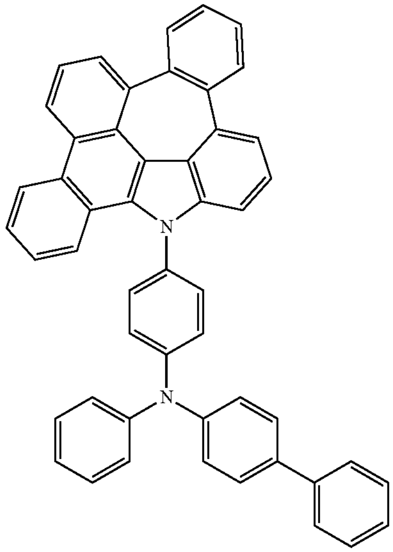
C-1-164
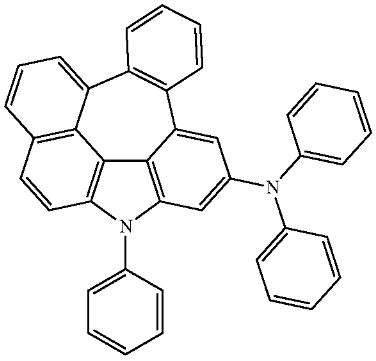
C-1-165
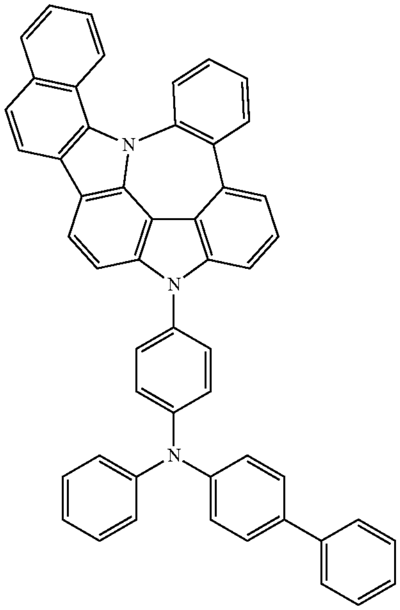
-continued
C-1-166
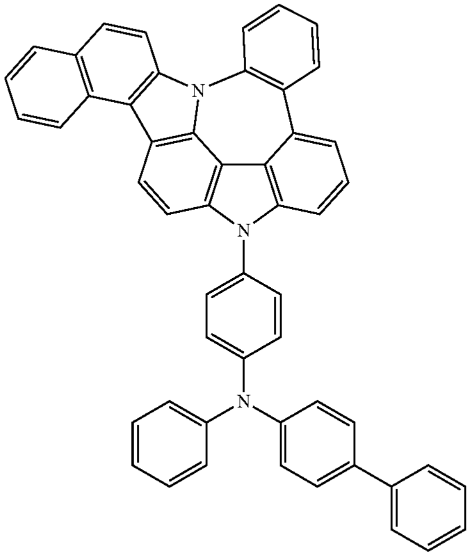
C-1-167
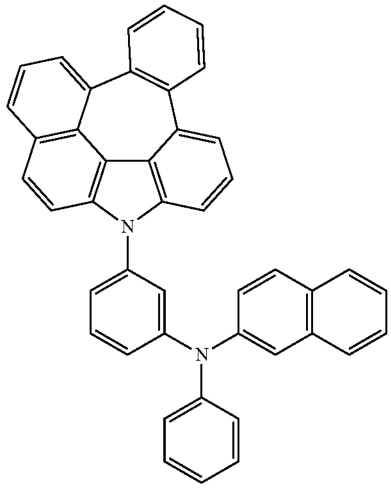
C-1-168
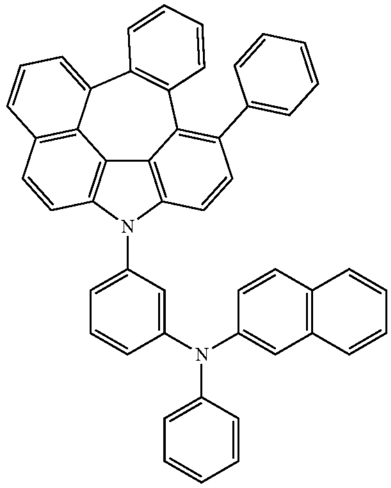

-continued
C-1-169
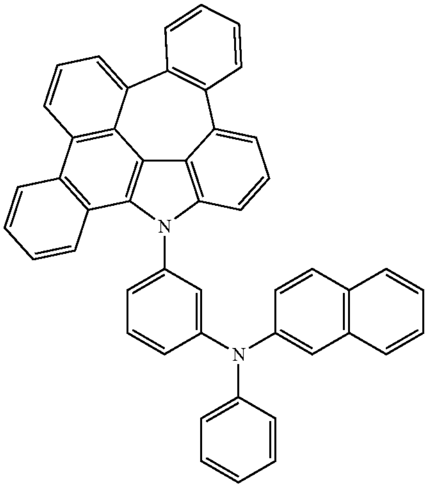
C-1-170
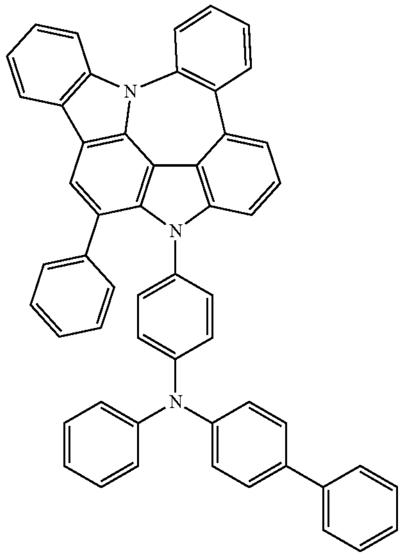
C-1-171
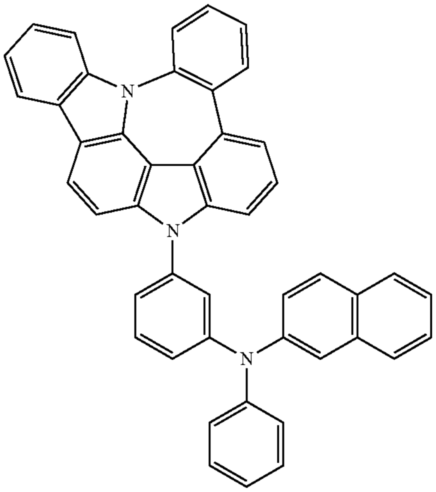
-continued
C-1-172
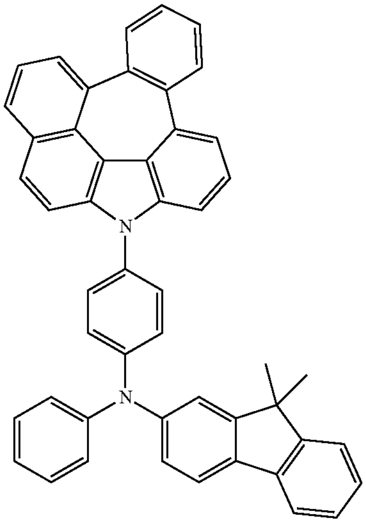
C-1-173
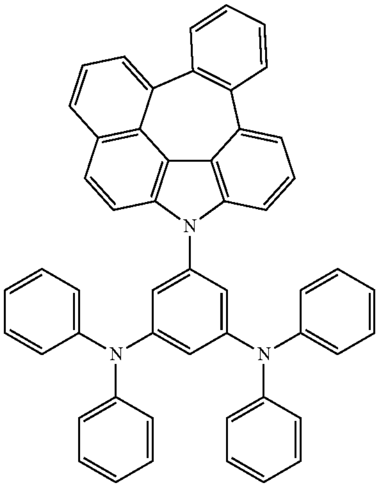
C-1-174
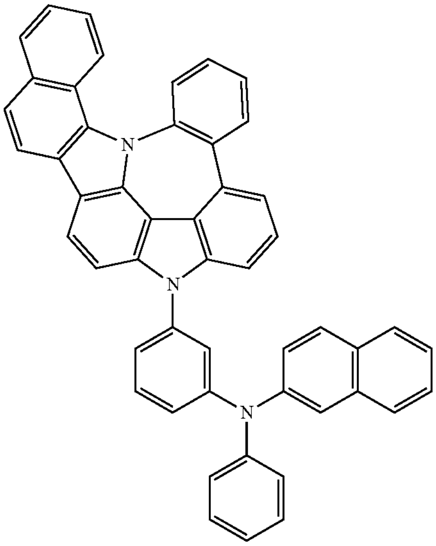

-continued
C-1-175
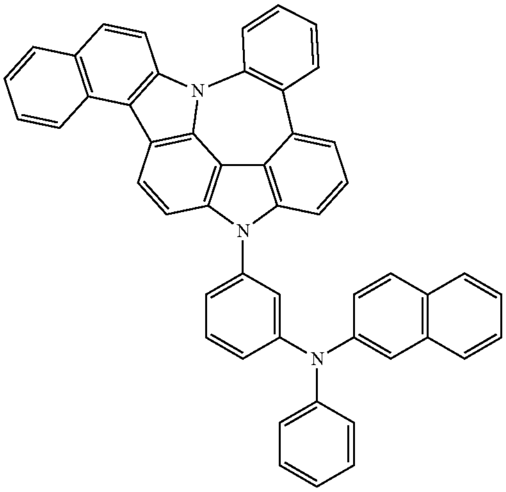
C-1-176
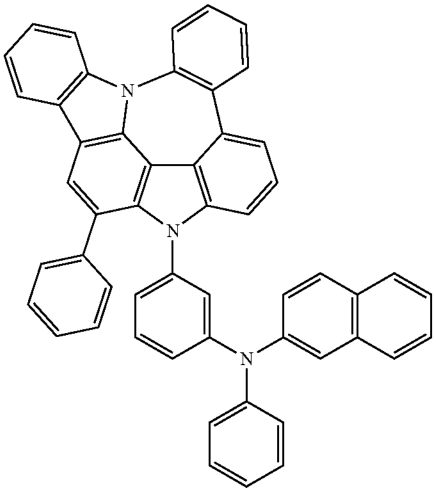
C-1-177
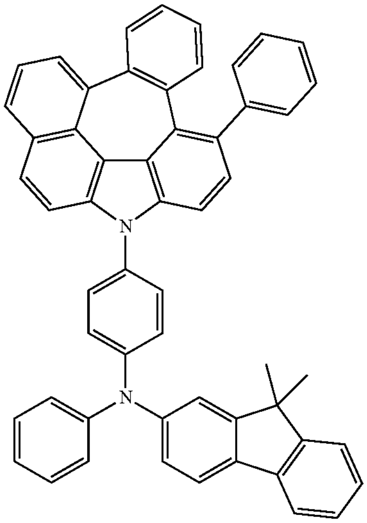
-continued
C-1-178
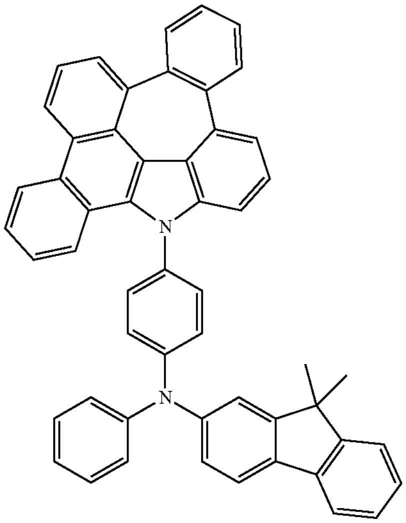
C-1-179
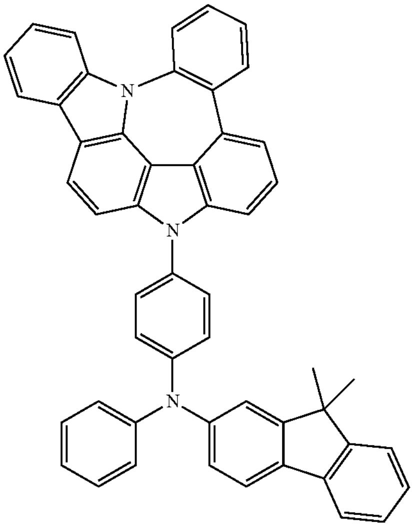
C-1-180
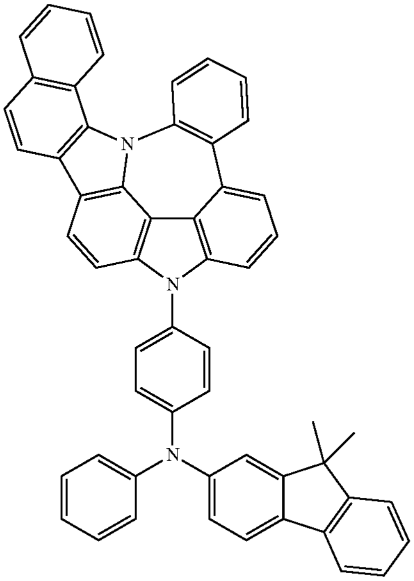

-continued
C-1-181
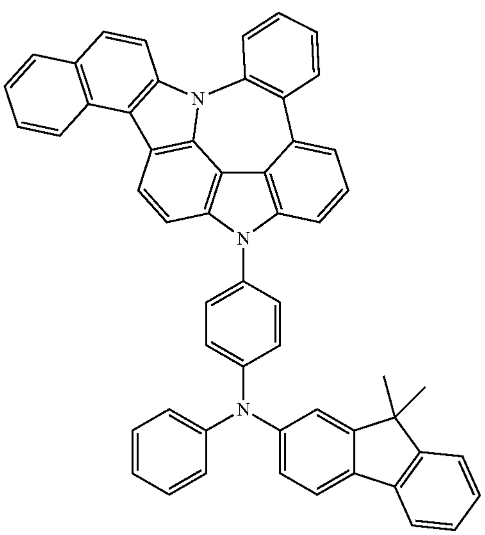
C-1-182
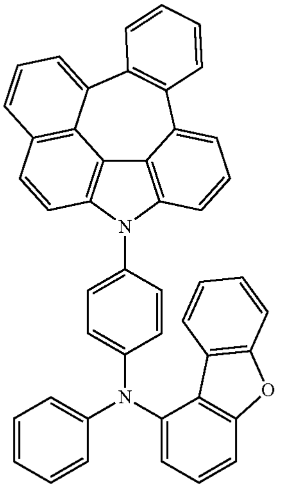
C-1-183
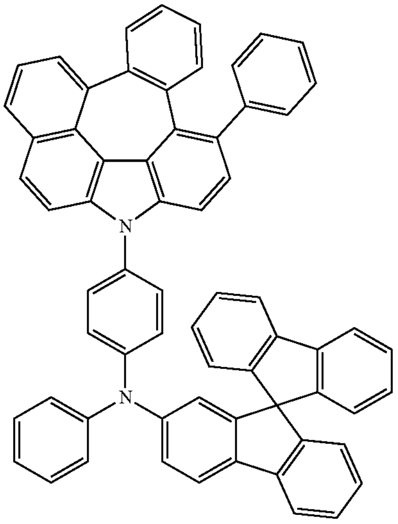
-continued
C-1-184
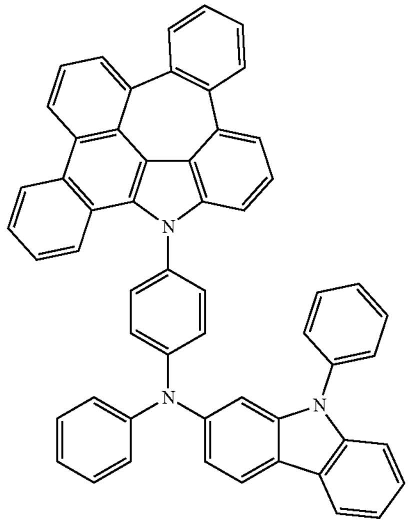
C-1-185
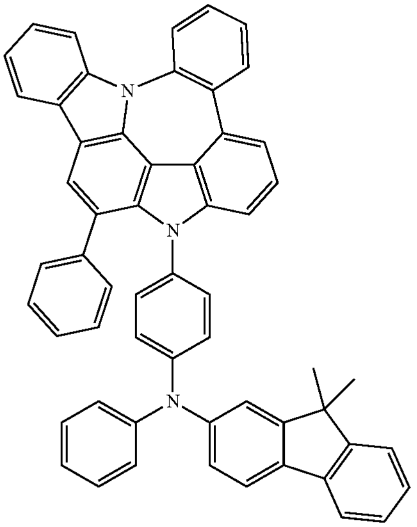
C-1-186
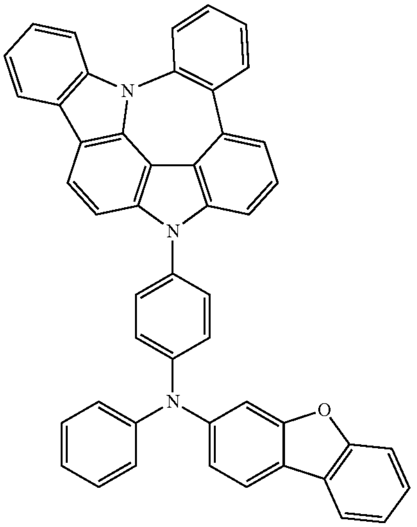

-continued
C-1-187
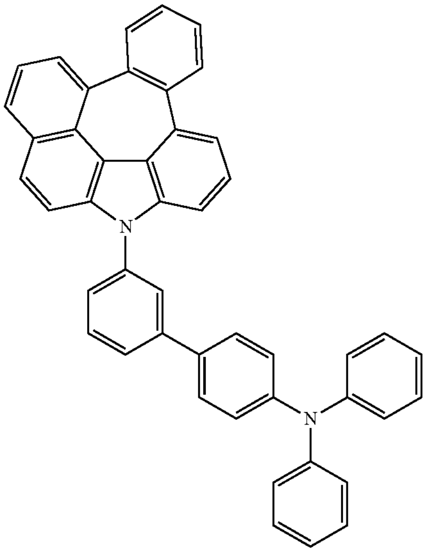
C-1-188
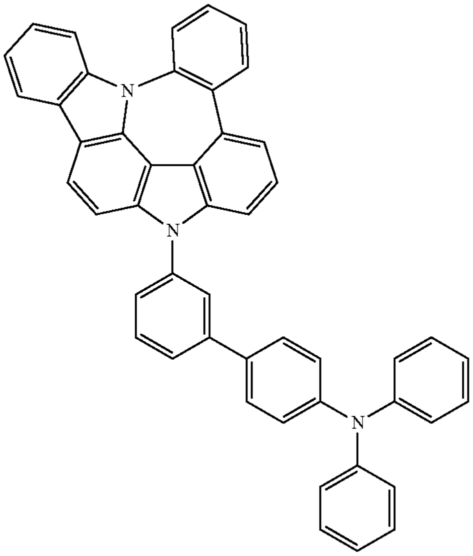
-continued
C-1-189
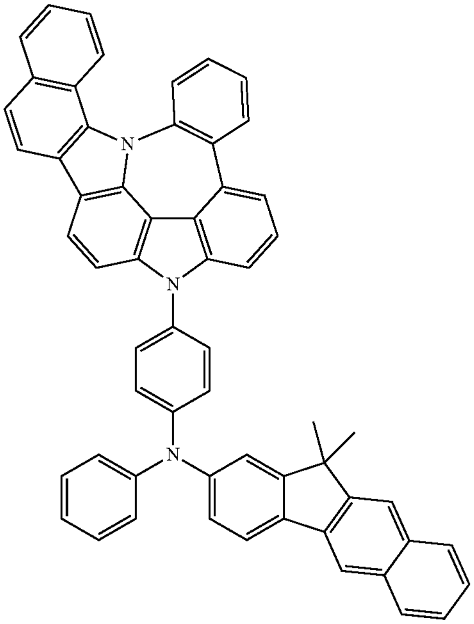
C-1-190
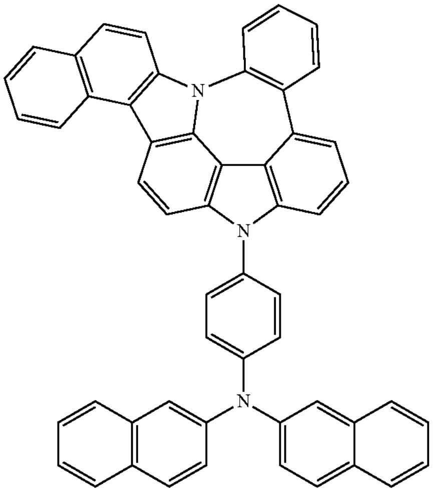
C-1-191
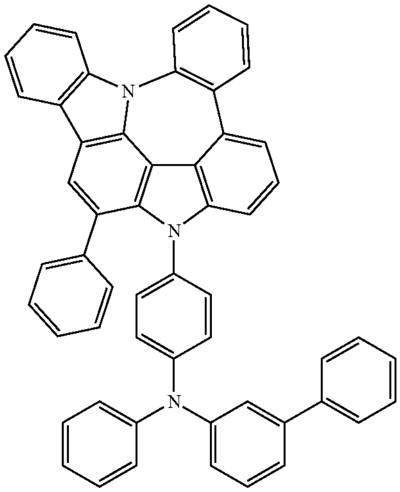

-continued
C-1-192
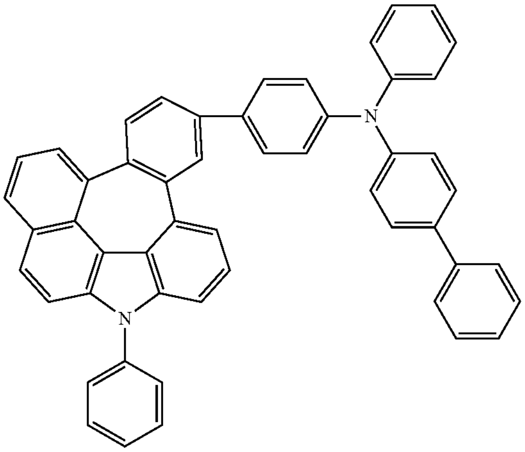
C-1-193
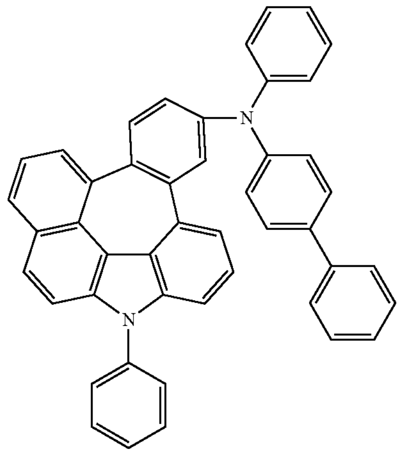
C-1-194
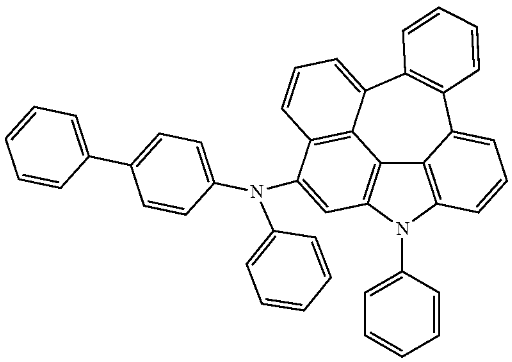
-continued
C-1-195
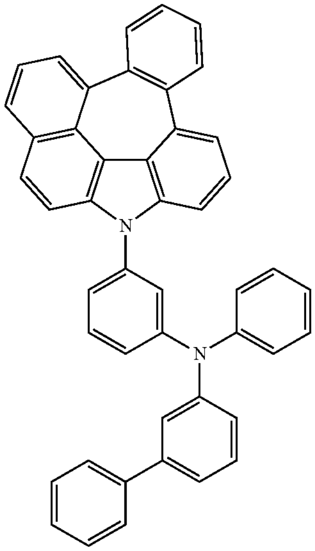
The compound represented by formula 2 may be specifically exemplified by the following compounds, but is not limited thereto.
C-2-1
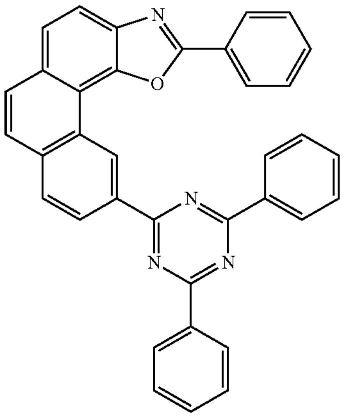
C-2-2
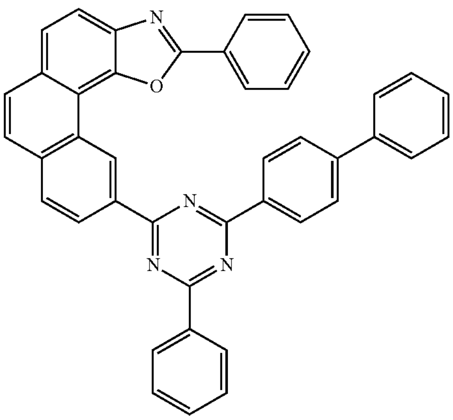

-continued
C-2-3
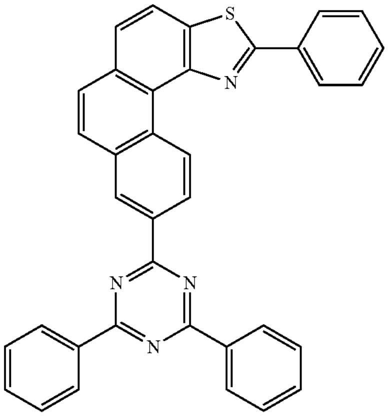
C-2-4
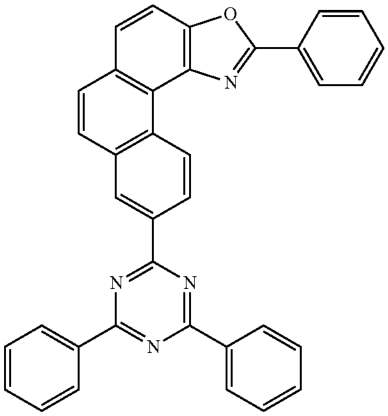
C-2-5
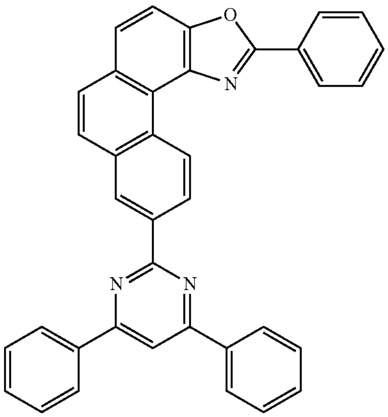
-continued
C-2-6
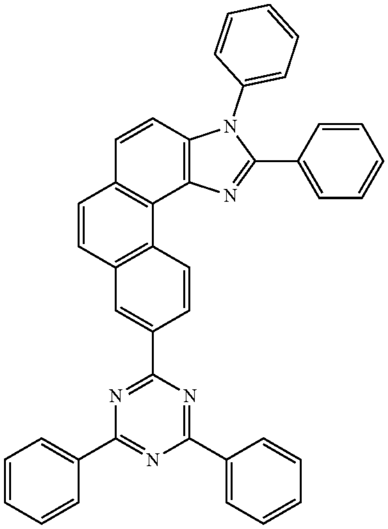
C-2-7
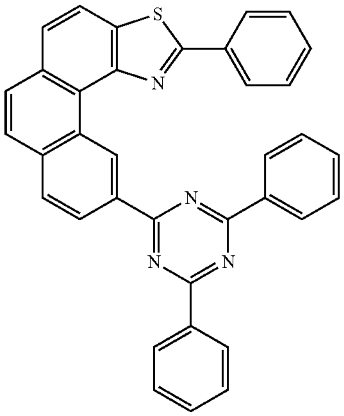
C-2-8
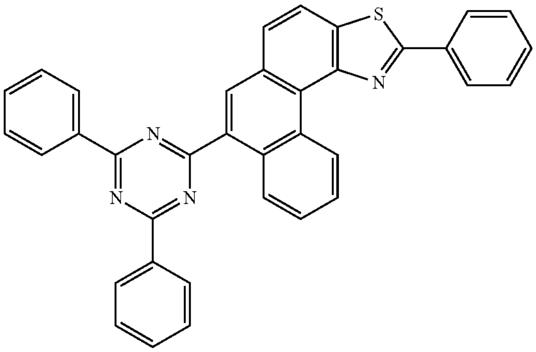

-continued
C-2-9
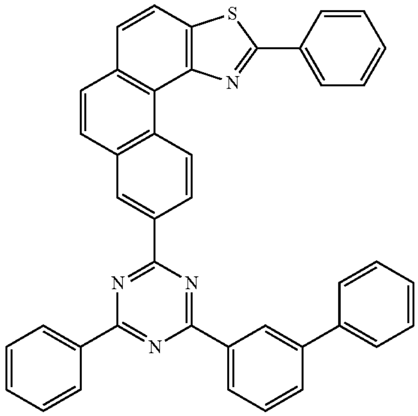
C-2-10
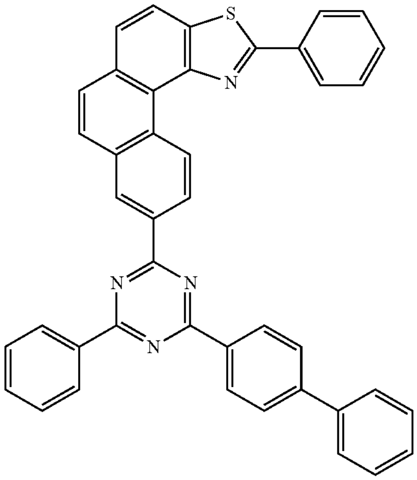
C-2-11
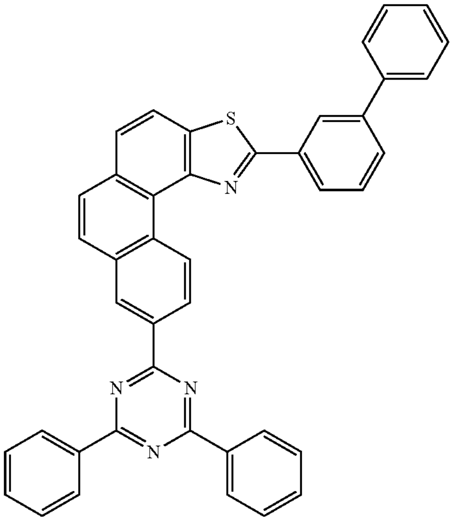
-continued
C-2-12
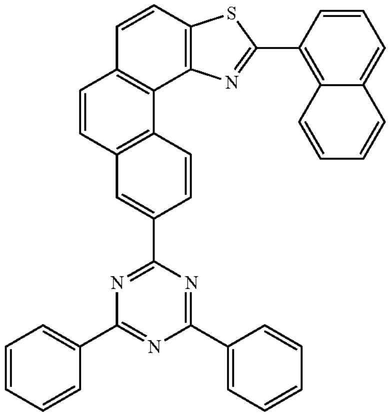
C-2-13
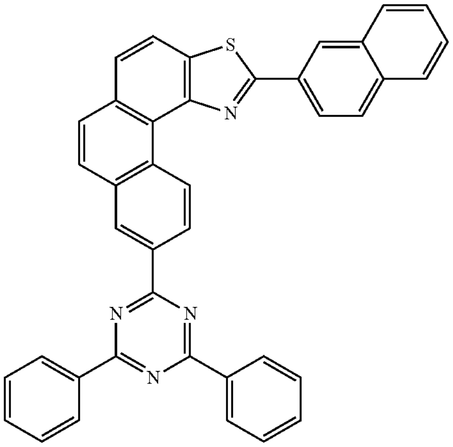
C-2-14
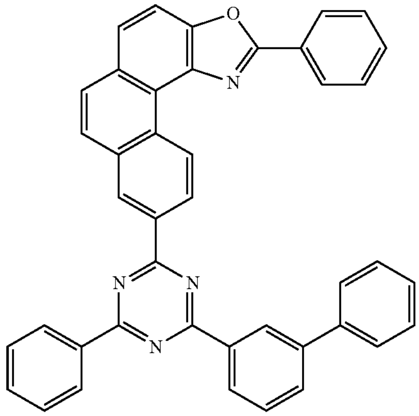

-continued
C-2-15
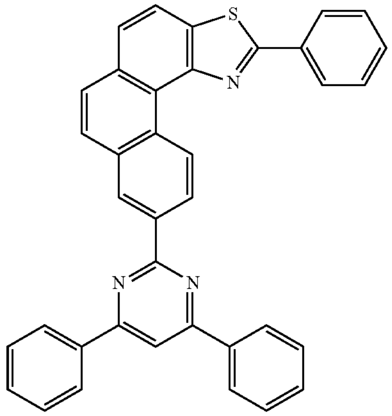
C-2-16
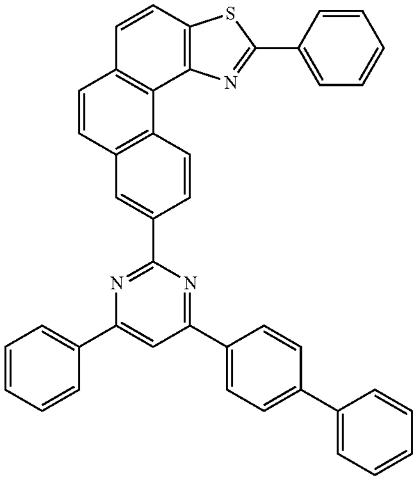
C-2-17
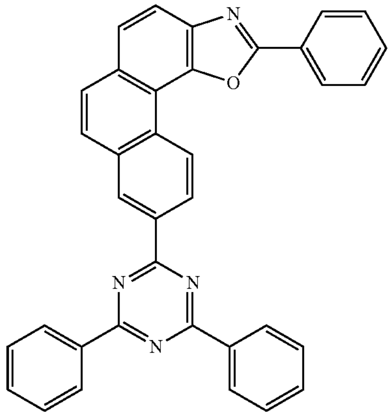
-continued
C-2-18
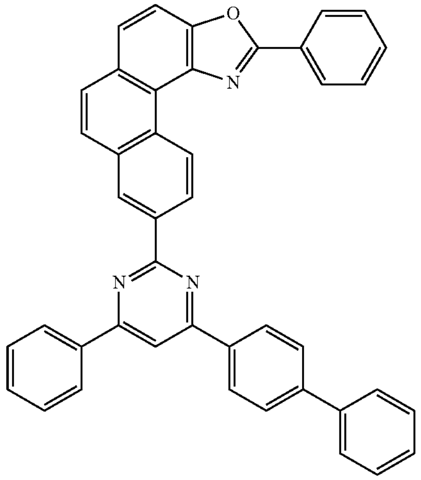
C-2-19
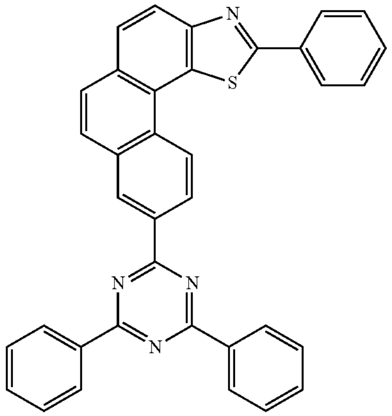
C-2-20
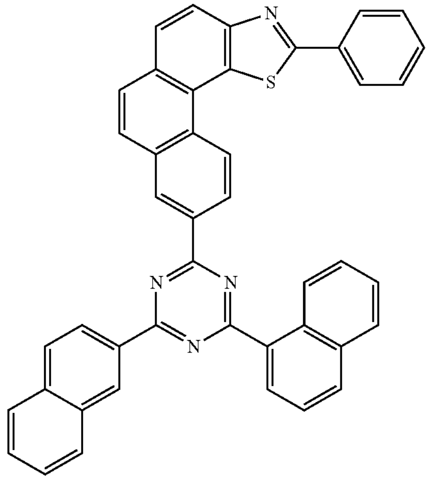

-continued
C-2-21
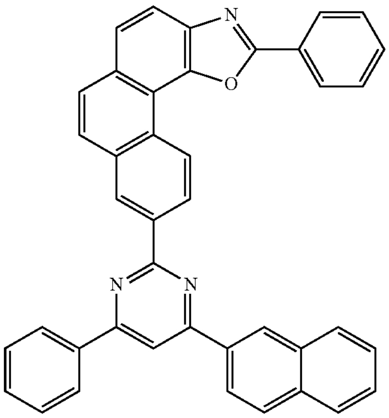
C-2-22
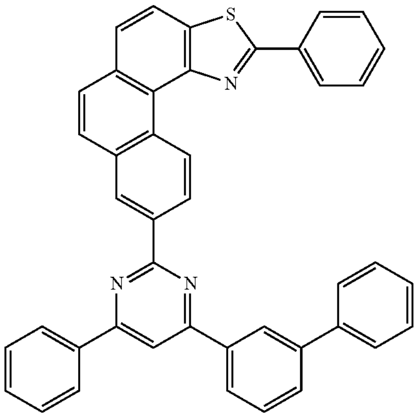
C-2-23
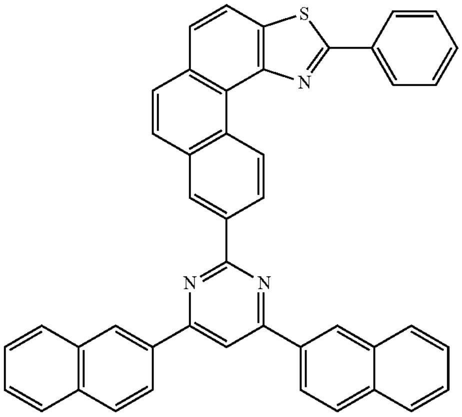
-continued
C-2-24
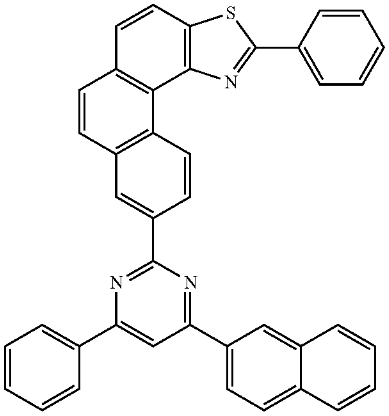
C-2-25
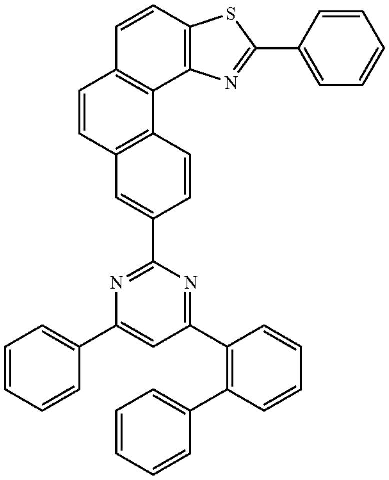
C-2-26
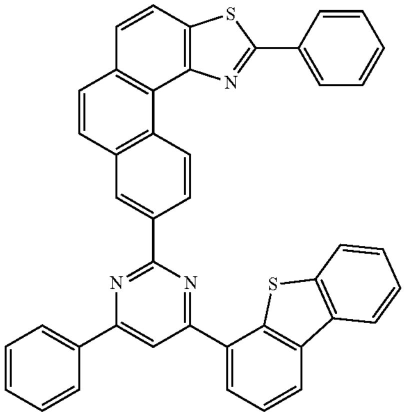

-continued
C-2-27
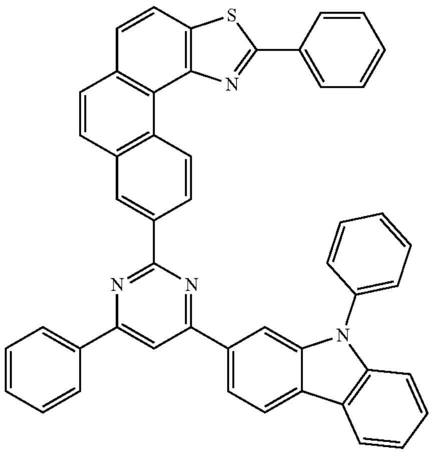
C-2-28
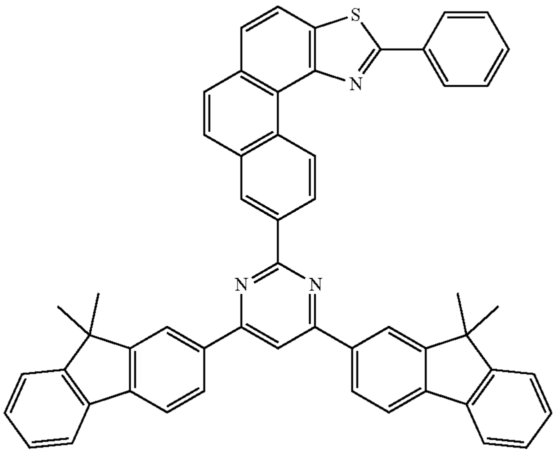
C-2-29
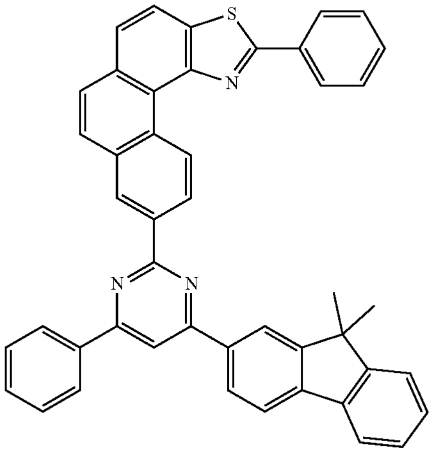
-continued
C-2-30
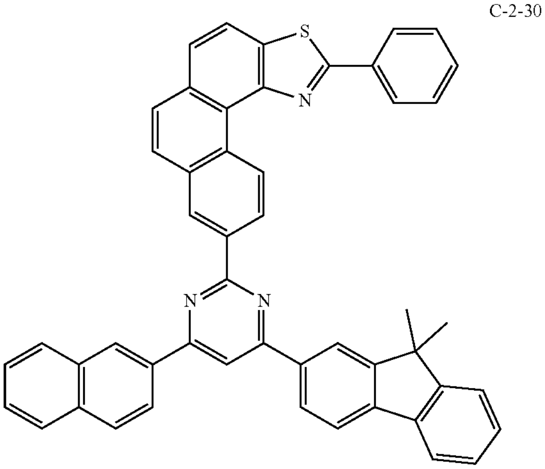
C-2-31
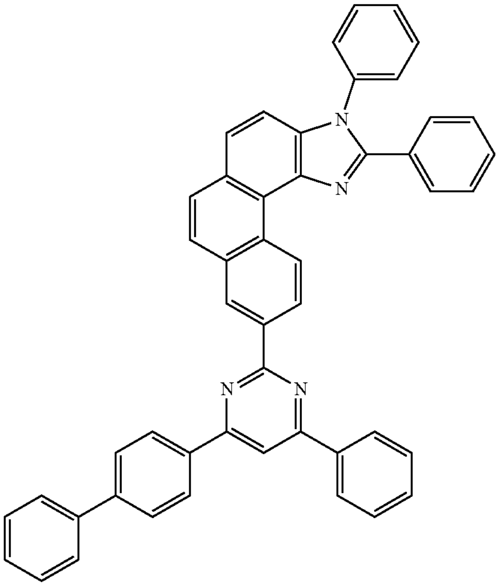
C-2-32
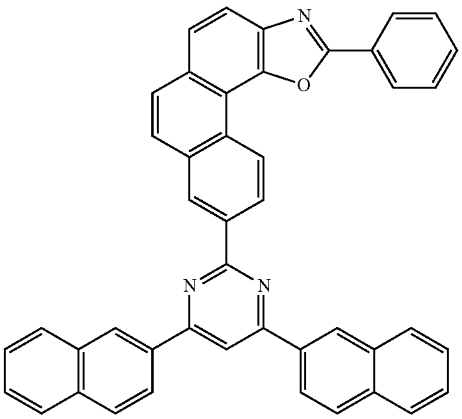

-continued
C-2-33
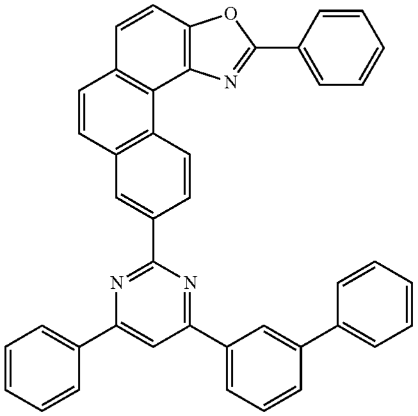
C-2-34
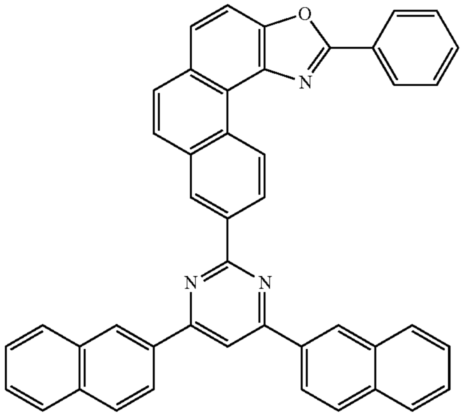
C-2-35
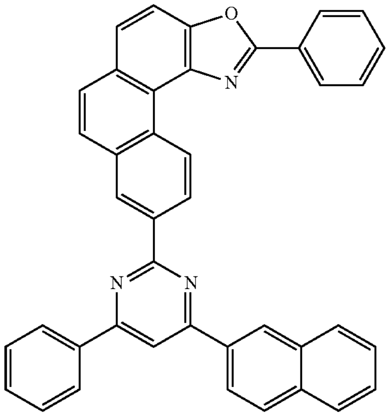
-continued
C-2-36
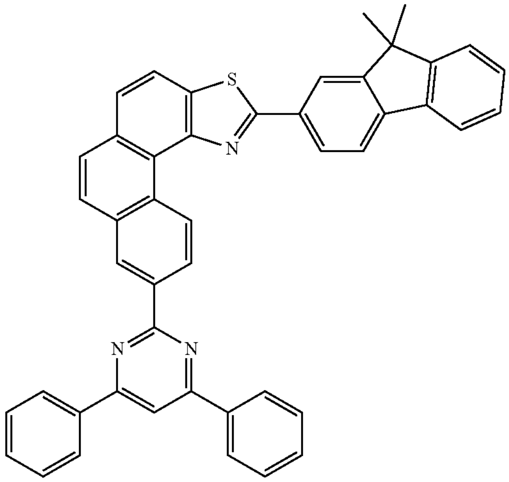
C-2-37
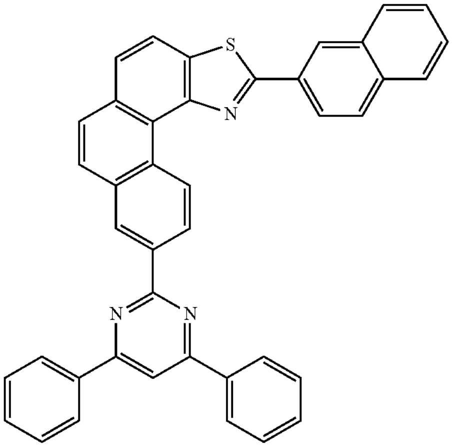
C-2-38
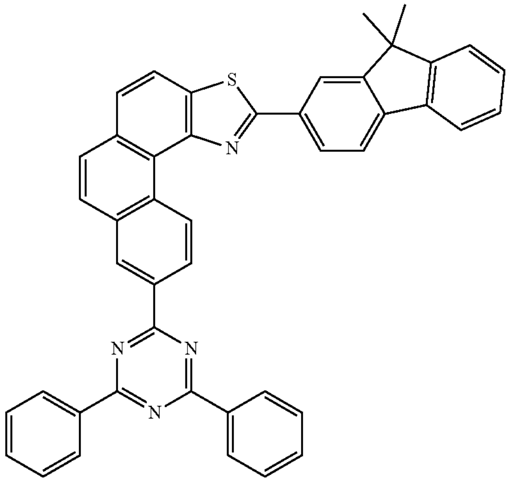

-continued
C-2-39
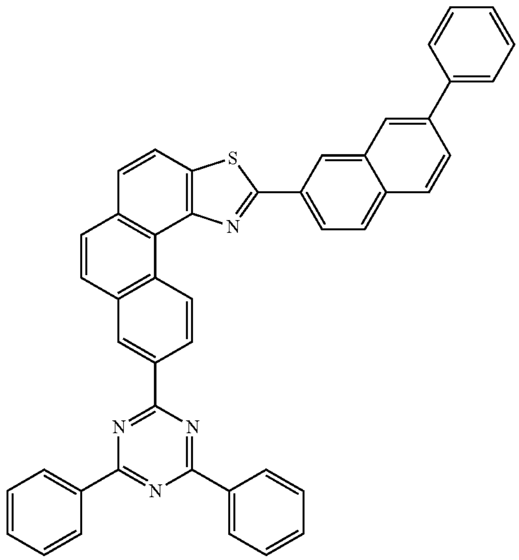
C-2-40
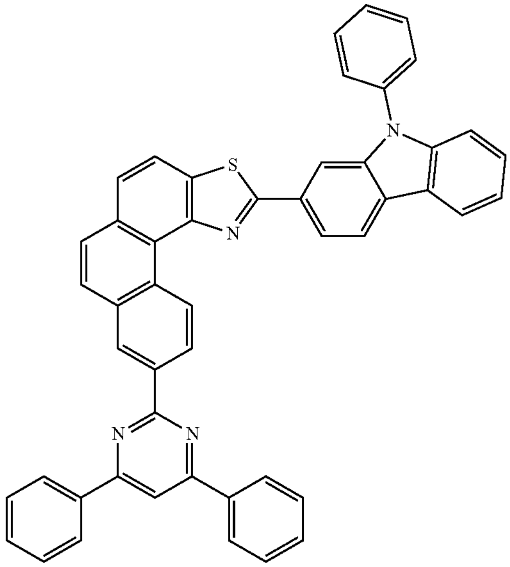
C-2-41
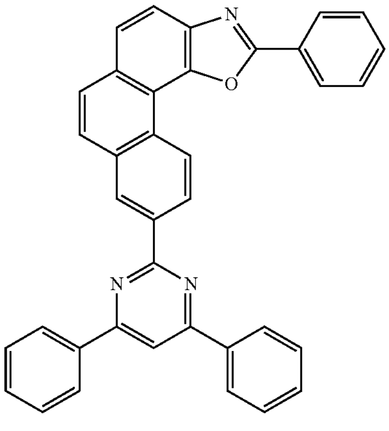
-continued
C-2-42
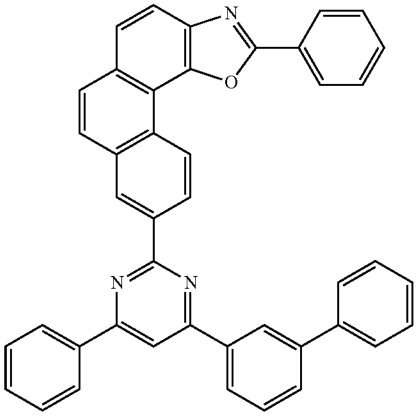
C-2-43
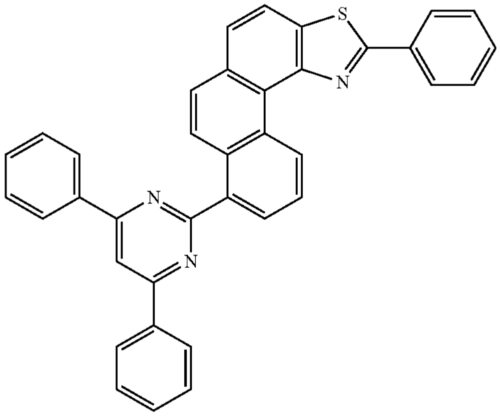
C-2-44
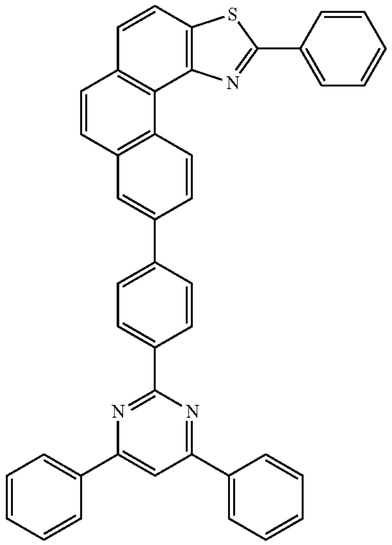

-continued
C-2-45
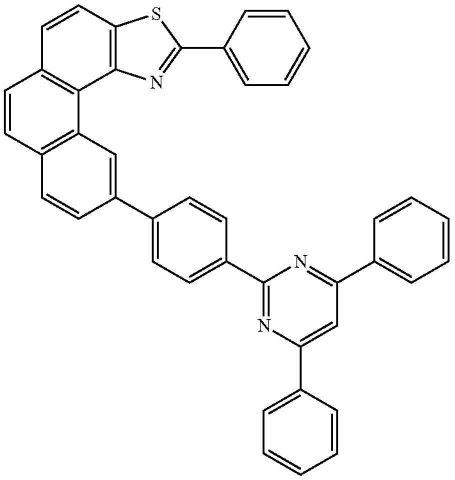
C-2-46
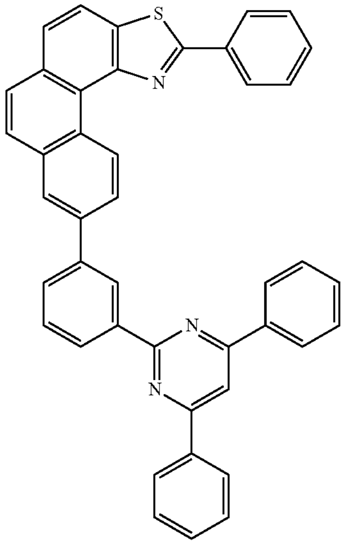
C-2-47
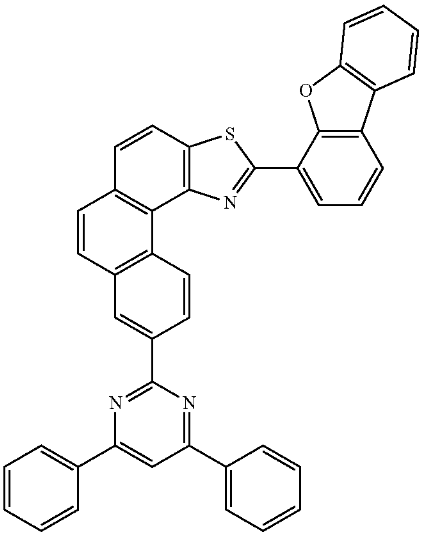
-continued
C-2-48
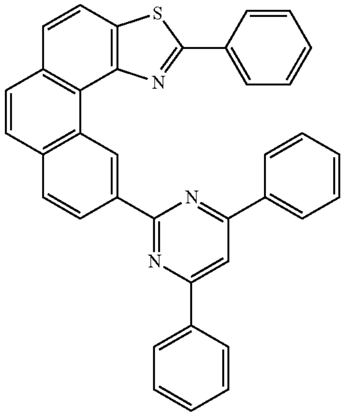
C-2-49
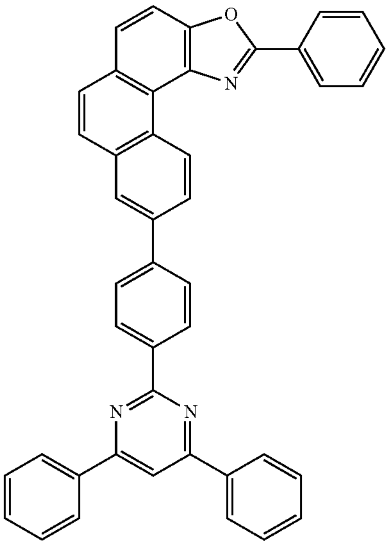
C-2-50
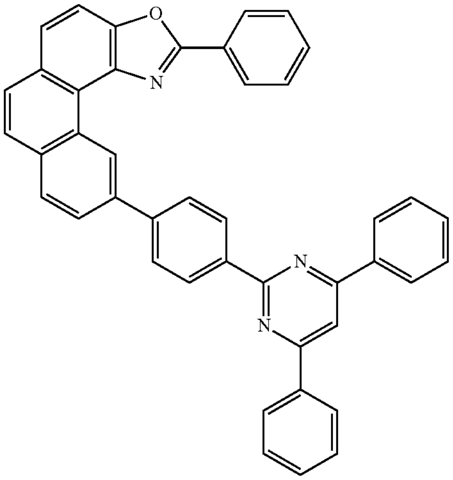

-continued
C-2-51
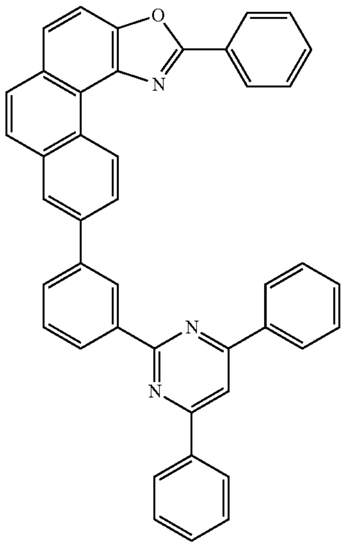
C-2-52
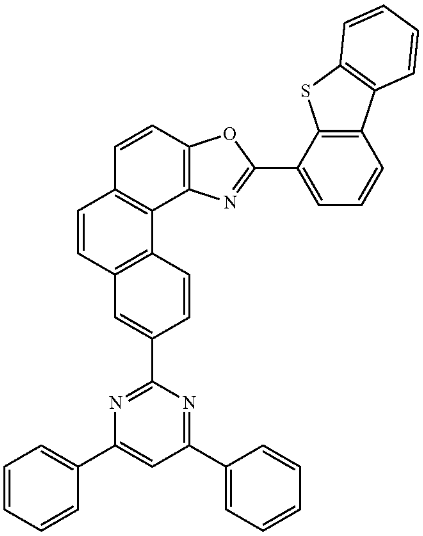
C-2-53
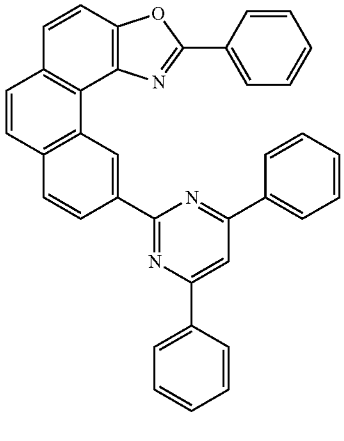
-continued
C-2-54
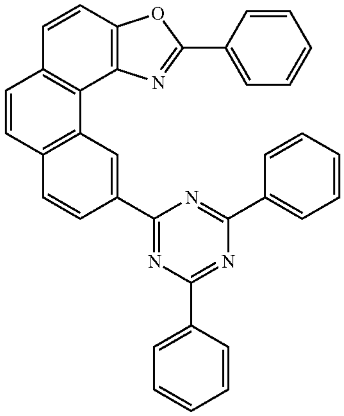
C-2-55
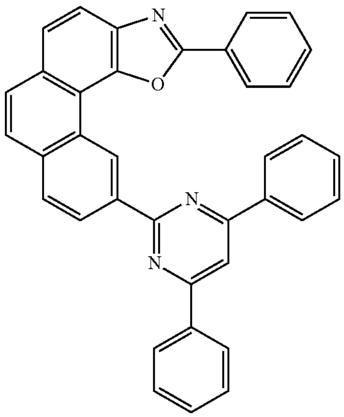
C-2-56
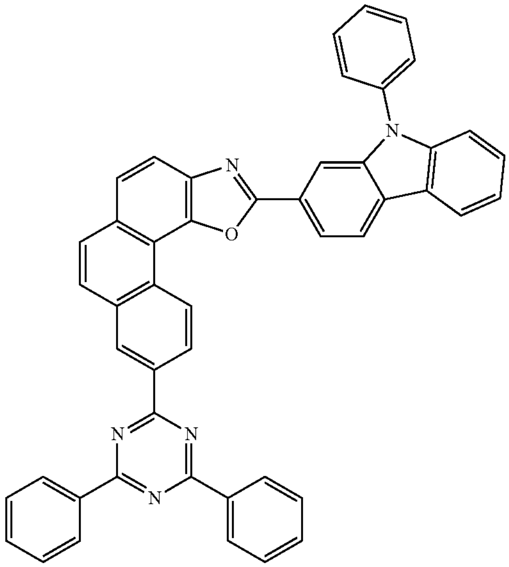

-continued
C-2-57
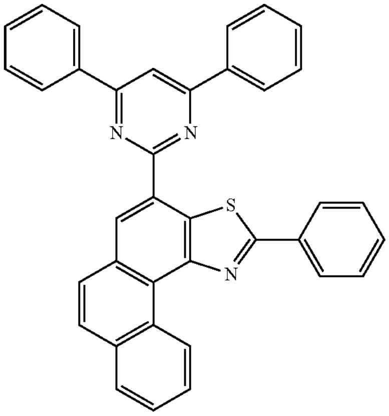
C-2-58
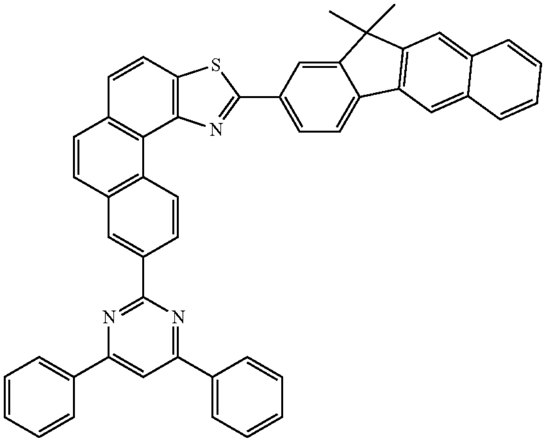
C-2-59
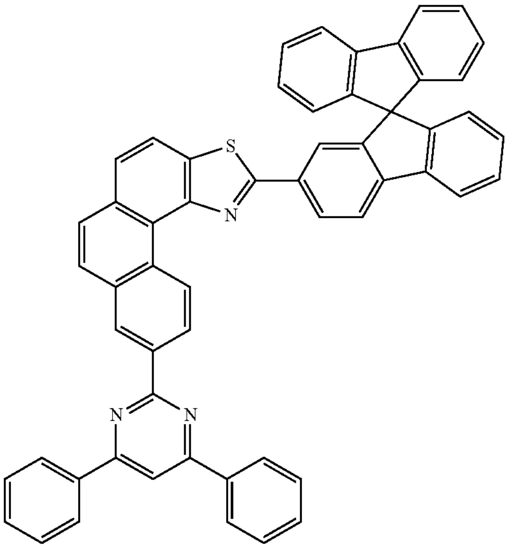
-continued
C-2-60
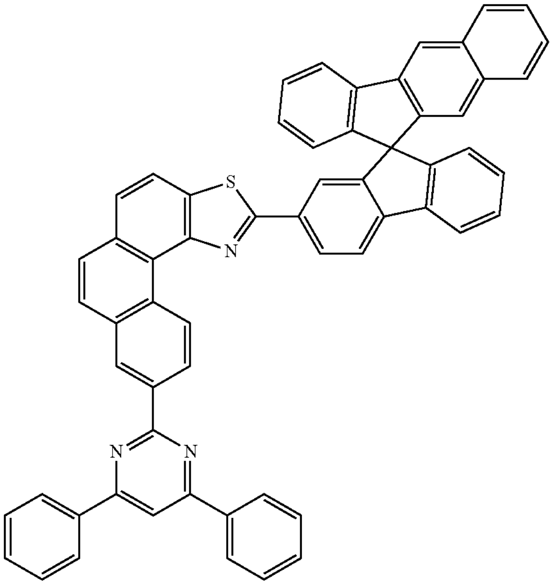
C-2-61
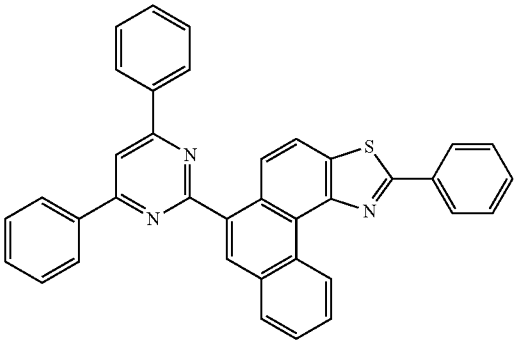
C-2-62
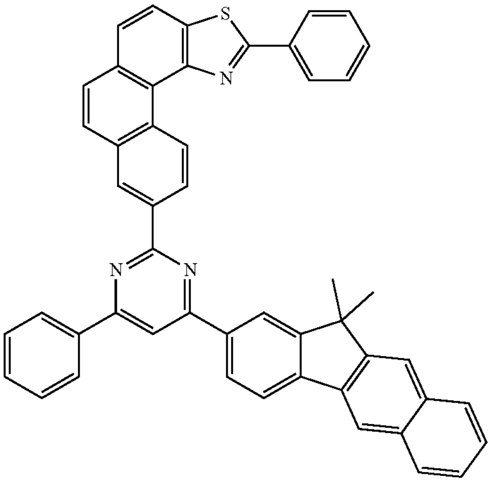

-continued
C-2-63
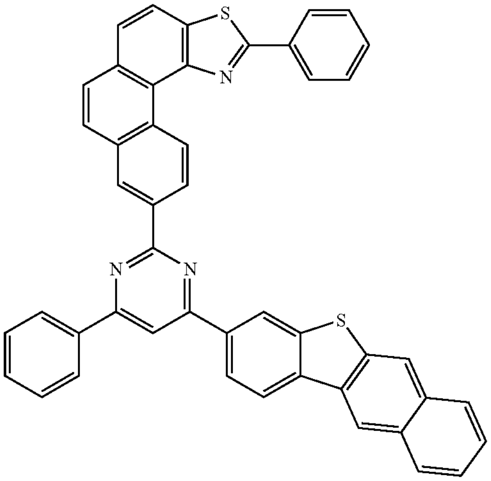
C-2-64
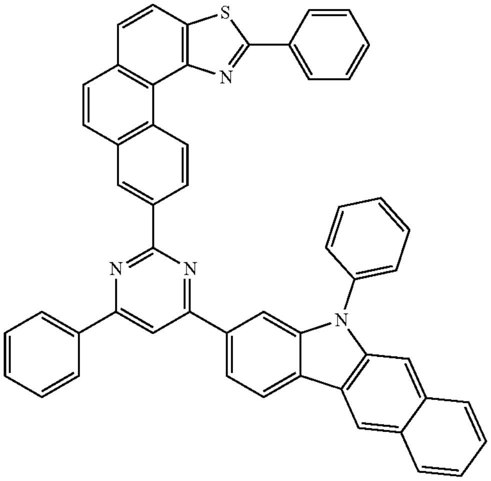
C-2-65
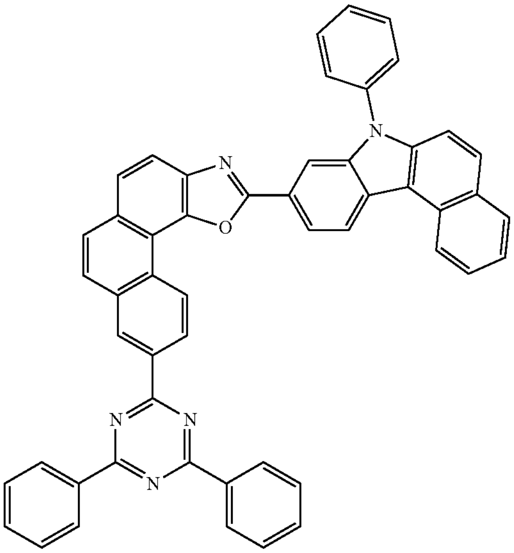
-continued
C-2-66
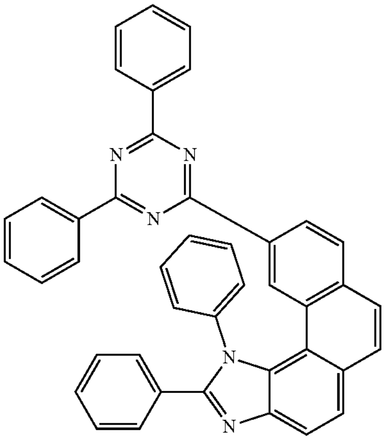
C-2-67
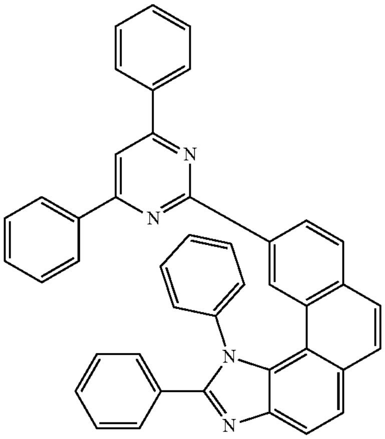
C-2-68
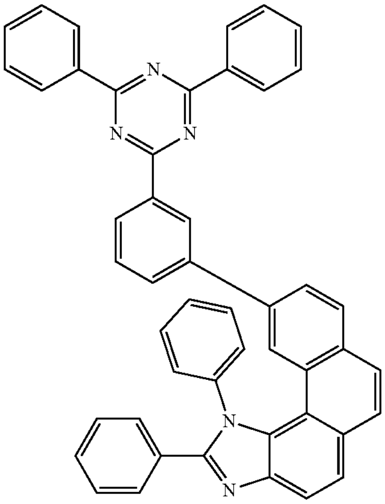

-continued
C-2-69
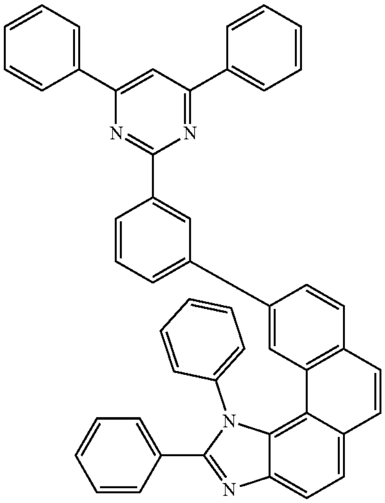
C-2-70
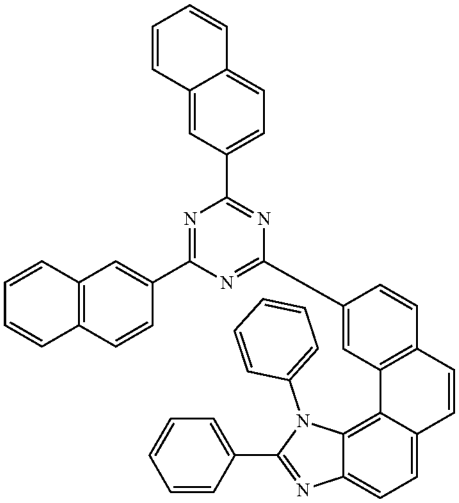
C-2-71
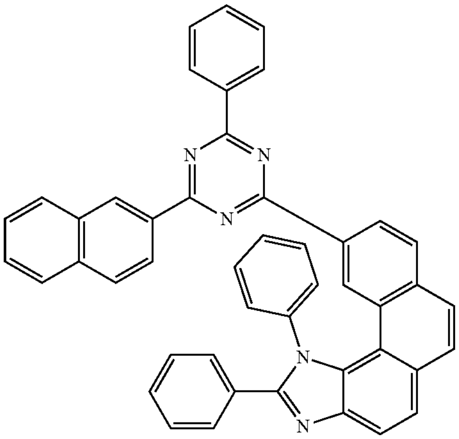
-continued
C-2-72
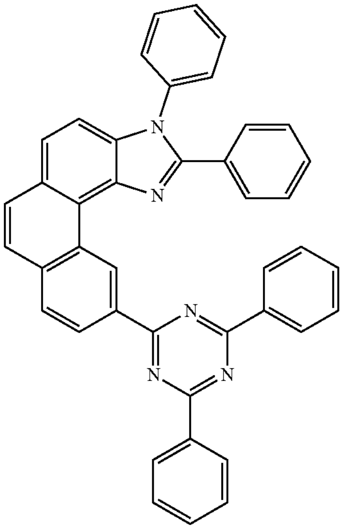
C-2-73
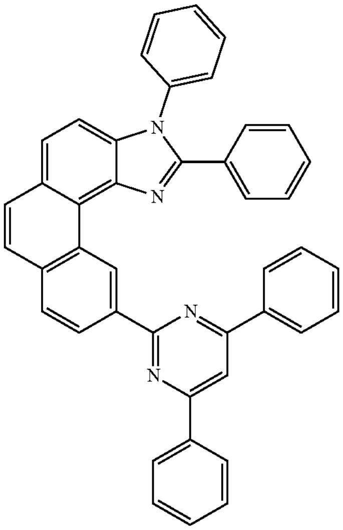
C-2-74
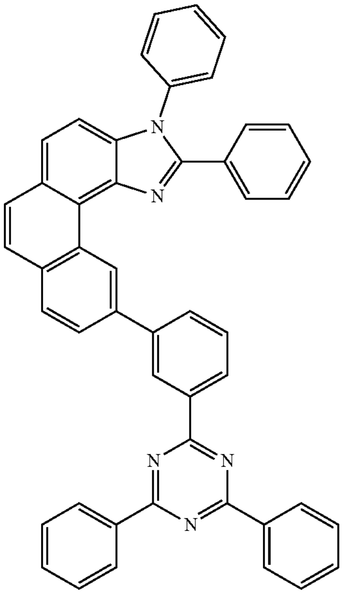

-continued
C-2-75
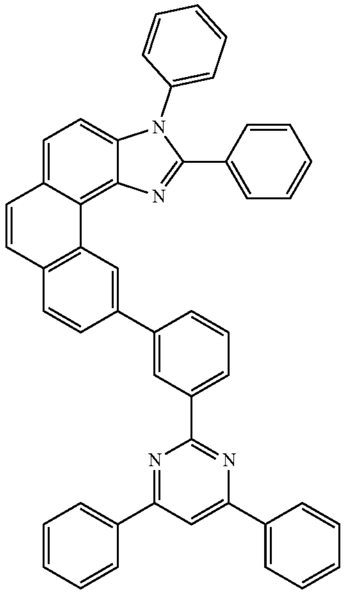
C-2-76
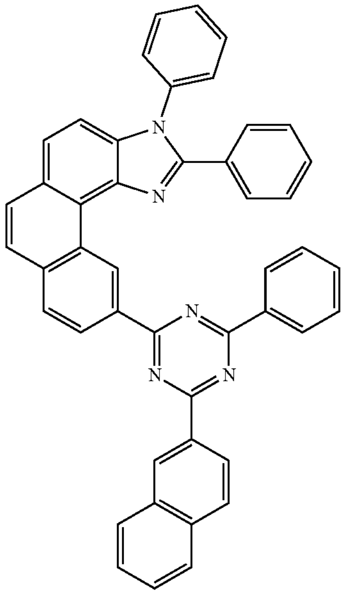
-continued
C-2-77
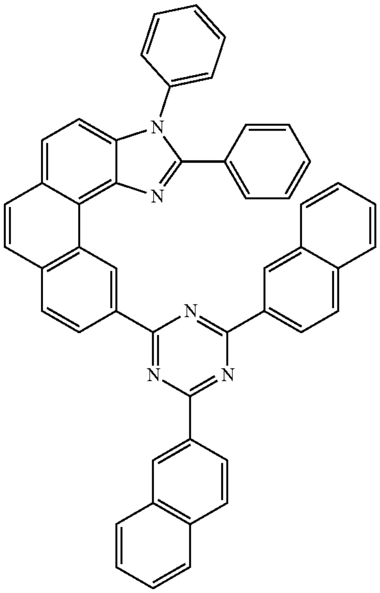
C-2-78
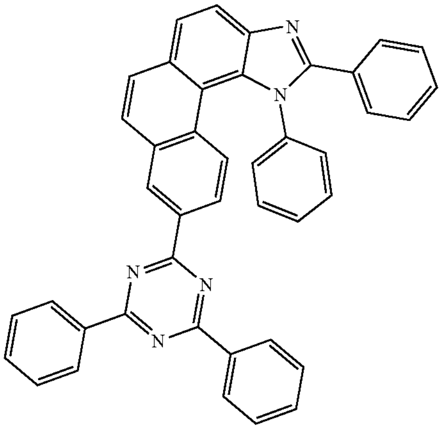
C-2-79
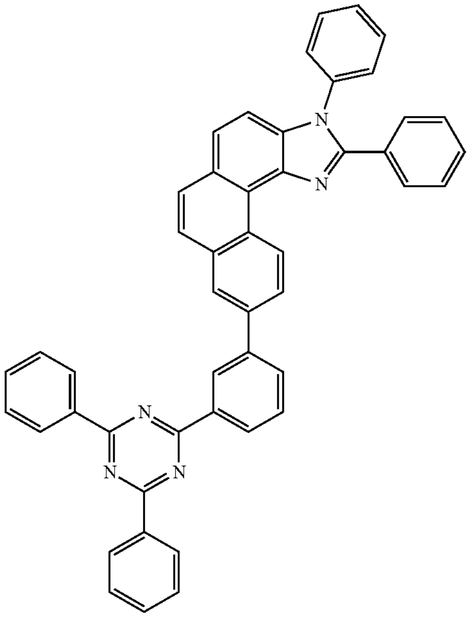

-continued
C-2-80
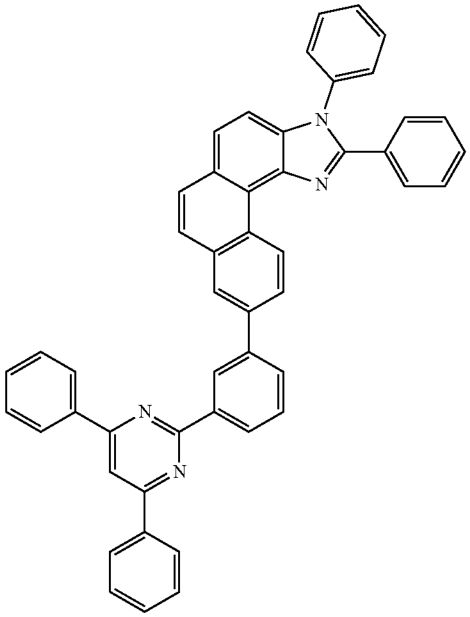
C-2-81
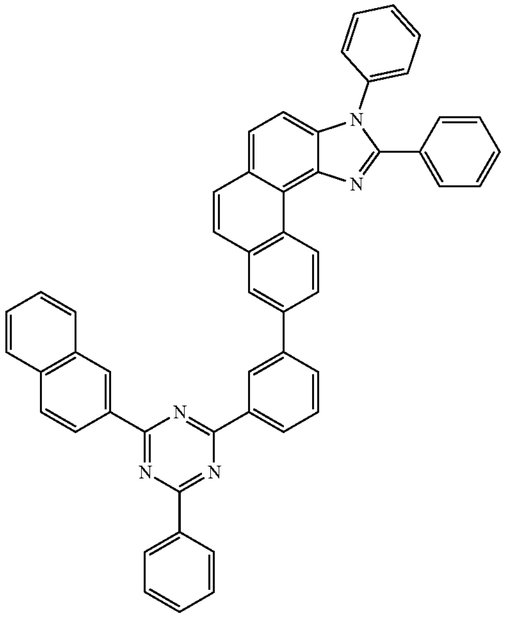
-continued
C-2-82
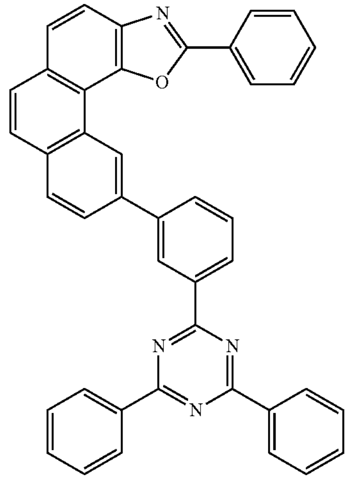
C-2-83
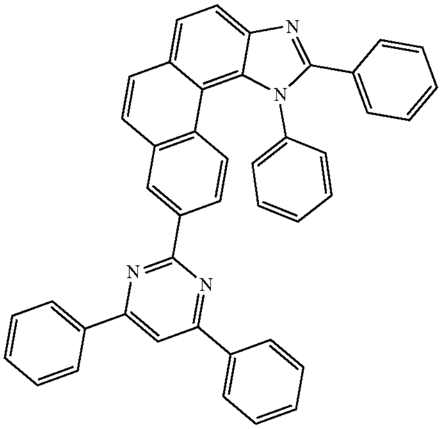
C-2-84
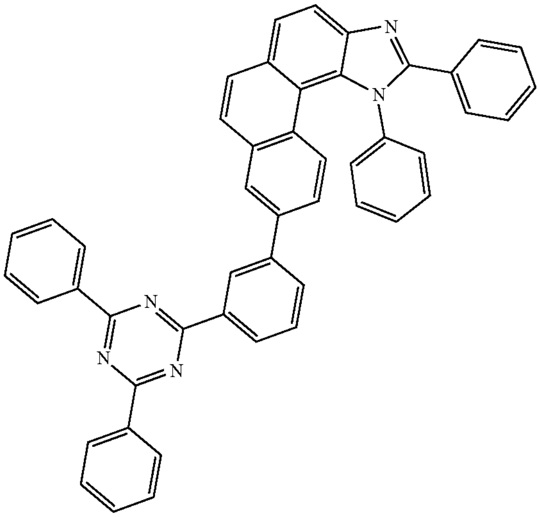

-continued
C-2-85
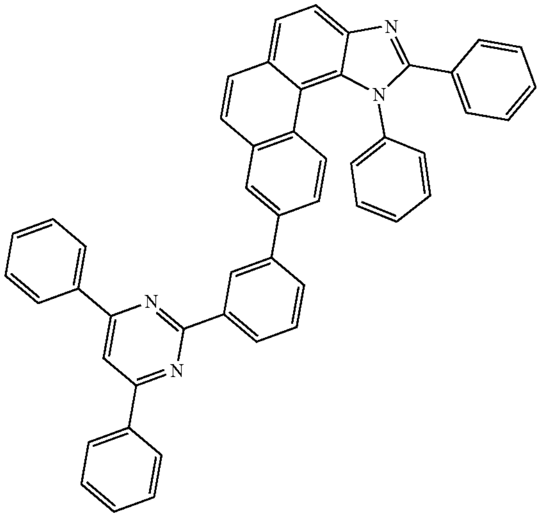
C-2-86
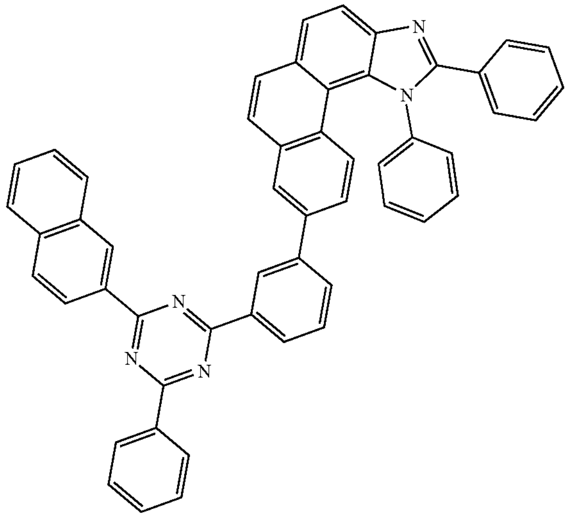
C-2-87
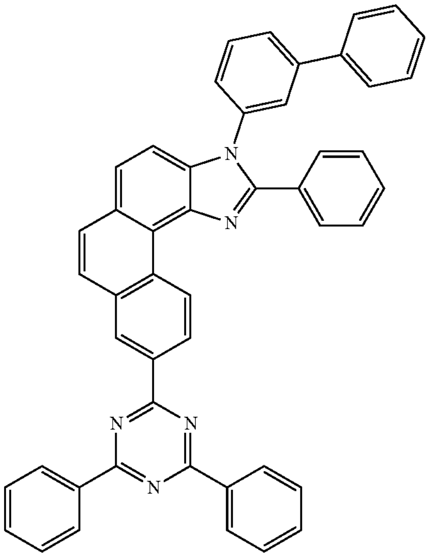
-continued
C-2-88
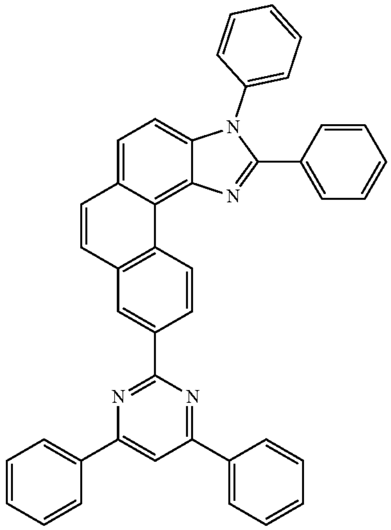
C-2-89
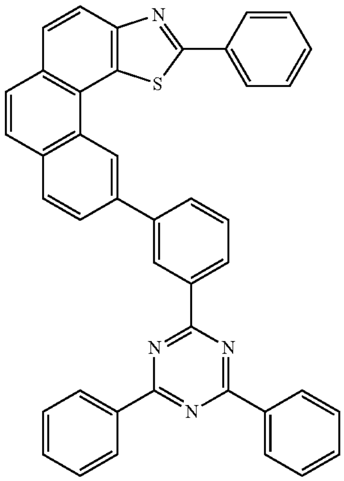
C-2-90
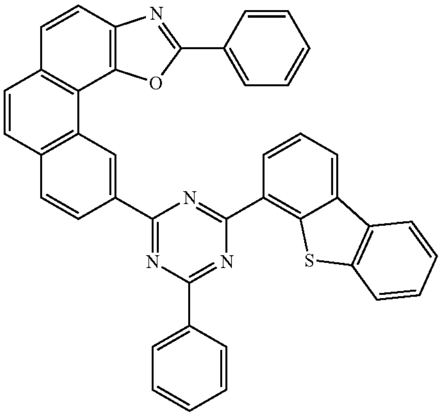

-continued
C-2-91
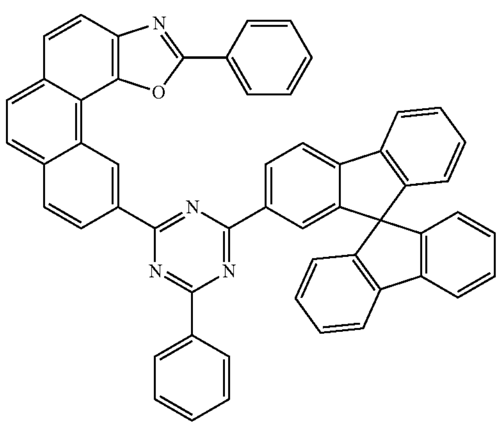
C-2-92
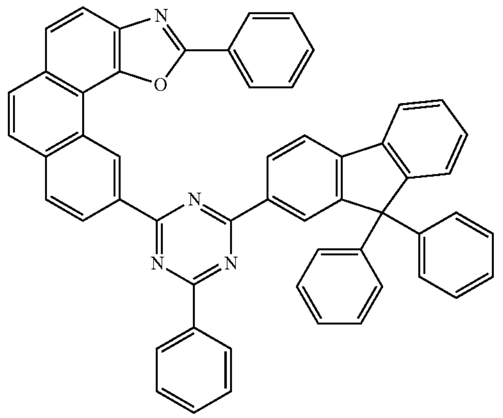
C-2-93
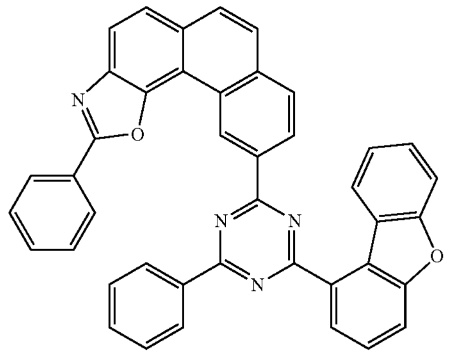
C-2-94
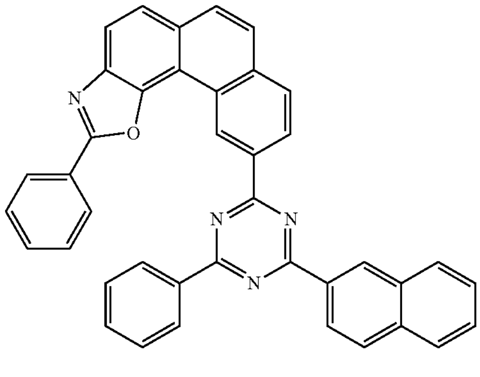
-continued
C-2-95
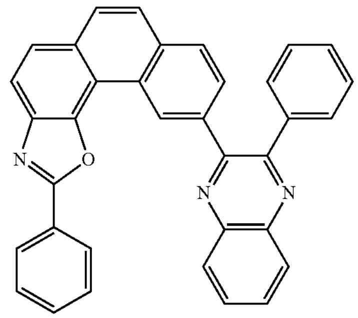
C-2-96
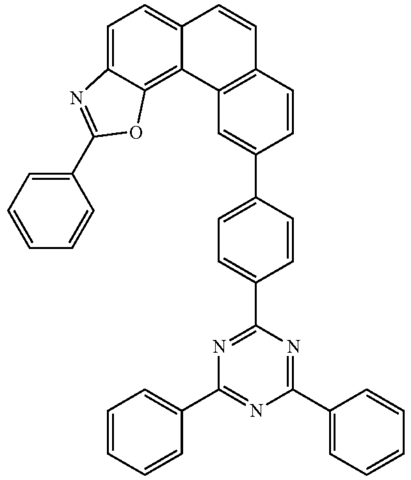
C-2-97
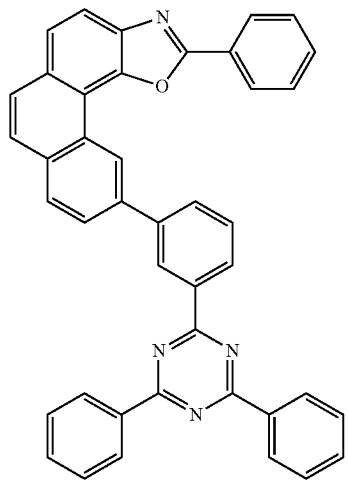
C-2-98
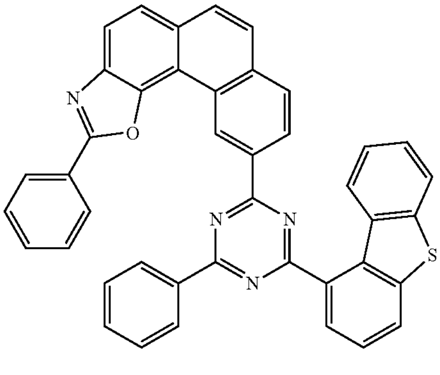

-continued
C-2-99
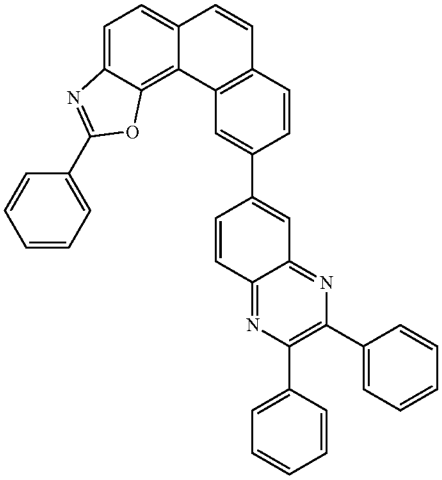
C-2-100
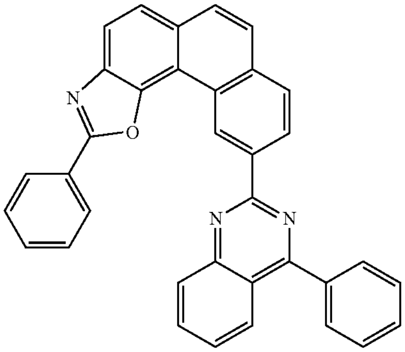
C-2-101
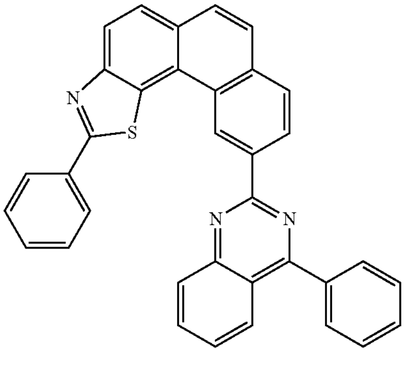
-continued
C-2-102
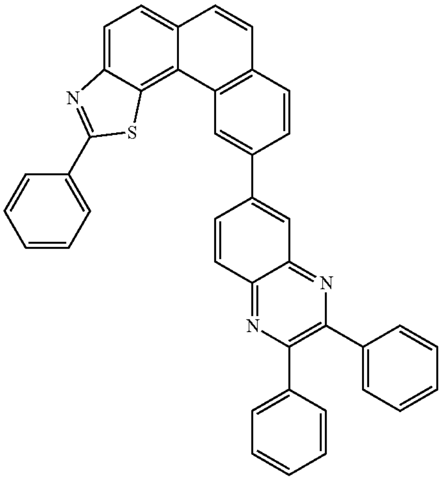
C-2-103
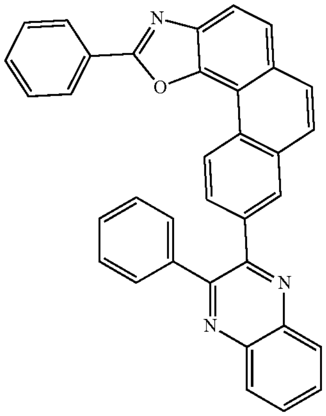
C-2-104
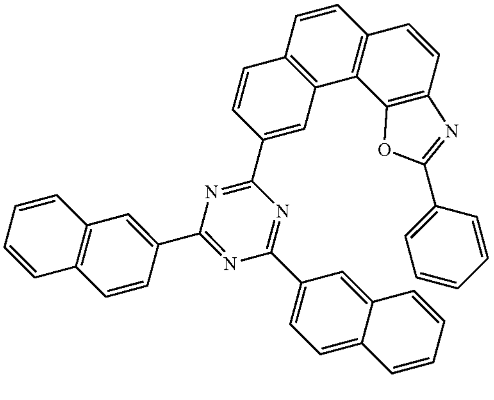

-continued
C-2-105
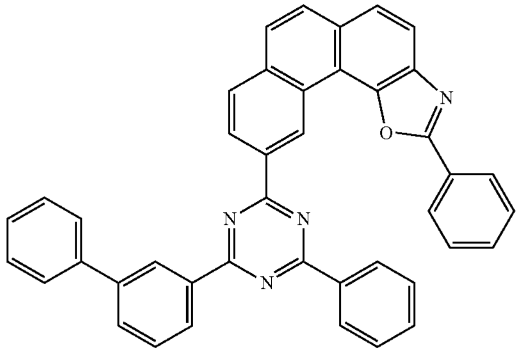
C-2-106
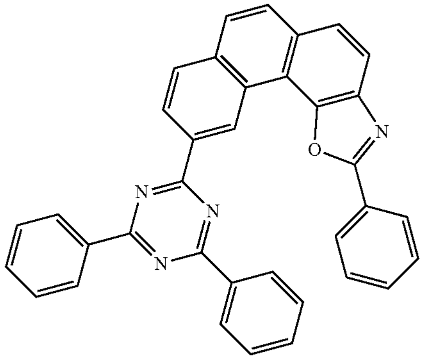
C-2-107
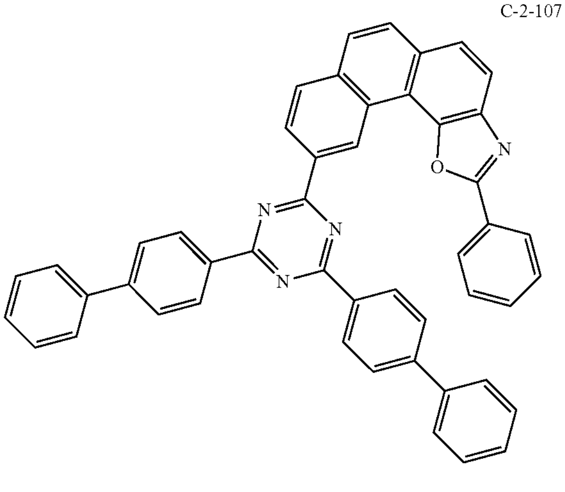
-continued
C-2-108
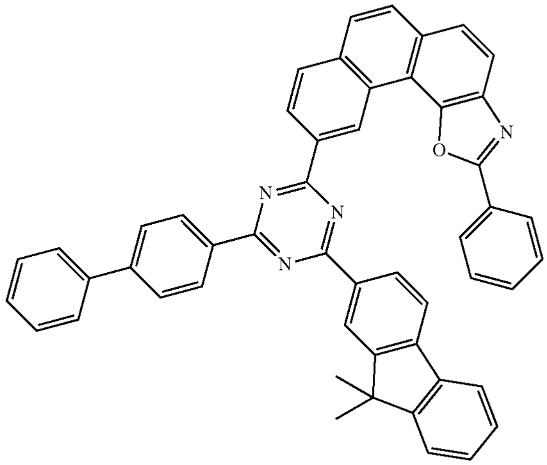
C-2-109
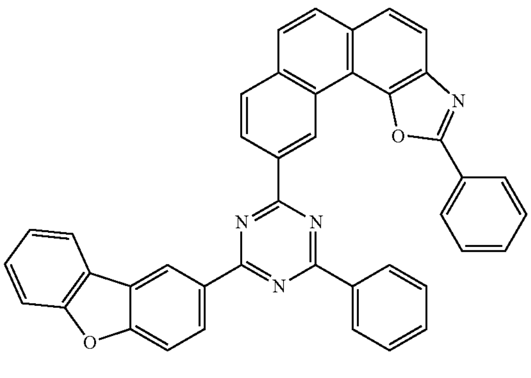

-continued

C-2-110

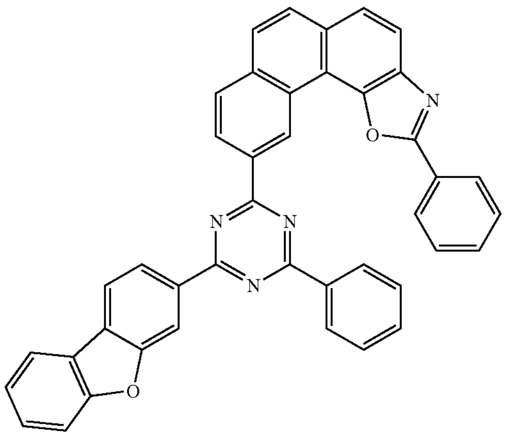

C-2-111

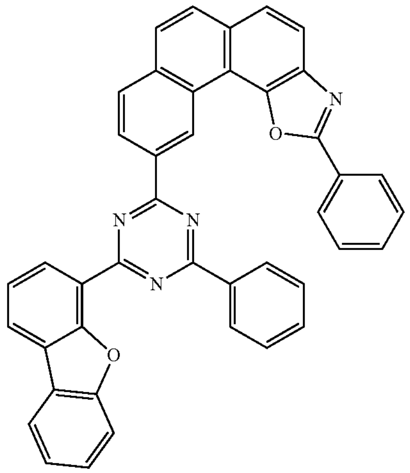

-continued

C-2-112

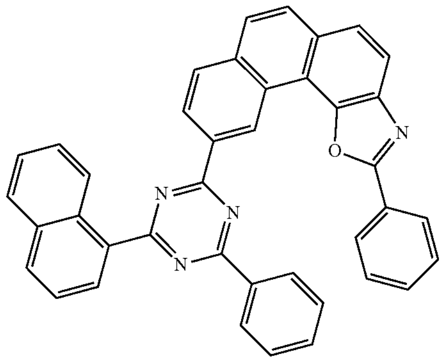

The combination of at least one of compounds C-1-1 to C-1-195 and at least one of compounds C-2-1 to C-2-112 may be used in an organic electroluminescent device.

The compounds represented by formula 1 and 2 according to the present disclosure may be prepared by a synthetic method known to one skilled in the art. For example, the compound represented by formula 1 can be prepared by referring to the following reaction schemes 1 to 3, and Korean Patent Appl. Laid-Open Nos. 10-2013-0106255 A (published on Sep. 27, 2013), 10-2012-0042633 A (published on May 3, 2012), 10-2018-0099510 A (published on Sep. 5, 2018), and 10-2015-0066202 A (published on Jun. 16, 2015); and the compound represented by formula 2 can be prepared by referring to Korean Patent Appl. Laid-Open No. 10-2017-0051198 A (published on May 11, 2017), but are not limited thereto.

[Reaction Scheme 1]

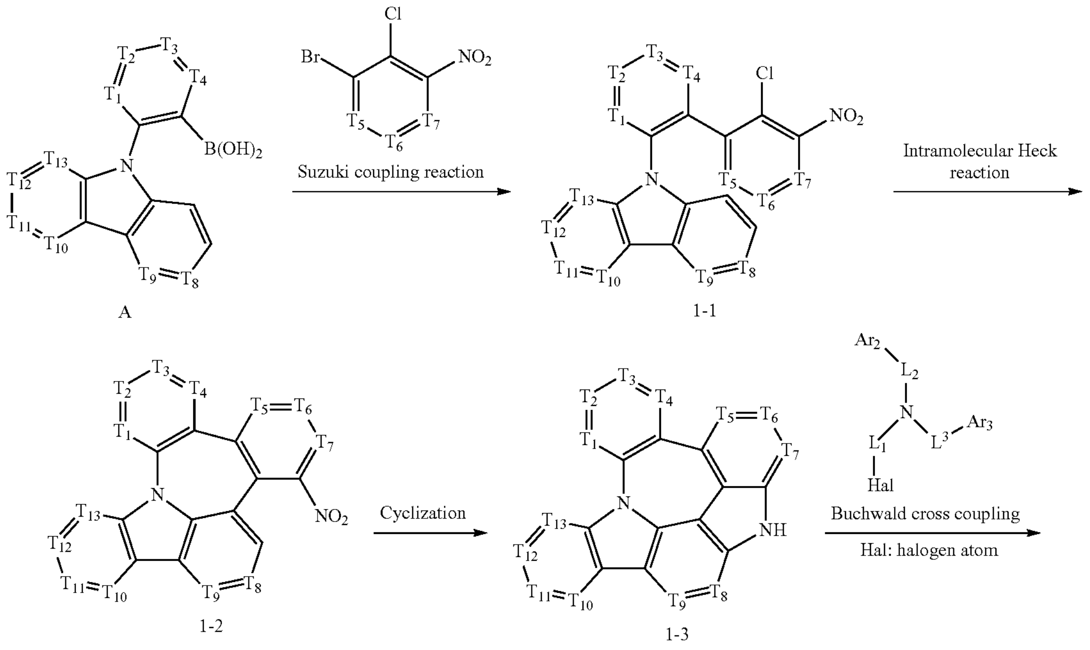

-continued
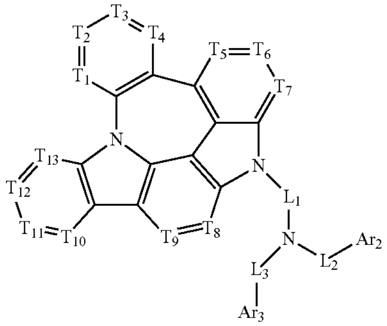
A-1
[Reaction Scheme 2]
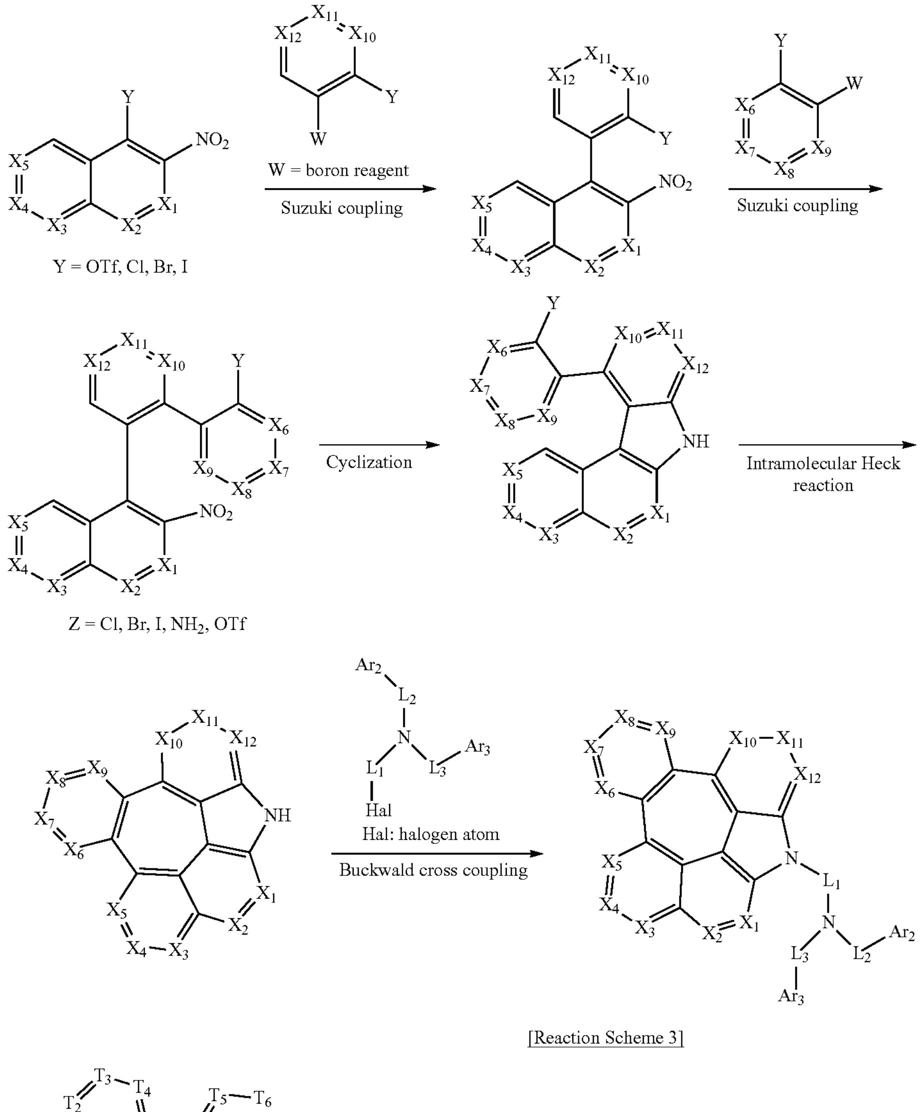
[Reaction Scheme 3]
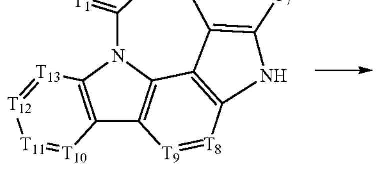

-continued
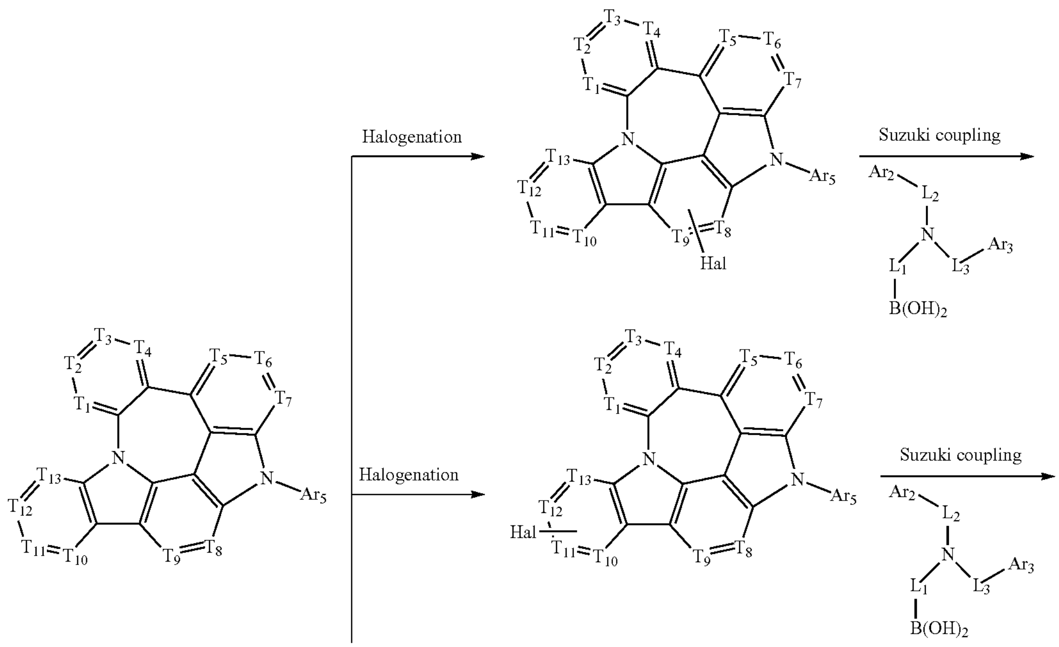
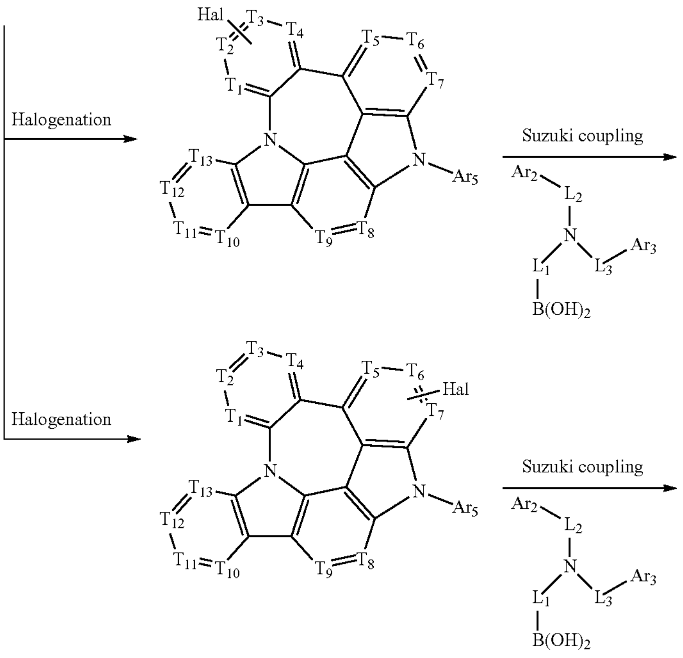

-continued

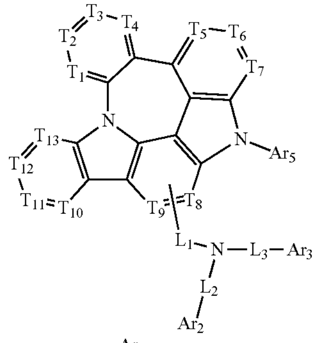

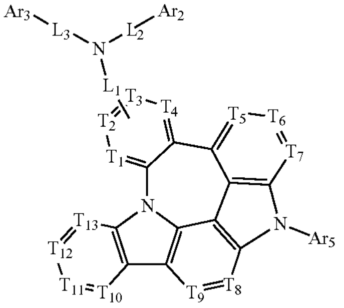

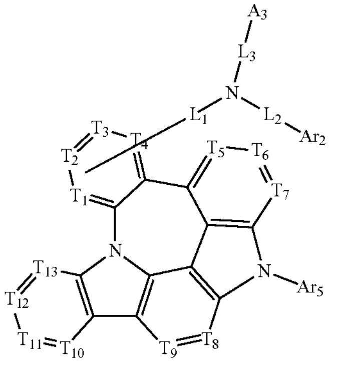

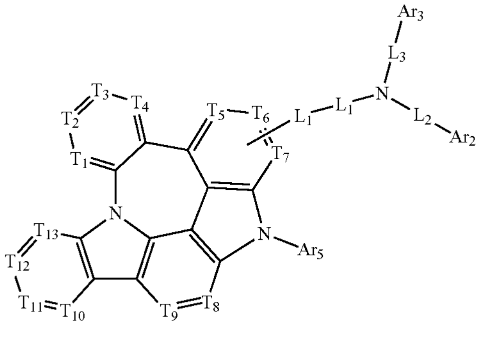

In reaction schemes 1 to 3, $T_1$ to $T_{13}$, $X_1$ to $X_{12}$, $L_1$ to $L_3$, $Ar_2$, and $Ar_3$ are as defined in formulas 1-4 and 1-7 above.

The organic electroluminescent device according to the present disclosure comprises an anode, a cathode, and at least one organic layer between the anode and the cathode. The organic layer may comprise a plurality of organic electroluminescent materials in which the compound represented by formula 1 is included as a first organic electroluminescent material, and the compound represented by formula 2 is included as a second organic electroluminescent material. According to one embodiment of the present disclosure, the organic electroluminescent device comprises an anode, a cathode, and at least one light-emitting layer between the anode and the cathode, and the light-emitting layer comprises a plurality of host materials comprising the compound represented by formula 1 as a first host material, and the compound represented by formula 2 as a second host material.

The light-emitting layer comprises a host and a dopant. The host comprises a plurality of host materials. The plurality of host materials comprises a first host material and a second host material. The first host material may consist of the compound represented by formula 1 alone, or at least one compound represented by formula 1, and may further include conventional materials included in organic electroluminescent materials. The second host material may consist of the compound represented by formula 2 alone, or at least one compound represented by formula 2, and may further include conventional materials included in organic electroluminescent materials. The weight ratio of the first host compound to the second host compound is in the range of about 1:99 to about 99:1, preferably about 10:90 to about 90:10, more preferably about 30:70 to about 70:30, even more preferably about 40:60 to about 60:40, and still more preferably about 50:50.

The light-emitting layer is a layer from which light is emitted, and can be a single layer or a multi-layer in which two or more layers are stacked. In the plurality of host materials according to the present disclosure, the first and second host materials may both be comprised in one layer, or may be respectively comprised in different light-emitting layers. According to one embodiment of the present disclosure, the doping concentration of the dopant compound with respect to the host compound in the light-emitting layer is less than about 20 wt %.

The organic electroluminescent device of the present disclosure may further comprise at least one layer selected from a hole injection layer, a hole transport layer, a hole auxiliary layer, a light-emitting auxiliary layer, an electron transport layer, an electron injection layer, an interlayer, an electron buffer layer, a hole blocking layer, and an electron blocking layer. According to one embodiment of the present disclosure, the organic electroluminescent device may further comprise amine-based compounds in addition to the plurality of host materials of the present disclosure as at least one of a hole injection material, a hole transport material, a hole auxiliary material, a light-emitting material, a light-emitting auxiliary material, and an electron blocking material. Also, according to one embodiment of the present disclosure, the organic electroluminescent device of the present disclosure may further comprise azine-based compounds in addition to the plurality of host materials of the present disclosure as at least one of an electron transport material, an electron injection material, an electron buffer material, and a hole blocking material.

The dopant comprised in the organic electroluminescent device of the present disclosure may be at least one phosphorescent or fluorescent dopant, preferably a phosphorescent dopant. The phosphorescent dopant material applied in the organic electroluminescent device of the present disclosure is not particularly limited, but may be selected from the metallated complex compounds of iridium (Ir), osmium (Os), copper (Cu), and platinum (Pt), preferably selected from ortho-metallated complex compounds of iridium (Ir), osmium (Os), copper (Cu), and platinum (Pt), and more preferably ortho-metallated iridium complex compounds.

The dopant may comprise a compound represented by at least one of the following formulas 101 to 103, but is not limited thereto.

(101)

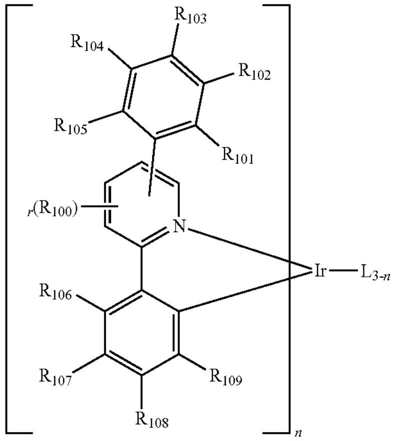

(102)

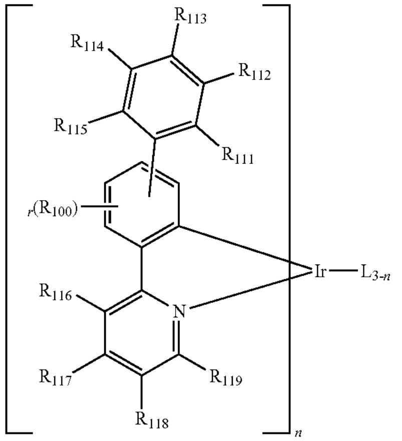

(103)

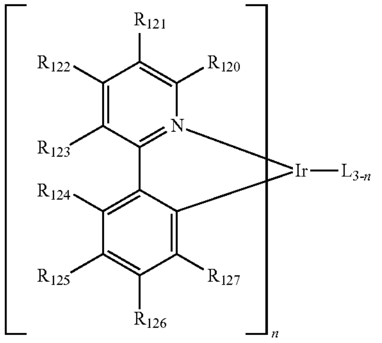

In formulas 101 to 103,

L is selected from the following structures 1 and 2:

[Structure 1]

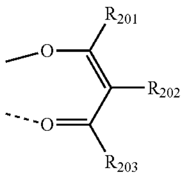

-continued

[Structure 2]

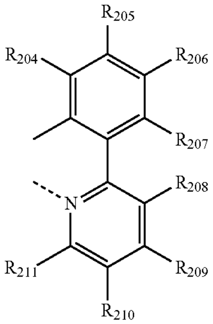

$R_{100}$, each independently, represent hydrogen, deuterium, a substituted or unsubstituted (C1-C30)alkyl, or a substituted or unsubstituted (C3-C30)cycloalkyl;

$R_{101}$ to $R_{109}$, and $R_{111}$ to $R_{123}$, each independently, represent hydrogen, deuterium, a halogen, a (C1-C30) alkyl unsubstituted or substituted with deuterium and/or a halogen(s), a substituted or unsubstituted (C3-C30) cycloalkyl, a substituted or unsubstituted (C6-C30)aryl, a cyano, or a substituted or unsubstituted (C1-C30) alkoxy; or may be linked to adjacent Rici to $R_{109}$ and $R_{111}$ to $R_{123}$, to form a ring(s). Specifically, $R_{106}$ to $R_{109}$ may be linked to adjacent $R_{106}$ to $R_{109}$ to form a ring, e.g., an indene ring unsubstituted or substituted with an alkyl(s), a benzothiophene ring unsubstituted or substituted with an alkyl(s), or a benzofuran ring unsubstituted or substituted with an alkyl(s); $R_{120}$ to $R_{123}$ may be linked to adjacent $R_{120}$ to $R_{123}$ to form a ring, and for example, $R_{120}$ and $R_{121}$ may be linked to each other to form a benzene ring unsubstituted or substituted with at least one of an alkyl(s), an aryl(s), an arylalkyl(s), and an alkylaryl(s), a fluorene ring unsubstituted or substituted with an alkyl(s), a dibenzofuran ring, or a dibenzothiophene ring;

$R_{124}$ to $R_{127}$, each independently, represent hydrogen, deuterium, a halogen, a substituted or unsubstituted (C1-C30)alkyl, or a substituted or unsubstituted (C6-C30)aryl; or may be linked to adjacent $R_{124}$ to $R_{127}$ to form a ring(s), e.g., an indene ring unsubstituted or substituted with an alkyl(s), a benzothiophene ring unsubstituted or substituted with an alkyl(s), or a benzofuran ring unsubstituted or substituted with an alkyl (s);

$R_{201}$ to $R_{211}$, each independently, represent hydrogen, deuterium, a halogen, a (C1-C30)alkyl unsubstituted or substituted with deuterium and/or a halogen(s), a substituted or unsubstituted (C3-C30)cycloalkyl, or a (C6-C30)aryl unsubstituted or substituted with an alkyl(s) and/or deuterium; or may be linked to adjacent $R_{201}$ to $R_{211}$ to form a ring, e.g., an indene ring unsubstituted or substituted with an alkyl(s), a benzothiophene ring unsubstituted or substituted with an alkyl(s), or a benzofuran ring unsubstituted or substituted with an alkyl (s);

r, each independently, represents an integer of 1 to 3, where if r, each independently, is an integer of 2 or more, each of $R_{100}$ may be the same or different; and n represents an integer of 1 to 3.

The specific examples of the dopant compound are as follows, but are not limited thereto.

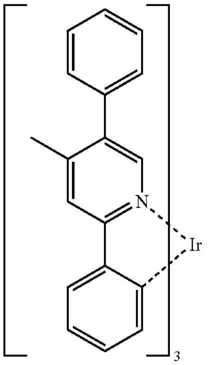

D-1

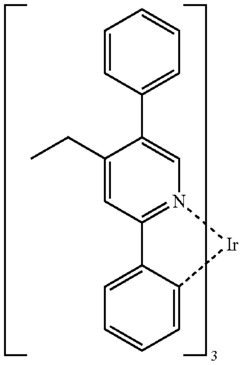

D-2

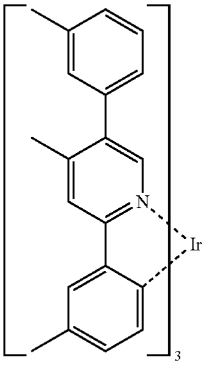

D-3

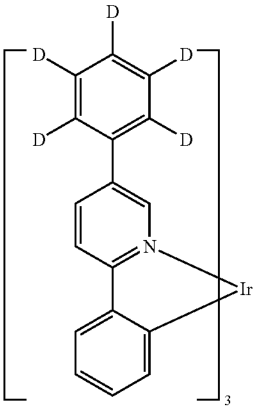

D-4

-continued
D-5
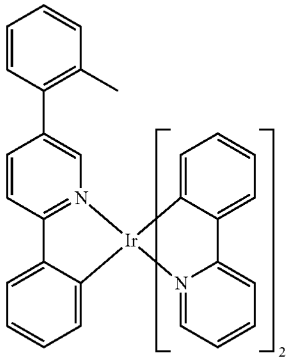
D-6
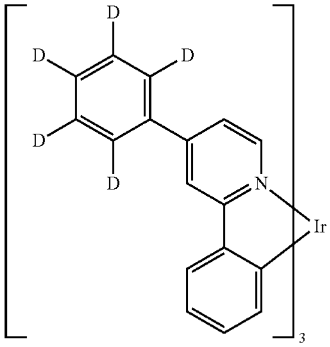
D-7
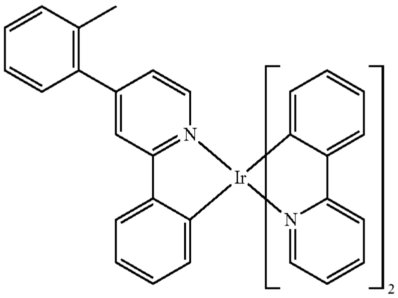
D-8
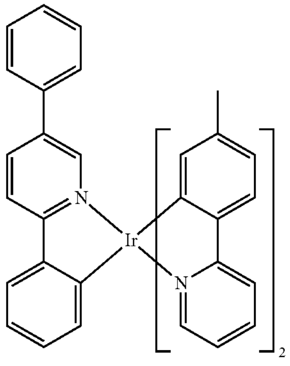
-continued
D-9
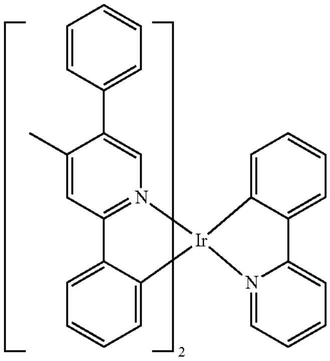
D-10
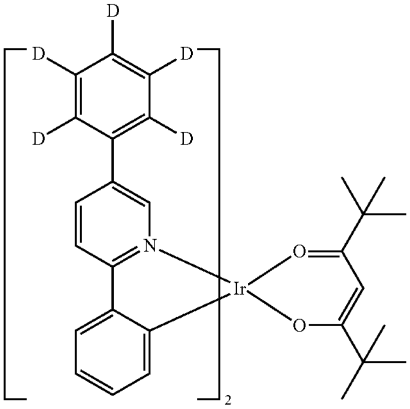
D-11
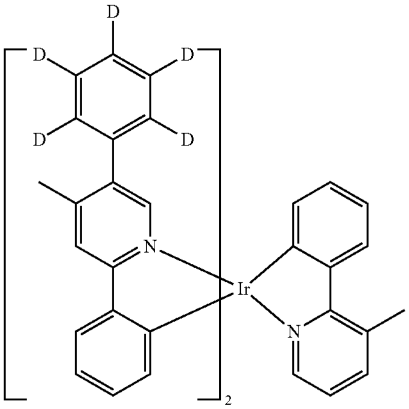
D-12
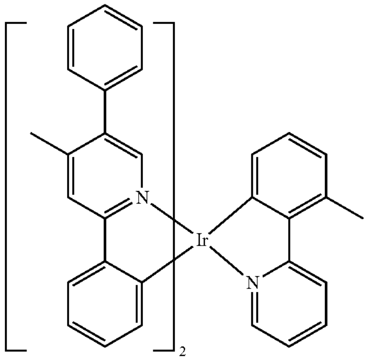

-continued
D-13
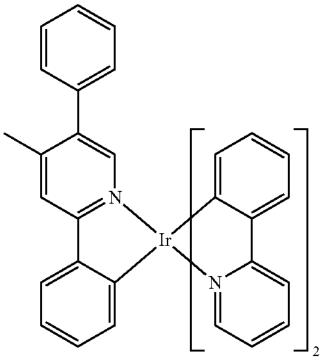
D-14
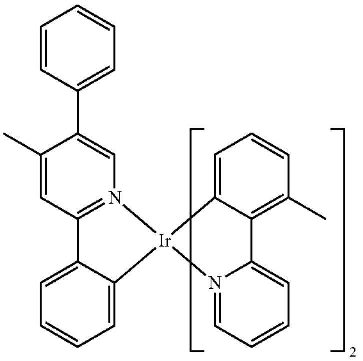
D-15
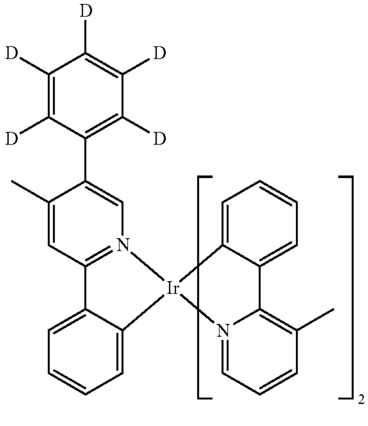
D-16
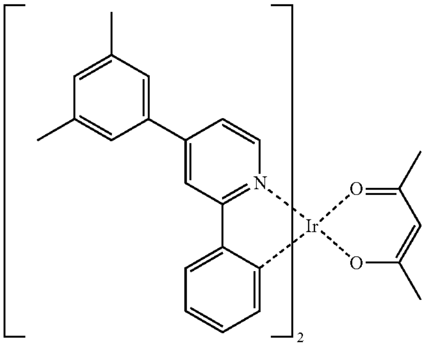
-continued
D-17
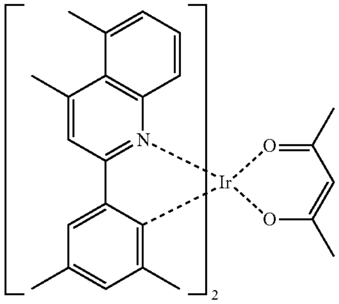
D-18
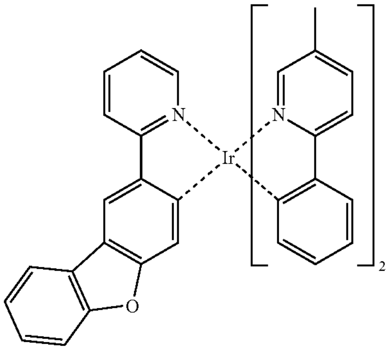
D-19
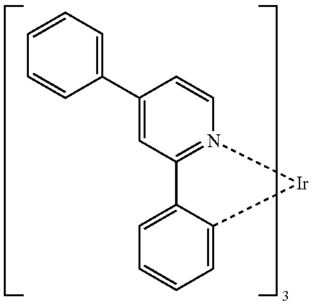
D-20
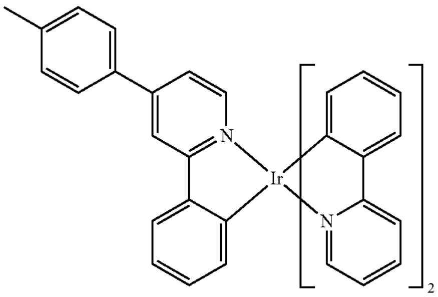
D-21
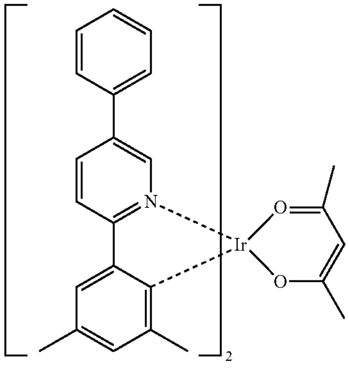

-continued
D-22
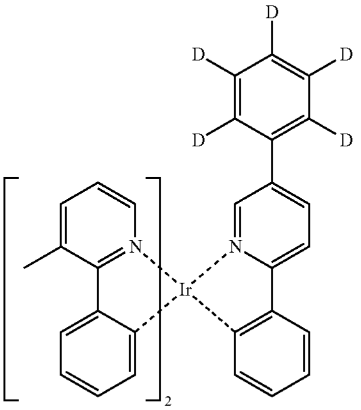
D-23
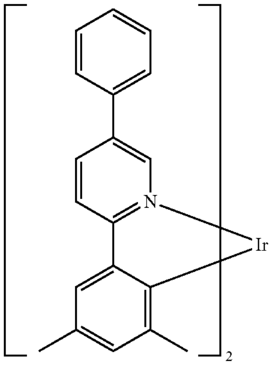
D-24
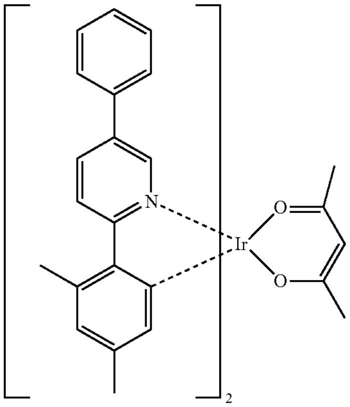
D-25
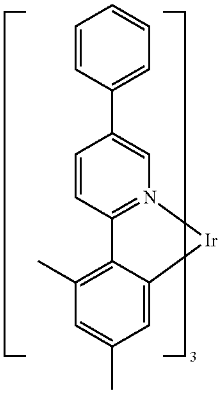
-continued
D-26
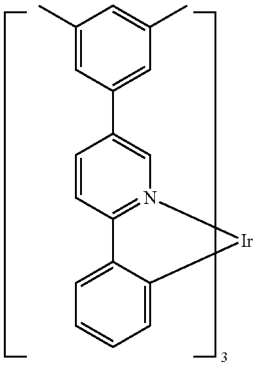
D-27
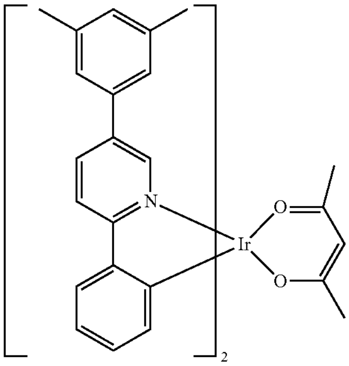
D-28
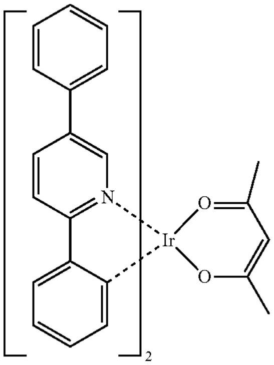
D-29
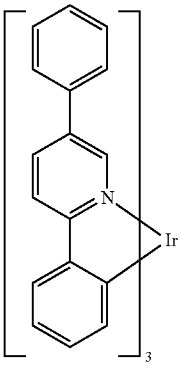

-continued
D-30
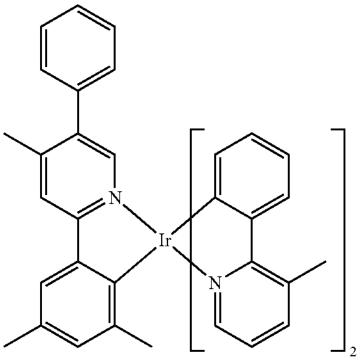
D-31
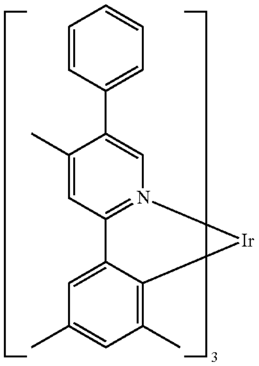
D-32
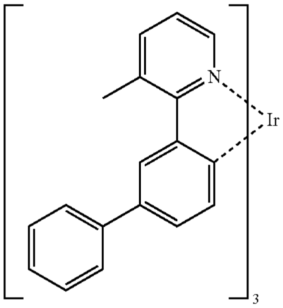
D-33
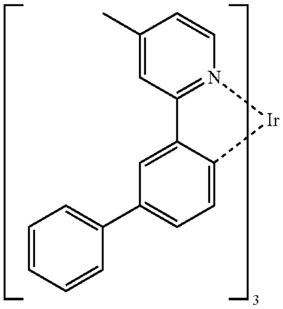
-continued
D-34
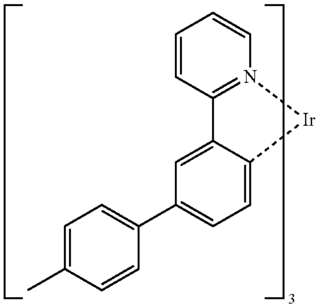
D-35
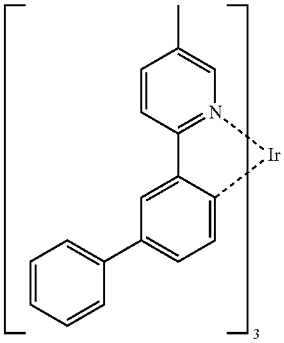
D-36
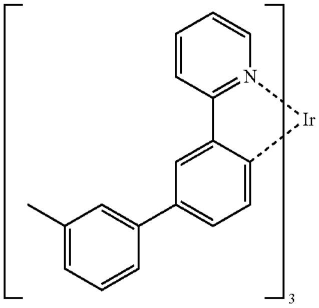
D-37
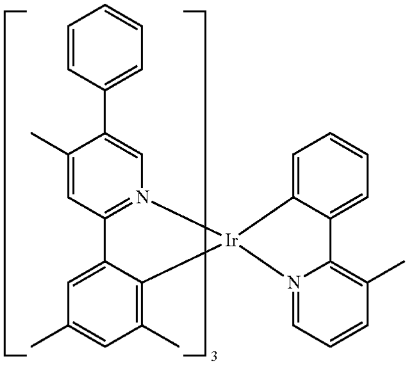

-continued
D-38
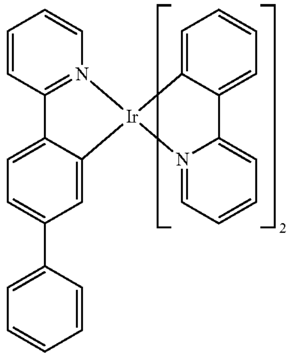
D-39
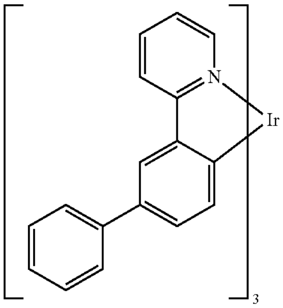
D-40
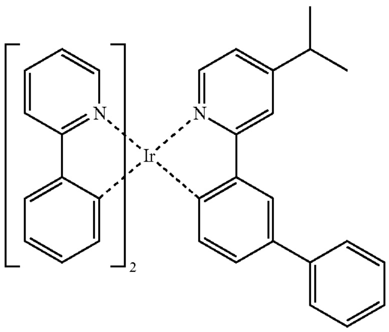
D-41
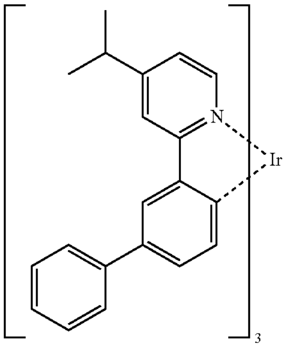
-continued
D-42
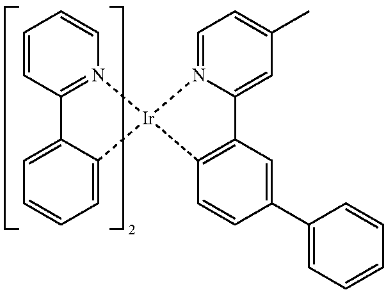
D-43
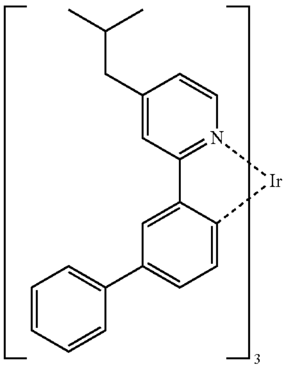
D-44
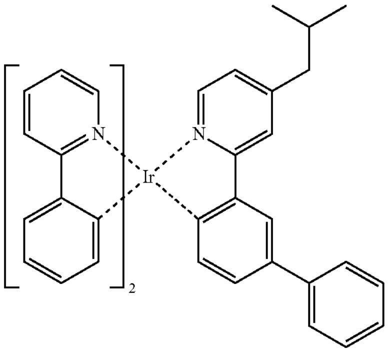
D-45
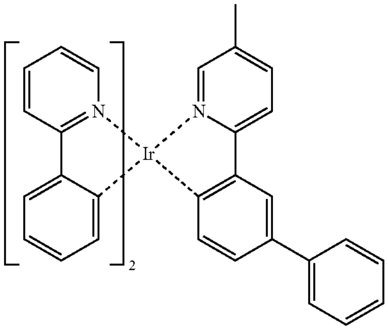

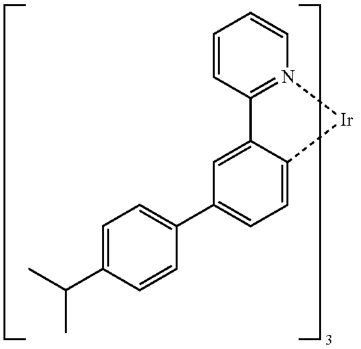
D-46
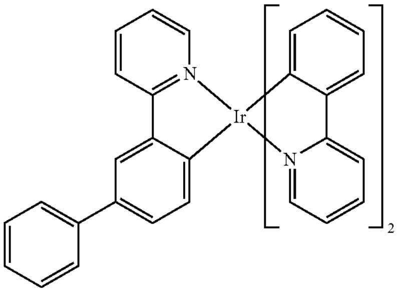
D-47
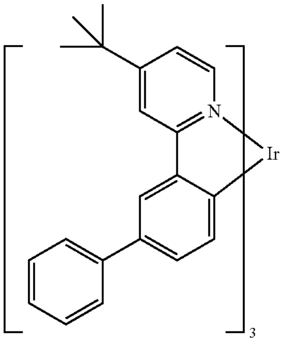
D-48
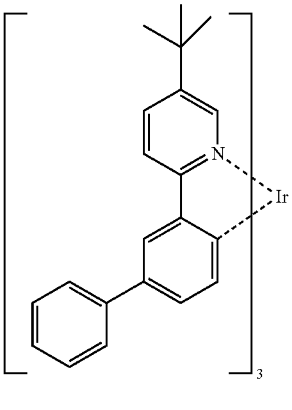
D-49
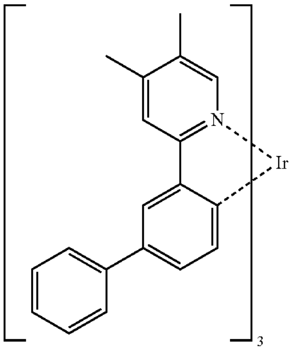
D-50
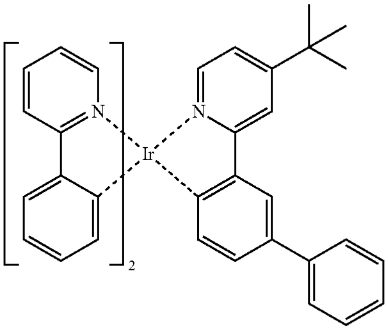
D-51
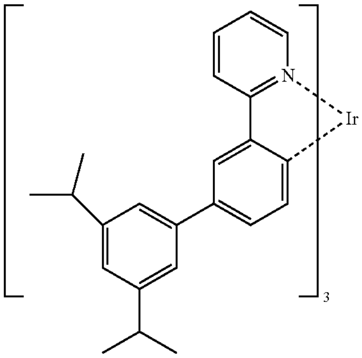
D-52
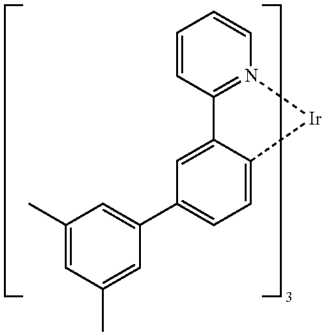
D-53

-continued
D-54
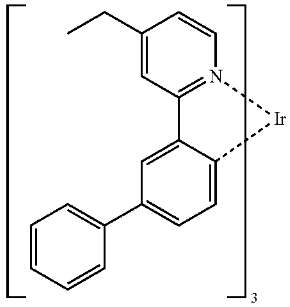
D-55
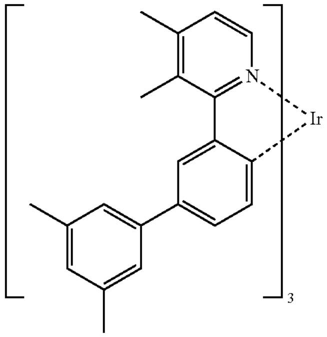
D-56
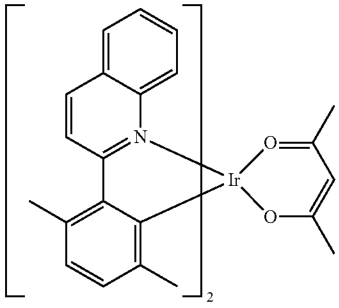
D-57
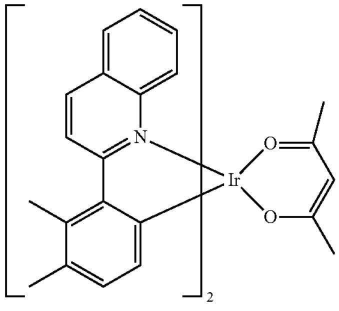
-continued
D-58
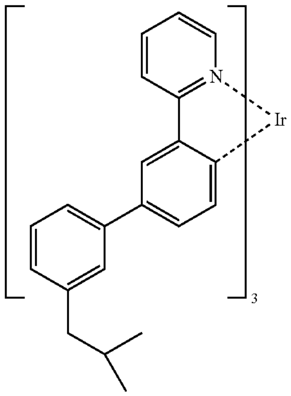
D-59
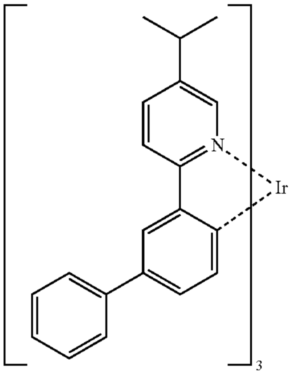
D-60
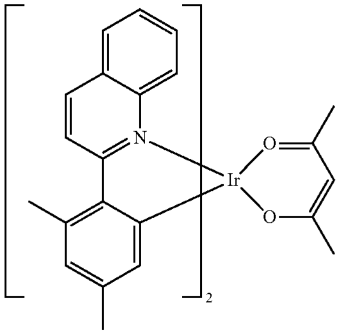
D-61
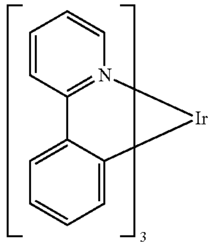

-continued
D-62
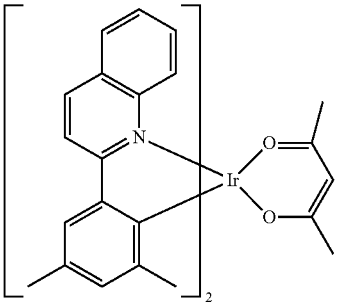
D-63
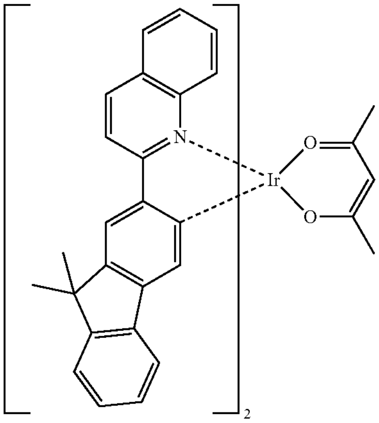
D-64
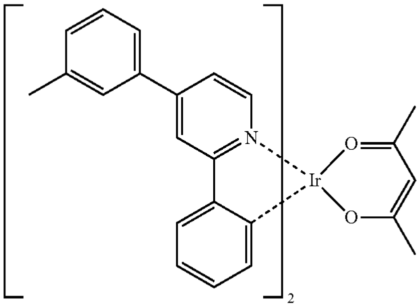
D-65
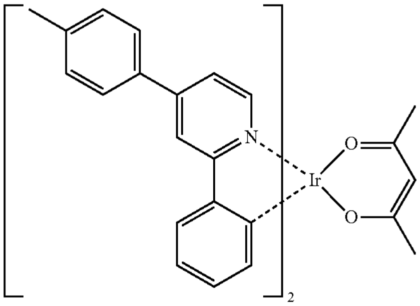
-continued
D-66
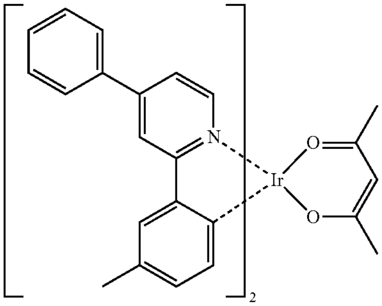
D-67
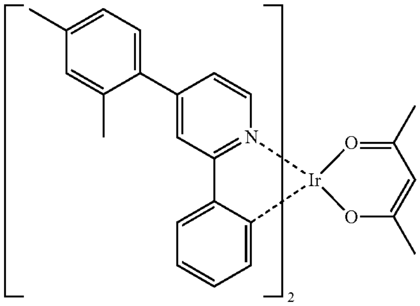
D-68
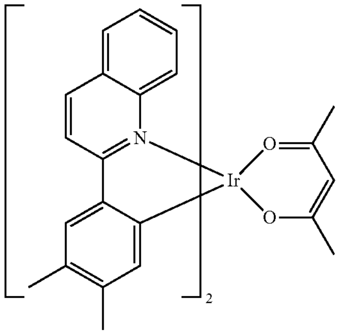
D-69
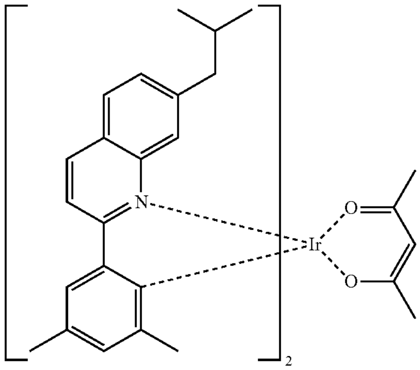
D-70
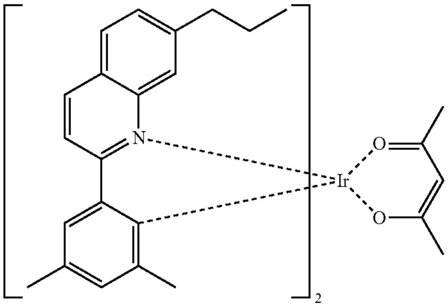

-continued
D-71
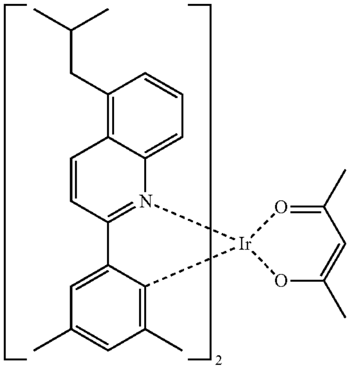
D-72
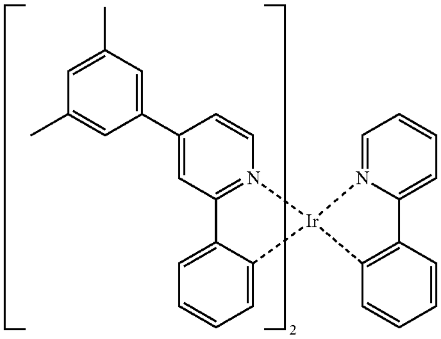
D-73
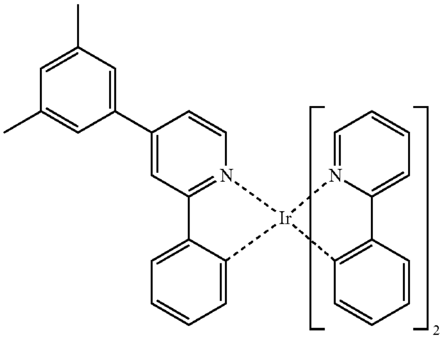
D-74
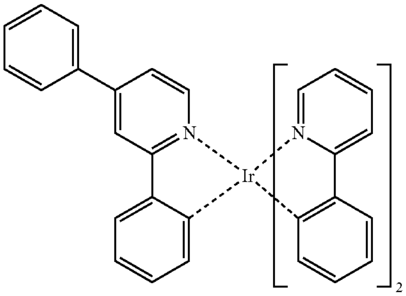
-continued
D-75
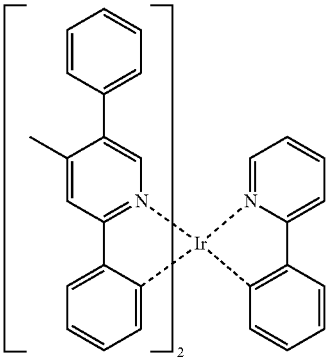
D-76
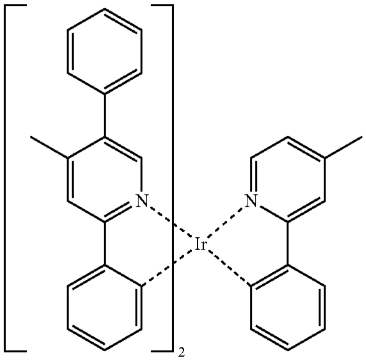
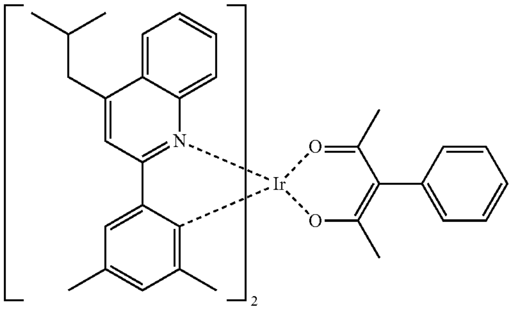
D-78
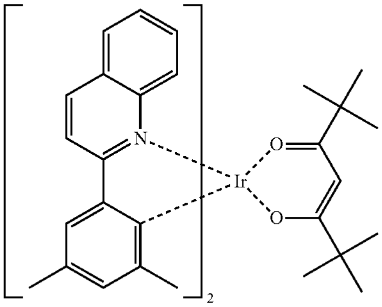

-continued
D-79
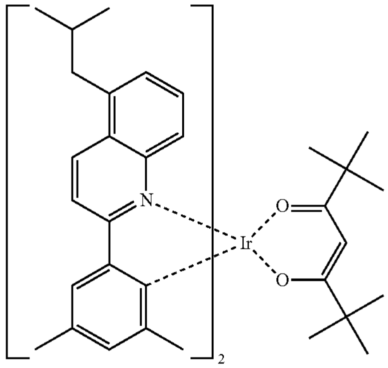
D-80
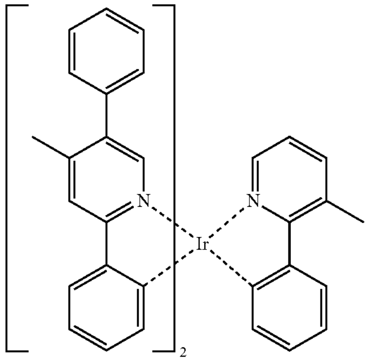
D-81
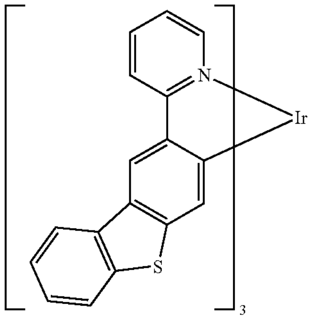
D-82
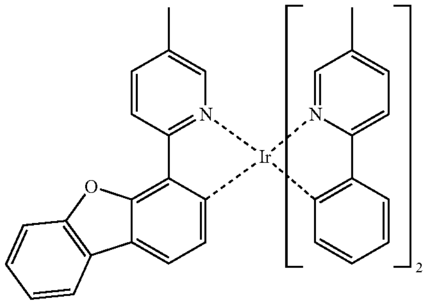
-continued
D-83
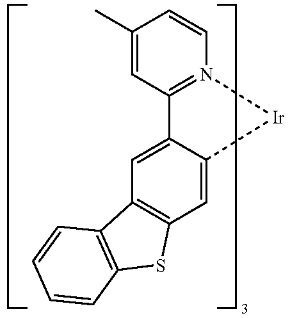
D-84
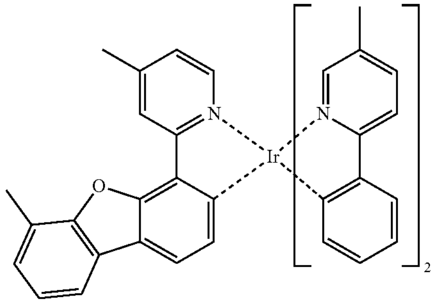
D-85
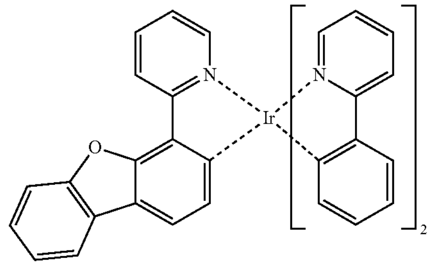
D-86
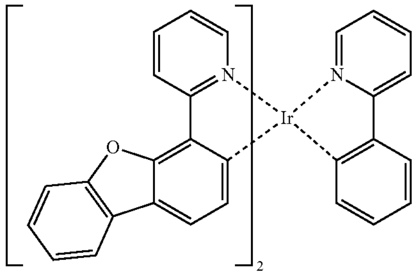
D-87
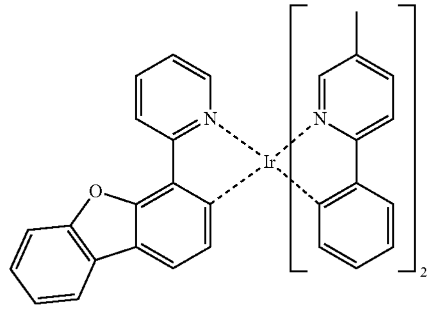

-continued
D-88
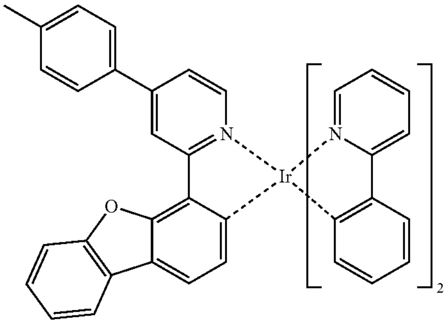
D-89
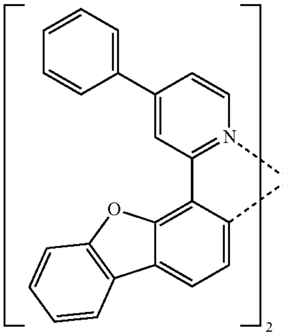
D-90
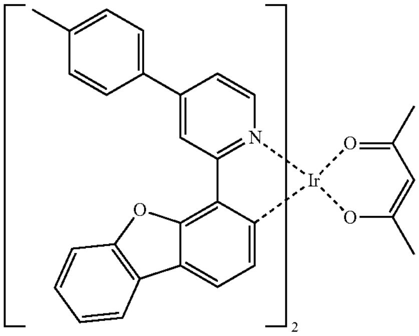
D-91
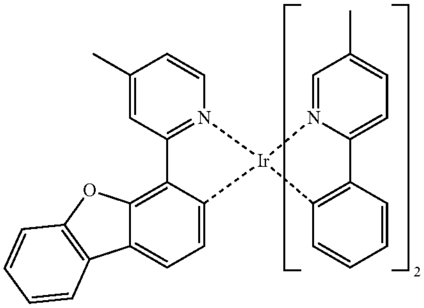
D-92
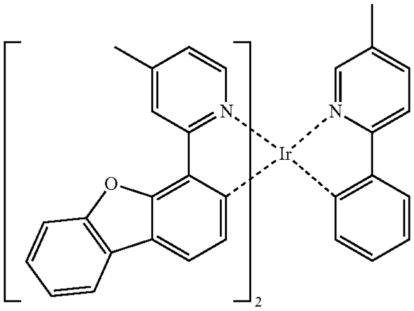
-continued
D-93
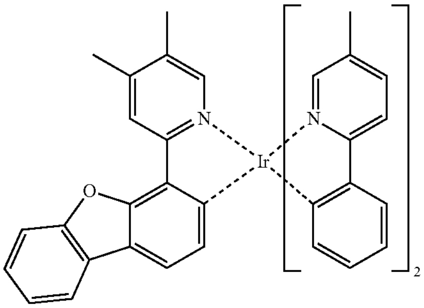
D-94
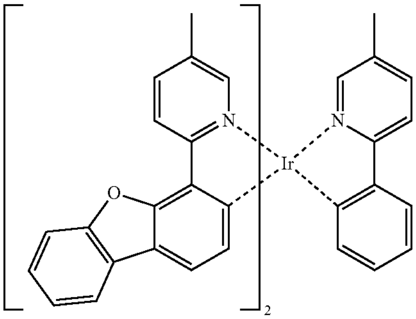
D-95
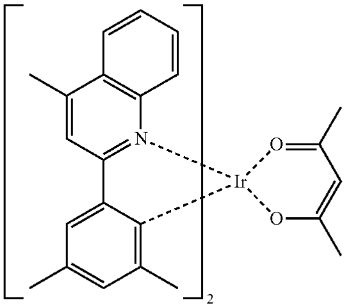
D-96
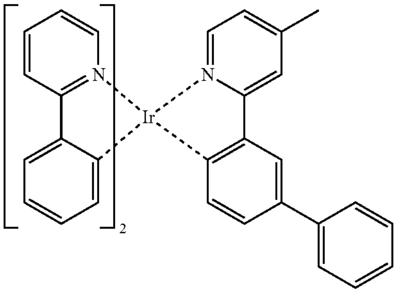
D-97
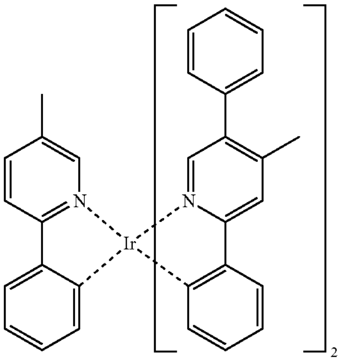

-continued
D-98
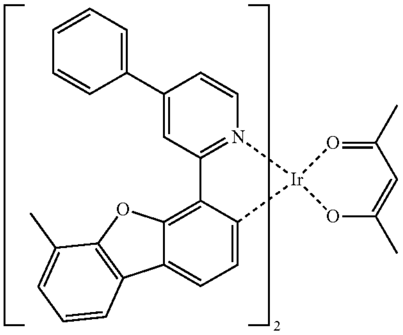
D-99
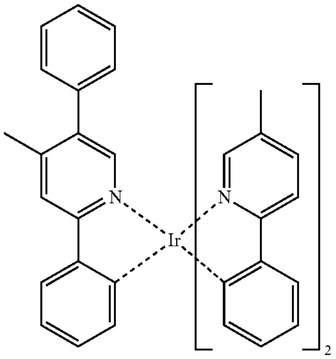
D-100
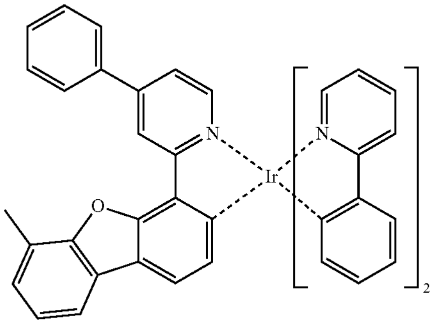
D-101
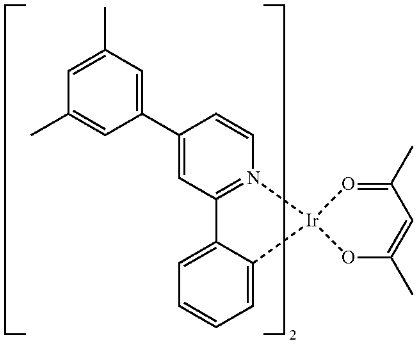
-continued
D-102
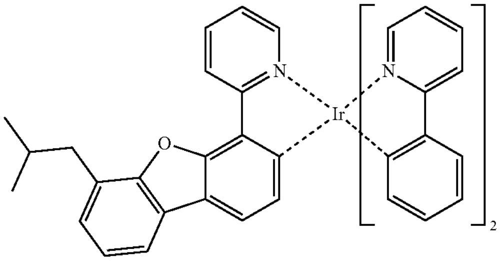
D-103
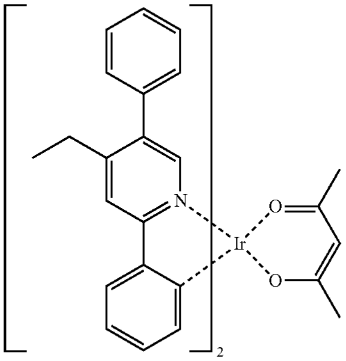
D-104
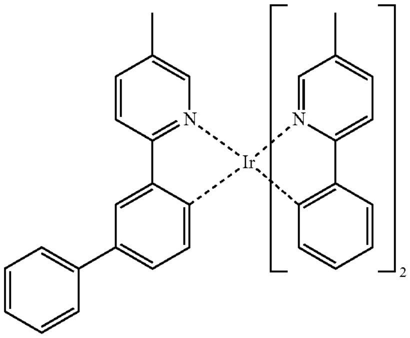
D-105
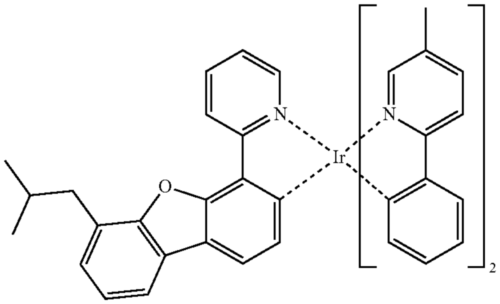
D-106
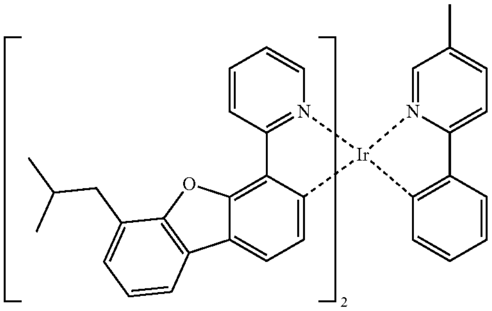

D-107
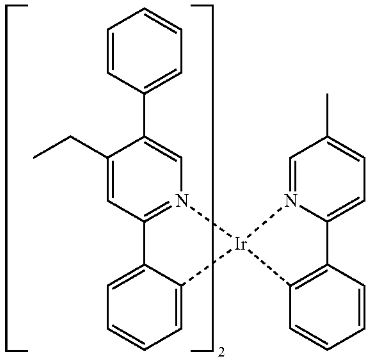
D-108
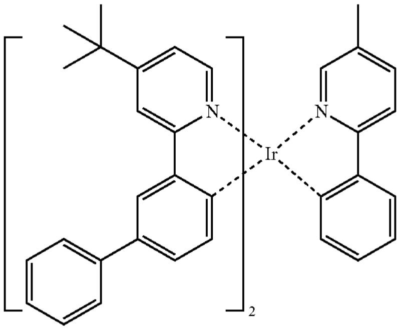
D-109
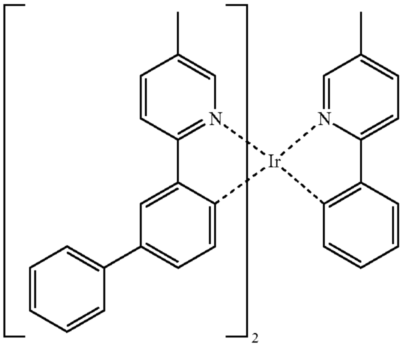
D-110
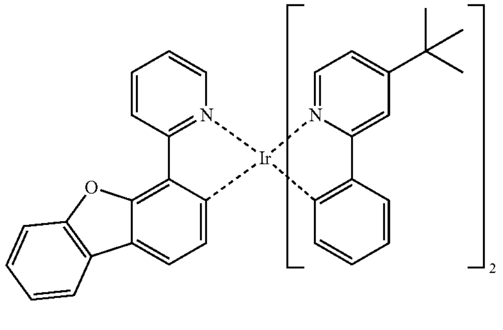
D-111
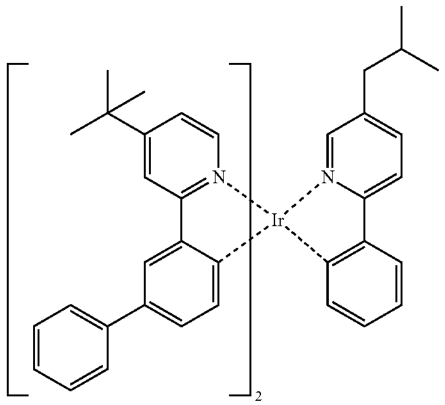
D-112
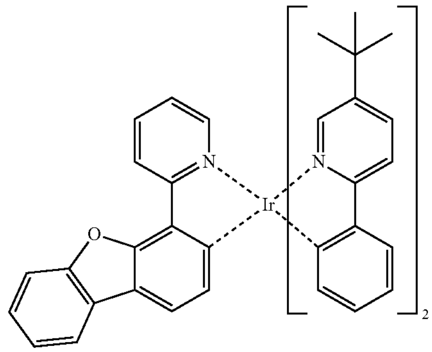
D-113
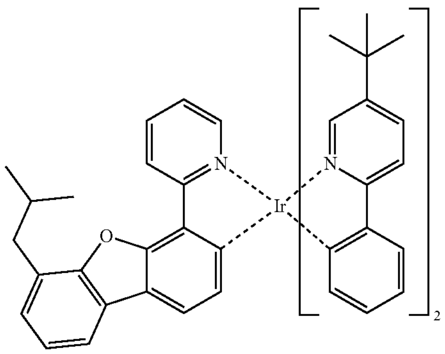
D-114
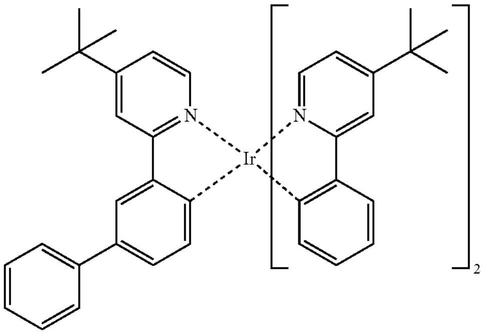

-continued
D-115
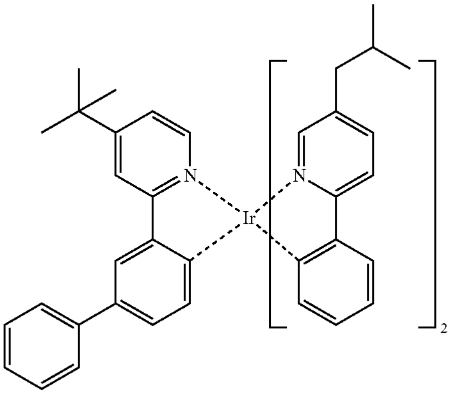
D-116
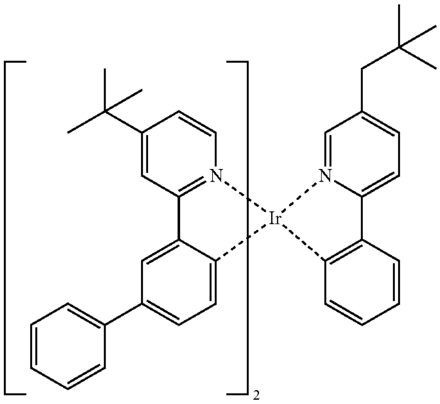
D-117
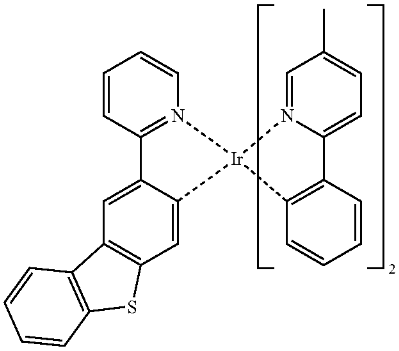
D-118
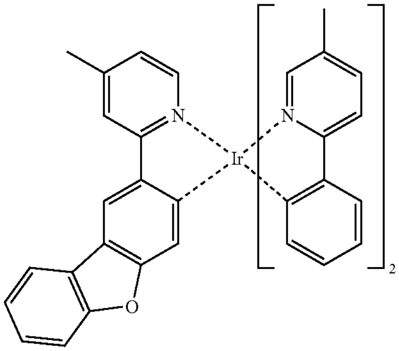
-continued
D-119
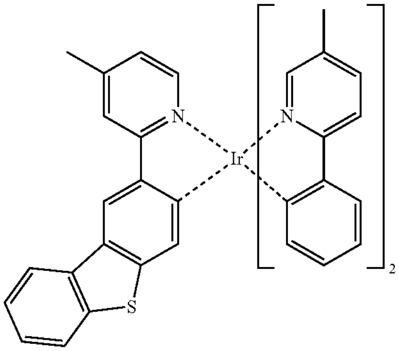
D-120
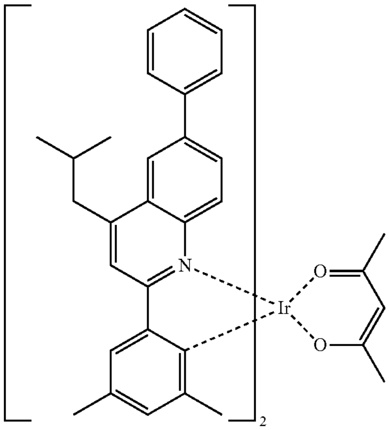
D-121
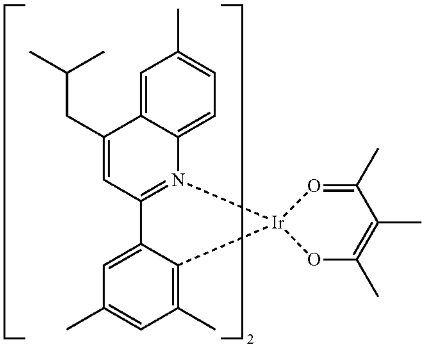
D-122
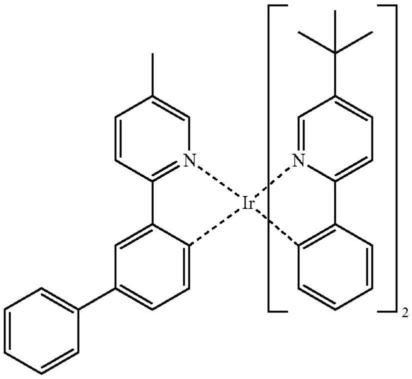

-continued
D-123
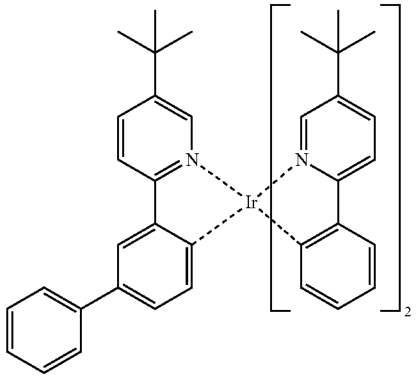
D-124
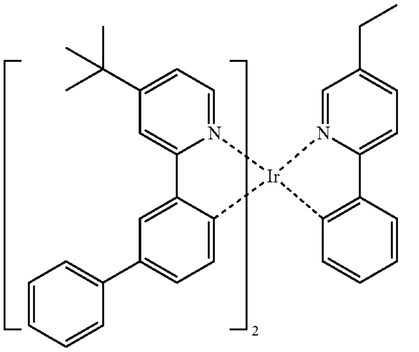
D-125
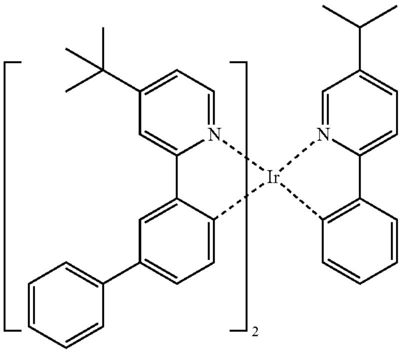
D-126
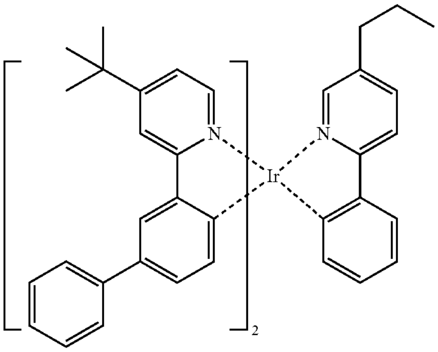
-continued
D-127
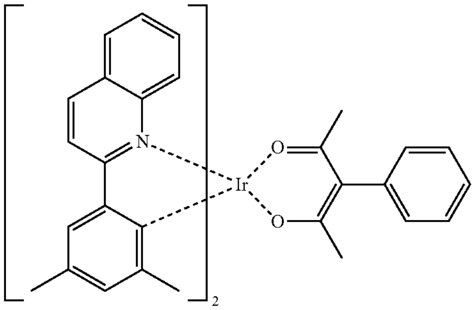
D-128
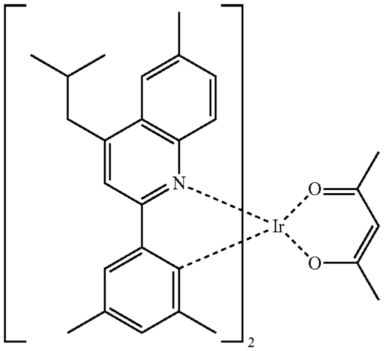
D-129
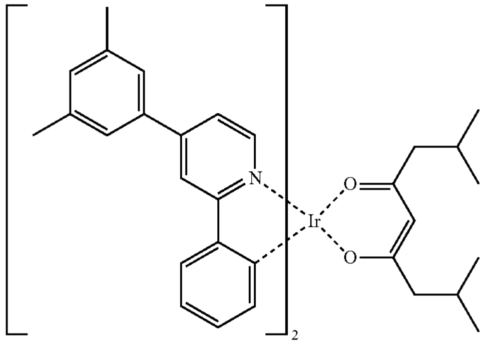
D-130
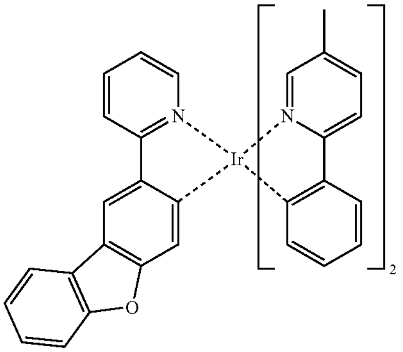

D-131
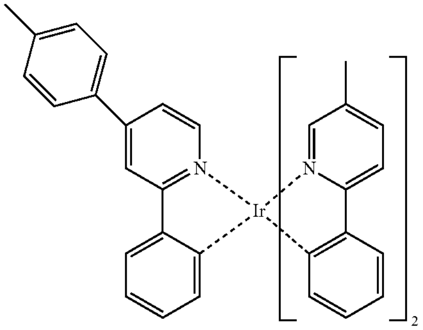
D-132
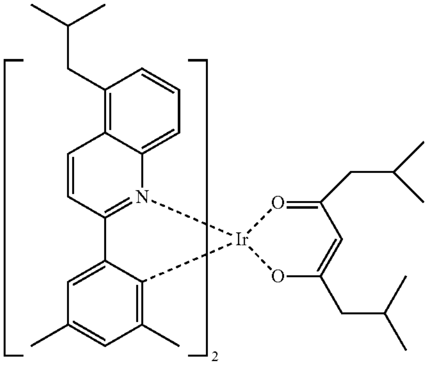
D-133
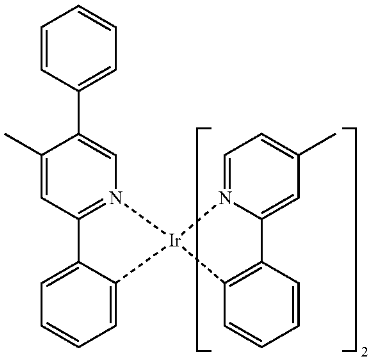
D-134
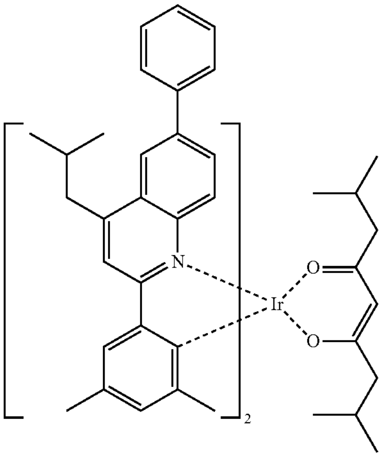
D-135
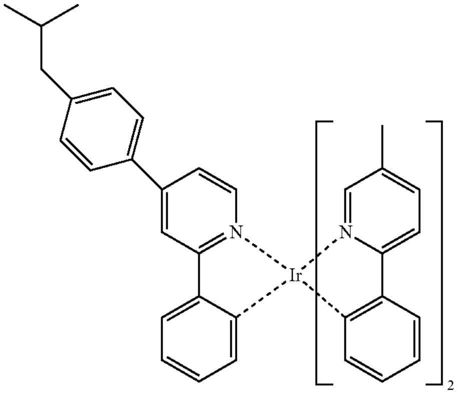
D-136
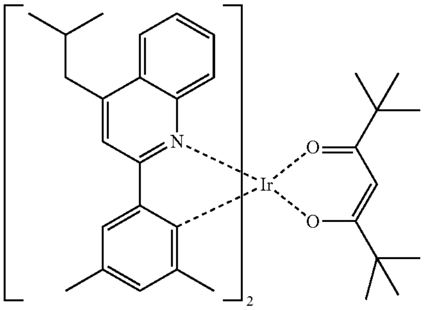
D-137
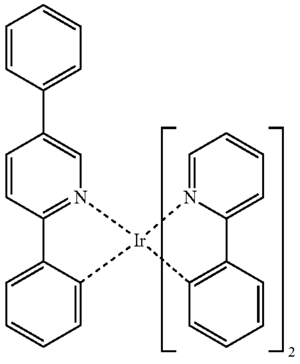
D-138
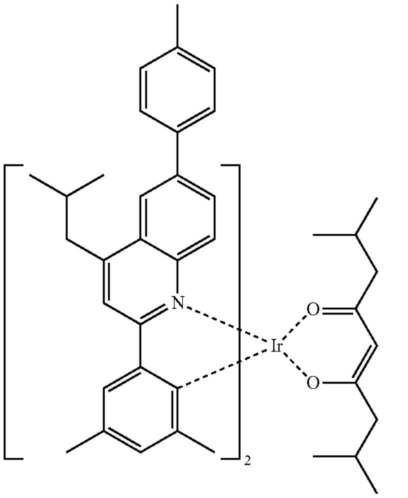

-continued
D-139
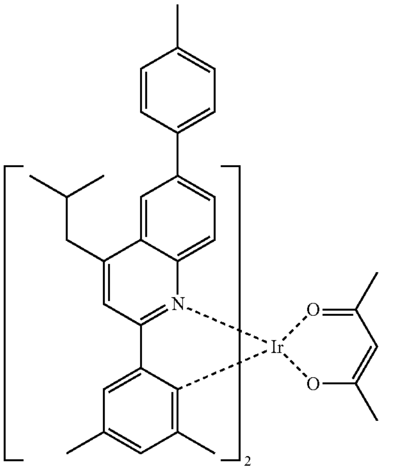
D-140
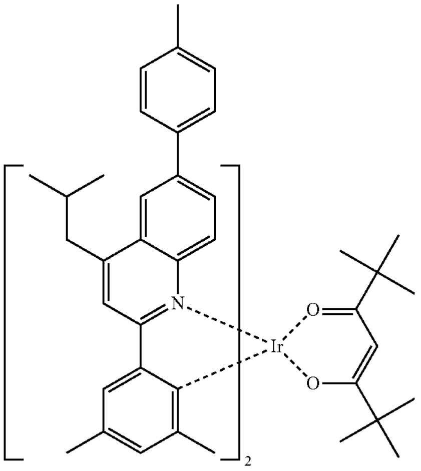
D-141
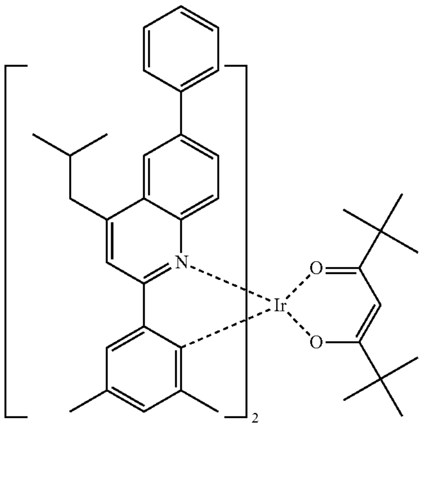
-continued
D-142
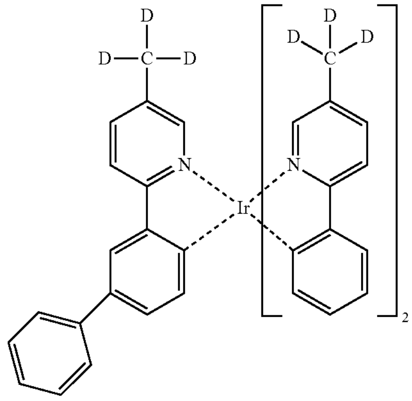
D-143
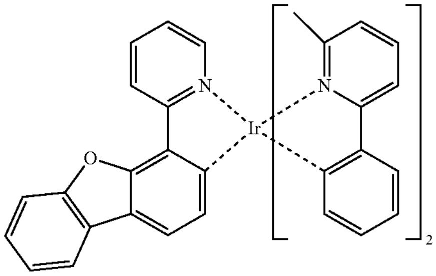
D-144
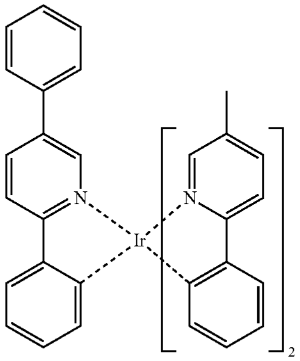
D-145
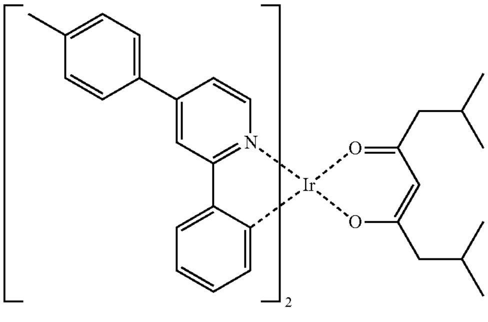
D-146
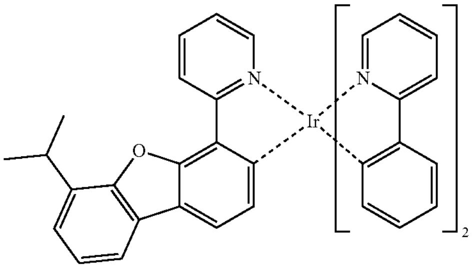

-continued
D-147
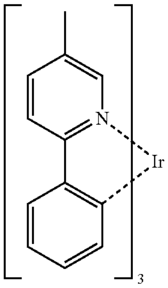
D-148
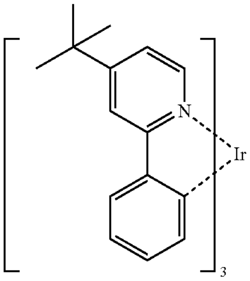
D-149
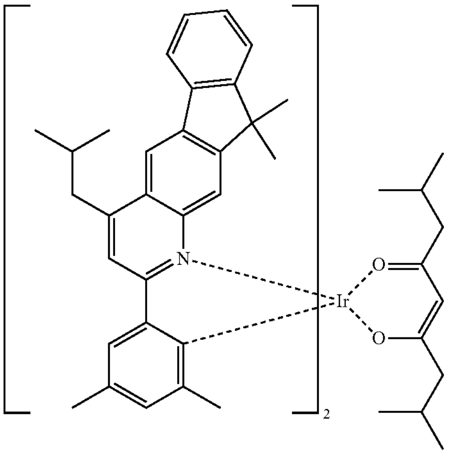
D-150
-continued
D-151
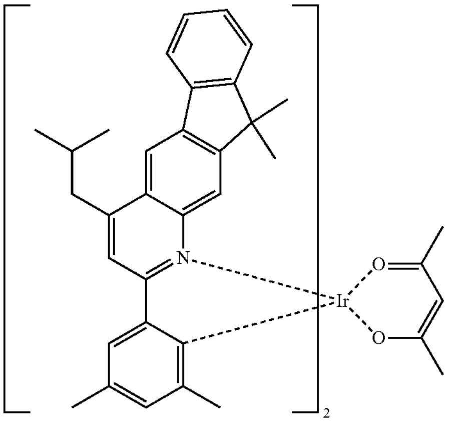
D-152
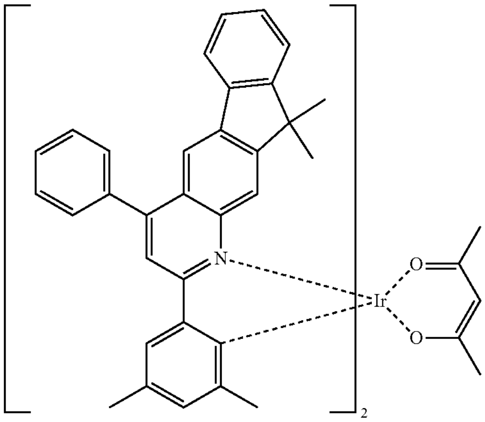
D-153
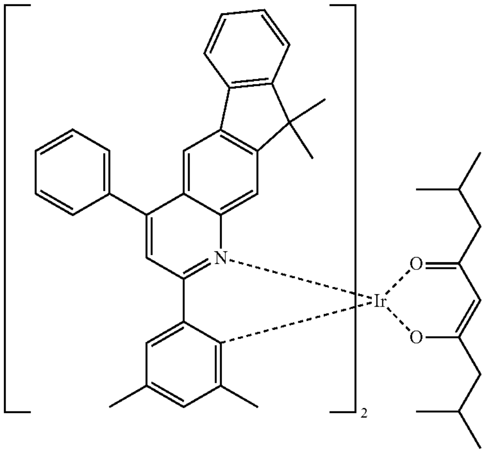

-continued

D-154

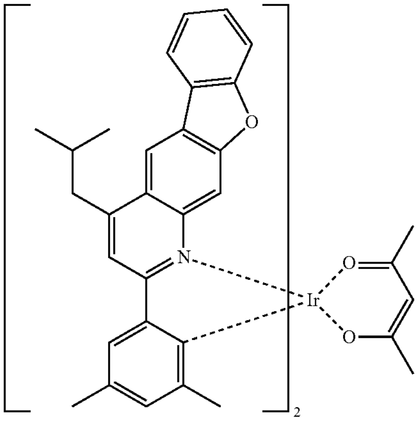

D-155

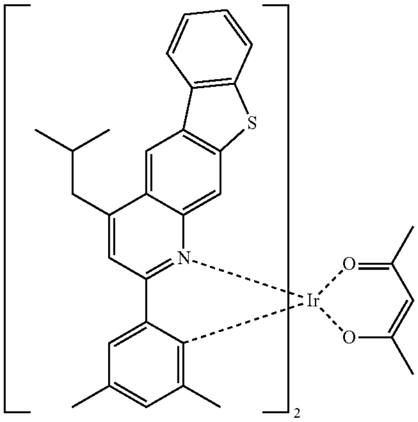

D-156

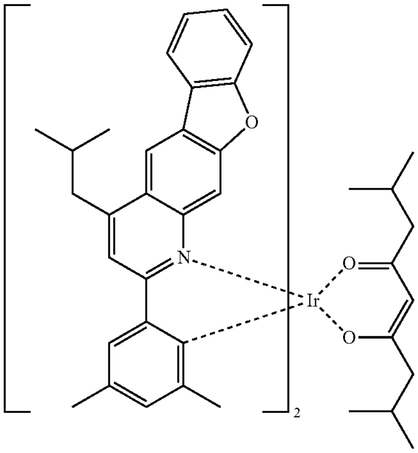

-continued

D-157

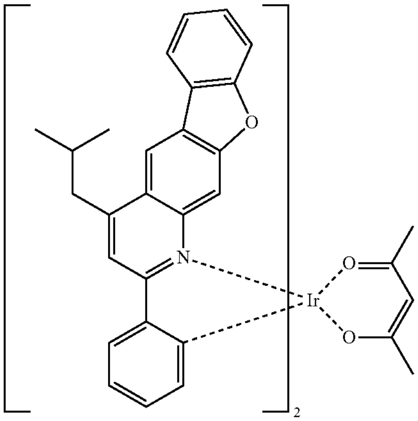

In the organic electroluminescent device of the present disclosure, a hole injection layer, a hole transport layer, or an electron blocking layer, or a combination thereof may be used between the anode and the light-emitting layer. The hole injection layer may be multilayers in order to lower the hole injection barrier (or hole injection voltage) from the anode to the hole transport layer or the electron blocking layer, wherein each of the multilayers may use two compounds simultaneously. The hole transport layer or the electron blocking layer may also be multilayers.

In addition, an electron buffer layer, a hole blocking layer, an electron transport layer, or an electron injection layer, or a combination thereof may be used between the light-emitting layer and the cathode. The electron buffer layer may be multilayers in order to control the injection of the electrons and improve the interfacial properties between the light-emitting layer and the electron injection layer, wherein each of the multilayers may use two compounds simultaneously. The hole blocking layer or the electron transport layer may also be multilayers, wherein each of the multilayers may use a plurality of compounds.

In order to form each layer of the organic electroluminescent device of the present disclosure, dry film-forming methods such as vacuum evaporation, sputtering, plasma, and ion plating methods, or wet film-forming methods such as ink jet printing, nozzle printing, slot coating, spin coating, dip coating, and flow coating methods can be used.

When using a solvent in a wet film-forming method, a thin film can be formed by dissolving or diffusing materials forming each layer into any suitable solvent such as ethanol, chloroform, tetrahydrofuran, dioxane, etc. The solvent can be any solvent where the materials forming each layer can be dissolved or diffused, and where there are no problems in film-formation capability.

In addition, the first host compound and the second host compound may be film-formed in the above-listed methods, commonly by a co-evaporation process or a mixture-evaporation process. The co-evaporation is a mixed deposition method in which two or more materials are placed in a respective individual crucible source and an electric current is applied to both cells at the same time to evaporate the materials. The mixture-evaporation is a mixed deposition method in which two or more materials are mixed in one crucible source before evaporating them, and an electric current is applied to the cell to evaporate the materials. Also, when the first and second host compounds are present in the same layer or different layers in the organic electroluminescent device, the two host compounds can be individually deposited. For example, the first host compound may be deposited, and then the second host compound may be deposited.

The present disclosure may provide a display system by using a plurality of host materials comprising the compound represented by formula 1, and the compound represented by formula 2. That is, it is possible to produce a display system or a lighting system by using the plurality of host materials of the present disclosure. Specifically, it is possible to produce a display system, e.g., a display system for smartphones, tablets, notebooks, PCs, TVs, or cars, or a lighting system, e.g., an outdoor or indoor lighting system, by using the plurality of host materials of the present disclosure.

Hereinafter, the preparation method and the physical properties of the compound of the present disclosure, and the properties of an OLED according to the present disclosure will be explained in detail. However, the following examples merely illustrate the preparation method of the compound and the properties of an OLED according to the present disclosure in detail, but the present disclosure is not limited to the following examples.

EXAMPLE 1: SYNTHESIS OF COMPOUND C-2-95

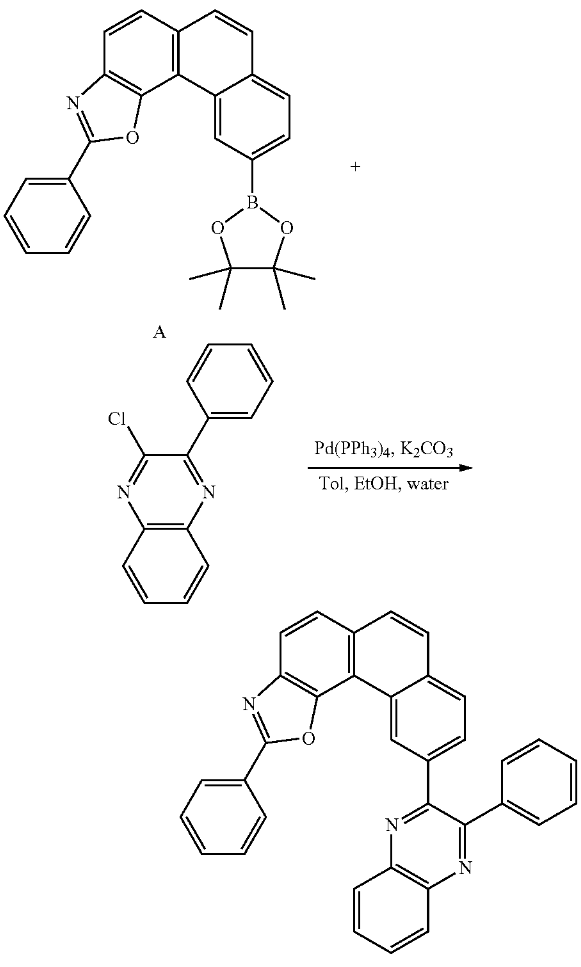

A

C-2-95

In a reaction container, 4.0 g of compound A (CAS: 2085325-18-2, 9.5 mmol), 2.8 g of 2-chloro-3-phenylquinoxaline (11.4 mmol), 0.5 g of tetrakis(triphenylphosphine) palladium $(Pd(PPh_2)_4)$ (0.5 mmol), and 2.0 g of potassium carbonate $(K_2CO_3)$ (19 mmol) were added to 30 mL of toluene, 7 mL of EtOH, and 10 mL of water, and the mixture was stirred under reflux for one day. After completion of the reaction, the reaction mixture was cooled to room temperature and then filtered through celite with methylene chloride (MC). The filtrate was distilled under reduced pressure, and then separated by column chromatography with methylene chloride/hexane (MC/Hex) to obtain 2.7 g of compound C-2-95 (yield: 57%).

| Compound | MW | M.P. |
|---|---|---|
| C-2-95 | 499.6 | 266° C. |

EXAMPLE 2: SYNTHESIS OF COMPOUND C-2-112

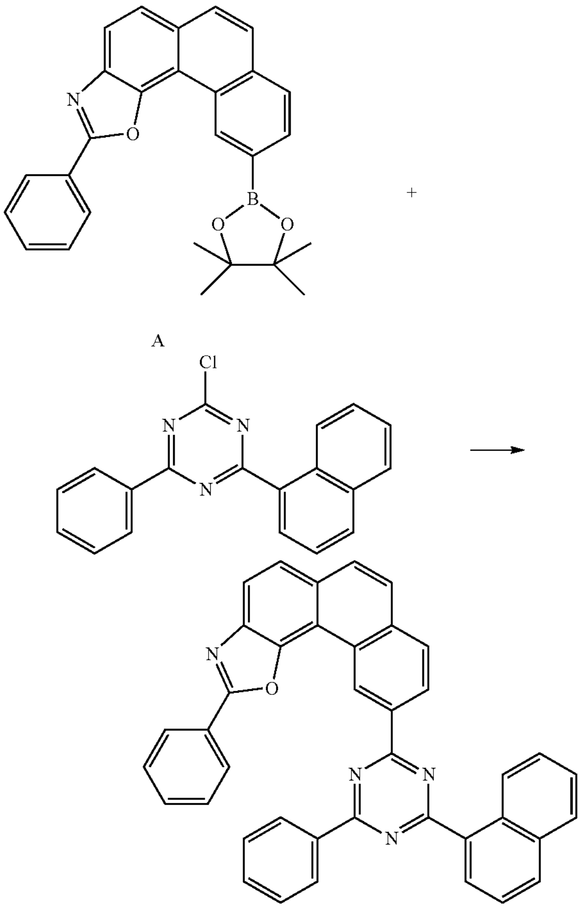

A

C-2-112

23.8 g of compound A (56.6 mmol), 15.0 g of 2-chloro-4-(naphthalen-1-yl)-6-phenyl-1,3,5-triazine (47.2 mmol), 2.72 g of $Pd(PPh_3)_4$ (2.36 mmol), and 16.3 g of $K_2CO_3$ (118 mmol) were added to 240 mL of toluene, 60 mL of EtOH, and 60 mL of purified water, and the mixture was stirred under reflux for 2 hours. After completion of the reaction, the reaction mixture was cooled to room temperature and then filtered through silica gel. The organic layer was distilled under reduced pressure, and then recrystallized with toluene to obtain 13.8 g of compound C-2-112 (yield: 51%).

| Compound | MW | M.P. |
|---|---|---|
| C-2-112 | 576.6 | 231° C. |

EXAMPLE 3: SYNTHESIS OF COMPOUND C-2-105

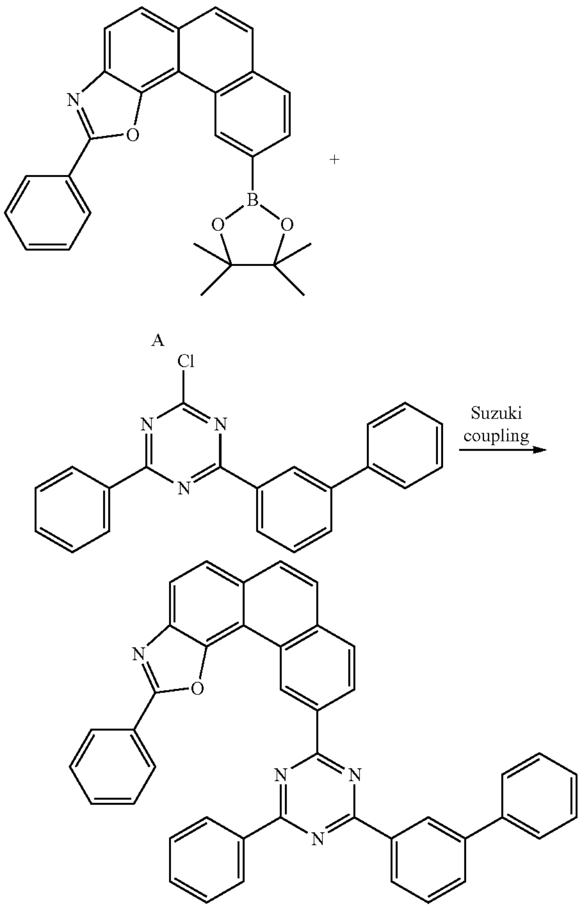

C-2-105

4.0 g of compound A (9.5 mmol), 3.9 g of 2-([1,1'-biphenyl]-3-yl)-4-chloro-6-phenyl-1,3,5-triazine (11.4 mmol), 0.5 g of $Pd(PPh_3)_4$ (0.5 mmol), and 2.6 g of $K_2CO_3$ (19 mmol) were added to 30 mL of toluene, 7 mL of EtOH, and 10 mL of purified water, and the mixture was stirred under reflux for 6 hours. After completion of the reaction, the reaction mixture was cooled to room temperature, and stirred at room temperature, and then MeOH was added thereto. The resultant solid was filtered under reduced pressure, and then separated by column chromatography with MC to obtain 4.6 g of compound C-2-105 (yield: 80%).

| Compound | MW | M.P. |
|---|---|---|
| C-2-105 | 602.7 | 227° C. |

EXAMPLE 4: SYNTHESIS OF COMPOUND C-2-93

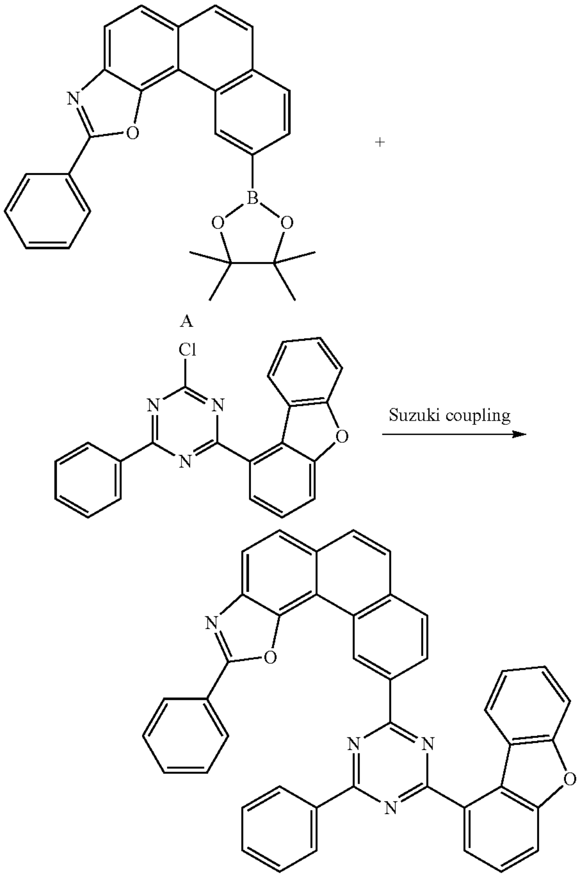

C-2-93

3.0 g of compound A (7.1 mmol). 3.4 g of 2-chloro-4-(dibenzo[b.d]furan-1-yl)-6-phenyl-1,3,5-triazine (9.26 mmol), 0.4 g of $Pd(PPh_3)$ 4 (0.36 mmol), and 2.0 g of $K_2CO_3$ (14 mmol) were added to 36 mL of toluene, 8 mL of EtOH, and 12 mL of purified water, and the mixture was stirred under reflux for 6 hours. After completion of the reaction, the reaction mixture was cooled to room temperature, and stirred at room temperature, and then MeOH was added thereto. The resultant solid was filtered under reduced pressure, and then separated by column chromatography with MC to obtain 3.3 g of compound C-2-93 (yield: 75%).

| Compound | MW | M.P. |
|---|---|---|
| C-2-93 | 616.7 | 282° C. |

EXAMPLE 5: SYNTHESIS OF COMPOUND C-2-94

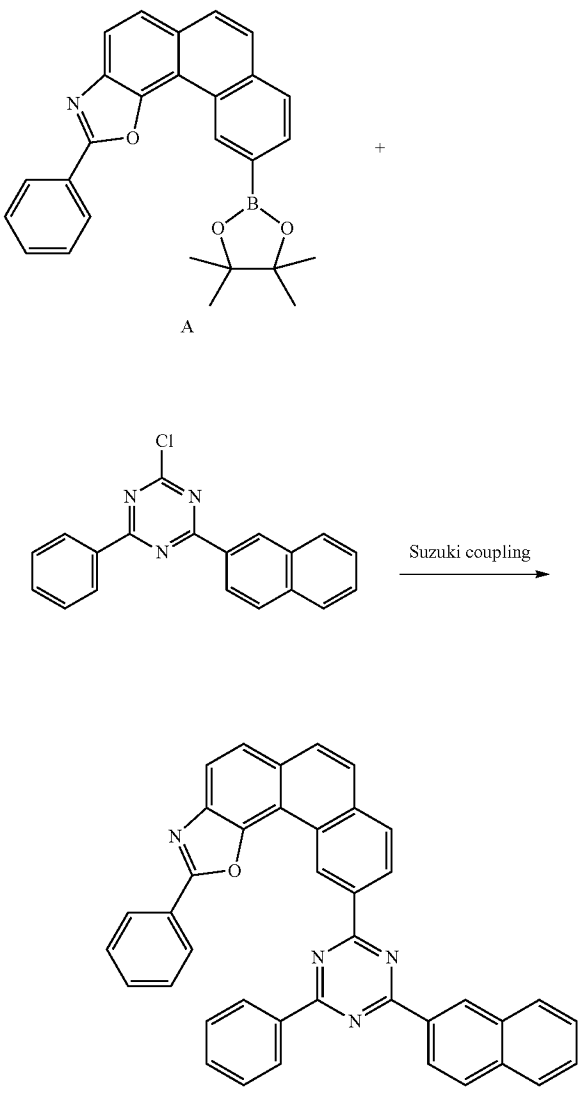

A

C-2-94

4.0 g of compound A (9.5 mmol), 3.6 g of 2-chloro-4-(naphthalen-2-yl)-6-phenyl-1,3,5-triazine (11.4 mmol), 0.5 g of $Pd(PPh_3)$ 4 (0.5 mmol), and 2.6 g of $K_2CO_3$ (19 mmol) were added to 30 mL of toluene, 7 mL of EtOH 7 mL, and 10 mL of purified water, and the mixture was stirred under reflux for 4 hours. After completion of the reaction, the reaction mixture was cooled to room temperature, and stirred at room temperature, and then MeOH was added thereto. The resultant solid was filtered under reduced pressure, and then separated by column chromatography with MC to obtain 3.45 g of compound C-2-94 (yield: 63%).

| Compound | MW | M.P. |
|---|---|---|
| C-2-94 | 576.6 | 268° C. |

EXAMPLE 6: SYNTHESIS OF COMPOUND C-1-138

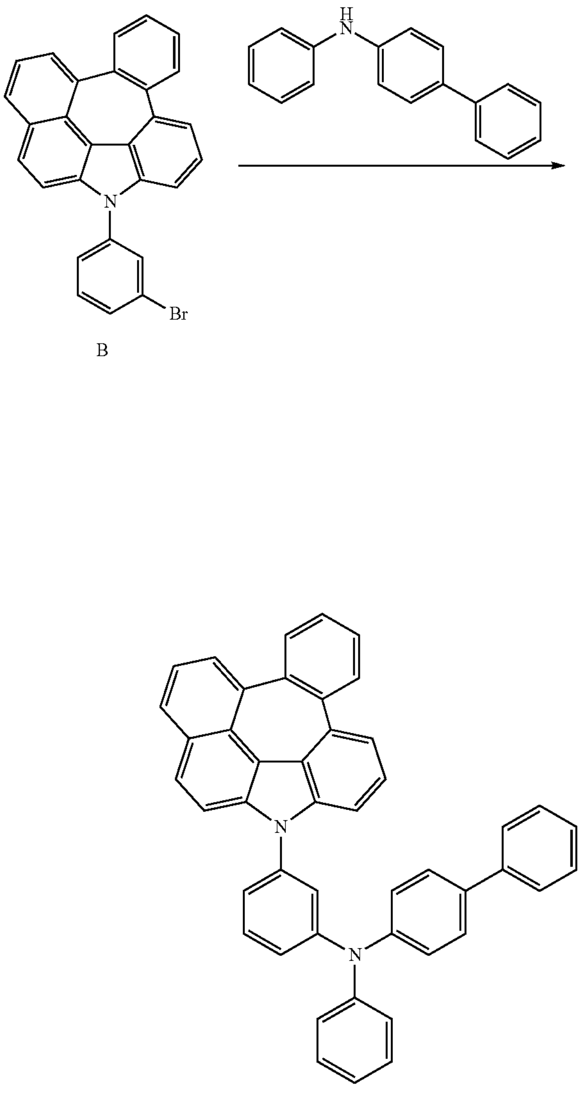

B

C-1-138

5.0 g of compound B (11.2 mmol), 3.0 g of N-phenyl-[1,1'-biphenyl]-4-amine (12.3 mmol), 0.5 g of Pdz (dba): (0.56 mmol), 0.46 g of s-phos (1.12 mmol), and 2.7 g of NaOtBu (28 mmol) were added to 60 mL of toluene, and the mixture was stirred under reflux for 6 hours. After completion of the reaction, the reaction mixture was cooled to room temperature, and stirred at room temperature, and then MeOH was added thereto. The resultant solid was filtered under reduced pressure, and then separated by column chromatography with MC/Hex to obtain 2.3 g of compound C-1-138 (yield: 34%).

| Compound | MW | M.P. |
|---|---|---|
| C-1-138 | 610.8 | 132° C. |

EXAMPLE 7: SYNTHESIS OF COMPOUND C-1-159

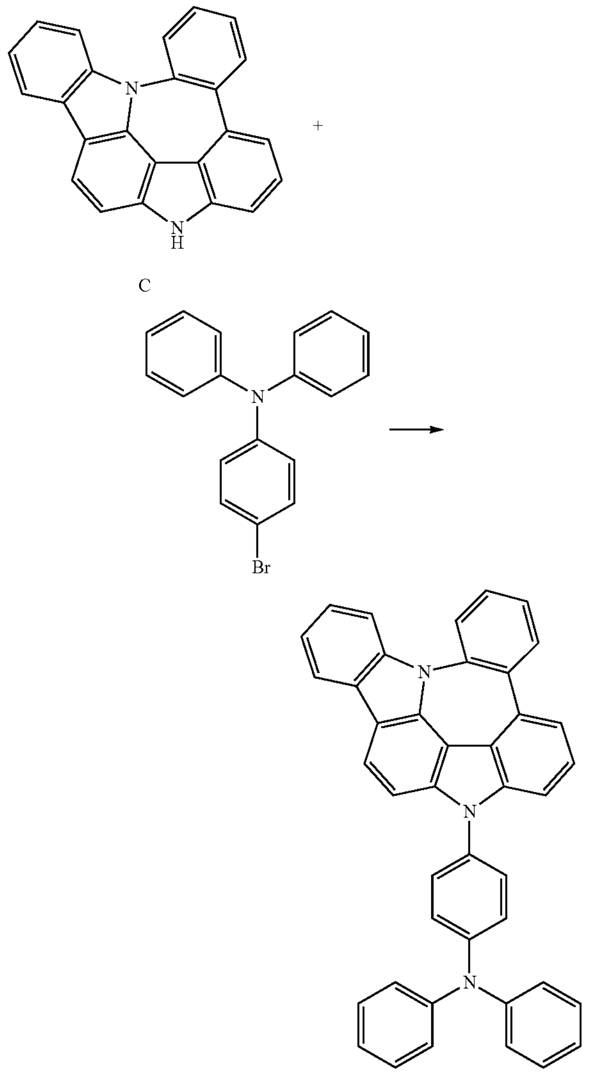

C

C-1-159

5.0 g of compound C (15.2 mmol), 5.4 g of 4-bromo-N, N-diphenylaniline (16.7 mmol), 0.7 g of Pd2 (dba) 3 (0.76 mmol), 0.6 g of s-phos (1.52 mmol), and 2.9 g of NaOtBu (30.4 mmol) were added to 80 mL of o-xylene, and the mixture was stirred under reflux for 4 hours. After completion of the reaction, the reaction mixture was cooled to room temperature, and stirred at room temperature, and then MeOH was added thereto. The resultant solid was filtered under reduced pressure, and then separated by column chromatography with MC/Hex to obtain 4.0 g of compound C-1-159 (yield: 46%).

| Compound | MW | M.P. |
|---|---|---|
| C-1-159 | 573.7 | 317° C. |

EXAMPLE 8: SYNTHESIS OF COMPOUND C-1-141

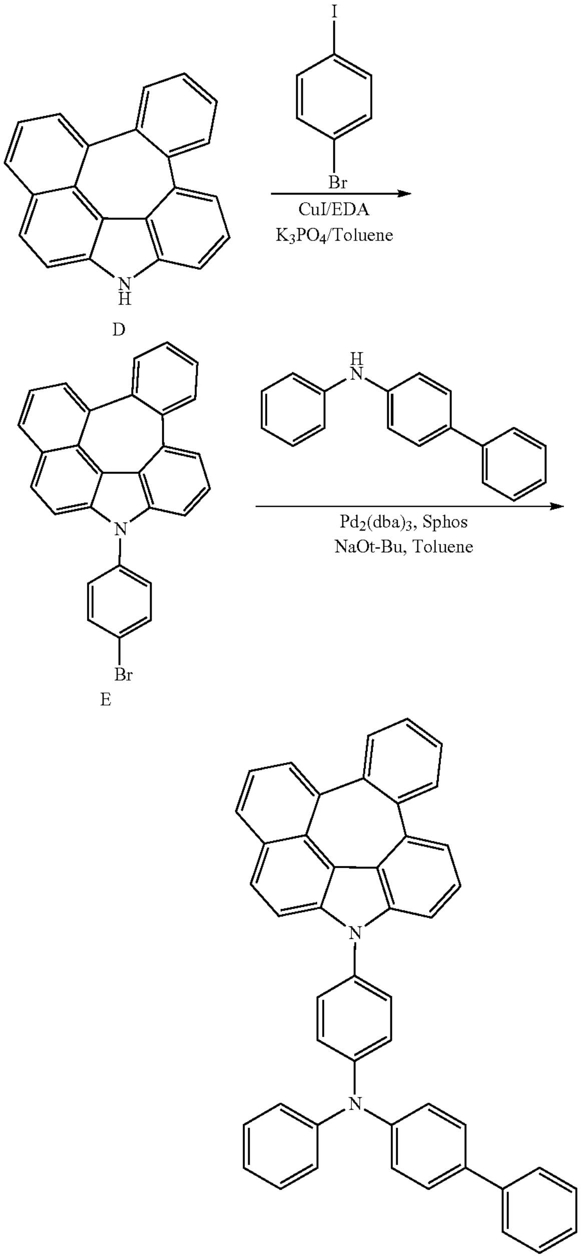

D

E

C-1-141

1) Synthesis of Compound E

In a reaction container, 10.0 g of compound D (34.3 mmol), 14.6 g of 1-bromo-4-iodobenzene (51.5 mmol), 3.28 g of CuI (17.2 mmol), 4.12 g of EDA (68.6 mmol), and 14.6 g of $K_3PO_4$ (68.6 mmol) were added to 170 mL of toluene, and the mixture was stirred under reflux at 145° C. for 3 hours. After completion of the reaction, the reaction mixture was extracted with MC, and then dried with $MgSO_4$. The residue was separated by column chromatograpy, and then MeOH was added thereto. The resultant solid was filtered under reduced pressure to obtain 9.0 g of compound E (yield: 59%).

2) Synthesis of Compound C-1-141

In a reaction container, 5.0 g of compound E (11 mmol), 3.3 g of N-phenyl-[1,1'-biphenyl]-4-amine (13 mmol), 0.513 g of Pd2 (dba) 3 (0.56 mmol), 0.460 g of s-phos (1 mmol), and 2.691 g of NaOt-Bu (28 mmol) were added to 60 mL of toluene, and the mixture was stirred under reflux at 100° C. for 0.5 hours. After completion of the reaction, the reaction mixture was extracted with MC, and then dried with $MgSO_4$. The residue was separated by column chromatography, and then MeOH was added thereto. The resultant solid was filtered under reduced pressure to obtain 1.3 g of compound C-1-141 (yield: 19%).

| Compound | MW | Color | M.P. |
|---|---|---|---|
| C-1-141 | 610.76 | Yellow | 168° C. |

EXAMPLE 9: SYNTHESIS OF COMPOUND C-1-195

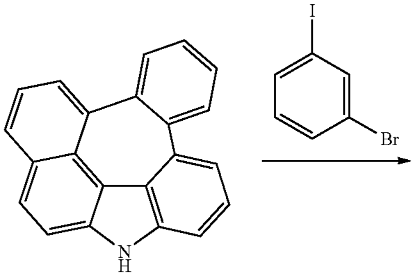

D

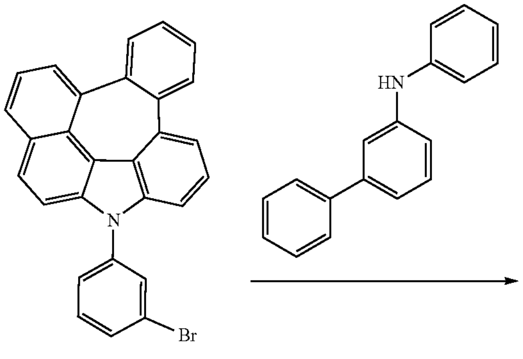

F

-continued

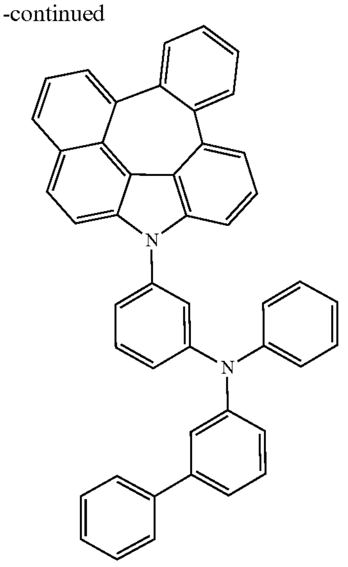

C-1-195

1) Synthesis of Compound F 15.0 g of compound D (51.5 mmol), 29.3 g of 1-bromo-3-iodobenzene (103 mmol), 4.9 g of CuI (25.8 mmol), 7.0 mL of ethylenediamine (103 mmol), and 27.5 g of $K_3PO_4$ (129 mmol) were added to 250 ml of toluene, and the mixture was stirred under reflux for 4 hours. After completion of the reaction, the reaction mixture was cooled to room temperature and then filtered through silica gel. The organic layer was concentrated, and then recrystallized with EA to obtain 14.2 g of compound F (yield: 62%).

2) Synthesis of Compound C-1-195

14.0 g of compound F (31.4 mmol), 7.78 g of N-phenyl-[1,1'-biphenyl]-3-amine (31.7 mmol), 1.44 g of $Pd_2dba_3$ (1.57 mmol), 635 mg of $t\text{-}Bu_3P$ (3.14 mmol), and 6.04 g of t-BuONa (62.8 mmol) were added to 160 mL of toluene, and the mixture was stirred under reflux for 2 hours. After completion of the reaction, the reaction mixture was cooled to room temperature and then extracted with distilled water and EA. The organic layer was distilled under reduced pressure, and then separated by column chromatography with MC/Hex to obtain 14.6 g of compound C-1-195 (yield: 76%).

| Compound | MW | M.P. |
|---|---|---|
| C-1-195 | 610.7 | 141° C. |

Device Examples 1-1 to 7: Producing an OLED According to the Present Disclosure

An OLED according to the present disclosure was produced as follows: A transparent electrode indium tin oxide (ITO) thin film (10 0/sq) on a glass substrate for an OLED (GEOMATEC CO., LTD., Japan) was subjected to an ultrasonic washing with trichloroethylene, acetone, ethanol and distilled water, sequentially, and then was stored in isopropanol. The ITO substrate was mounted on a substrate holder of a vacuum vapor deposition apparatus. Compound HI-1 was introduced into a cell of the vacuum vapor deposition apparatus, and the pressure in the chamber of the apparatus was then controlled to 10-6 torr. Thereafter, an electric current was applied to the cell to evaporate the above-introduced material, thereby forming a first hole injection layer having a thickness of 80 nm on the ITO substrate. Next, compound HI-2 was introduced into another cell of the vacuum vapor deposition apparatus and was evaporated by applying an electric current to the cell, thereby forming a second hole injection layer having a thickness of 5 nm on the first hole injection layer. Compound HT-1 was then introduced into another cell of the vacuum vapor deposition apparatus and was evaporated by applying an electric current to the cell, thereby forming a first hole transport layer having a thickness of 10 nm on the second hole injection layer. Compound HT-2 was then introduced into another cell of the vacuum vapor deposition apparatus and was evaporated by applying an electric current to the cell, thereby forming a second hole transport layer having a thickness of 60 nm on the first hole transport layer. After forming the hole injection layers and the hole transport layers, a light-emitting layer was formed thereon as follows: The first host compound and the second host compound shown in Table 1 were introduced into two cells of the vacuum vapor depositing apparatus, respectively, as hosts and compound D-71 was introduced into another cell as a dopant. The two host materials were evaporated at a rate of 1:1, and at the same time the dopant material was evaporated at different rates to be deposited in a doping amount of 3 wt % based on the total amount of the hosts and dopant to form a light-emitting layer having a thickness of 40 nm on the second hole transport layer. Next, compound ET-1 and compound EI-1 were evaporated at a rate of 1:1 in two other cells to deposit an electron transport layer having a thickness of 35 nm on the light-emitting layer. After depositing compound EI-1 as an electron injection layer having a thickness of 2 nm on the electron transport layer, an Al cathode having a thickness of 80 nm was deposited on the electron injection layer by another vacuum vapor deposition apparatus. Thus, an OLED was produced.

HI-1

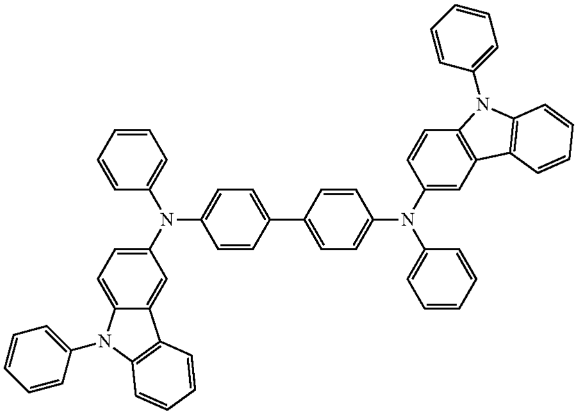

HI-2

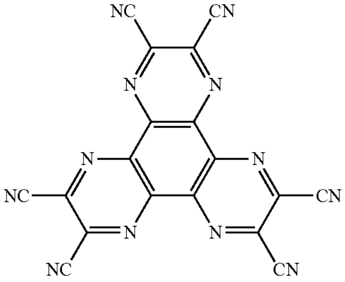

-continued

HT-1

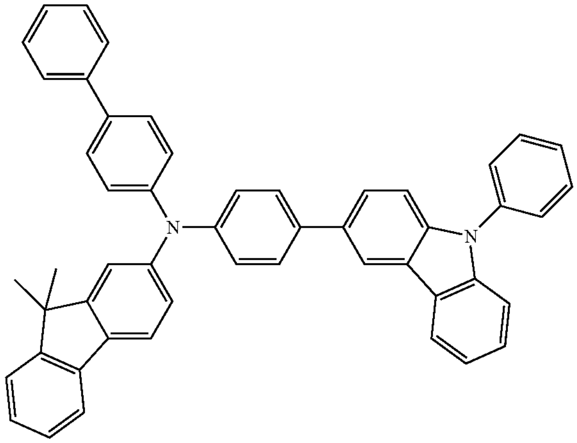

HT-2

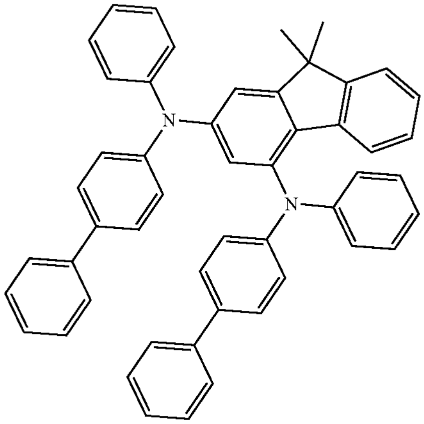

D-71

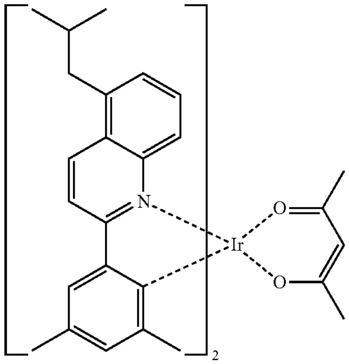

-continued

ET-1

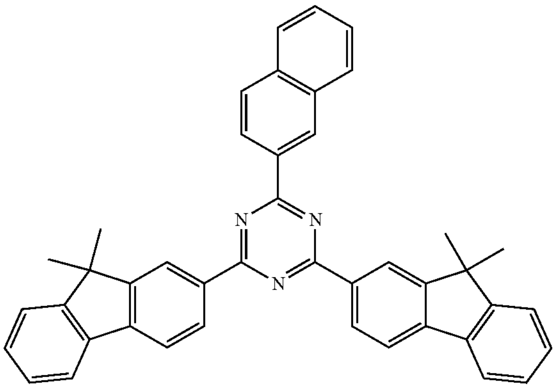

EI-1

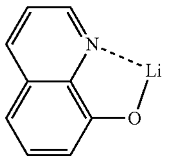

Comparative Examples 1 to 7: Producing an OLED not According to the Present Disclosure An OLED was produced in the same manner as in Device Example 1-1, except that only the second host compound shown in Table 1 was used instead of the two hosts.

The luminous efficiency at a luminance of 5,000 nit, and the time taken to reduce from the initial luminance of 100% to a luminance of 96% at a constant current in a luminance of 5,000 nit (T96) of the OLEDs produced in the Device Examples and the Comparative Examples, are shown in the following Table 1.

TABLE 1

| | First Host | Second Host | Luminous Efficiency (cd/A) | Increase Rate in Efficiency (%) | T96 (hr) |
|---|---|---|---|---|---|
| Device Example 1-1 | C-1-7 | C-2-2 | 23.1 | 26.9 | 209 |
| Device Example 1-2 | C-1-131 | C-2-2 | 21.9 | 20.3 | 119 |
| Comparative Example 1 | — | C-2-2 | 18.2 | — | 18 |
| Device Example 2-1 | C-1-7 | C-2-82 | 26.3 | 43.7 | 252 |
| Device Example 2-2 | C-1-138 | C-2-82 | 24.5 | 33.9 | 166 |
| Device Example 2-3 | C-1-125 | C-2-82 | 23.9 | 30.6 | 110 |
| Comparative Example 2 | — | C-2-82 | 18.3 | — | 3 |
| Device Example 3 | C-1-7 | C-2-1 | 24.9 | 27.7 | 366 |
| Comparative Example 3 | — | C-2-1 | 19.5 | — | 19 |
| Device Example 4 | C-1-7 | C-2-93 | 25.5 | 17.5 | 253 |
| Comparative Example 4 | — | C-2-93 | 21.7 | — | 72 |
| Device Example 5 | C-1-7 | C-2-94 | 26.4 | 28.2 | 188 |
| Comparative Example 5 | — | C-2-94 | 20.6 | — | 20 |
| Device Example 6 | C-1-7 | C-2-95 | 27.8 | 23.6 | 127 |
| Comparative Example 6 | — | C-2-95 | 22.5 | — | 40 |
| Device Example 7 | C-1-131 | C-2-96 | 24.7 | 23.5 | 337 |
| Comparative Example 7 | — | C-2-96 | 20.0 | — | 29 |

Device Examples 8 to 15: Producing an OLED According to the Present Disclosure An OLED was produced in the same manner as in Device Example 1-1, except that the first host compound and the second host compound shown in Table 2 were used. The luminous efficiency at a luminance of 1,000 nit, and the time taken to reduce from the initial luminance of 100% to a luminance of 95% at a constant current in a luminance of 5,000 nit ($T_{95}$) of the OLEDs produced in the Device Examples, are shown in the following Table 2.

TABLE 2

| | First Host | Second Host | Luminous Efficiency (cd/A) | T95 (hr) |
|---|---|---|---|---|
| Device Example 8 | C-1-141 | C-2-105 | 29.1 | 714 |
| Device Example 9 | C-1-6 | C-2-93 | 31.2 | 270 |
| Device Example 10 | C-1-141 | C-2-2 | 29.2 | 290 |
| Device Example 11 | C-1-7 | C-2-105 | 30.0 | 261 |
| Device Example 12 | C-1-138 | C-2-93 | 32.0 | 310 |
| Device Example 13 | C-1-195 | C-2-93 | 31.0 | 174 |
| Device Example 14 | C-1-167 | C-2-93 | 31.8 | 169 |
| Device Example 15 | C-1-159 | C-2-112 | 29.6 | 151 |

In Tables 1 and 2, the compounds used as the first host and the second host are the same as the compounds exemplified as the specific compounds herein. From the Device Examples and the Comparative Examples above, it was confirmed that the organic electroluminescent device according to the present disclosure had a higher luminous efficiency of at least 17.5%, and an improved lifespan of at least 100 hours as compared with a conventional organic electroluminescent device.

The invention claimed is:

1. A plurality of host materials comprising a first host material and a second host material, wherein the first host material comprises a compound represented by at least one of the following formulas 1-4, and 1-7 to 1-14:

(1-4)

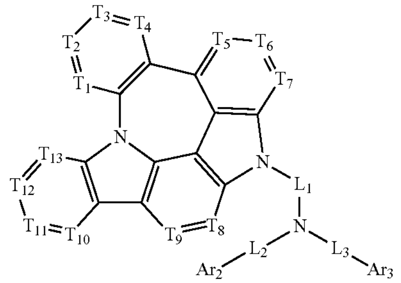

(1-7)

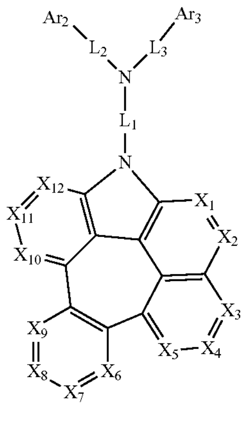

-continued (1-8)

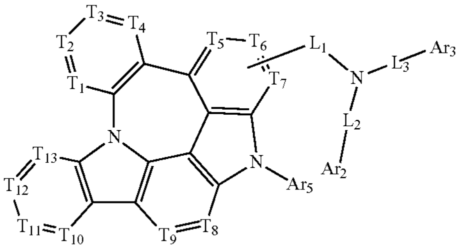

(1-9)

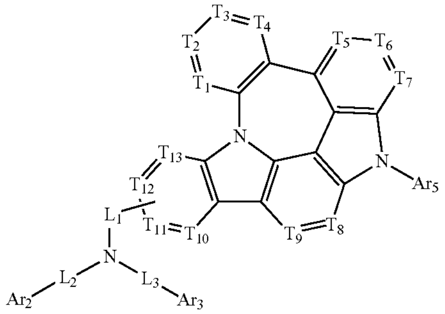

(1-10)

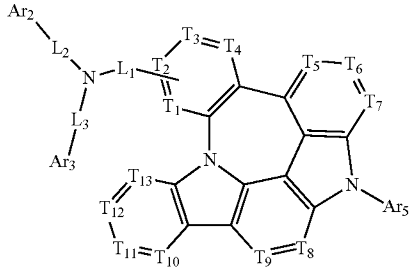

(1-11)

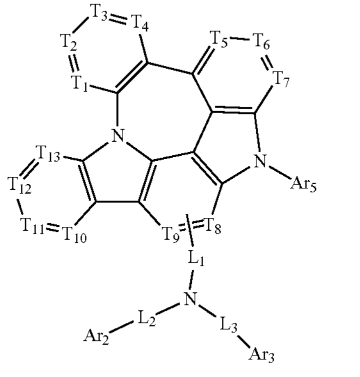

(1-12)

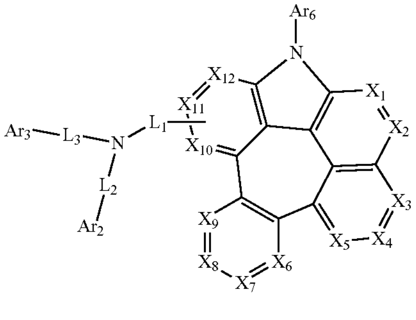

-continued (1-13)

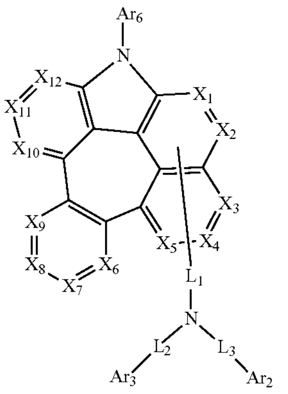

(1-14)

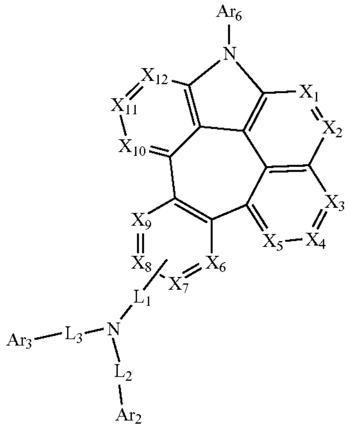

wherein, $Ar_2$ to $Ar_3$, each independently, represent hydrogen, deuterium, a halogen, a cyano, a substituted or unsubstituted (C1-C30)alkyl, a substituted or unsubstituted (C8-C30)aryl, a substituted or unsubstituted (3- to 30-membered) heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

$L_1$ to $L_3$, each independently, represent a single bond, a substituted or unsubstituted (C1-C30)alkylene, a substituted or unsubstituted (C6-C30)arylene, a substituted or unsubstituted (3- to 30-membered) heteroarylene, or a substituted or unsubstituted (C3-C30)cycloalkylene;

Y represents $CR_7R_8$, $NR_9$, O, or S;

$T_1$ to $T_{13}$, and $X_1$ to $X_{12}$, each independently, represent N or $CV_1$;

$V_1$, each independently, represents hydrogen, deuterium, a halogen, a cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30)alkylsilyl, a substituted or unsubstituted di(C1-C30)alkyl (C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino; or adjacent two $V_1$'s may be linked to each other to form a ring(s);

$R_7$ to $R_9$, each independently, represent hydrogen, deuterium, a halogen, a cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30)alkylsilyl, a substituted or unsubstituted di(C1-C30)alkyl (C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino; or adjacent ones of $R_4$ to $R_9$ may be linked to each other to form a ring(s);

$Ar_4$ represents hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, or a substituted or unsubstituted (C3-C30)cycloalkyl;

$Ar_5$ and $Ar_6$, each independently, represent a substituted or unsubstituted (C6-C30)aryl, or a substituted or unsubstituted (3- to 30-membered) heteroaryl;

the second host material comprises a compound represented by the following formula 2:

(2)

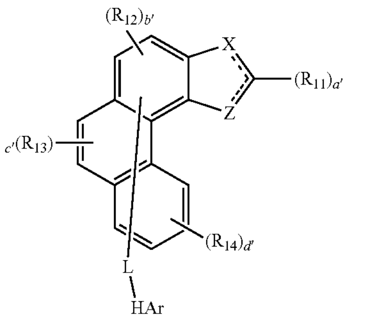

wherein,

X represents —N═, —$NR_{15}$—, —O—, or —S—;

Z represents —N═, —$NR_{16}$—, —O—, or —S—; with a proviso that when X represents —N═, Z represents —$NR_{16}$—, —O—, or —S—, and when X represents —$NR_{15}$—, Z represents —N═, —O—, or —S—;

HAr represents a substituted or unsubstituted (3- to 30-membered) heteroaryl;

$R_{11}$ represents a substituted or unsubstituted (C6-C30) aryl, or a substituted or unsubstituted (3- to 30-membered) heteroaryl;

$R_{12}$ to $R_{14}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or adjacent ones of $R_{12}$ to $R_{14}$ may be linked to each other to form a ring(s);

$R_{15}$ and $R_{16}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

L represents a single bond, a substituted or unsubstituted (C6-C30)arylene, or a substituted or unsubstituted (3- to 30-membered) heteroarylene;

a' represents an integer of 1; b' and c', each independently, represent an integer of 1 or 2; d' represents an integer of 1 to 4; where if b', c', and d', each independently, are an integer of 2 or more, each of $R_{12}$ to $R_{14}$ may be the same or different.

2. The plurality of host materials according to claim 1, wherein the substituents of the substituted alkyl, the substituted alkylene, the substituted aryl, the substituted arylene, the substituted heteroaryl, the substituted heteroarylene, the substituted cycloalkyl, the substituted cycloalkylene, the substituted alkoxy, the substituted trialkylsilyl, the substituted dialkylarylsilyl, the substituted alkyldiarylsilyl, the substituted triarylsilyl, the substituted mono- or di-alkylamino, the substituted mono- or di-arylamino, or the substituted alkylarylamino in $Ar_1$ to $Ar_3$, $L_1$ to $L_3$, HAr, $R_{11}$ to $R_{16}$, and L, each independently, are at least one selected from the group consisting of deuterium; a halogen; a cyano; a carboxyl; a nitro; a hydroxyl; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered) heterocycloalkyl; a (C6-C30)aryloxy; a (C6-C30)arylthio; a (3- to 30-membered) heteroaryl unsubstituted or substituted with a (C6-C30)aryl(s); a (C6-C30)aryl unsubstituted or substituted with a (3- to 30-membered) heteroaryl(s); a tri(C1-C30)alkylsilyl; a tri(C6-C30)arylsilyl; a di(C1-C30)alkyl (C6-C30)arylsilyl; a (C1-C30)alkyldi(C6-C30)arylsilyl; an amino; a mono- or di-(C1-C30)alkylamino; a mono- or di-(C6-C30)arylamino unsubstituted or substituted with a (C1-C30)alkyl(s); a (C1-C30)alkyl(C6-C30)arylamino; a (C1-C30)alkylcarbonyl; a (C1-C30)alkoxycarbonyl; a (C6-C30)arylcarbonyl; a di(C6-C30)arylboronyl; a di(C1-C30) alkylboronyl; a (C1-C30)alkyl(C6-C30)arylboronyl; a (C6-C30)aryl(C1-C30)alkyl; and a (C1-C30)alkyl(C6-C30)aryl.

3. The plurality of host materials according to claim 1, wherein the formula 2 is represented by at least one of the following formulas 2-1 to 2-6:

(2-1)

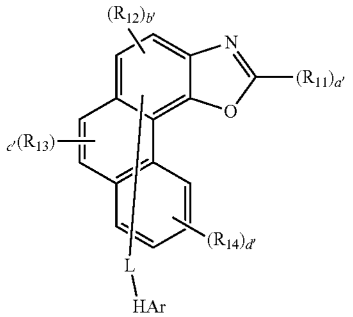

(2-2)

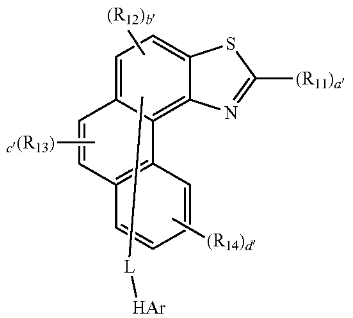

(2-3)

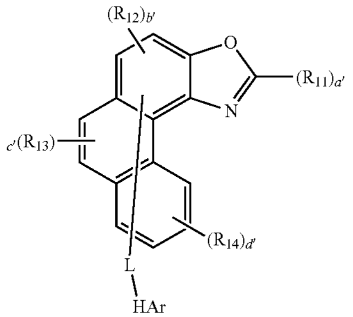

(2-4)

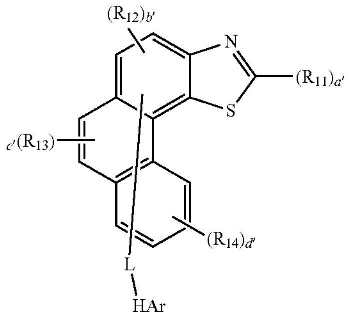

(2-5)

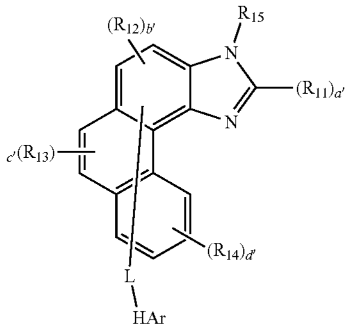

-continued (2-6)

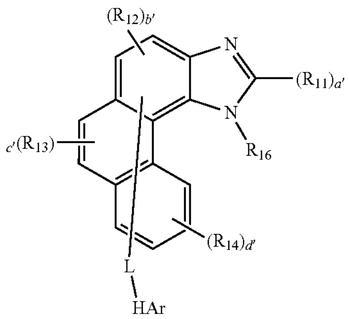

wherein,

HAr, $R_{11}$ to $R_{16}$, L, and a' to d' are as defined in claim 1.

4. The plurality of host materials according to claim 3, wherein HAr represents a substituted or unsubstituted quinazolinyl, a substituted or unsubstituted quinoxalinyl, a substituted or unsubstituted triazinyl, or a substituted or unsubstituted pyrimidinyl.

5. The plurality of host materials according to claim 3, wherein the compound represented by formula 1 is at least one selected from the group consisting of the following compounds:

C-1-25

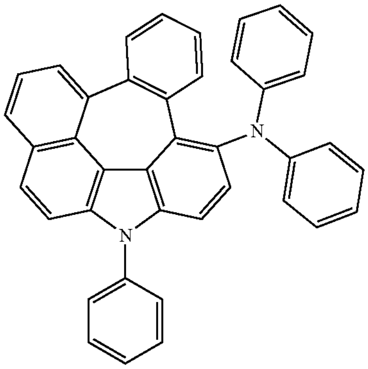

C-1-26

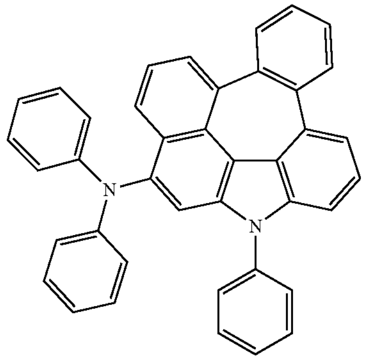

-continued
C-1-27
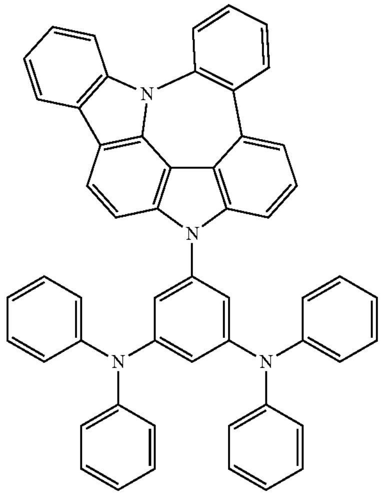
C-1-28
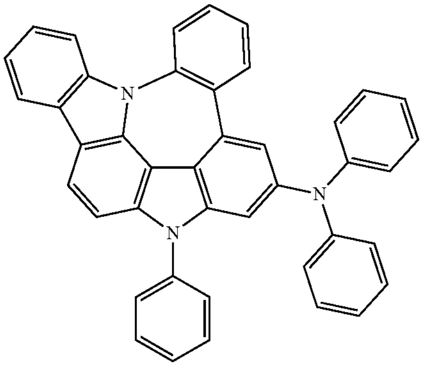
C-1-29
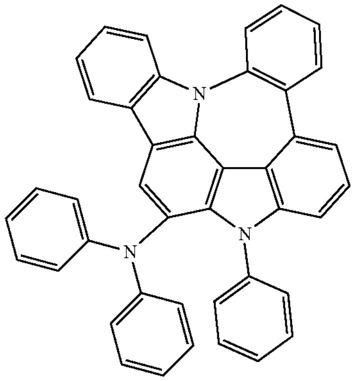
-continued
C-1-30
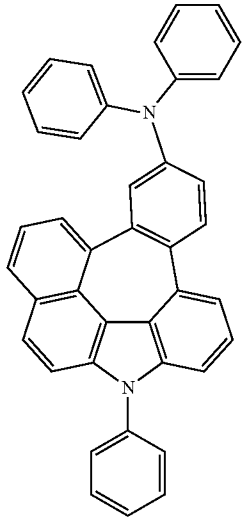
C-1-105
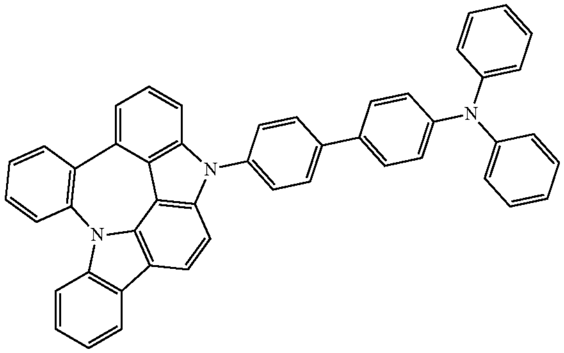
C-1-106
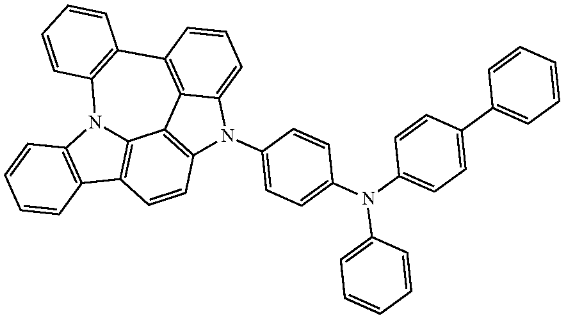

-continued
C-1-107
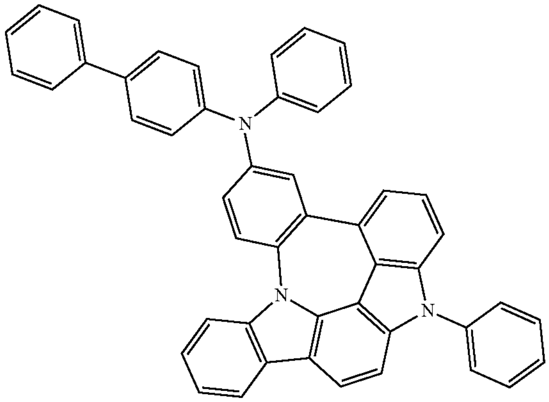
C-1-108
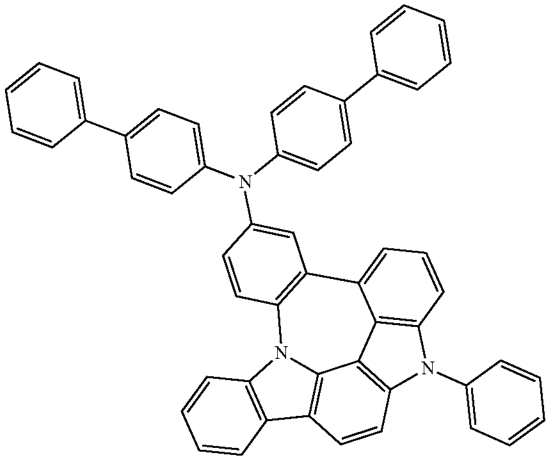
C-1-109
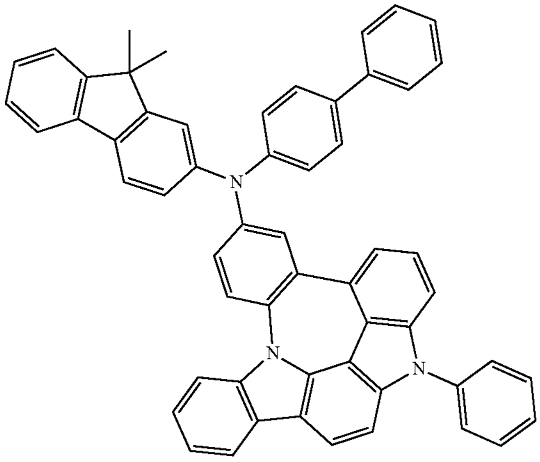
-continued
C-1-110
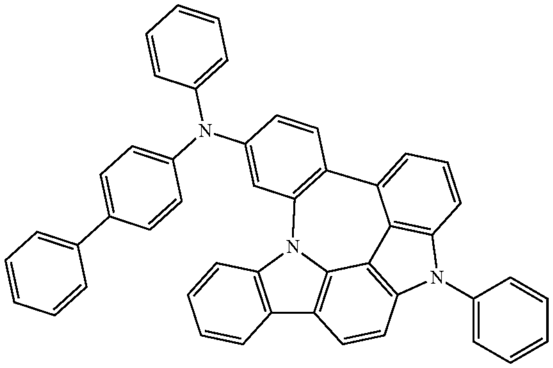
C-1-138
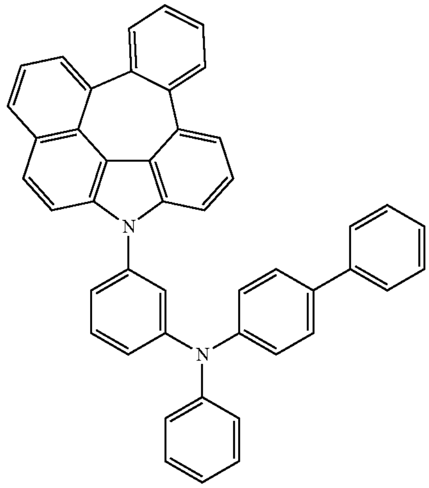
C-1-139
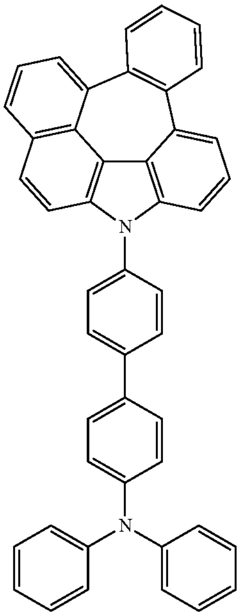

-continued
C-1-140
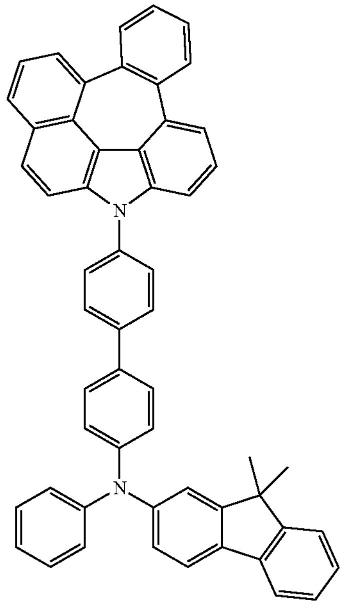
C-1-141
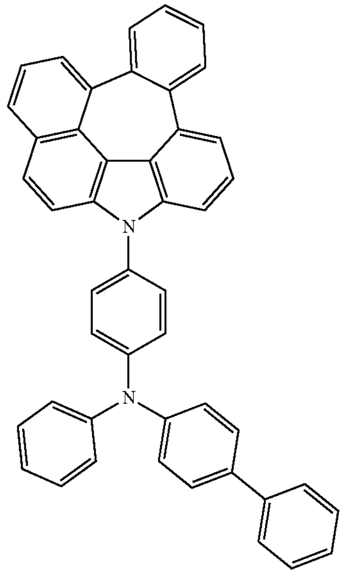
-continued
C-1-142
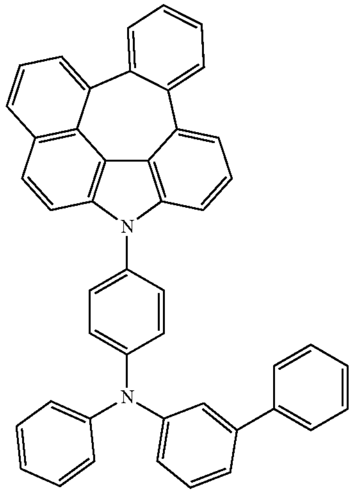
C-1-143
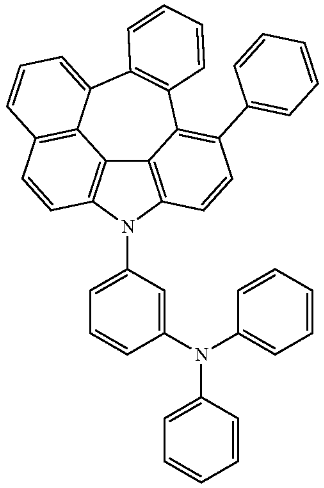
C-1-144
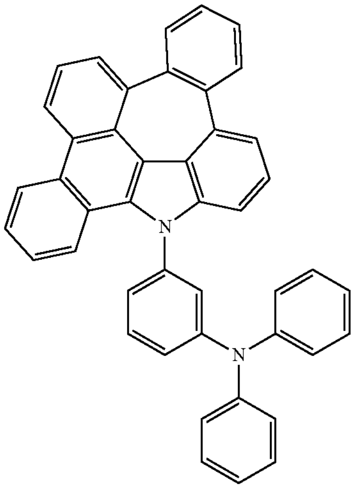

-continued
C-1-145
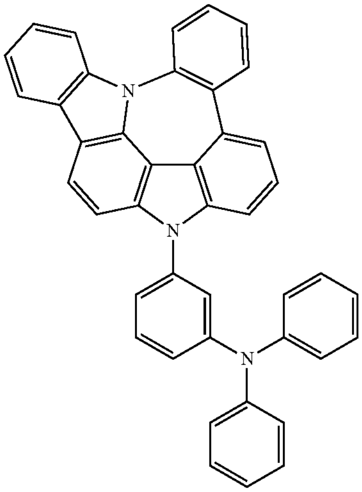
C-1-146
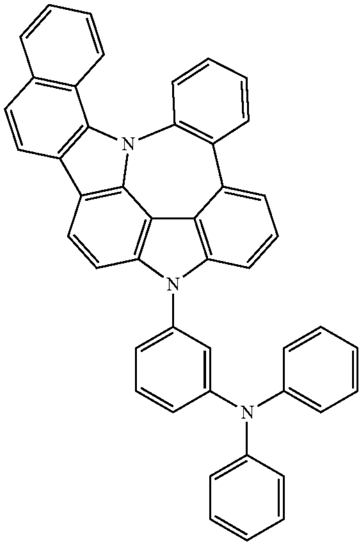
C-1-147
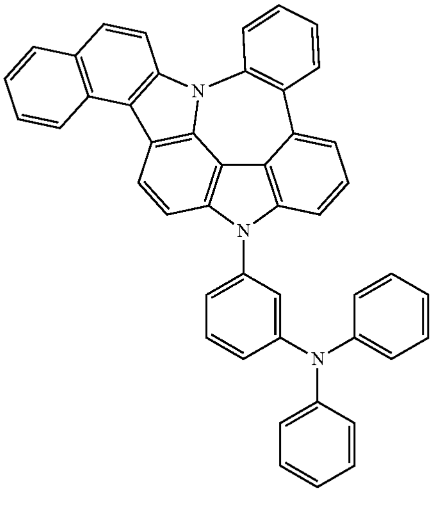
-continued
C-1-148
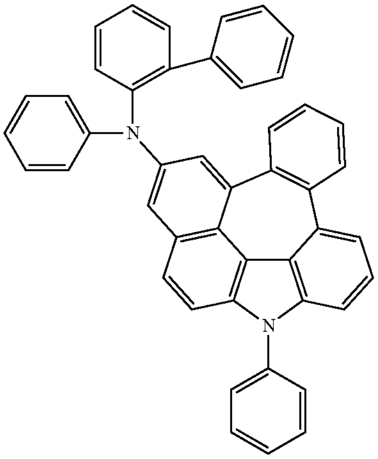
C-1-149
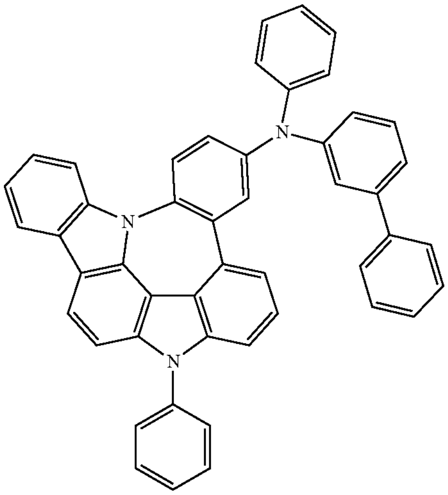
C-1-150
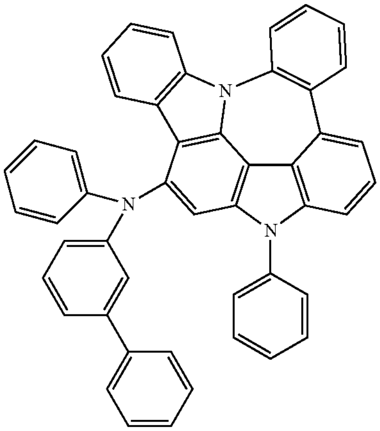

-continued
C-1-151
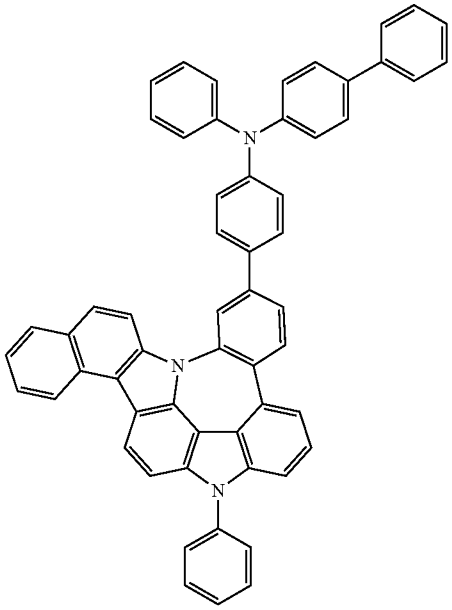
C-1-152
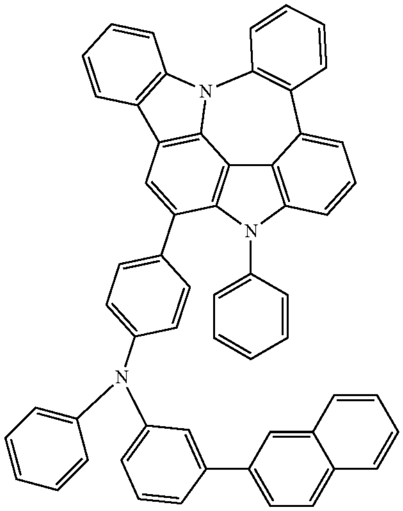
C-1-153
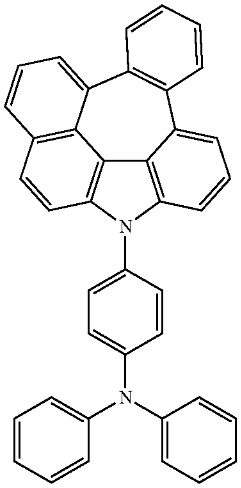
-continued
C-1-154
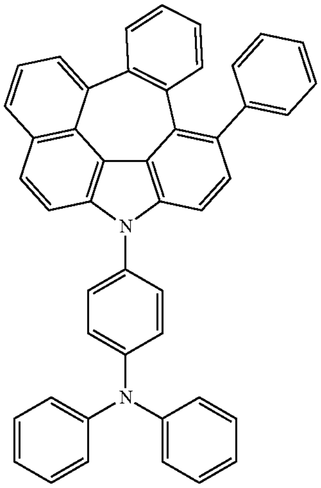
C-1-155
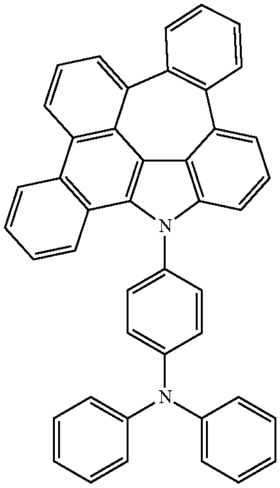
C-1-156
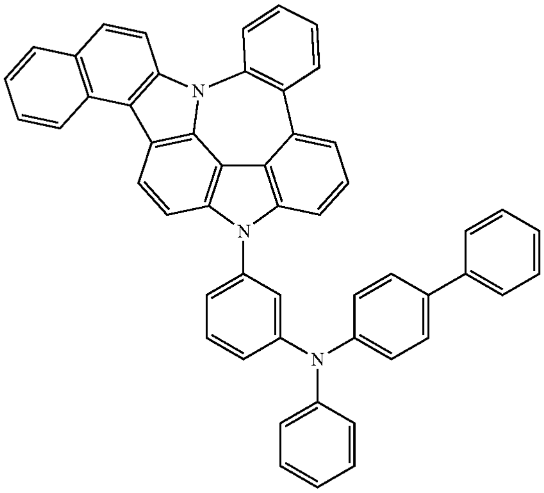

C-1-157
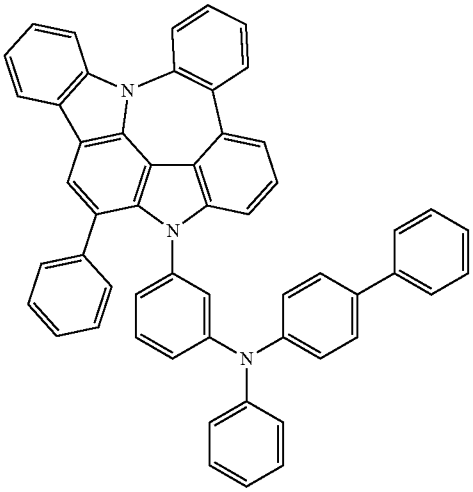
C-1-158
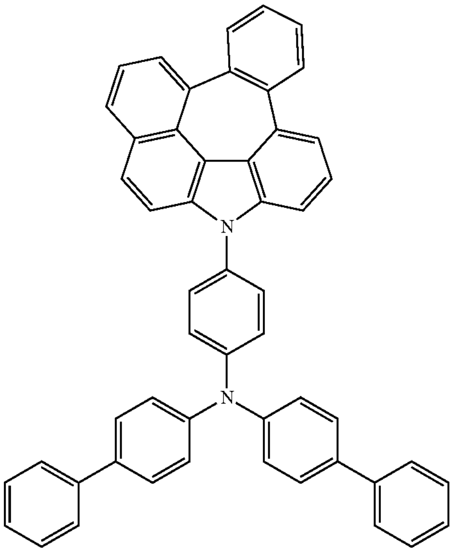
C-1-159
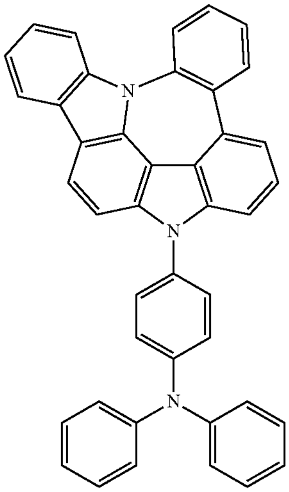
C-1-160
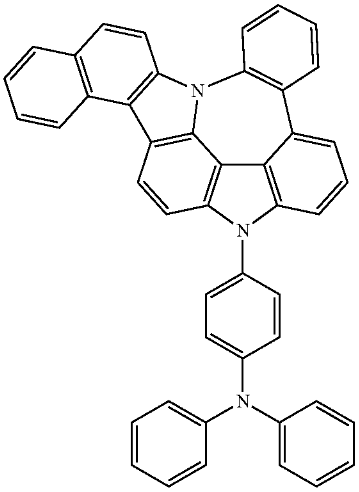
C-1-161
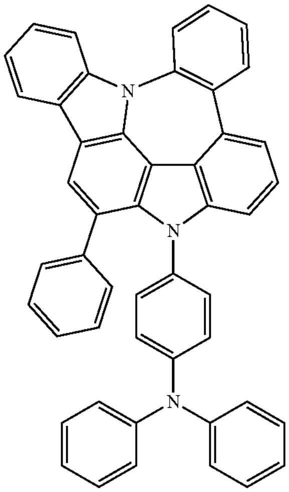
C-1-162
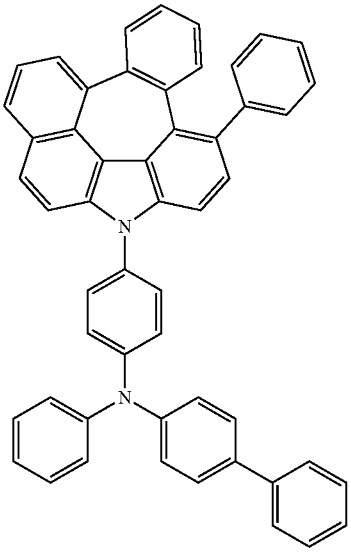

-continued
C-1-163
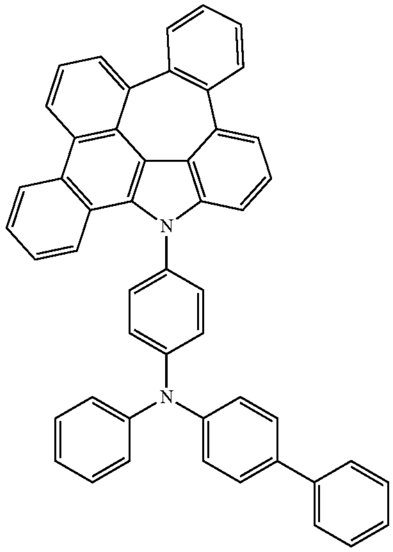
C-1-164
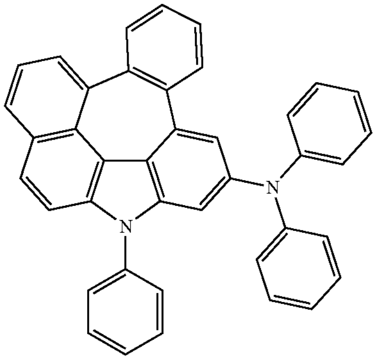
C-1-165
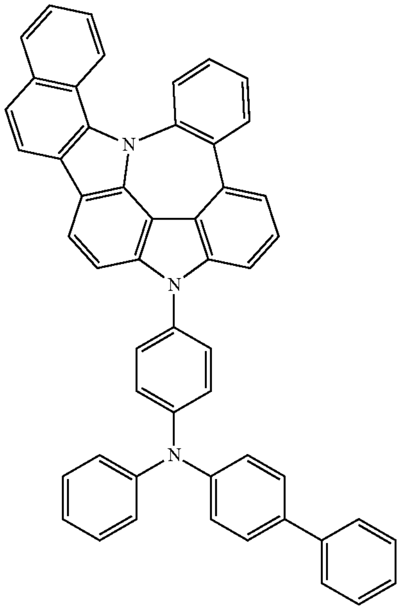
-continued
C-1-166
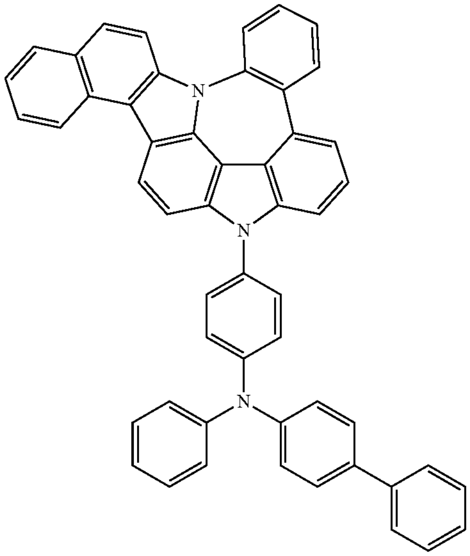
C-1-167
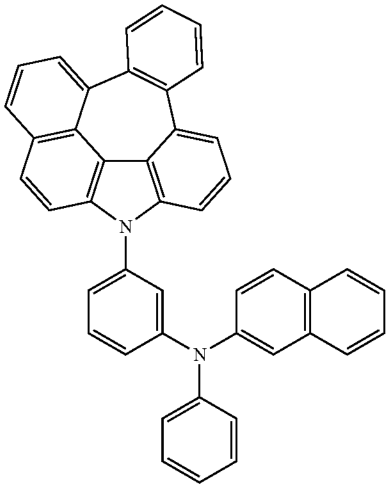
C-1-168
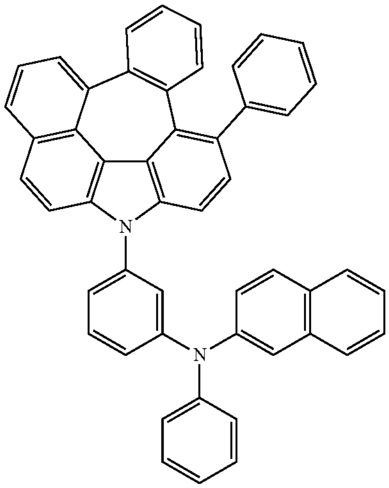

-continued
C-1-169
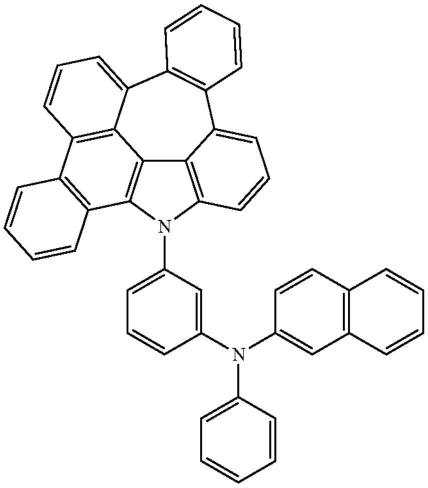
C-1-170
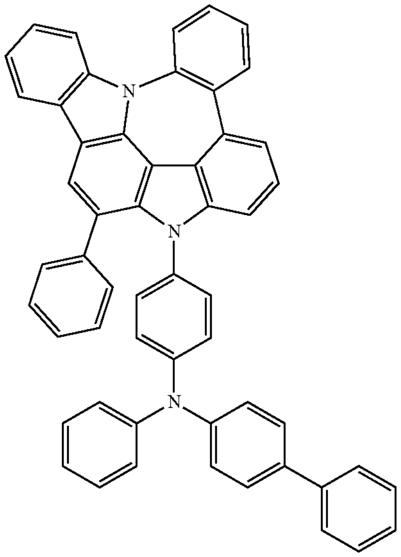
C-1-171
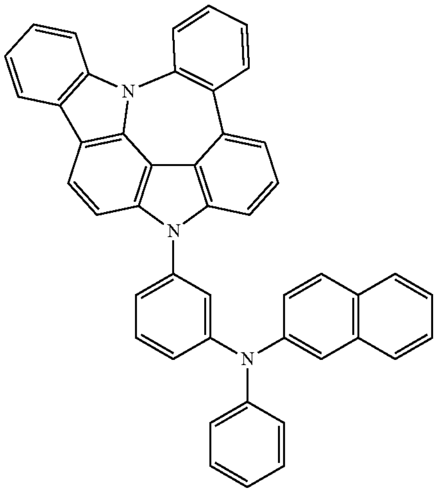
-continued
C-1-172
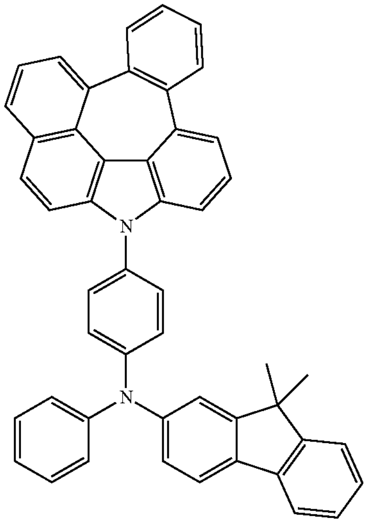
C-1-173
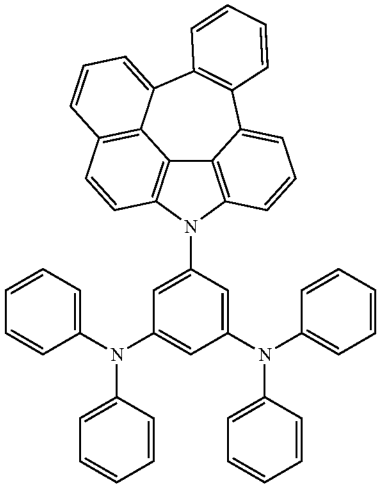
C-1-174
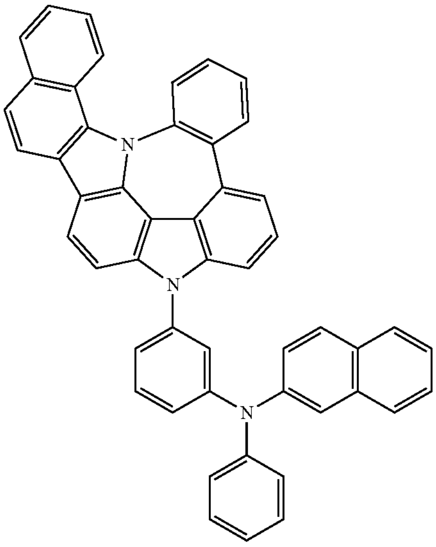

-continued
C-1-175
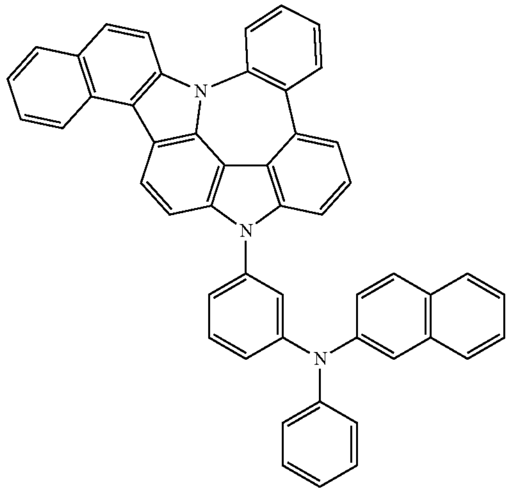
C-1-176
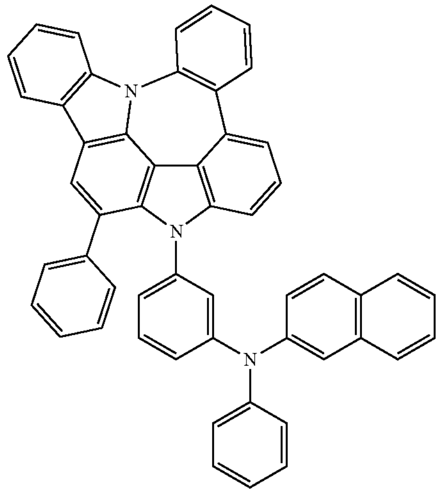
C-1-177
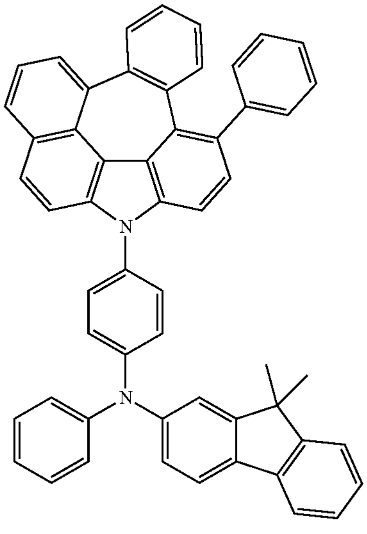
-continued
C-1-178
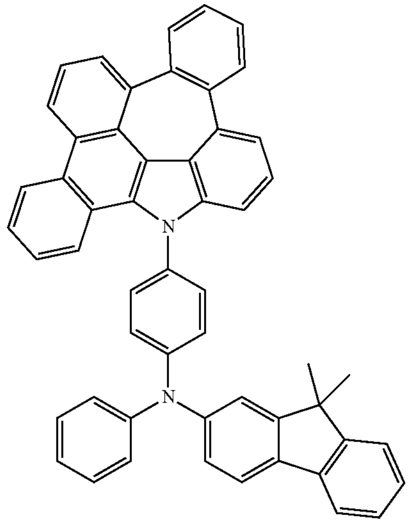
C-1-179
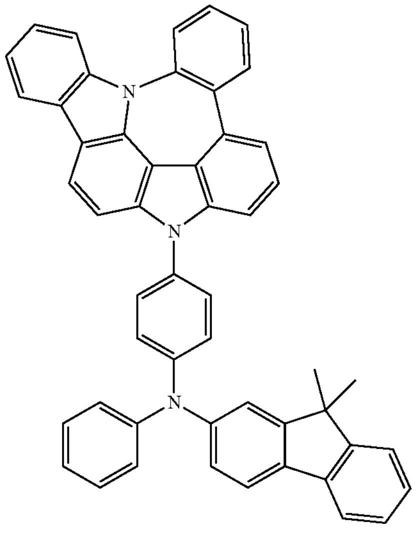

-continued
C-1-180
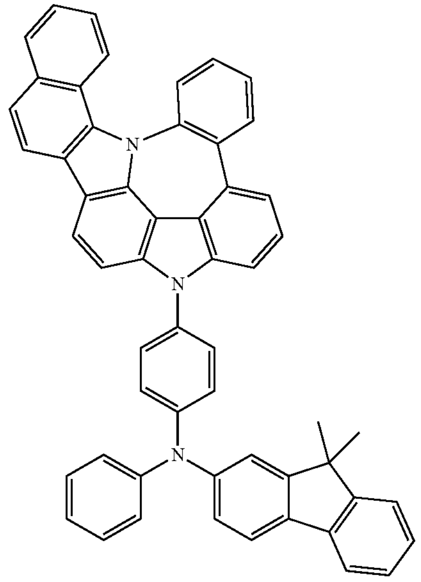
C-1-181
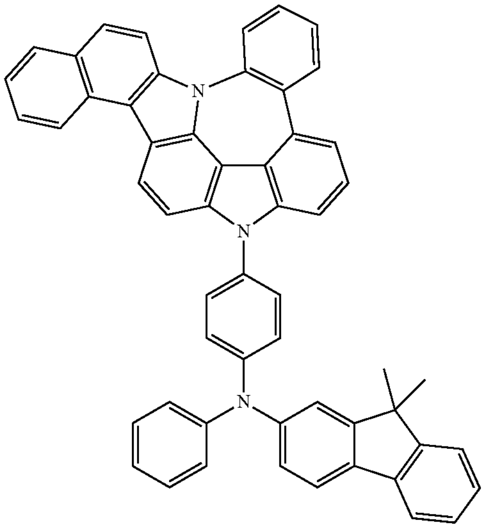
C-1-182
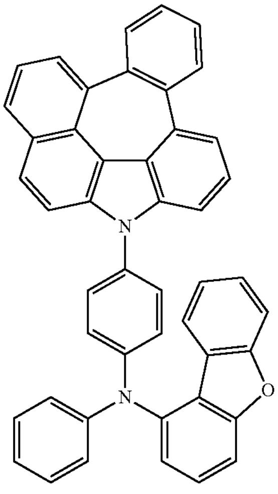
-continued
C-1-183
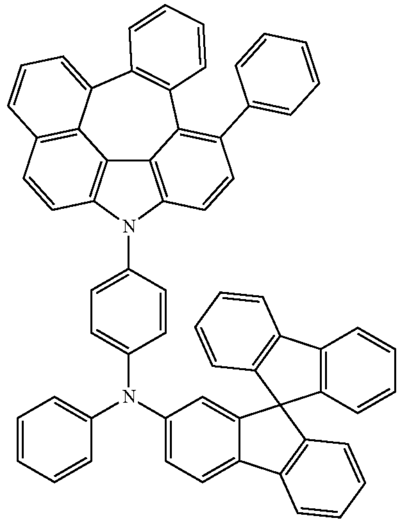
C-1-184
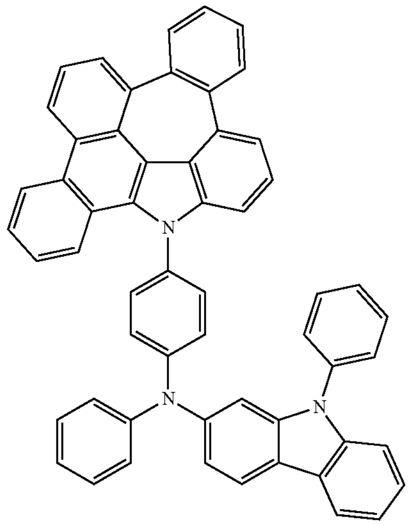
C-1-185
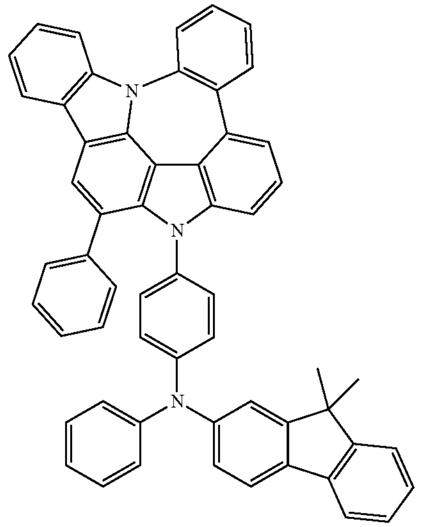

-continued
C-1-186
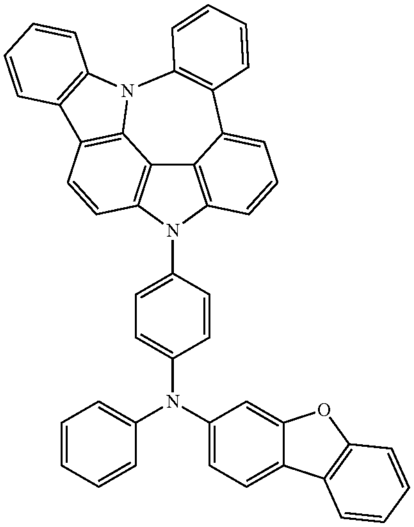
C-1-187
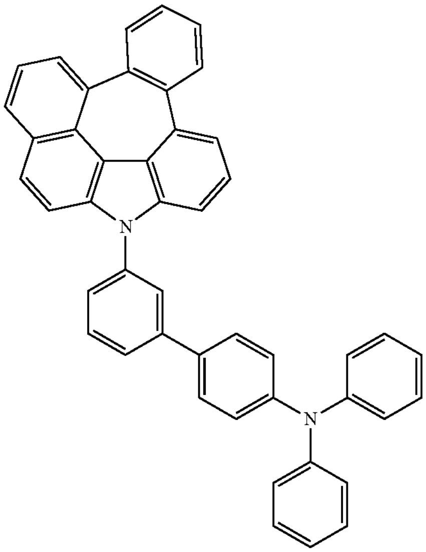
-continued
C-1-188
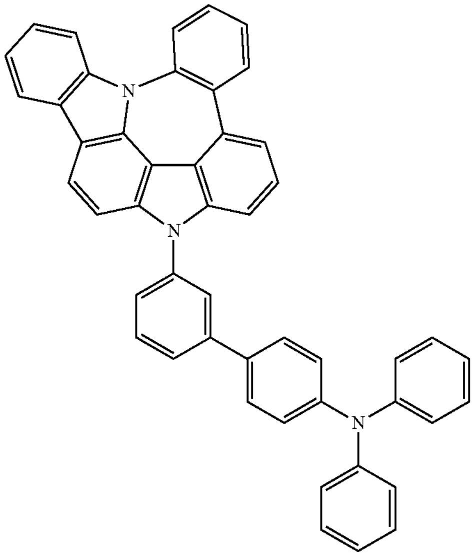
C-1-189
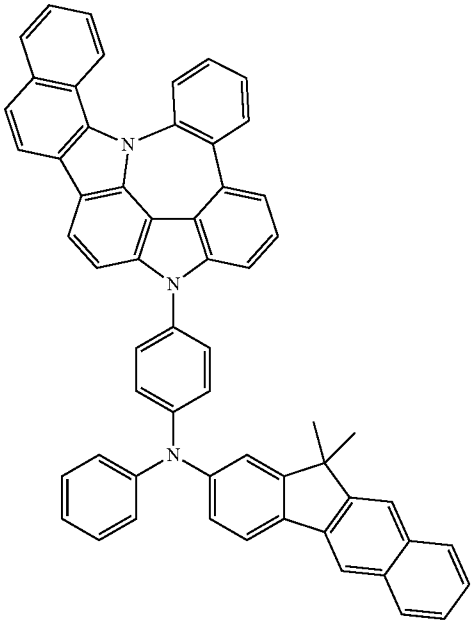

-continued
C-1-190
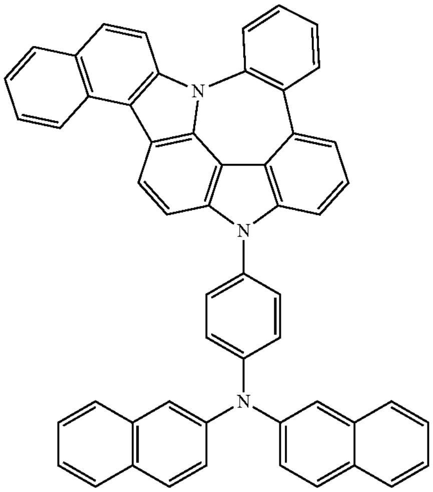
C-1-191
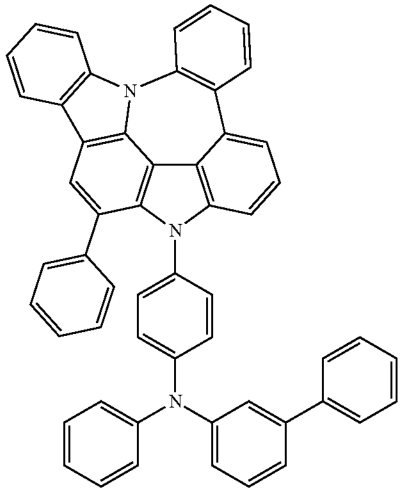
C-1-192
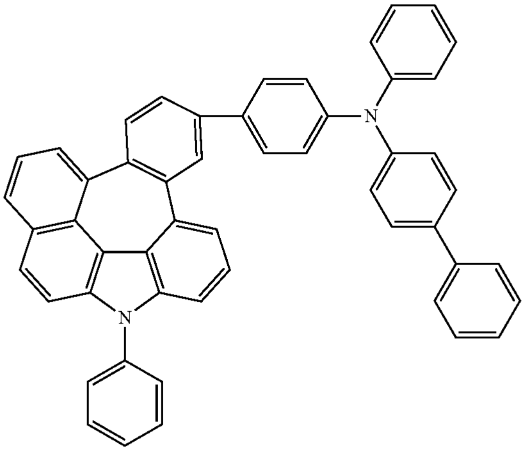
-continued
C-1-193
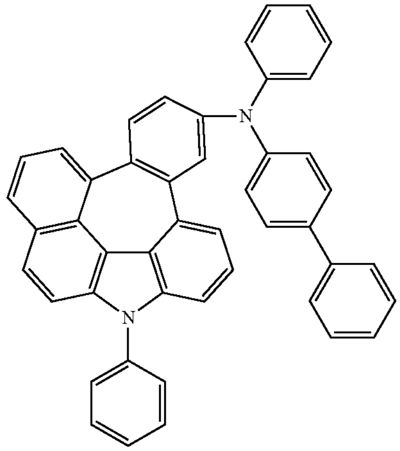
C-1-194
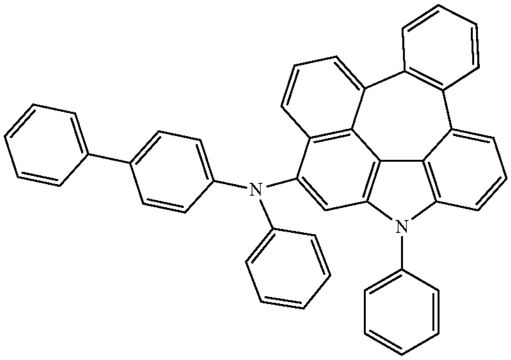
and
C-1-195
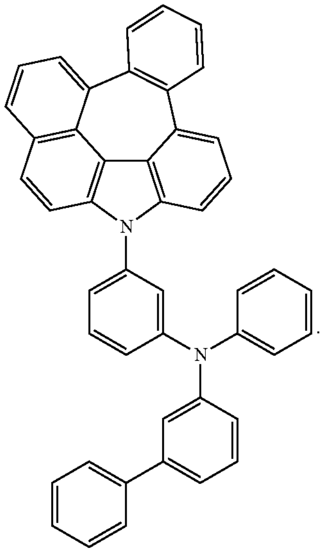
.
6. The plurality of host materials according to claim 3, wherein the compound represented by formula 2 is at least one selected from the group consisting of the following compounds:

-continued
C-2-1
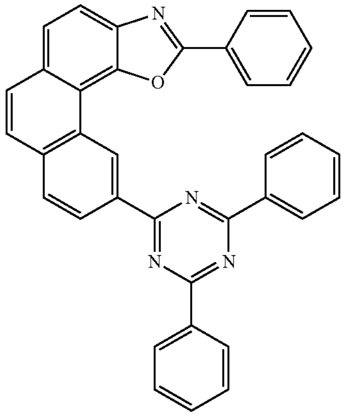
C-2-4
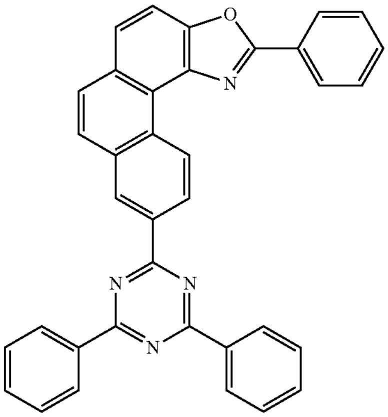
C-2-2
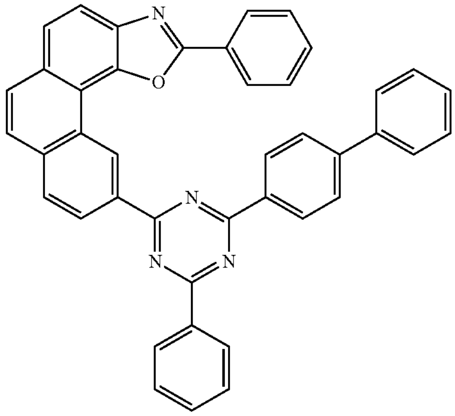
C-2-5
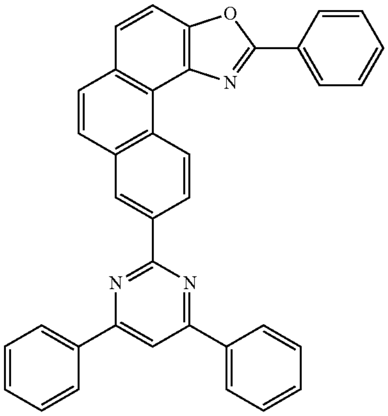
C-2-3
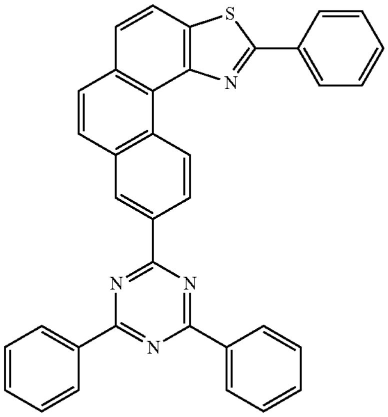
C-2-6
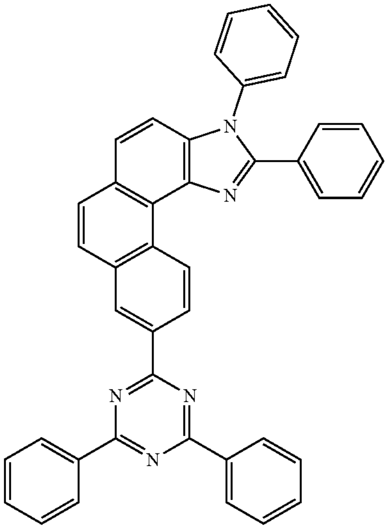

-continued
C-2-7
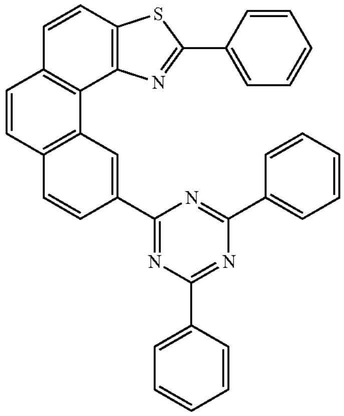
C-2-8
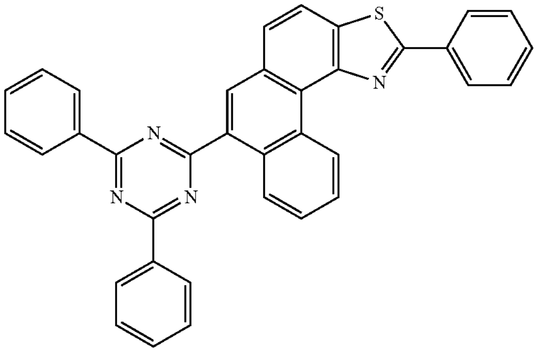
C-2-9
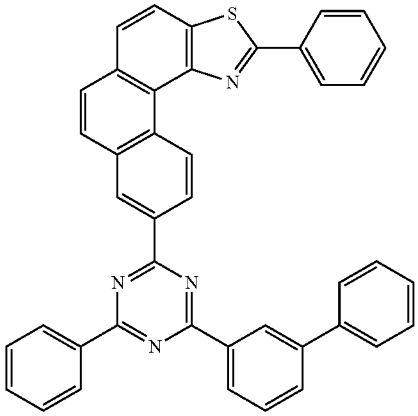
-continued
C-2-10
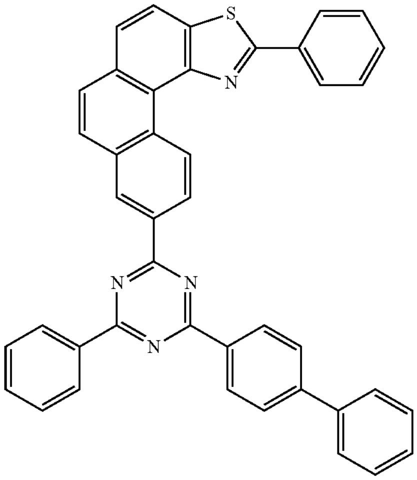
C-2-11
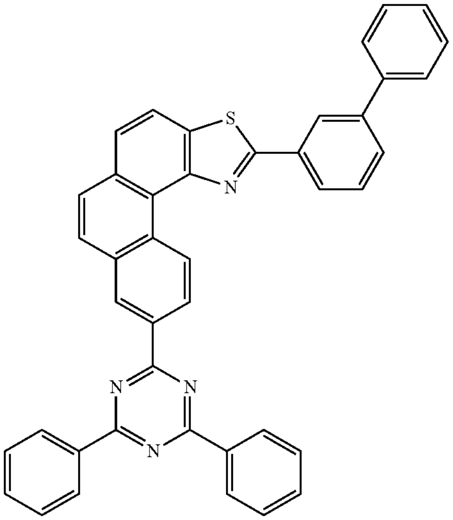
C-2-12
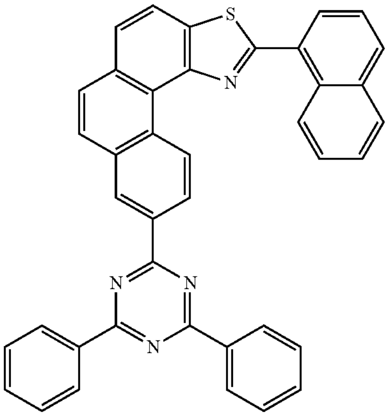

-continued
C-2-13
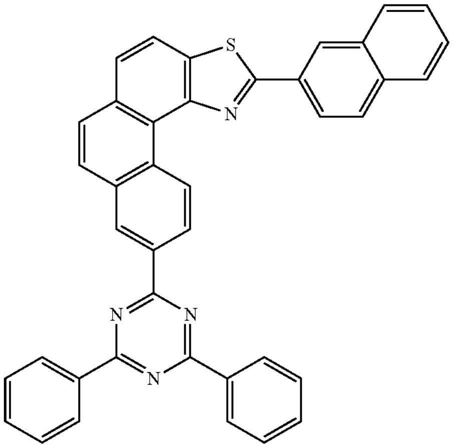
C-2-14
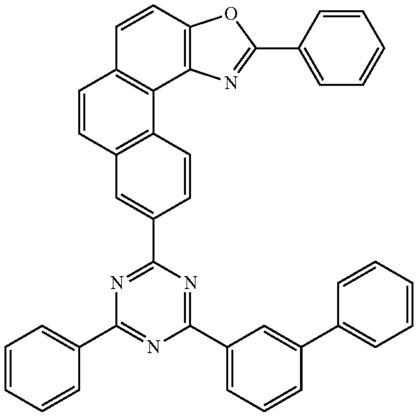
C-2-15
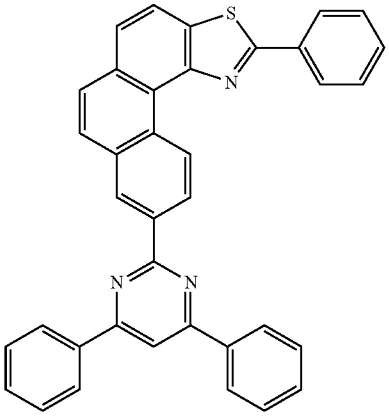
-continued
C-2-16
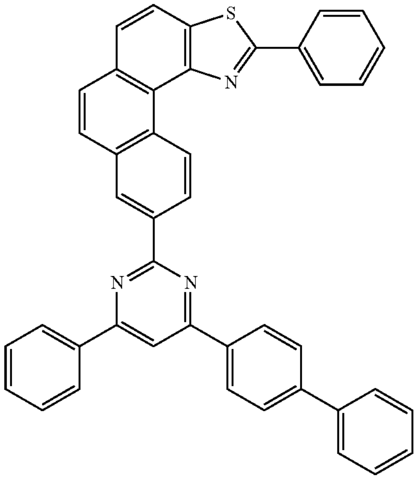
C-2-17
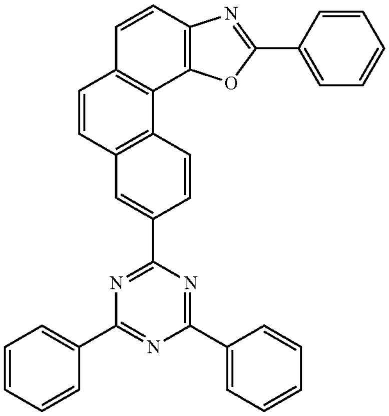
C-2-18
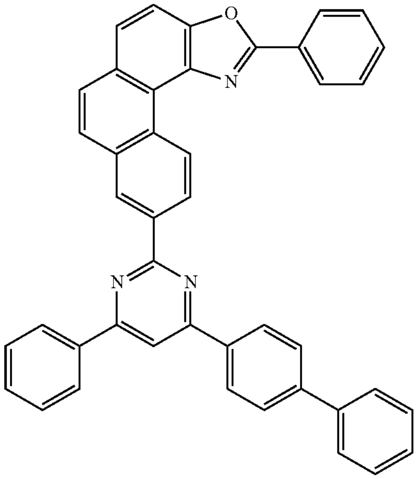

-continued
C-2-19
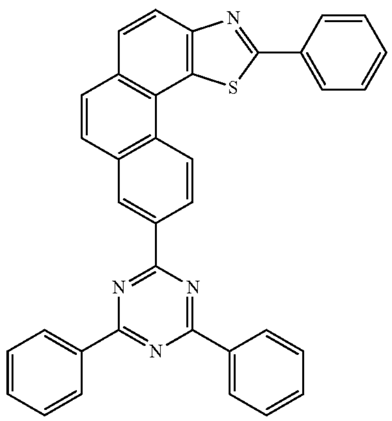
C-2-20
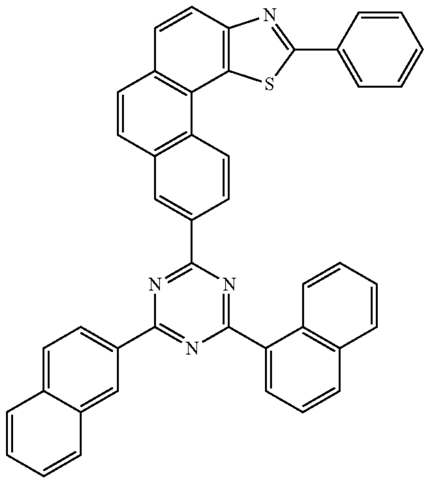
C-2-21
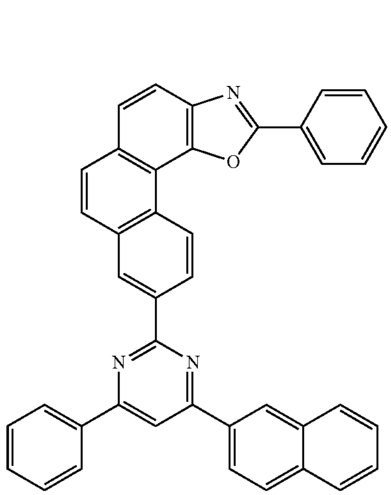
-continued
C-2-22
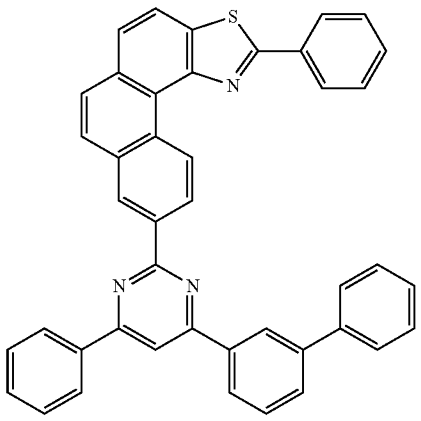
C-2-23
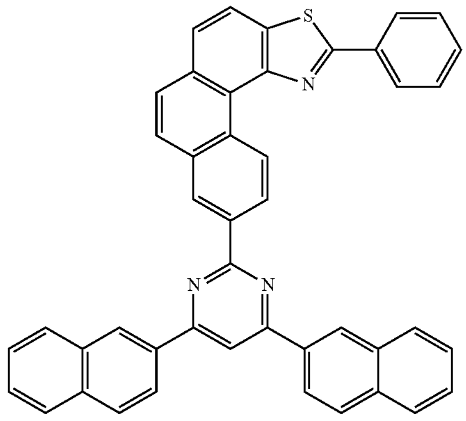
C-2-24
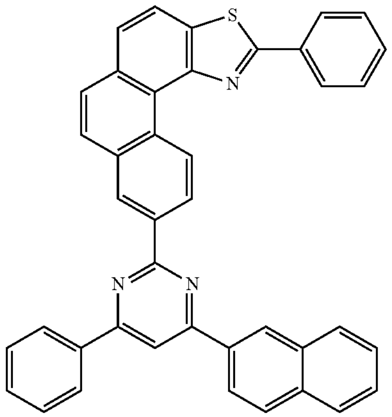

C-2-25
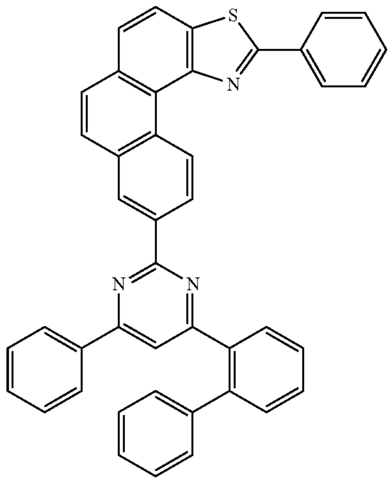
C-2-26
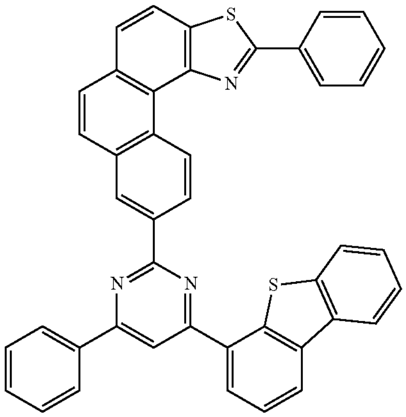
C-2-27
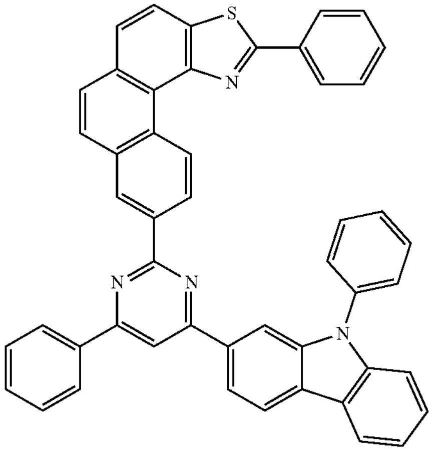
C-2-28
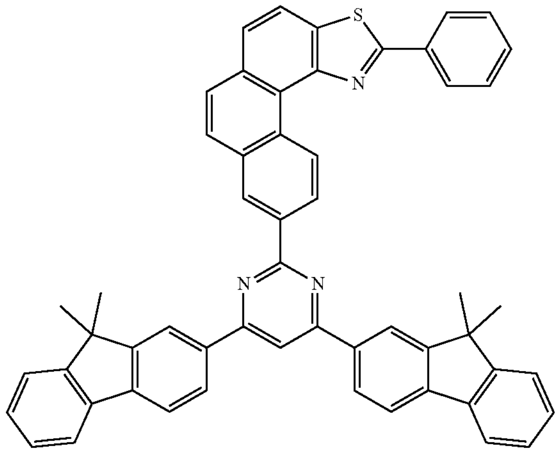
C-2-29
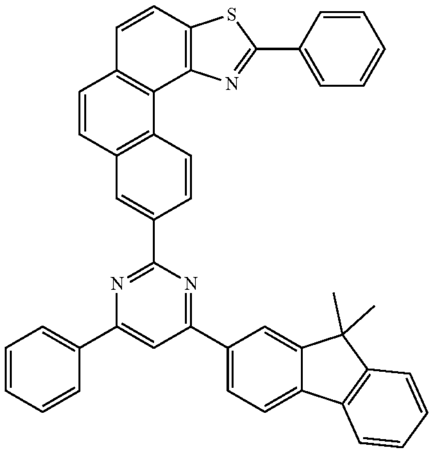
C-2-30
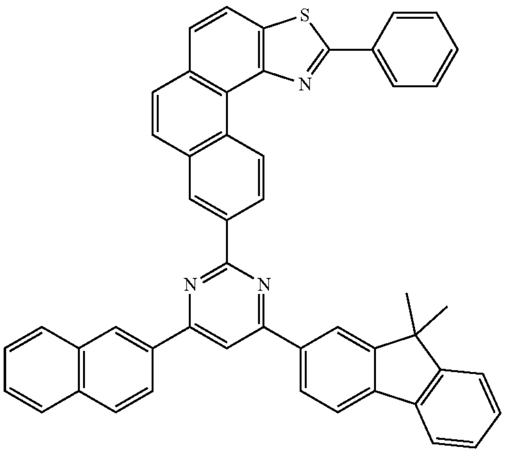

-continued
C-2-31
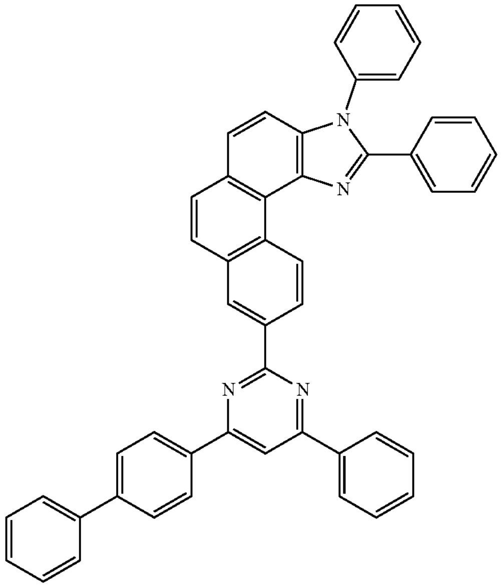
C-2-32
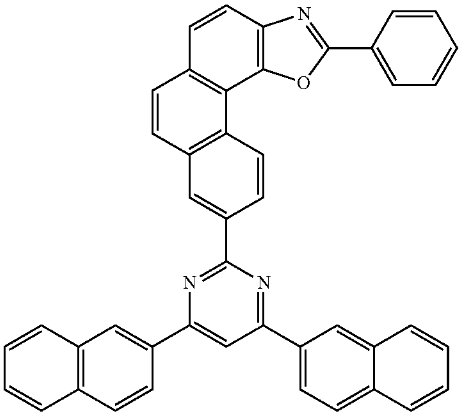
C-2-33
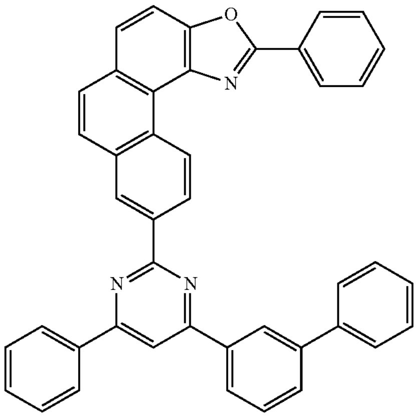
-continued
C-2-34
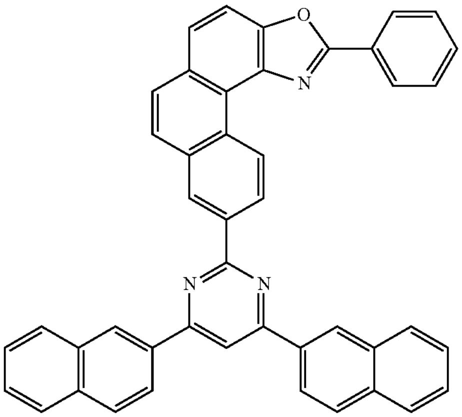
C-2-35
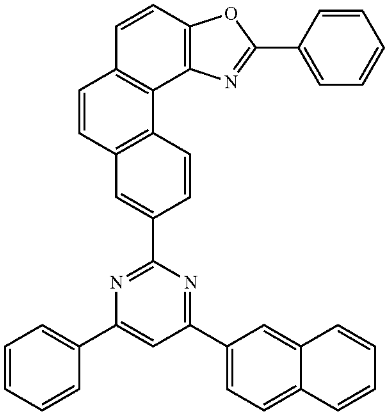
C-2-36
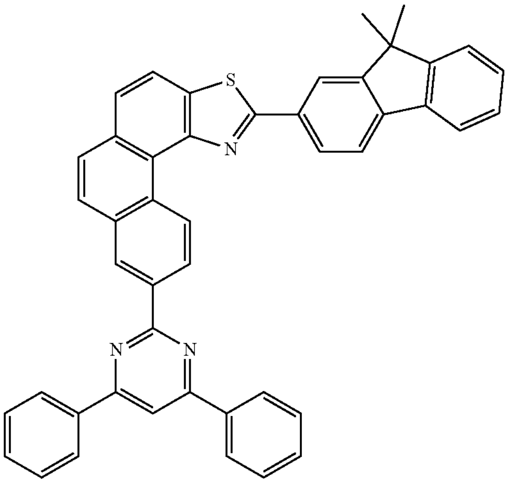

-continued
C-2-37
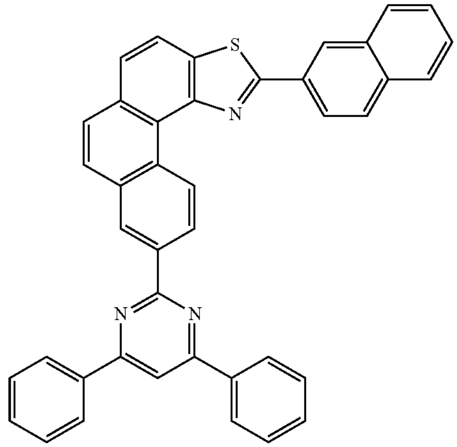
C-2-38
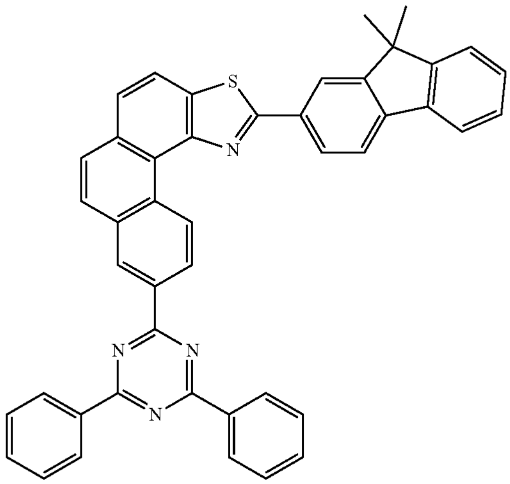
C-2-39
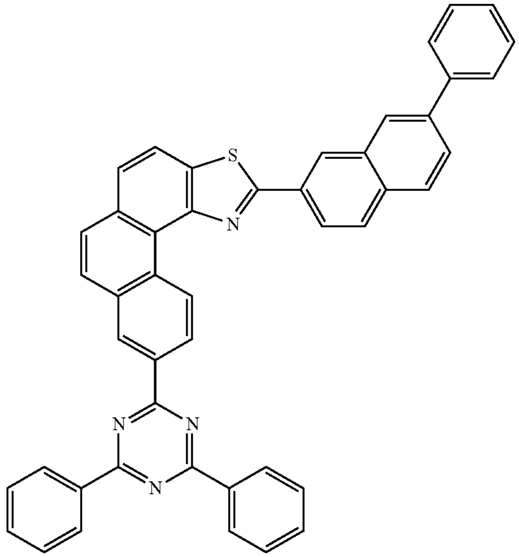
-continued
C-2-40
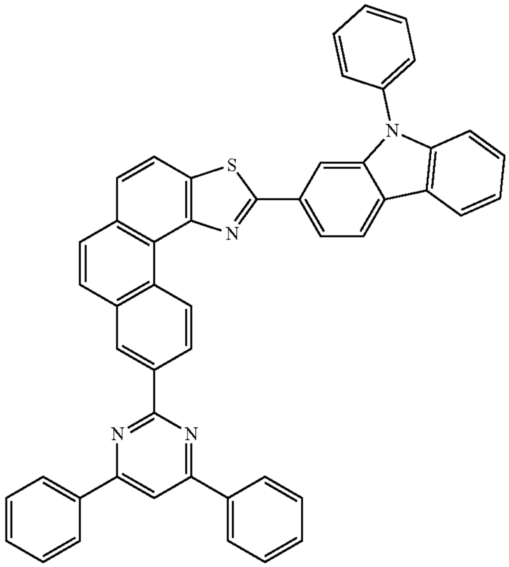
C-2-41
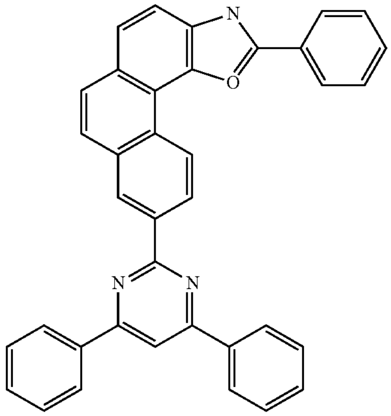
C-2-42
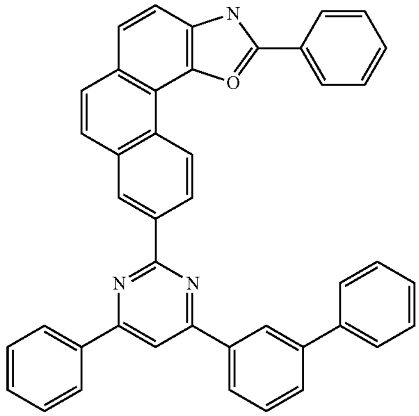

-continued
C-2-43
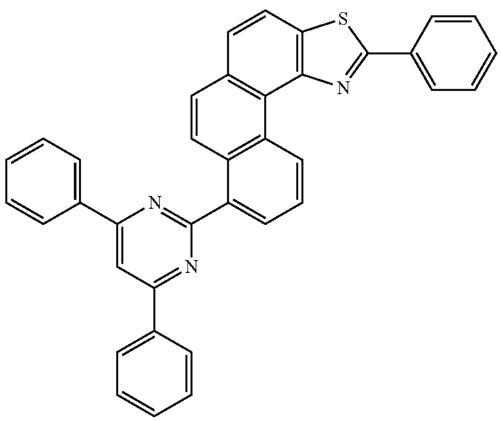
C-2-44
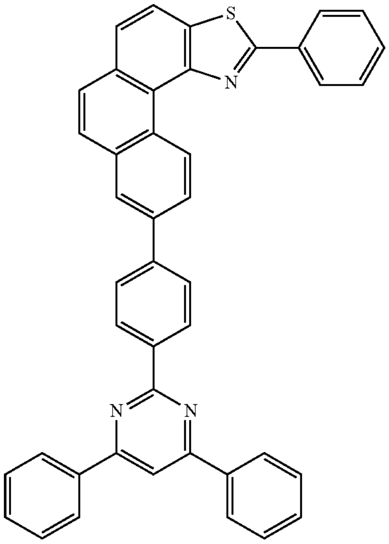
C-2-45
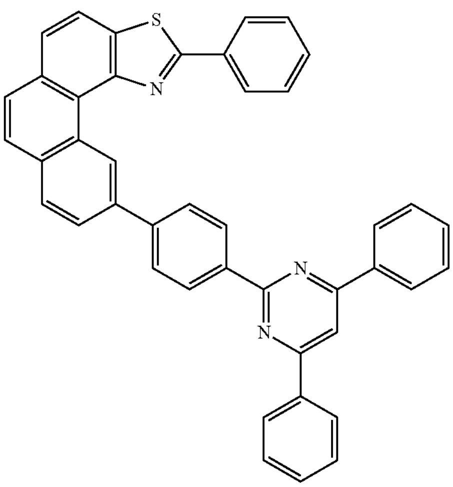
-continued
C-2-46
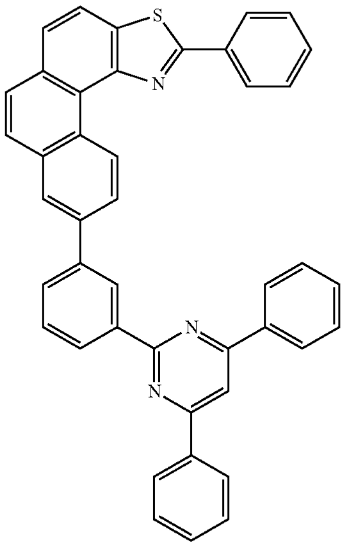
C-2-47
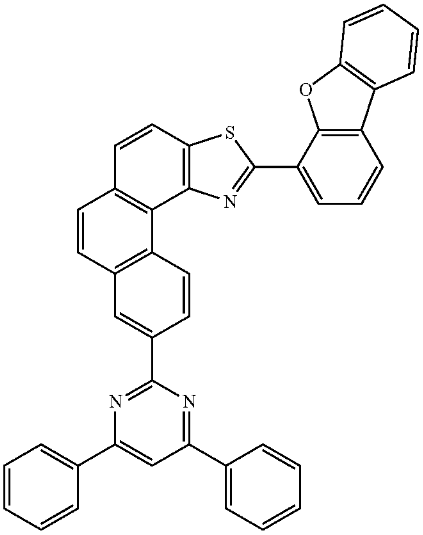
C-2-48
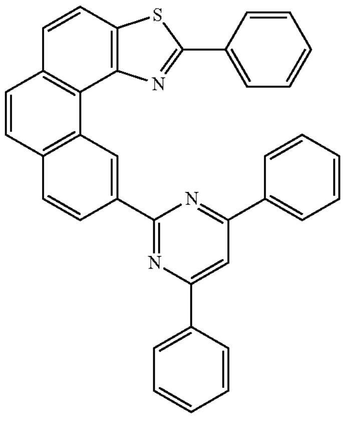

-continued
C-2-49
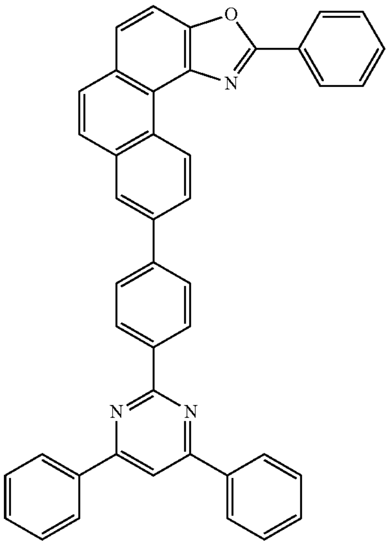
C-2-50
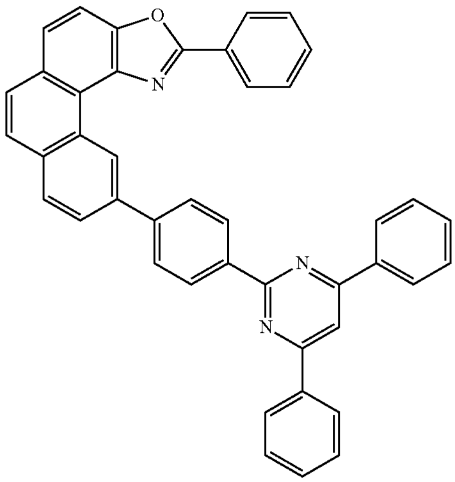
C-2-51
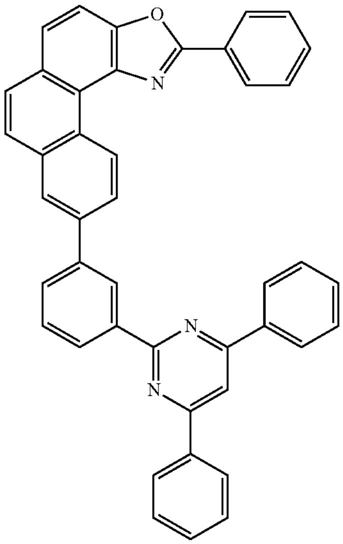
-continued
C-2-52
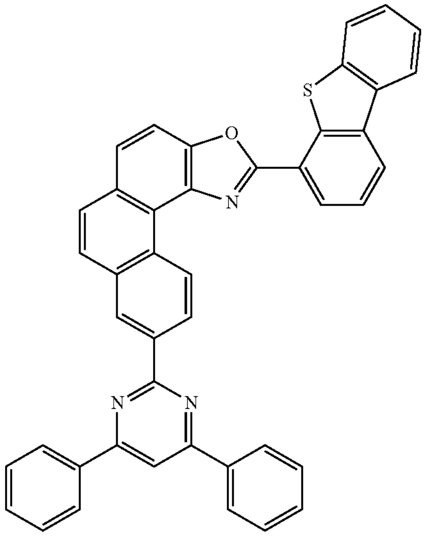
C-2-53
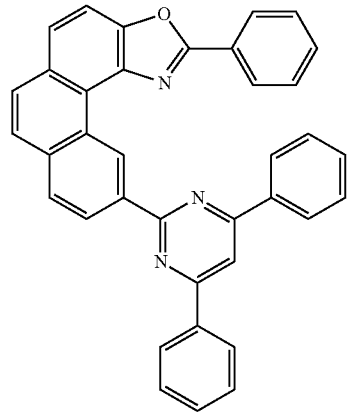
C-2-54
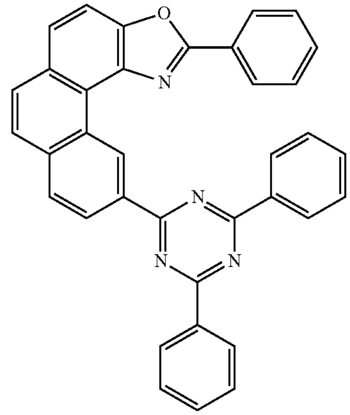

C-2-55
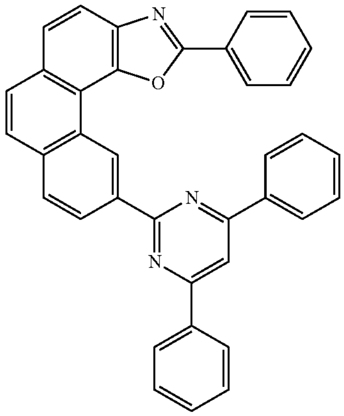
C-2-56
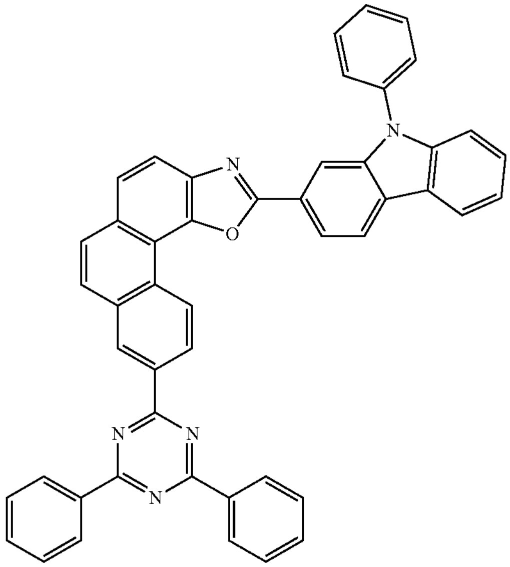
C-2-57
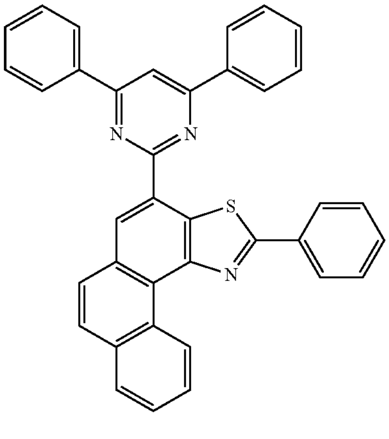
C-2-58
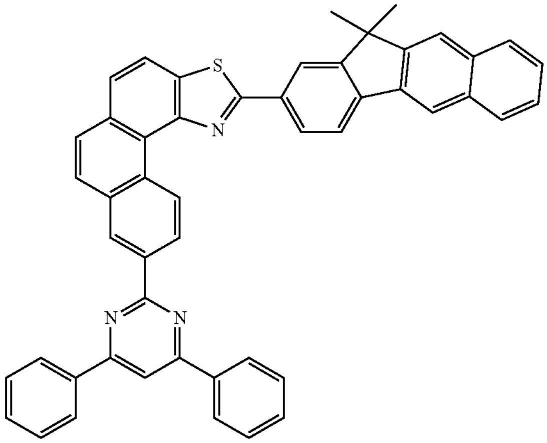
C-2-59
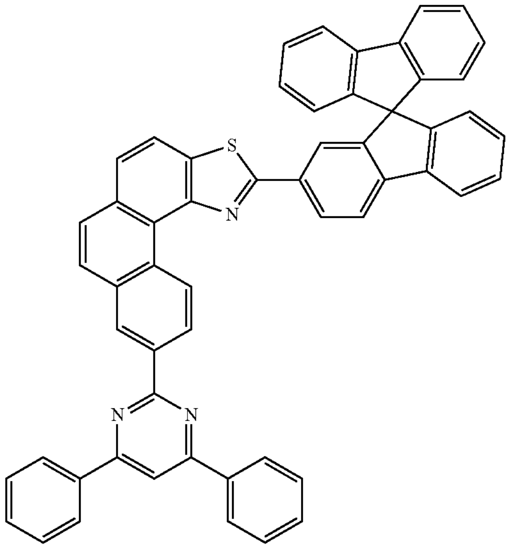
C-2-60
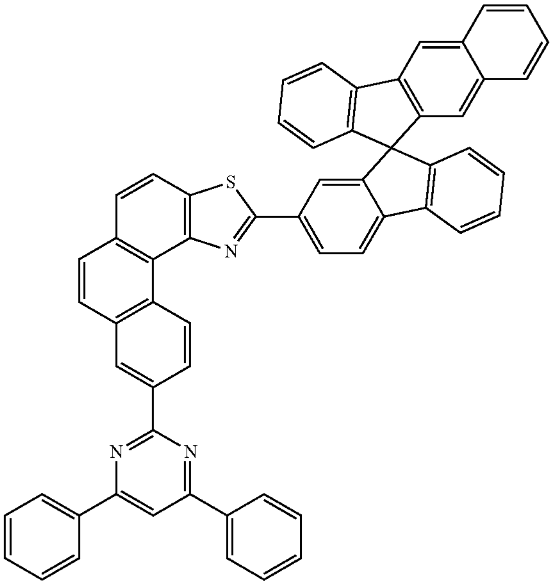

-continued
C-2-61
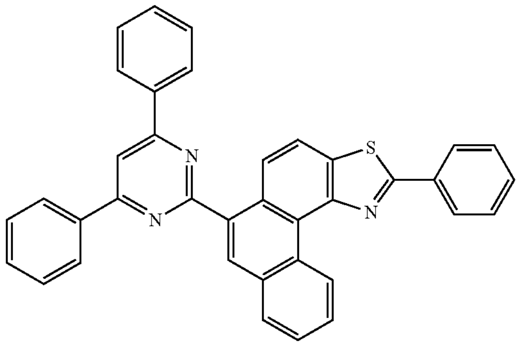
C-2-62
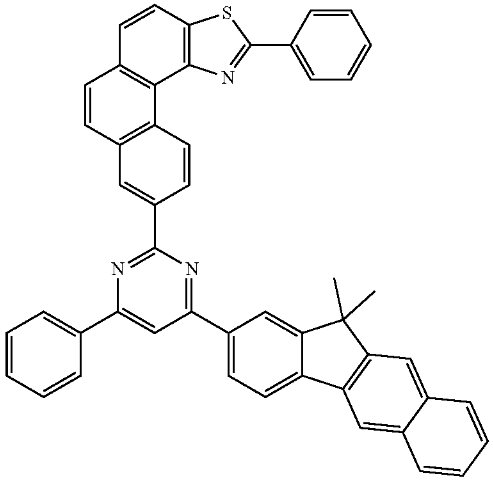
C-2-63
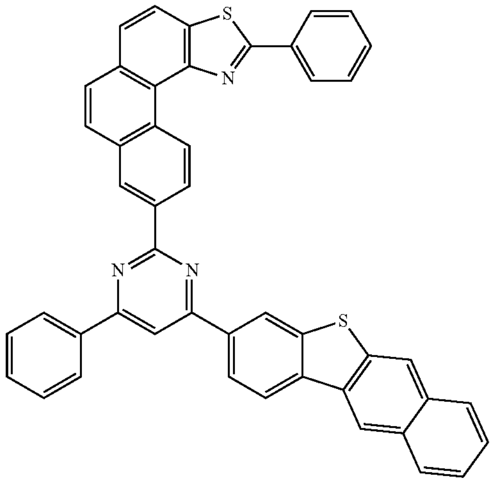
-continued
C-2-64
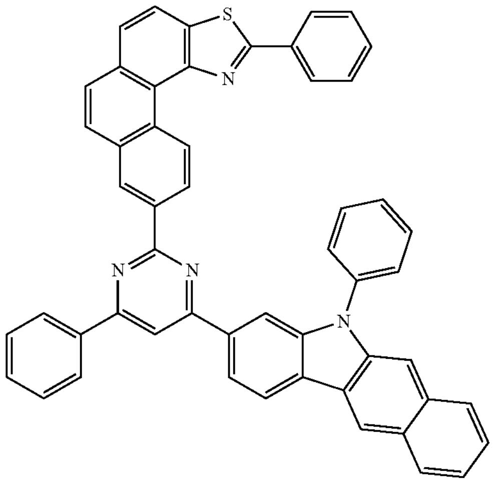
C-2-65
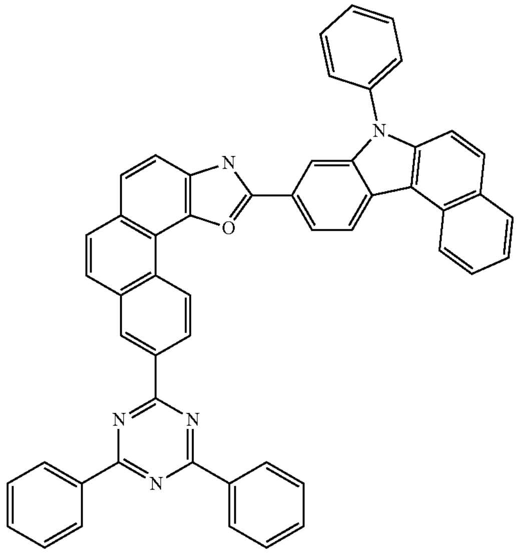
C-2-66
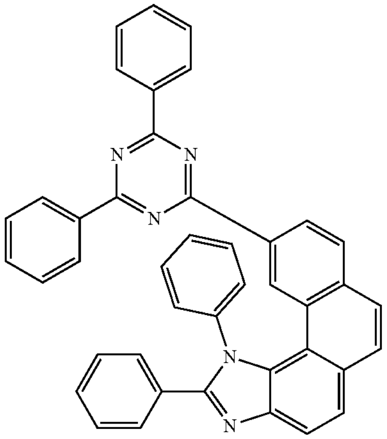

-continued
C-2-67
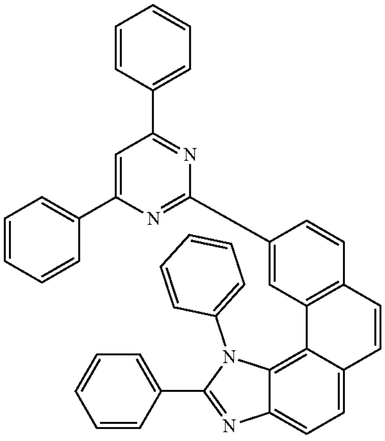
C-2-68
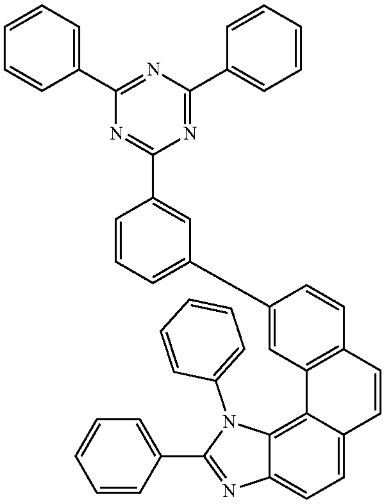
C-2-69
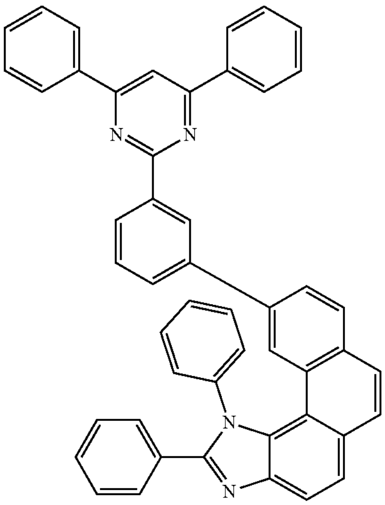
-continued
C-2-70
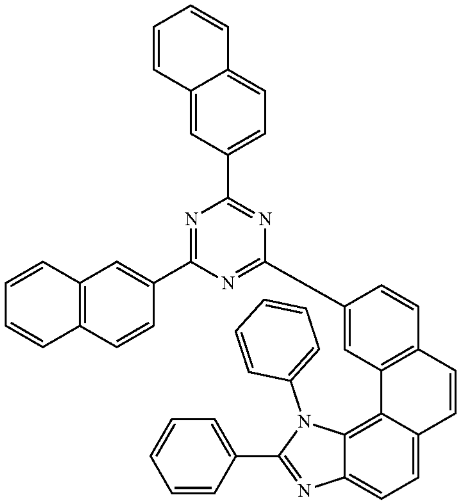
C-2-71
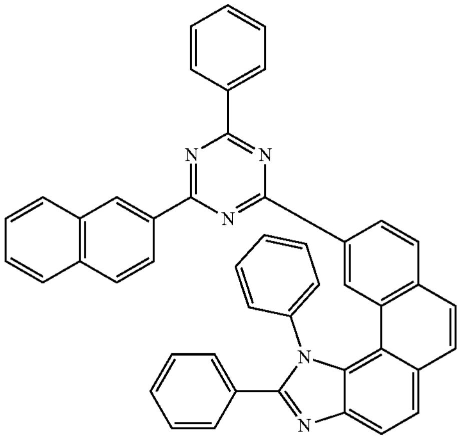
C-2-72
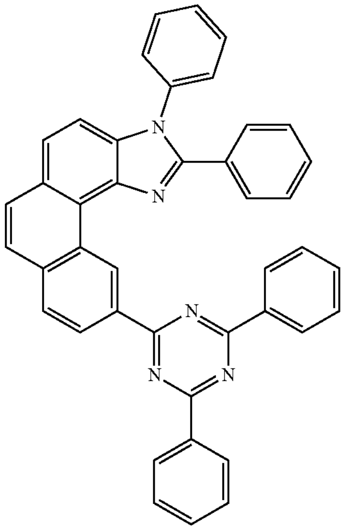

-continued
C-2-73
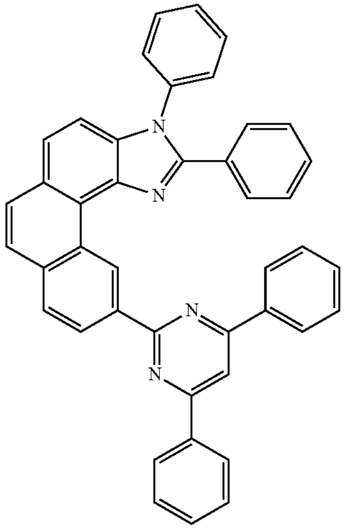
C-2-74
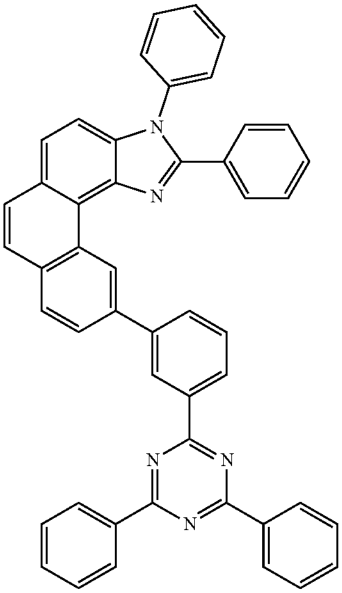
-continued
C-2-75
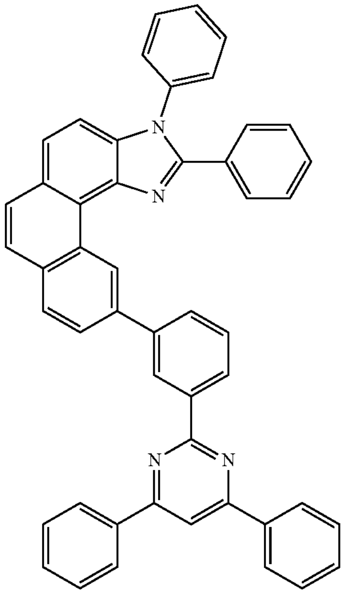
C-2-76
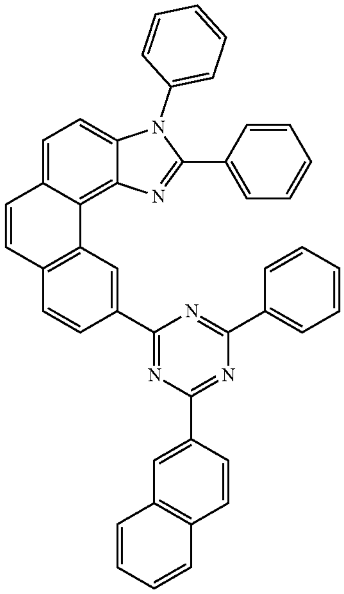

-continued
C-2-77
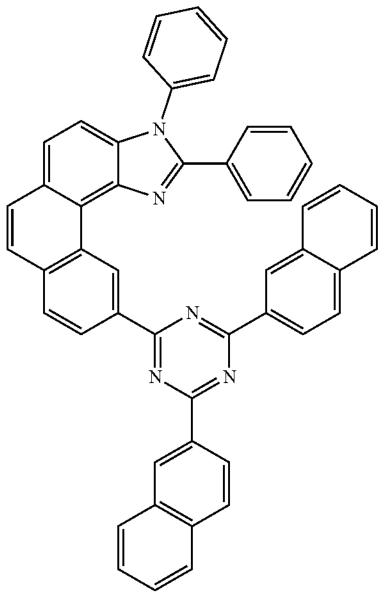
C-2-78
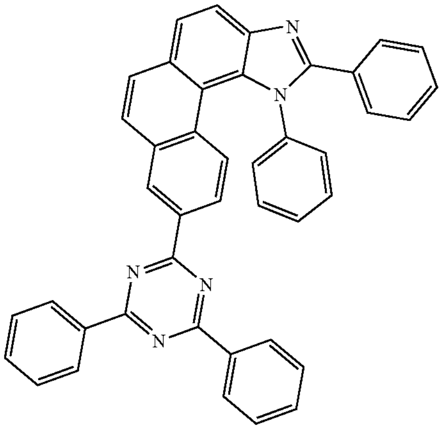
C-2-79
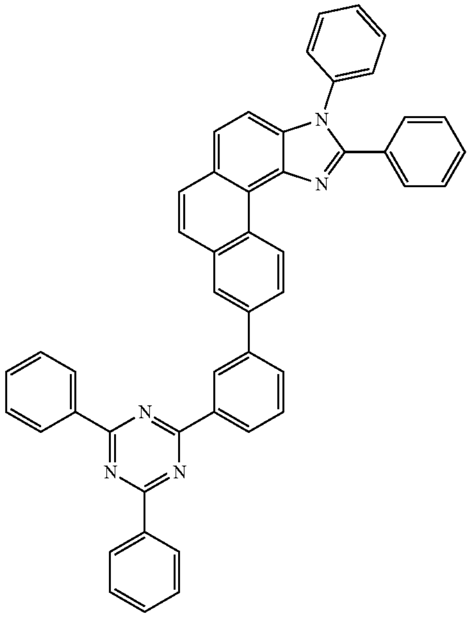
-continued
C-2-80
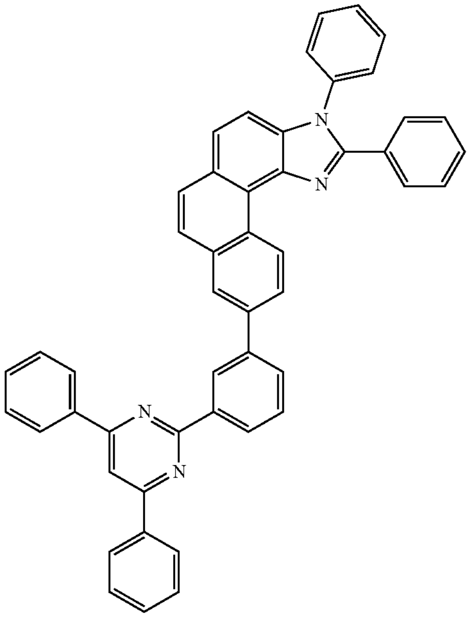
C-2-81
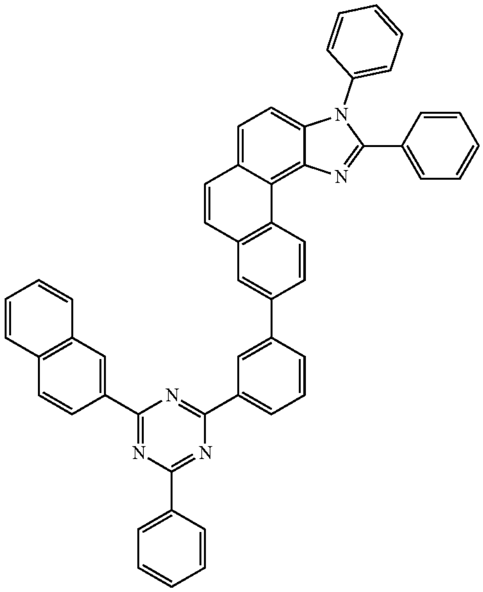

-continued
C-2-82
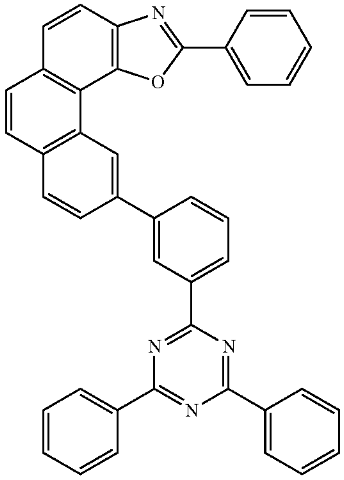
C-2-83
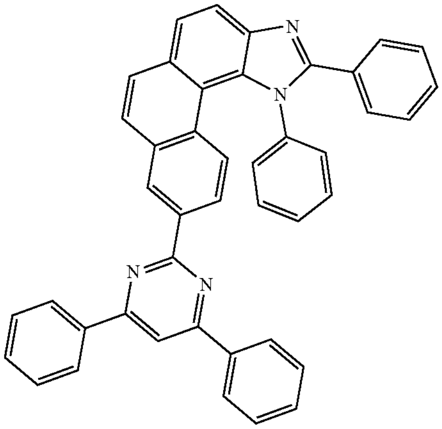
C-2-84
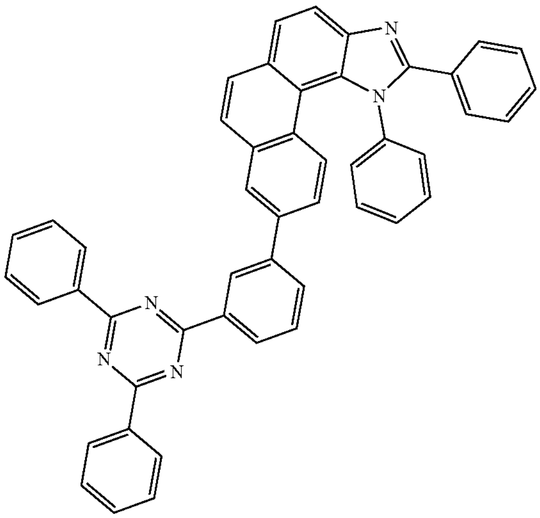
-continued
C-2-85
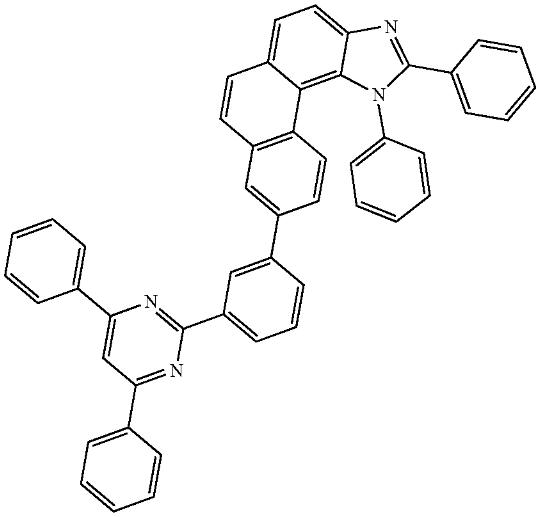
C-2-86
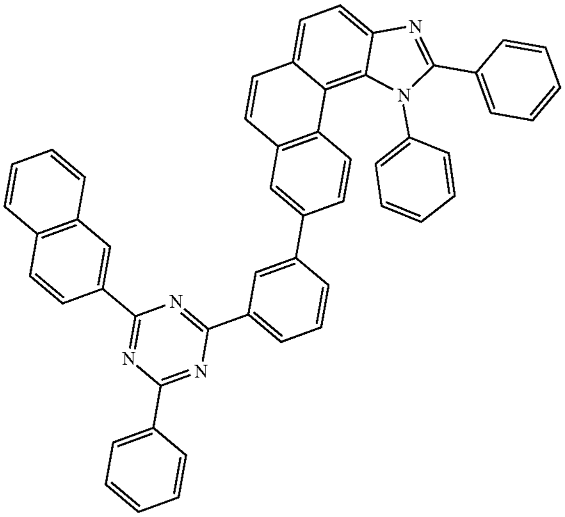
C-2-87
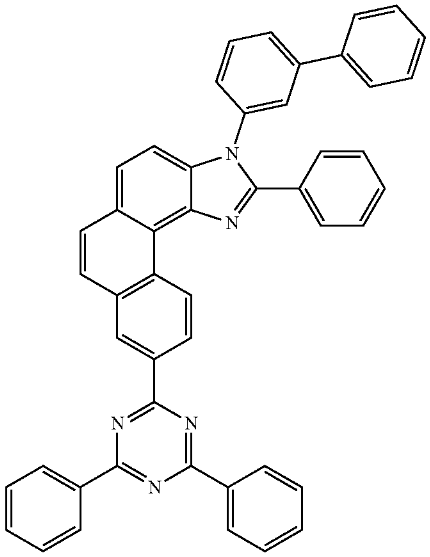

-continued
C-2-88
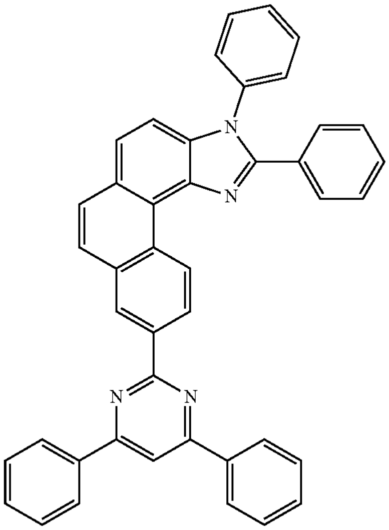
C-2-89
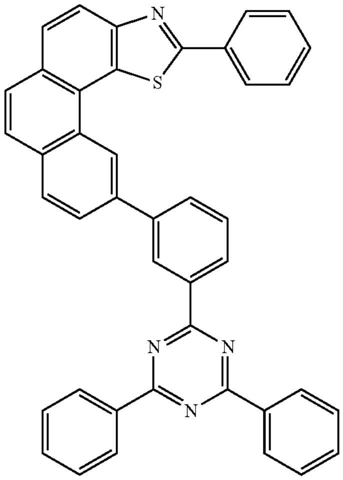
C-2-90
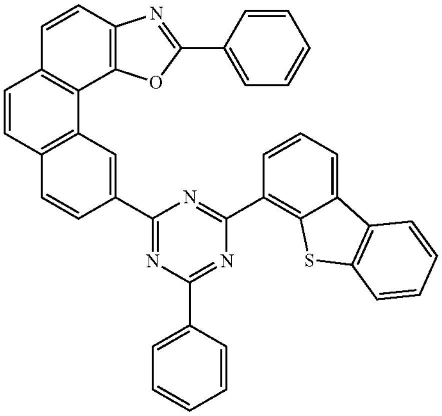
-continued
C-2-91
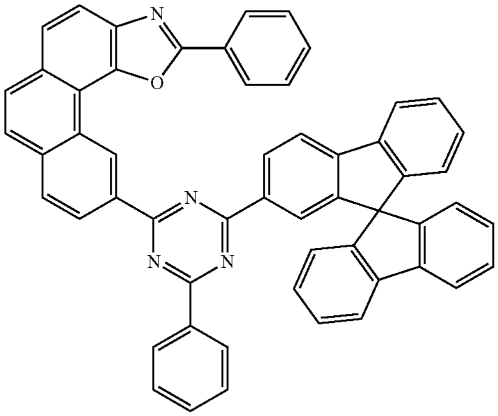
C-2-92
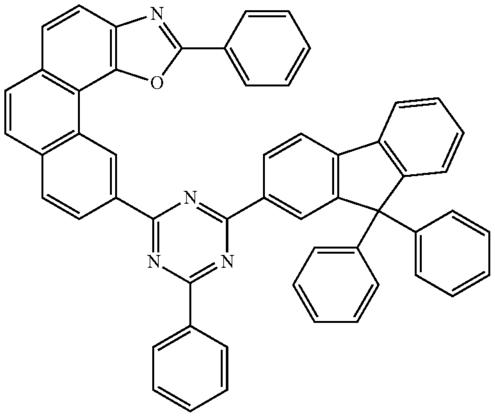
C-2-93
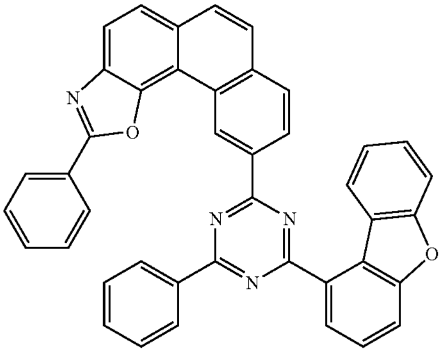
C-2-94
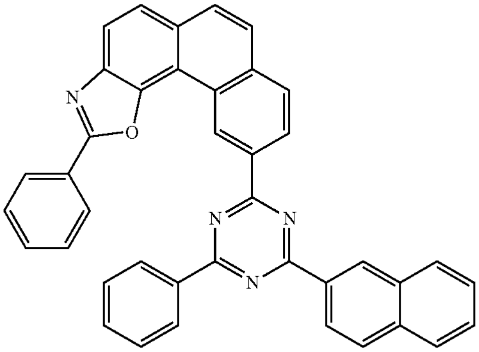

-continued
C-2-95
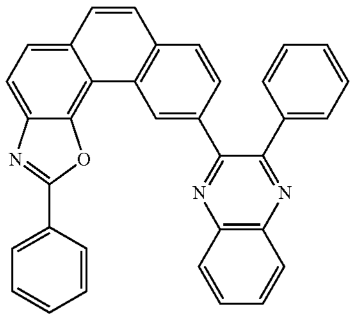
C-2-96
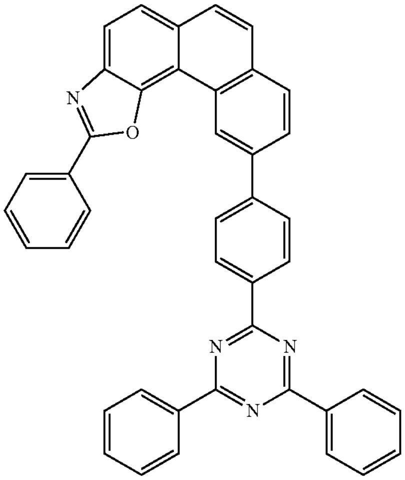
C-2-97
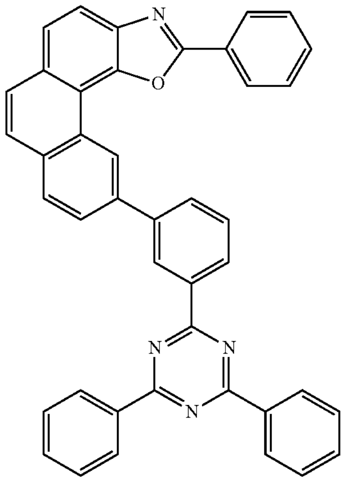
C-2-98
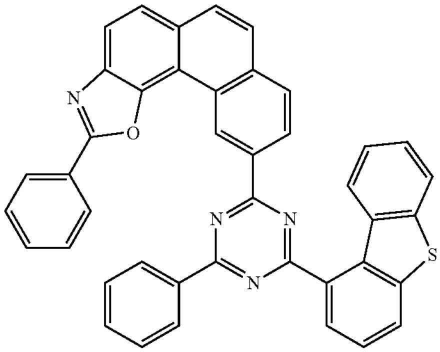
-continued
C-2-99
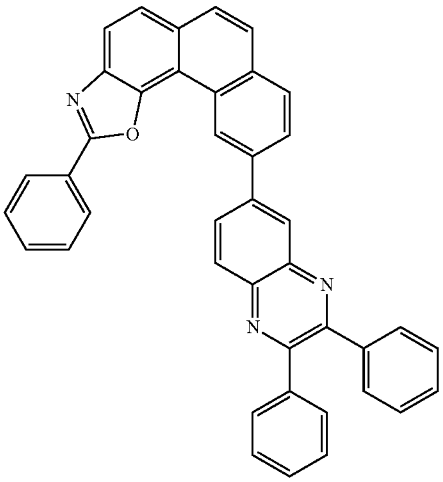
C-2-100
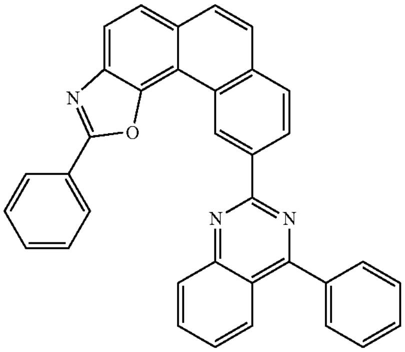
C-2-101
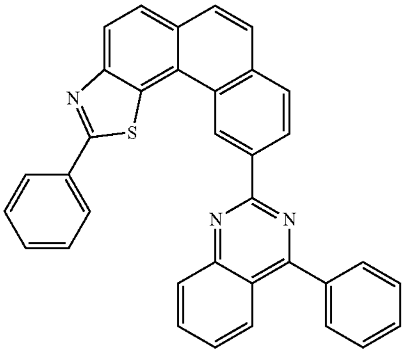

-continued
C-2-102
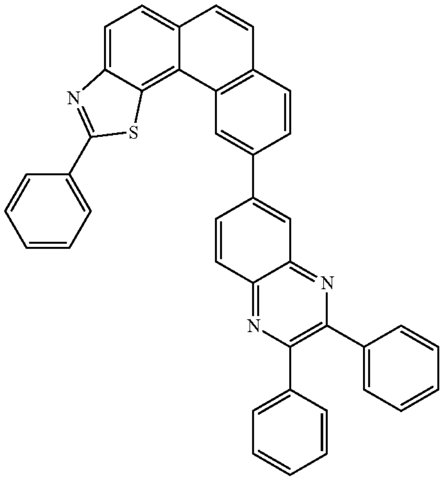
C-2-103
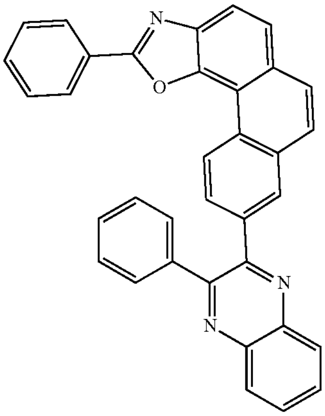
C-2-104
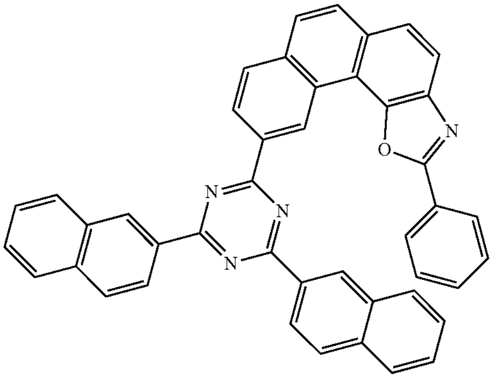
-continued
C-2-105
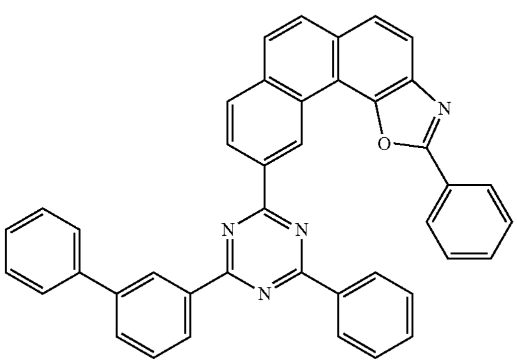
C-2-106
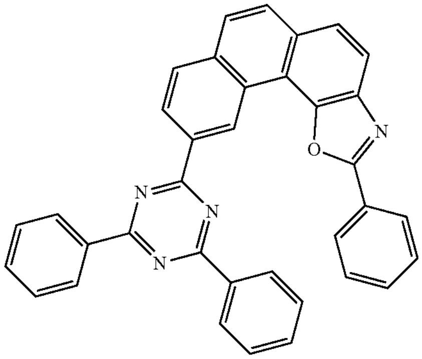
C-2-107
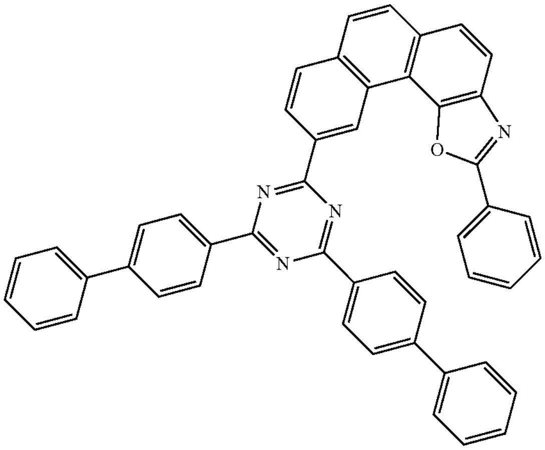

-continued
C-2-108
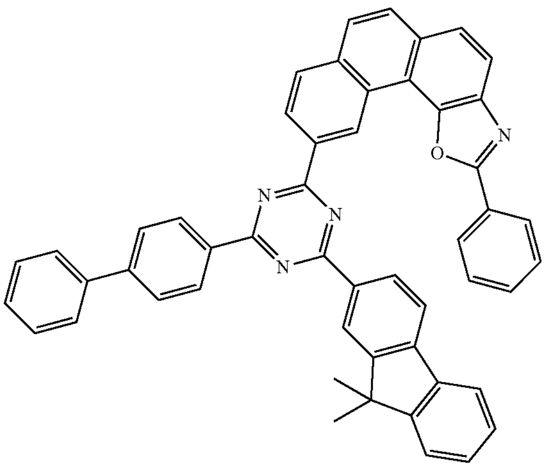
C-2-109
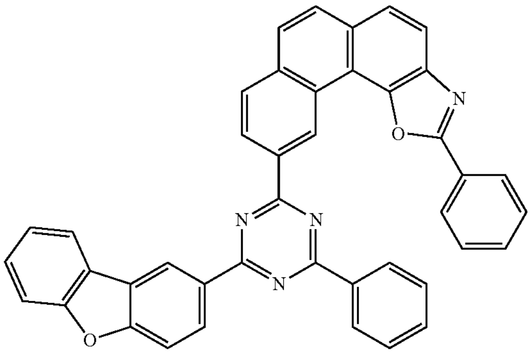
C-2-110
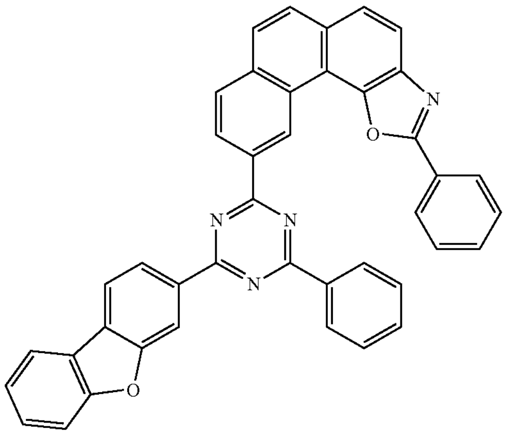
-continued
C-2-111
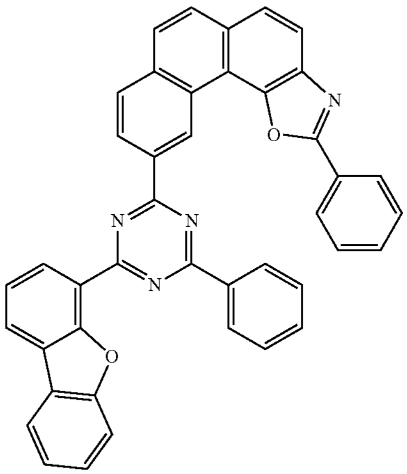
and
C-2-112
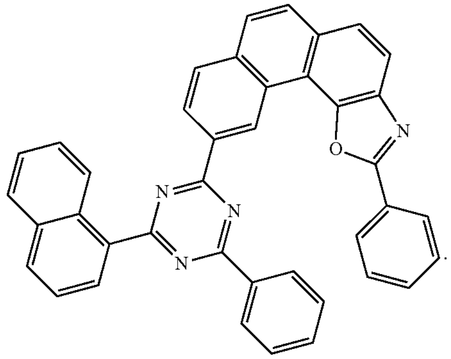
7. An organic electroluminescent device comprising an anode, a cathode, and at least one light-emitting layer between the anode and the cathode, wherein the at least one layer of the light-emitting layers comprises the plurality of host materials according to claim 1.
* * * * *